US008552299B2

(12) United States Patent
Rogers et al.

(10) Patent No.: US 8,552,299 B2
(45) Date of Patent: Oct. 8, 2013

(54) STRETCHABLE AND FOLDABLE ELECTRONIC DEVICES

(75) Inventors: John A. Rogers, Champaign, IL (US); Yonggang Huang, Glencoe, IL (US); Heung Cho Ko, Urbana, IL (US); Mark Stoykovich, Dover, NH (US); Won Mook Choi, Champaign, IL (US); Jizhou Song, Miami, FL (US); Jong Hyun Ahn, Gyeonggi-do (KR); Dae Hyeong Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 820 days.

(21) Appl. No.: 12/398,811

(22) Filed: Mar. 5, 2009

(65) Prior Publication Data
US 2010/0002402 A1  Jan. 7, 2010

Related U.S. Application Data

(60) Provisional application No. 61/033,886, filed on Mar. 5, 2008, provisional application No. 61/061,978, filed on Jun. 16, 2008, provisional application No. 61/084,045, filed on Jul. 28, 2008.

(51) Int. Cl.
*H05K 1/00* (2006.01)
(52) U.S. Cl.
USPC .......................... 174/254; 257/642; 361/750
(58) Field of Classification Search
USPC ................... 174/254; 438/30, 780, 790, 794; 257/642–643; 361/749, 750
See application file for complete search history.

(56) References Cited

U.S. PATENT DOCUMENTS

| 4,392,451 A | 7/1983 | Mickelsen et al. |
| 4,471,003 A | 9/1984 | Cann |
| 4,487,162 A | 12/1984 | Cann |
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,086,785 A | 2/1992 | Gentile et al. |
| 5,204,144 A | 4/1993 | Cann et al. |
| 5,313,094 A | 5/1994 | Beyer et al. |

(Continued)

FOREIGN PATENT DOCUMENTS

| DE | 4241045 C1 | 5/1994 |
| EP | 0929097 | 7/1999 |

(Continued)

OTHER PUBLICATIONS

Extended European Search Report corresponding to European Patent Application No. 09716695.3, dated Jun. 15, 2012, 12 pgs.

(Continued)

*Primary Examiner* — Khiem Nguyen
(74) *Attorney, Agent, or Firm* — Lathrop & Gage LLP

(57) ABSTRACT

Disclosed herein are stretchable, foldable and optionally printable, processes for making devices and devices such as semiconductors, electronic circuits and components thereof that are capable of providing good performance when stretched, compressed, flexed or otherwise deformed. Strain isolation layers provide good strain isolation to functional device layers. Multilayer devices are constructed to position a neutral mechanical surface coincident or proximate to a functional layer having a material that is susceptible to strain-induced failure. Neutral mechanical surfaces are positioned by one or more layers having a property that is spatially inhomogeneous, such as by patterning any of the layers of the multilayer device.

32 Claims, 107 Drawing Sheets

(56) References Cited

U.S. PATENT DOCUMENTS

| | | | |
|---|---|---|---|
| 5,525,815 A | 6/1996 | Einset |
| 5,545,291 A | 8/1996 | Smith et al. |
| 5,648,148 A | 7/1997 | Simpson |
| 5,691,245 A | 11/1997 | Bakhit et al. |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,928,001 A | 7/1999 | Gillette et al. |
| 5,955,781 A | 9/1999 | Joshi et al. |
| 5,976,683 A | 11/1999 | Liehrr et al. |
| 5,998,291 A | 12/1999 | Bakhit et al. |
| 6,080,608 A | 6/2000 | Nowak |
| 6,225,149 B1 | 5/2001 | Gan et al. |
| 6,265,326 B1 | 7/2001 | Ueno |
| 6,274,508 B1 | 8/2001 | Jacobsen et al. |
| 6,277,712 B1 | 8/2001 | Kang et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,317,175 B1 | 11/2001 | Salerno et al. |
| 6,334,960 B1 | 1/2002 | Willson et al. |
| 6,380,729 B1 | 4/2002 | Smith |
| 6,403,397 B1 | 6/2002 | Katz |
| 6,413,790 B1 | 7/2002 | Duthaler et al. |
| 6,417,025 B1 | 7/2002 | Gengel |
| 6,420,266 B1 | 7/2002 | Smith et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,667,548 B2 | 12/2003 | O'Connor et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,900,094 B2 | 5/2005 | Hammond et al. |
| 6,917,061 B2 | 7/2005 | Pan et al. |
| 6,949,199 B1 | 9/2005 | Gauzner et al. |
| 6,949,206 B2 | 9/2005 | Whitford |
| 6,950,220 B2 | 9/2005 | Abramson et al. |
| 6,984,934 B2 | 1/2006 | Moller et al. |
| 6,989,285 B2 | 1/2006 | Ball |
| 7,029,951 B2 | 4/2006 | Chen et al. |
| 7,067,903 B2 | 6/2006 | Tachibana et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,195,733 B2 | 3/2007 | Rogers et al. |
| 7,253,442 B2 | 8/2007 | Huang et al. |
| 7,255,919 B2 | 8/2007 | Sakata et al. |
| 7,374,968 B2 | 5/2008 | Kornilovich et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,691 B2 | 12/2009 | Roush et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 2003/0006527 A1 | 1/2003 | Rabolt et al. |
| 2003/0178316 A1 | 9/2003 | Jacobs et al. |
| 2003/0222282 A1 | 12/2003 | Fjelstad et al. |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0192082 A1 | 9/2004 | Wagner et al. |
| 2004/0206448 A1 | 10/2004 | Dubrow |
| 2004/0250950 A1 | 12/2004 | Dubrow |
| 2005/0038498 A1 | 2/2005 | Dubrow et al. |
| 2005/0227389 A1 | 10/2005 | Bhattacharya et al. |
| 2005/0238967 A1 | 10/2005 | Rogers et al. |
| 2006/0038182 A1 | 2/2006 | Rogers et al. |
| 2006/0049485 A1 | 3/2006 | Pan et al. |
| 2006/0076561 A1 | 4/2006 | Hioki et al. |
| 2006/0127817 A1 | 6/2006 | Ramanujan et al. |
| 2006/0132025 A1 | 6/2006 | Gao et al. |
| 2006/0134893 A1 | 6/2006 | Savage et al. |
| 2006/0169989 A1 | 8/2006 | Bhattacharya et al. |
| 2006/0231288 A1 | 10/2006 | Vanfleteren et al. |
| 2006/0244105 A1 | 11/2006 | Forbes et al. |
| 2006/0286488 A1 | 12/2006 | Rogers et al. |
| 2006/0286785 A1 | 12/2006 | Rogers et al. |
| 2007/0032089 A1 | 2/2007 | Nuzzo et al. |
| 2008/0041617 A1 | 2/2008 | Chen et al. |
| 2008/0055581 A1 | 3/2008 | Rogers et al. |
| 2008/0108171 A1 | 5/2008 | Rogers et al. |
| 2008/0157235 A1 | 7/2008 | Rogers et al. |
| 2008/0212102 A1 | 9/2008 | Nuzzo et al. |
| 2009/0199960 A1 | 8/2009 | Nuzzo et al. |
| 2009/0294803 A1 | 12/2009 | Nuzzo et al. |
| 2010/0052112 A1 | 3/2010 | Rogers et al. |
| 2010/0059863 A1 | 3/2010 | Rogers et al. |
| 2010/0072577 A1 | 3/2010 | Nuzzo et al. |

FOREIGN PATENT DOCUMENTS

| | | |
|---|---|---|
| EP | 1357773 | 10/2003 |
| JP | 2002092984 | 3/2002 |
| TW | 367570 | 8/1999 |
| TW | 494257 | 7/2002 |
| TW | 200836353 | 9/2008 |
| WO | WO 96/21245 | 7/1996 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 02/27701 | 4/2002 |
| WO | WO 02/43032 | 5/2002 |
| WO | WO 02/45160 | 6/2002 |

| | | |
|---|---|---|
| WO | WO 02/071137 | 9/2002 |
| WO | WO 02/097708 | 12/2002 |
| WO | WO 02/097724 | 12/2002 |
| WO | WO 03/032240 | 4/2003 |
| WO | WO 03/049201 | 6/2003 |
| WO | WO 03/060986 | 7/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/086530 | 10/2004 |
| WO | WO 2004/094303 | 11/2004 |
| WO | WO 2004/100252 | 11/2004 |
| WO | WO 2004/099068 | 12/2004 |
| WO | WO 2004/105456 | 12/2004 |
| WO | WO 2004/107973 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |
| WO | WO 2005/033786 | 4/2005 |
| WO | WO 2005/033787 | 4/2005 |
| WO | WO 2005/054119 | 6/2005 |
| WO | WO 2005/104756 | 11/2005 |
| WO | WO 2005/106934 | 11/2005 |
| WO | WO 2005/122285 | 12/2005 |
| WO | WO 2006/130558 | 12/2006 |
| WO | WO 2006/130721 | 12/2006 |
| WO | WO 2007/126412 | 11/2007 |
| WO | WO 2008/030666 | 3/2008 |
| WO | WO 2008/030960 | 3/2008 |
| WO | WO 2008/036837 | 3/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/005707 | 1/2010 |
| WO | WO 2010/036807 | 4/2010 |

OTHER PUBLICATIONS

Notice of Reasons for Rejection corresponding to Japanese Patent Application No. P2006-165159, Dispatched Apr. 24, 2012—includes English translation.
STELLA Project—Stretchable Electronics for Large-Area Applications. Available at www.stella-project.de. Accessed Feb. 8, 2012.
BIOFLEX—Biocompatible Flexible Electronic Circuits. Available at http://tfcg.elis.ugent.be/projects/bioflex. Accessed Feb. 8, 2012.
SWEET: Stretchable and Washable Electronics for Embedding Textiles. Available at http://tfcg.elis.ugent.be/projects/sweet. Accessed Feb. 8, 2012.
J. Vanfleteren. SWEET: Stretchable and Washable Electronics for Embedding Textiles. Available at ftp://ftp.cordis.europa.eu/pub/ist/docs/mnd/ws-sfit_en.pdf. Accessed Feb. 8, 2012.
Abbaschian et al. (Dec. 2005) "High Pressure-High Temperature Growth of Diamond Crystals Using Split Sphere Apparatus," *Diamond Relat. Mater.* 14(11-12):1916-1919.
Adachi et al (1982) "Chemical Etching of InGaAsP/InP DH Wafer," *J. Electrochem. Soc.* 129:1053-1062.
Adachi et al. (1983) "Chemical Etching Characteristics of (001)GaAs," *J. Electrochem. Soc.* 130:2427-2435.
Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.
Ahn et al. (2007) "Bendable Integrated Circuits on Plastic Substrates by Use of Printed Ribbons of Single-Crystalline Silicon," *Appl. Phys. Lett.* 90:213501.

Ahn et al. (Dec. 15, 2006) "Heterogeneous Three-Dimensional Electronics by Use of Printed Semiconductor Nanomaterials," *Science* 314:1754-1757.
Ahn et al. (Jun. 2006) "High-Speed Mechanically Flexible Single-Crystal Silicon Thin-Film Transistors on Plastic Substrates," *IEEE Electron Dev. Lett.* 27(6):460-462.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Al-Sarawi et al. (Feb. 1998) "A Review of 3-D Packaging Technology," *IEEE Trans. Comp. Packag. Manufac. Technol. B* 21(1):2-14.
Amano et al. (Feb. 3, 1986) "Metalorganic Vapor Phase Epitaxial Growth of a High Quality GaN Film Using an AlN Buffer Layer," *Appl. Phys. Lett.* 48(5):353-355.
Ambrosy et al. (1996) "Silicon Motherboards for Multichannel Optical Modules," *IEEE Trans. Compon. Pack. A* 19:34-40.
Andersson et al. (Oct. 16, 2002) "Active Matrix Displays Based on All-Organic Electrochemical Smart Pixels Printed on Paper," *Adv. Mater.* 14:1460-1464.
Ando et al. (2004) "Self-Aligned Self-Assembly Process for Fabricating Organic Thin-Film Transistors," *Appl. Phys. Lett.* 85:1849-1851.
Angadi et al. (Web Release Jun. 1, 2006) "Thermal Transport and Grain Boundary Conductance in Ultrananocrystalline Diamond Thin Films," *J. Appl. Phys.* 99:114301.
Aoki et al. (2003) "Microassembly of Semiconductor Three Dimensional Photonic Crystals," *Nat. Mater.* 2:117-121.
Arnold et al. (Web Release Dec. 28, 2002) "Field-Effect Transistors Based on Single Semiconducting Oxide Nanobelts," *J. Phys. Chem. B* 107(3):659-663.
Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81:126-128.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bhunia et al. (2004) "Free-Standing and Vertically Aligned InP Nanowires Grown by Metalorganic Vapor Phase Epitaxy," *Physica E* 21:583-587.
Bhushan et al. (2004) "Multiwalled Carbon Nanotube AFM Probes for Surface Characterization of Micro/Nanostructures," *Microsyst. Technol.* 10:633-639.

Bietsch et al. (2000) "Conformational Contact and Pattern Stability of Stamps Used for Soft Lithography," *J. Appl. Phys.* 88:4310-4318.

Bishay et al. (2000) "Temperature Coefficient of the Surface Resistivity of Two-Dimensional Island Gold Films," *J. Phys. D. Appl. Phys.* 33(18):2218-2222.

Blanchet et al. (2003) "Large Area, High Resolution, Dry Printing of Conducting Polymers for Organic Electronics," *Appl. Phys. Lett.* 82:463-465.

Blanchet et al. (2003) "Printing Techniques for Plastic Electronics," *J. Imag. Sci. Tech.* 47(4):296-303.

Blazdell et al. (Nov. 1999) "Preparation of Ceramic Inks for Solid Freeforming Using a Continuous Jet Printer," *J. Mat. Syn. Process.* 7(6):349-356.

Boltau et al. (1998) "Surface-Induced Structure Formation of Polymer Blends on Patterned Substrates," *Nature* 391:877-879.

Boncheva et al. (Mar. 15, 2005) "Magnetic Self-Assembly of Three-Dimensional Surfaces from Planar Sheets," *Proc. Natl. Acad. Sci. USA* 102(11):3924-3929.

Boncheva et al. (Mar. 8, 2005) "Templated Self-Assembly: Formation of Folded Structures by Relaxation of Pre-Stressed, Planar Tapes. The Path to Ubiquitous and Low-cost Organic Electronic Appliances on Plastic," *Adv. Mater.* 17(5):553-557.

Bowden et al. (1997) "Self Assembly of Mesoscale Objects into Ordered Two-Dimensional Arrays," *Science* 276:233-235.

Bowden et al. (1998) "Spontaneous Formation of Ordered Structures in Thin Films of Metals Supported on an Elastomeric Polymer," *Nature* 393:146-149.

Bowden et al. (2001) "Molecule-Mimetic Chemistry and Mesoscale Self-Assembly," *Acc. Chem. Res.* 34:231-238.

Bracher et al. (2009) "Shaped Films of Ionotropic Hydrogels Fabricated Using Templates of Patterns Paper," *Adv. Mater.* 21:445-450.

Braun et al. (1999) "Electrochemically Grown Photonic Crystals," *Nature* 402:603-604.

Britton et al. (Web Release Oct. 25, 2005) "Microstructural Defect Characterization of a Si:H Deposited by Low Temperature HW-CVD on Paper Substrates," *Thin Solid Films* 501(1-2):79-83.

Brown et al. (Dec. 19, 2001) "Heterogeneous Materials Integration: Compliant Substrates to Active Device and Materials Packaging," *Mater. Sci. Eng. B* 87(3):317-322.

Brown, H.R. (1991) "The Adhesion Between Polymers," *Ann. Rev. Mater. Sci.* 21:463-489.

Bruschi et al. (2001) "Micromachined Silicon Suspended Wires With Submicrometric Dimensions," *Microelectron. Eng.* 57-58:959-965.

Buma et al. (2001) "High-Frequency Ultrasound Array Element Using Thermoelastic Expansion in an Elastomeric Film," *Appl. Phys. Lett.* 79:548-550.

Burdinski et al. (2005) "Single Etch Patterning of Stacked Silver and Molybdenum Alloy Layers on Glass Using Microcontat Wave Printing," *J. Am. Chem. Soc.* 127(31):10786-10787.

Burdinski, D. (non-dated) "Soft Lithography and Microcontact Wave Printing," http://www.research.philips.com/technologies/light_dev_microsys/softlitho/index.html , Downloaded May 23, 2007.

Burgin et al. (2000) "Large Area Submicrometer Contact Printing Using a Contact Aligner," *Langmuir* 16:5371-5375.

Burns et al. (2003) "Printing of Polymer Thin-Film Transistors for Active-Matrix-Display Applications," *J. Soc. Inf. Display* 11:599-604.

Campbell et al. (2000) "Fabrication of Photonic Crystals for the Visible Spectrum by Holographic Lithography," *Nature* 404:53-56.

Cao et al. (2006) "Highly Bendable,Transparent Thin-Film Transistors That Use Carbon-Nanotube-Based Conductors and Semiconductors with Elastomeric Delectrics," *Adv. Mater.* 18(3):304-309.

Cao et al. (Jul. 24, 2008) "Medium-Scale Carbon Nanotube Thin-Film Integrated Circuits on Flexible Plastic Substrates," *Nature* 454:495-500.

Carr et al. (1998) "Measurement of Nanomechanical Resonant Structures in Single-Crystal Silicon," *J. Vac. Sci. Technol. B* 16:3821-3824.

Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.

Chang et al. (1994) "Process Techniques, Lithography and Device-Related Physics and Principles," In; *GaAs High-Speed Devices: Physics, Technology and Circuit Application*, John Wiley and Sons, New York, pp. 115-278.

Chen et al. (2003) "Characterization of Pd-GaAs Schottly Diodes Prepared by the Electrodes Plating Technique," *Semiconductor. Sci. Technol.* 18:620-626.

Chen et al. (2003) "Electronic Paper: Flexible Active-Matrix Electronics Ink Display," *Nature* 423:136.

Chen et al. (2004) "Herringbone Buckling Patterns of Compresses Thin Films on Comlliant Substrates," *J. Appl. Mech.* 71:597.

Chen et al. (2005) "InGaN Nanorings and Nanodots by Selective Area Epitaxy,"*Appl. Phys. Lett.* 87:143111.

Chen et al. (2005) "The Role of Metal-Nanotube Caontact in the Performance of Carbon Nanotube Field-Effect Transistors," *Nano Lett.* 5(7):1497-1502.

Chen et al. (Feb. 27, 2006) "Complementary Carbon Nanotube-Gated Carbon Nanotube Thin-Fim Transistor," *Appl. Phys. Lett.* 88:093502.

Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-2775.

Chen et al. (Mar. 2004) "A Family of Herringbone Patterns in Thin Films," *Scr. Mater.* 50(6):797-801.

Chen et al. (Mar. 24, 2006) "An Integrated Logic Crcuit Assembled on a Single Carbon Nanotube," *Science* 311:1735.

Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.

Childs et al. (2002) "Decal Transfer Microlithography: A New Soft-Lithographic Patterning Method," *J. Am. Chem. Soc.* 124:13583-13596.

Childs et al. (2005) "Masterless Soft-Lithography: Patterning UV/Ozone-Induced Adhesion on Poly(dimethylsiloxane) Surfaces," *Langmuir* 21:10096-10105.

Childs et al. (Aug. 14, 2004) "Patterning of Thin-Film Microstructures on Non-Planar Substrate Surfaces Using Decal Transfer Lithography," *Adv. Mater.* 16(15):1323-1327.

Choi et al. (2007) "Biaxially Stretchable 'Wavy' Silicon Nanomembranes," *Nano Lett.* 7(6):1655-1663.

Choi et al. (Web Release Jan. 25, 2005) "Simple Detachment Patterning of Organic Layers and Its Applications to Organic Light-Emitting Diodes," *Adv. Mater.* 17(2):166-171.

Chou et al. (2004) "An Orientation-Controlled Pentacene Film Aligned by Photoaligned Polyimide for Organic Thin-Film Transistor Applications," *Adv. Func. Mater.* 14:811-815.

Chou et al. (Jun. 8, 1999) "Micromachining on (111)-Oriented Silicon," *Sens. Actuators A* 75(3):271-277.

Chu et al. (2005) "High-Performance Organic Thin-Film Transistors with Metal Oxide/Metal Bilayer Electrode," *Appl. Phys. Lett.* 87:193508.

Chung et al. (2000) "Silicon Nanowire Devices," *Appl. Phys. Lett.* 76(15):2068-2070.

Chung et al. (Jul. 1, 2003) "A Study on Formation of Al and $Al_2O_3$ on the Porous Paper by DC Magnetron Sputtering," *Surf. Coat. Technol.* 171(1-3):65-70.

Collins et al. (Apr. 27, 2001) "Engineering Carbon Nanotubes and Nanotube Circuits Using Electrical Breakdown," *Science* 292:706-709.

Creagh et al. (2003) "Design and Performance of Inkjet Print Heads for Non-Graphic-Arts Applications," *MRS Bull.* 28:807-811.

Crone et al. (Feb. 3, 2000) "Large-Scale Complementary Integrated Circuits Based on Organic Transistors," *Nature* 403:521-523.

Crowder et al. (1998) "Low-Temperature Single-Crystal Si TFTs Fabricated on Si Films Processed via Sequential Lateral Solidification," *IEEE Electron. Dev. Lett.* 19:306-308.

Cui et al. (2001) "Nanowire Nanosensors for Highly Sensitive and Selective Detection of Biological and Chemical Species," *Science* 293:1289-1292.

Dai et al. (2003) "Novel Nanostructures of Functional Oxides Synthesized by Thermal Evaporation," *Adv. Funct. Mater.* 13:9-24.

Dai et al. (Web Release Jan. 15, 2002) "Gallium Oxide Nanoribbons and Nanosheets," *J. Phys. Chem. B* 106(5):902-904.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
de Gans (2004) "Inkjet Printing of Polymers: State of the Art and Future Developments," *Adv. Mater.* 16(3):203-213.
De Sio et al. (Web Release May 18, 2005) "Electro-Optical Response of a Single-Crystal Diamond Ultraviolet Photoconductor in Transverse Configuration," *Appl. Phys. Lett.* 86:213504.
DeBoer et al. (2004) "Organic Single-Crystal Field-Effect Transistors," *Phys. Stat. Sol.* 201:1302-1331.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Desai et al. (Feb. 1999) "Nanopore Technology for Biomedical Applications," *Biomed. Microdevices* 2(1):11-40.
Dick et al. (2004) "Synthesis of Branched 'Nanotrees' by Controlled Seeding of Multiples Branching Events," *Nat. Mater.* 3:380-384.
Dimroth et al. (Mar. 2007) "High-Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Dodabalapur A. (Apr. 2006) "Organic and Polymer Transistors for Electronics," *Mater Today* 9(4):24-30.
Dodabalapur et al. (1995) "Organic Transistors: Two-Dimensional Transport and Improved Electrical Characteristics," *Science* 268:270-271.
Duan et al. (2000) "General Synthesis of Compound Semiconductor Nanowires," *Adv. Mater.* 12:298-302.
Duan et al. (2003) "High-performance Thin-Film Transistors Using Semiconductor Nanowires and Nanoribbons," *Nature* 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.
Duboz et al. (1998) "Transistors and Detectors Based on GaN-Related Materials," In; *Group III Nitride Semiconductor Compounds*, Gill, B. ed., Clarendon, Oxford, pp. 343-387.
Duffy et al. (1998) "Rapid Prototyping of Microfluidic Systems in Poly(dimethylsiloxane)," *Anal. Chem.* 70(23):4974-4984.
Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.
Eftekhari, G. (1993) "Variation in the Effective Richardson Constant of Metal—GaAs and Metal—InP Contacta Due to the Effect of Processing Parameters," *Phys. Status Solid A—Appl. Res.* 140:189-194.
Ensell, G. (1995) "Free Standing Single-Crystal Silicon Microstructures," *J. Micromech. Microeng.* 5:1-4.
Examination Report, Corresponding to European Application No. EP 05 756 327.2, Dated Jan. 20, 2010.
Examination Report, Corresponding to Malaysian Patent Application No. PI 20062672, Mailed Aug. 28, 2009.
Examination Report, Corresponding to Malaysian Patent Application No. PI 20092343, Mailed Jun. 15, 2010.
Examination Report, Corresponding to Malaysian Patent Publication No. PI 20052553, Mailed Mar. 13, 2009.
Examination Report, Corresponding to Singapore Patent Application No. 200608359-6, Completed on Aug. 27, 2008.
Faez et al. (1999) "An Elastomeric Conductor Based on Polyaniline Prepared by Mechanical Mixing," *Polymer* 40:5497-5503.
Felgner et al. (1996) "Flexural Rigidity of Microtubules Measured with the Use of Optical Tweezers," *J. Cell Sci.* 109:509-516.
Fink et al. (1999) "Block Copolymers as Photonic Bandgap Materials," *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," *IEEE Electron. Dev. Lett.* 29(9):988-990.
Freire et al. (1999) "Thermal Stability of Polyethylene Terephthalate (PET): Oligomer Distribution and Formation of Volatiles," *Packag. Technol. Sci.* 12:29-36.
Freund, L.B. (2000) "The Mechanics of Electronic Materials," *Int. J. Solids Struct.* 37:185-196.
Friedman et al. (2005) "Nanotechnology: High-Speed Integrated Nanowire Circuits," *Nature* 434:1085.
Fu et al. (Jan. 10, 2003) "Patterning of Diamond Microstructures on Si Substrate by Bulk and Surface Micromachining," *J. Mater. Process. Technol.* 132(1-3):73-81.
Furneaux et al. (1989) "The Formation of Controlled-Porosity Membranes from Anodically Oxidized Aluminum," *Nature* 337:147-149.
Gan et al. (2002) "Preparation of Thin-Film Transistors with Chemical Bath Deposited CdSe and CdS Thin Films," *IEEE Trans. Electron. Dev.* 49:15-18.
Gao et al. (Sep. 9, 2005) "Conversion of Zinc Oxide Nanobelts into Superlattice-Structures Nanohelices," *Science* 309:1700-1704.
Garcia et al. (Oct. 2004) "Etchant Anisotropy Controls the Step Bunching Instability in KOH Etching of Silicon," *Phys. Rev. Lett.* 93(16):166102.
Garnier et al. (1994) "All-Polymer Field-Effect Transistor Realized by Printing Techniques," *Science* 265:1684-1686.
Geim et al. (Mar. 2007) "The Rise of Graphene," *Nature Mater.* 6:183-191.
Geissler et al. (2003) "Fabrication of Metal Nanowires Using Microcontact Printing," *Langmuir* 19(15):6301-6311.
Geissler et al. (Jun. 2003) "Selective Wet-Etching of Microcontact-Printed Cu Substrates with Control Over the Etch Profile," *Microelec. Eng.* 67-68:326-332.
Gelinck et al. (2000) "High-Performance All-Polymer Integrated Circuits," *Appl. Phys. Lett.* 77:1487-1489.
Gelinck et al. (2004) "Flexible Active-Matrix Displays and Shift Registers Based on Solution-Processed Organic Transistors," *Nat. Mater.* 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Apple. Phys.* 80:6849-6854.

Goldmann et al. (2004) "Hole Mobility in Organic Single Crystals Measured by a "Flip-Crystal" Field-Effect Technique," *J. Appl. Phys.* 96:2080-2086.

Goldsmith, T.H. (Sep. 1990) "Optimization, Constraint, and History in the Evolution of Eyes," *Quart. Rev. Biol.* 65(3):281-322.

Gray et al. (2004) "High-Conductivity Elastomeric Electronics," *Adv. Mater.* 16:393-397.

Gray et al. (Dec. 2001) "Screen Printed Organic Thin Film Transistors (OTFTs) on a Flexible Substrate," *Proc. SPIE* 4466:89-94.

Grayson, T. (2002) "Curved Focal Plane Wide Field of View Telescope Design," *Proc. SPIE* 4849:269-274.

Gruen et al. (Mar. 21, 1994) "Fullerenes as Precursors for Diamond Film Growth Without Hydrogen or Oxygen Additions," *Appl. Phys. Lett.* 65(12):1502-1504.

Gudiksen et al. (Web Release Apr. 18, 2001) "Synthetic Control of the Diameter and Length of Single Crystal Semiconductor Nanowires," *J. Phys. Chem. B* 105:4062-4064.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Gurbuz et al. (Jul. 2005) "Diamond Semiconductor Technology for RF Device Applications." *Solid State Electron.* 49(7):1055-1070.

Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng. R* 37:1-60.

Halik et al. (2004) "Low-Voltage Organic Transistors with an Amorphous Molecular Gate Dielectric," *Nature* 431:963-966.

Hamedi et al. (May 2007) "Towards Woven Logic from Organic Electronic Fibres," *Nat. Mater.* 6:357-362.

Hamilton et al. (2004) "Field-Effect Mobility of Organic Polymer Thin-Film Transistors," *Chem. Mater.* 16:4699-4704.

Han et al. (2005) "Template-Free Directional Growth of Single-Walled Carbon Nanotues on a- and r-Plane Sapphire," *J. Am. Chem. Soc.* 127:5294-5295.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Harkonen et al. (Jun. 8, 2006) "4 W Single-Transverse Mode VECSEL Utilizing Intra-Cavity Diamond Heat Spreader," *Electron Lett.* 42(12):693-694.

He et al. (2005) "Si Nanowire Bridges in Microtrenches: Integration of Growth into Device Fabrication," *Adv. Mater.* 17:2098-2102.

Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.

Hines et al. (2005) "Nanotransfer Printing of Organic and Carbon Nanotube Thin-Film Transistors on Plastic Substrates," *Appl. Phys. Lett.* 86:163101.

Holmes et al. (Feb. 25, 2000) "Control of Thickness and Orientation of Solution-Grown Silicon Nanowires," *Science* 287:1471-1473.

Horn et al. (1992) "Contact Electrification and Adhesion Between Dissimilar Materials," *Science* 256:362-364.

Hoyer, P. (1996) "Semiconductor Nanotube Formation by a Two-Step Template Process," *Adv. Mater.* 8:857-859.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302:1355-1359.

Hsu et al. (2003) "Nature of Electrical Contacts in a Metal-Molecule-Semiconductor System," *J. Vac. Sci. Technol. B* 21(4):1928-1935.

Hsu et al. (2004) "Effects of Mechanical Strain on TFTs on Spherical Domes," *IEEE Trans. Electron. Dev.* 51:371-377.

Hsu et al. (Jan. 15, 2004) "Spherical Deformation of Compliant Substrates with Semiconductor Device Islands," *J. Appl. Phys.* 95(2):705-712.

Hu et al. (1997) "Using Soft Lithography to Fabricate GaAs/AlGaAs Heterostructure Field Effect Transistors," *Appl. Phys. Lett.* 71:2020-2022.

Hu et al. (1999) Chemistry and Physics in One Dimension: Synthesis and Properties of Nanowires and Nanotubes, *Acc. Chem. Res.* 32:435-445.

Huang et al. (2001) "Directed Assembly of One-Dimensional Nanostructures into Functional Networks," *Science* 291:630-633.

Huang et al. (2001) "Room-Temperature Ultraviolet Nanowire Nanolasers," *Science* 292:1897-1899.

Huang et al. (2004) "Self-Organizing High-Density Single-Walled Carbon Nanotube Arrays from Surfactant Suspensions," *Nanotechnol.* 15:1450-1454.

Huang et al. (2005) "Nanomechanical Architecture of Strained Bilayer Thin Films: From Design Principles to Experimental Fabrication," *Adv. Mater.* 17(23):2860-2864.

Huang et al. (2005) "Nanowires for Integrated Multicolor Nanophotonics," *Small* 1(1):142-147.

Huang et al. (2005) "Nonlinear Analyses of Wrinkles in a Film Bonded to a Compliant Substrate," *J. Mech. Phys. Solids* 53:2101-2118.

Huang et al. (2005) "Stamp Collapse in Soft Lithography," *Langmuir* 21:8058-8068.

Huang et al. (Jan. 16, 2001) "Catalytic Growth of Zinc Oxide Nanowires by Vapor Transport," *Adv. Mater.* 13(2):113-116.

Huck et al. (2000) "Ordering of Spontaneously Formed Buckles on Planar Surfaces," *Langmuir* 16:3497-3501.

Huie, J.C. (2003) "Guided Molecular Self-Assembly: A Review of Recent Efforts," *Smart Mater. Struct.* 12:264-271.

Huitema et al. (2001) "Plastic Transistors in Active-Matrix Displays," *Nature* 414:599.

Hur et al. (2005) "Organic Nanodelectrics for Low Voltage Carbon Nanotube Thin Film Transistors and Complementary Logc Gates," *J. Am. Chem. Soc.* 127:13808-13809.

Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.

Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

International Search Report and Written Opinion, Corresponding to International Application No. PCT/US 07/77759, Mailed Apr. 11, 2008.

International Search Report and Written Opinion, Corresponding to International Application No. PCT/2005/014449, Mailed Jul. 3. 2008.

International Search Report and Written Opinion, Corresponding to International Application No. PCT/US07/22959, Mailed Oct. 14, 2008.

International Search Report and Written Opinion, Corresponding to International Application No. PCT/US2009/036192, Mailed Jul. 6, 2009.

International Search Report anf Written Opinion, Corresponding to International PCT Application No. PCT/US05/19354 Mailed Apr. 18, 2007.

Isberg et al. (Sep. 6, 2002) "High Carrier Mobility in Single-Crystal Plasma-Deposited Diamond," *Science* 297:1670-1672.

Islam et al. (Jan. 16, 2003) "High Weight Fraction Surfactant Solubilization of Single-Wall Carbon Nanotubes in Water," *Nano Lett.* 3(2):269-273.

Ismach et al. (2004) "Atomic-Step-Templated Formation or a Single Wall Carbon Nanotube Patterns," *Angew. Chem. Int. Ed.* 43:6140-6143.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jabbour et al. (2001) "Screen Printing for the Fabrication of Organic Light-Emitting Devices," *IEEE J. Select. Top. Quantum. Electron.* 7(5):769-773.

Jackman et al. (Aug. 4, 1995) "Fabrication of Submicrometer Features on Curved Substrates by Microcontact Printing," *Science* 269:664-666.

Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.* 87:965-1006.

Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.

James et al. (1998) "Patterned Protein Layers on Solid Substrates by This Stamp Microcontact Printing," *Langmuir* 14:742-744.

Jang et al. (2006) "Low-Voltage and High-Field-Effect Mobility Organic Transistors with a Polymer Insulator," *Appl. Phys. Lett.* 88:072101.

Javey et al. (2002) "High-κ Dielectrics for Advanced Carbon-Nanotube Transistors and Logic Gates," *Nature Mater.* 1:241-246.

Javey et al. (Aug. 7, 2003) "Ballistic Carbon Nanotube Field-Effect Transistors," *Nature* 424:654-657.

Jenkins et al. (1994) "Gallium Arsenide Transistors: Realization Through a Molecularly Designed Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.

Jeon et al. (2004) "Fabricating Complex Three-Dimensional Nanostructures with High Resolution Conformable Phase Masks," *Proc. Natl. Acad. Sci. USA* 101:12428-12433.

Jeon et al. (Aug. 4, 2004) "Three Dimensional Nanofabrication with Rubber Stamps and Conformable Photomasks," *Adv. Mater.* 16(15):1369-1373.

Jiang et a. (Oct. 2, 2007) "Finite Deformation Mechanics in Buckled Thin Films on Compliant Supports," *Proc. Natl. Acad. Sci. USA* 104(40):15607-15612.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jin et al. (2004) "Soft Lithographic Fabrication of an Image Senbsor Array on a Curved Substrate," *J. Vac. Sci. Technol. B* 22:2548-2551.

Joachim et al. (Nov. 30, 2000) "Electronics Using Hybrid-Molecular and Mono-Molecular Devices," *Nature* 408:541-548.

Johnson et al. (1999) "Ordered Mesoporous Polymers of Tunable Pore Size from Colloidal Silica Templates," *Science* 283:963-965.

Jones et al. (Jul./Aug. 2004) "Stretchable Wavy Metal Interconnects," *J. Vac. Sci. Technol. A* 22(4):1723-1725.

Joo et al. (2006) "Low-Temperature Solution-Phase Synthesis of Quantum Well Structures CdSe Nanoribbons," *J. Am. Chem. Soc.* 128(17):5632-5633.

Jortner et al. (2002) "Nanostructured Advanced Materials Perspectives and Directions," *Pure Appl. Chem.* 74(9):1491-1506.

Kagan (1999) "Organic-Inorganic Hybrid Materials as Semiconducting Channels in Thin-Film Field-Effect Transistors," *Science* 286:945-947.

Kagan et al. (2001) "Patterning Organic-Inorganic Thin-Film Transistors Using Microcontact Printed Templates," *Appl. Phys Lett.* 79(21):3536-3538.

Kagan et al. (2003) "Thin Film Transistors—A Historical Perspective," In; *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kane et al. (Apr. 2007) "High-Performance Electronics Using Dense, Perfectly Aligned Arrays of Single-Walled Carbon Nanotubes," *Nat. Nanotechnol.* 2(4):230-236.

Kang et al. (2007) "High-Performance Electronics Using Dense, Perfectly Aligned Arrays of Single-Walled Carbon Nanotubes," *Nat. Nanotechnol.* 2:230-236.

Kar et al. (Web Release Feb. 18, 2006) "Shape Selective Growth of CdS One-Dimensional Nanostructures by a Thermal Evaporation Process," *J. Phys. Chem. B.* 110(10):4542-4547.

Kar et al. (Web Release Feb. 8, 2005) "Controlled Synthesis and Photoluminescence Properties of ZnS Nanowires and Nanoribbons," *J. Phys. Chem. B* 109(8):3298-3302.

Kar et al. (Web Release Sep. 28, 2005) "Synthesis and Optical Properties of CdS Nanoribbons," *J. Phys. Chem B.* 109(41):19134-19138.

Karnik et al. (2003) "Lateral Polysilicon $p^+$-p-$n^+$ and $p^+$-n-$n^+$ Diodes," *Solid-State Electronics* 47:653-659.

Karnik et al. (2003) "Multiple Lateral Polysilicon Diodes as Temperature Sensors for Chemical Microreaction Systems," *Jpn. J. Appl. Phys.* 42:1200-1205.

Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.

Katz et al. (2001) "Synthetic Chemistry for Ultrapure, Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kendall, D.L. (1979) "Vertical Etching of Silicon at Very High Apect Ratios," *Ann. Rev. Mater. Sci.* 9:373-403.

Khan et al. (1993) "High Electron Mobility Transistor Based on a GaN-$Al_xGa_{1-x}$N Heterojunction," *Appl. Phys. Lett.* 63:1214-1215.

Khang et al. (2006) "A Stretchable Form of Single-Crystal Silicon for High-Performance Electronics on Rubber Substraights," *Science* 311:208-212.

Kilby, J.S. (1976) "Invention of the Integrated Circuit," *IEEE Trans. Electron. Dev.* 23:648-654.

Kim et al. (2000) "Field Emission from Carbon Nanotubes for Displays," *Diamond and Related Mater.* 9(3-6):1184-1189.

Kim et al. (2002) "Nanolithography Based on Patterned Metal Transfer and its Application to Organic Electronic Devices," *Appl. Phys. Lett.* 80:4051-4053.

Kim et al. (2003) "Epitaxial self-assembly of block copolymers on lithographically defined nanopatterned substrates," *Nature* 424:411-414.

Kim et al. (2009) "Optimized Structural Designs for Stretchable Silicon Integrated Circuits," *Small* 5(24):2841-2847.

Kim et al. (Apr. 25, 2008) "Stretchable and Foldable Silicon Integrated Circuits," *Science* 320:507-511.

Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.

Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.

Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.

Kim et al. (Oct. 2004) "Organic TFT Array on a Paper Substrate," *IEEE Electron. Dev. Lett.* 25(10):702-704.

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.

Kim, Y.S. (Web Release Aug. 9, 2005) "Microheater-Integrated Single Gas Sensor Array Chip Fabricated on Flexible Polyimide Substrate," *Sens. Actuators B* 114(1):410-417.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *J Appl. Phys.* 93:347-355.

Ko et al. (2006) "Bulk Quantities of Single-Crystal Silicon Micro-/Nanoribbons Generated from Bulk Wafers," *Nano Lett.* 6(10):2318-2324.

Ko et al. (Aug. 7, 2008) "A Hemispherical Electronic Eye Camera Based on Compressible Silicon Optoelectronics," *Nature* 454:748-753.

Ko et al. (Web Release Oct. 28, 2009) "Curvilinear Electronics Formed Using Silicon Membrane Circuits and Elastomeric Transfer Elements," *Small* 5(23):2703-2709.

Kocabas et al. (2005) "Guided Growth of Large-Scale, Horizontally Aligned Arrays of Single-Walled Carbon Nanotubes and Their Use in Thin-Film Transstors," *Small* 1(11):1110-1116.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (Feb. 5, 2008) "Radio Frequency Analog Electronics Based on Carbon Nanotube Transistors," *Proc. Natl. Acad. Sci. USA* 105(5):1405-1409.

Kodambaka et al. (2006) "Control of Si Nanowire Growth by Oxygen," *Nano Lett.* 6(6):1292-1296.

Koide et al. (2000) "Patterned Luminescence of Organic Light-Emitting Diodes by Hot Microcontact Printing (HµCP) of Self-Assembled Monolayers," *J. Am. Chem. Soc.* 122:11266-11267.

Konagai et al. (1978) "High Efficiency GaAs Thin Film Solar Cells by Peeled Film Technology," *J. Cryst. Growth* 45:277-280.

Kong et al. (2004) "Single-Crystal Nanorings Formed by Epitaxial Self-Coiling of Polar Nanobelts," *Science* 303:1348-1351.

Kong et al. (Jan. 28, 2000) "Nanotube Molecular Wires as Chemical Sensors," *Science* 287:622-625.

Kong et al. (Oct. 2003) "Structure of Indium Oxide Nanobelts," *Solid State Commun.* 128(1):1-4.

Kong et al. (Oct. 29, 1998) "Synthesis of Individual Single-Walled Carbon Nanotubes on Patterned Silicon Wafers," *Nature* 395:878-881.

Kudo et al. (Web Release Jun. 13, 2006) "A Flexible and Wearable Glucose Sensor Based on Functional Polymers with Soft-MEMS Techniques," *Biosens. Bioelectron.* 22:558-562.

Kulkarni et al. (2002) "Mesoscale Organization of Metal Nanocrystals," *Pure Appl. Chem* 74(9):1581-1591.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):2002-2004.

Kumar et al. (1994) "Patterning Self-Assembled Monolayers: Applications in Materials Science," *Langmuir* 10:1498-1511.

Kumar et al. (2002) "Thermally-Stable Low-Resistance Ti/Al/Mo/Au Multilayer Ohmic Contacts on n-GaN," *J. Appl. Phys.* 92:1712-1714.

Kuo et al. (1985) "Effect of Mismatch Strain on Band Gap in III-V Semiconductors," *J. Appl. Phys.* 57:5428-5432.

Kuykendall et al. (Aug. 2004) "Crystallographic Alignment of High Density Gallium Nitride Nanowire Arrays," *Nat. Mater.* 3:524-528.

Lacour et al. (2003) "Stretchable Gold Conductors on Elastomeric Substrates," *Appl. Phys. Lett.* 82(15):2404-2406.

Lacour et al. (2005) "Stretchable Interconnects for Elastic Electronic Surfaces," *Proc. IEEE* 93(8):1459-1467.

Lacour et al. (Apr. 2004) "Design and Performance of Thin Metal Film Interconnects for Skin-Like Electronic Circuits," *IEEE Electron. Dev. Lett.* 25(4):179-181.

Lacour et al. (Dec. 2004) "An Elastically Stretchable TFT Circuit," *IEEE Electron Dev. Lett.* 25(12):792-794.

Lacour et al. (Web Release Jul. 14, 2006) "Stiff Subcircuit Islands of Diamondlike Carbon for Stretchable Electronics," *J. Appl. Phys.* 100:014913.

Lacour et al. (Web Release May 16, 2006) "Mechanisms of Reversible Stretchability of Thin Metal Films on Elastomeric Substrates," *Appl. Phys. Lett.* 88:204103.

Laimer et al. (Mar. 1997) "Diamond Growth in a Direct-Current Low-Pressure Supersonic Plasmajet," *Diamond Relat. Mater.* 6:406-410.

Lambacher et al. (2004) "Electrical Imaging of Neuronal Activity by Multi-Transistor-Array (MTA) Recording at 7.8 µm Resolution," *Appl. Phys. A* 79:1607-1611.

Landes et al. (2002) "Some Properties of Spherical and Rod-Shaped Semiconductor and Metal Nanocrystals," *Pure Appl. Chem.* 74(9):1675-1692.

Law et al. (2004) "Semiconductor Nanowires and Nanotubes," *Ann. Rev. Mater. Res.* 34:83-122.

Law et al. (Aug. 27, 2004) "Nanoribbon Waveguides for Subwavelength Photonics Integration," *Science* 305:1269-1273.

Leclercq et al. (1998) "III-V Micromachined Devices for Microsystems," *Microelectronics J.* 29:613-619.

Lecomte et al. (Apr. 2006) "Degradation Mechanism of Diethylene Glycol Units in a Terephthalate Polymer," *Polym. Degrade. Stab.* 91(4):681-689.

Lee et al. (2000) "Thin Film Transistors for Displays on Plastic Substrates," *Solid State Electron.* 44:1431-1434.

Lee et al. (2003) "High-Performance Poly-Si TFTs on Plastic Substrates Using a Nano-Structured Separation Layer Approach," *IEEE Elec. Dev. Lett.* 24:19-21.

Lee et al. (2004)"Organic Light-Emitting Diodes Formed by Soft Contact Lamination," *Proc. Natl. Acad. Sci. USA* 101(2):429-433.

Lee et al. (2005) "A Printable Form of Single-Crystalline Gallium Nitride for Flexible Optoelectronic Systems," *Small* 1:1164-1168.

Lee et al. (2005) "Large-Area, Selective Transfer of Microstructured Silicon (µs-Si): A Printing-Based Approach to High-Performance Thin0Film Transistors Supported on Flexible Substraights," *Adv. Mater.* 17:2332-2336.

Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.

Lee et al. (Apr. 2005) "Fabrication of Stable Metallic Patterns Embedded in Poly(dimethylsiloxane) and Model Applications in Non-Planar Electronic and Lab-ona-Chip Device Patterning," *Adv. Funct. Mater.* 15(4):557-566.

Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.

Lee et al. (Feb. 2001) "Application of Carbon Nanotubes to Field Emission Displays," *Diamond and Related Mater.* 10(2):265-270.

Lee et al. (Feb. 2005) "Weave Patterned Organic Transistors on Fiber for E-Textiles," *IEEE Trans. Electron. Dev.* 52(2):269-275.

Li et al. (2002) "High-Resolution Contact Printing with Dendrimers," *Nano Lett.* 2(4):347-349.

Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.

Li et al. (2004) "Electrospinning of Nanofibers: Reinventing the Wheel," *Adv. Mater.* 16(14):1151-1170.

Li et al. (Dec. 2005) "Compliant Thin Film Patterns of Stiff Materials as Platforms for Stretchable Electronics," *J. Mater. Res.* 20(12):3274-3277.

Li et al. (Jul. 1, 2002) "ZnO Nanobelts Grown on Si Substrate," *Appl. Phys. Lett.* 81(1):144-146.

Li et al. (Web Release Mar. 16, 2006) "Catalyst-Assisted Formation of Nanocantilever Arrays on ZnS Nanoribbons by Post-Annealing Treatment," *J. Phys. Chem. B* 110(13):6759-6762.

Lieber, C. (2001) "The Incredible Shrinking Circuit," *Sci. Am.* 285(3):58-64.

Lieber, C.M. (2003) "Nanoscale Science and Technology: Building a Bog Future from Small Things," *MRS. Bull.* 28:486-491.

Lim et al. (2005) "Flexible Membrane Pressure Sensor," *Sens. Act. A* 119:332-335.

Lima et al. (2007) "Creating Micro- and Nanostructures on Tubular and Spherical Surfaces," *J. Vac. Sci. Technol. B* 25(6):2412-2418.

Lin et al. (2005) "High-Performance Carbon Nanotube Field-Effect Transistor with Tunable Polarities," *IEEE Trans. Nano* 4(5):481-489.

Linder et al. (1994) "Fabrication Technology for Wafer Through-Hole Interconnections and Three-Dimensional Stacks of Chips and Wafers," *Proc. IEEE Micro. Electro Mech. Syst.* 349-354.

Ling et al. (2004) "Thin Film Deposition, Patterning, and Printing in Organic Thin Film Transistors," *Chem. Mater.* 16:4824-4840.

Long et al. (1990) "Heterostructure FETs and Bipolar Transistors," In; *Gallium Arsenide Digital Integrated Circuit Design*, McGraw-Hill, New York, pp. 58-69.

Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Interfacial Chemistries for Nanoscale Transfer Printing," *J. Am. Chem. Soc.* 124:7654-7655.

Loo et al. (2002) "Soft, Conformable Electrical Contacts for Organic Semiconductors: High-Resolution Plastic Circuits by Lamination," *Proc. Natl. Acad. Sci. USA* 99(16):10252-10256.

Loo et al. (2003) "Electrical Contacts to Molecular Layers by Nanotransfer Printing," *Nano Lett.* 3(7):913-917.

Lopes et al. (Sep. 2004) "Thermal Conductivity of PET/(LDPE/Al) Composites Determined by MDSC," *Polym. Test.*23(6):637-643.

Lu et al. (Dec. 2006) "Electronic Materials-Buckling Down for Flexible Electronics," *Nat. Nanotechnol.* 1:163-164.

Lu et al. (Jul. 19, 2005) "One Dimensional Hole Gas in Germanium/Silicon Nanowire Heterostructures," *Proc. Nat. Acad. Sci. USA* 102(29):10046-10051.

Lu et al. (Nov. 2008) "Nanowire Transistor Performance Limits and Applications," *IEEE Trans Electron Dev.* 55(11):2859-2876.

Luan et al. (1992) "An Experimental Study of the Source/Drain Parasitic Resistance Effects in Amorphous Silicon Thin Film Transistors," *J. Appl. Phys.* 72:766-772.

Ma et al. (2004) "Single-Crystal CdSe Nanosaws," *J. Am. Chem. Soc.* 126(3):708-709.

Mack et al. (2006) "Mechanically Flexible Thin-Film Transistors that Use Ultrathin Ribbons of Silicon Derived from Bulk Wafers," *Appl. Phys. Lett.* 88:213101.

Madou, M. (1997) "Etch-Stop Techniques," In; *Fundamentals of Microfabrication*, CRC Press, New York, pp. 193-199.

Maikap et al. (2004) "Mechanically Strained-Si NMOSFETs," *IEEE Electron. Dev. Lett.* 25:40-42.

Maldovan et al. (2004) "Diamond-Structured Photonic Crystals," *Nature Materials* 3:593-600.

Mandlik et al. (Aug. 2006) "Fully Elastic Interconnects on Nanopatterned Elastomeric Substrates," *IEEE Electron Dev. Lett.* 27(8):650-652.

Manna et al. (Web Release May 25, 2003) "Controlled Growth of Tetrapod-Branched Inorganic Nanocrystals," *Nat. Mater.* 2:382-385.

Markovich et al. (1999) "Architectonic Quantum Dot Solids," *Acc. Chem. Res.* 32:415-423.

Marquette et al. (2004) "Conducting Elastomer Surface Texturing: A Path to Electrode Spotting Application to the Biochip Production," *Biosens. Bioelectron.* 20:197-203.

Martensson et al. (2004) "Nanowire Arrays Defined by Nanoimprint Lithography," *Nano Lett.* 4:699-702.

Martin, C.R. (1995) "Template Synthesis of Electronically Conductive Polymer Nanostructures," *Acc. Chem. Res.* 28:61-68.

Mas-Torrent et al. (2006) "Large Photoresponsivity in High-Mobility Single-Crystal Organic Field-Effect Phototransistors," *ChemPhysChem* 7:86-88.

Masuda et al. (2000) "Fabrication of Ordered Diamonds/Metal Nanocomposite Structures," *Chem. Lett.* 10:1112-1113.

Matsunaga et al. (2003) "An Improved GaAs Device Model for the Simulation of Analog Integrated Circuit," *IEEE Trans. Elect. Dev.* 50:1194-1199.

McAlpine et al. (2003) "High-Performance Nanowire Electronics and Photonics on Glass and Plastic Substrates," *Nano Lett.* 3:1531-1535.

McAlpine et al. (2005) "High-Performance Nanowire Electronics and Photonics and Nanoscale Patterning on Flexible Plastic Substrates," *Proc. IEEE* 93:1357-1363.

McCaldin et al. (1971) "Diffusivity and Solubility of Si in the Al Metallization of Integrated Circuits," *Appl. Phys. Lett.* 19:524-527.

Meisel et al. (2004) "Three-Dimensional Photonic Crystals by Holographic Lithography Using the Umbrella Configuration: Symmetries and Complete Photonic Band Gaps," *Phys. Rev. B*. 70:165101:1-10.

Meitl et al. (2004) "Solution Casting and Transfer Printing Single-Walled Carbon Nanotube Films," *Nano Lett.* 4(9):1643-1947.

Meitl et al. (2006) "Transfer Printing by Kinetic Control of Adhesion to an Elastomeric Stamp," *Nat. Mater.* 5:33-38.

Meitl et al. (Web Release Feb. 22, 2007) "Stress Focusing for Controlled Fracture in Microelectromechanical Systems," *Appl. Phys. Lett.* 90:083110.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "High-Performance n- and p-Type Single-Crystal Organic Transistors with Free-Space Gate Dielectrics," *Adv. Mat.* 16:2097-2101.

Menard et al. (2004) "Improved Surface Chemistries, Thin Film Deposition Techniques, and Stamp Designs for Nanotransfer Printing," *Langmuir* 20:6871-6878.

Menard et al. (2005) Bendable Single Crystal Silicon Thin Film Transistors Formed by Printing on Plastic Substrates *Appl. Phys. Lett.* 86:093507.

Miao et al. (2003) "Micromachining of Three-Dimensional GaAs Membrane Structures Using High-Energy Nitrogen Implantation," *J. Micromech. Microeng.* 13:35-39.

Michel et al. (2001) Printing Meets Lithography: Soft Approaches to High-Resolution Patterning, *IBM J. Res. Dev.* 45(5):697-719.

Miller et al. (2002) "Direct Printing of Polymer Microstructures on Flat and Spherical Surfaces Using a Letterpress Technique," *J. Vac. Sci. Technol. B* 20(6):2320-2327.

Milliron et al. (2004) "Colloidal Nanocrystal Heterostructures with Linear and Branched Topology," *Nature* 430:190-195.

Min, G. (Apr. 4, 2003) "Plastic Electronics and Their Packaging Technologies," *Syn. Metals.* 135:141-143.

Mirkin et al. (Jul. 2001) "Emerging Methods for Micro- and Nanofabrication," *MRS Bull.* 26(7):506-507.

Misewich et al. (May 2, 2003) "Electronically Induced Optical Emission from a Carbon Nanotube FET," *Science* 300:783-786.

Mishra et al. (2002) "AIGaN/GaN HEMTs—an Overview of Device Operation and Applications," *Proc. IEEE* 90:1022-1031.

Mitzi et al. (2004) "High-Mobility Ulltrathin Semiconducting Films Prepared by Spin Coating," *Nature* 428:299-303.

Moon et al. (2002) "Ink-Jet Printing of Binders for Ceramic Compinents," *J. Am. Ceram. Soc.* 85(4):755-762.

Moore et al. (Sep. 9, 2003) "Individually Suspended Single-Walled Carbon Nanotubes in Various Surfactants," *Nano Lett.* 3(10):1379-1382.

Morales et al. (Jan. 9, 1998) "A Laser Ablation Method for the Synthesis of Crystalline Semiconductor Nanowires," *Science* 279:208-211.

Morent et al. (2007) "Adhesion Enhancement by a Dielectric Barrier Discharge of PDMS used for Flexible and Stretchable Electronics," *J. Phys. D. Appl. Phys.* 40:7392-7401.

Mori et al. (1978) "A New Etching Solution System, $H_3PO_4$-$H_2O_2$-$H_2O$, for GaAs and Its Kinetics," *J. Electrochem. Soc.* 125:1510-1514.

Morkoc et al. (1995) "High-Luminosity Blue and Blue-Green Gallium Nitride Light-Emitting Diodes," *Science* 267:51-55.

Morkved et al. (1994) "Mesoscopic Self-Assembly of Gold Islands on Diblock-Copolymer Films," *Appl. Phys. Lett.* 64:422-424.

Morra et al. (1990) "On the Aging of Oxygen Plasma-Treated Polydimethylsiloxane Surfaces," *J. Colloid Interface Sci.* 137:11-24.

Namazu et al. (2000) "Evaluation of Size Effect on Mechanical Properties of Single Crystal Silicon by Nanoscale Bending Test Using AFM," *J. MMES* 9:450-459.

Nath et al. (2002) "Nanotubes of the Disulfides of Groups 4 and 5 Metals," *Pure Appl. Chem.* 74(9):1545-1552.

Nathan et al. (2000) "Amorphous Silicon Detector and Thin Film Transistor Technology for Large-Area Imaging of X-Rays,." *Microelectron J.* 31:883-891.

Nathan et al. (2002) "Amorphous Silicon Technology for Large Area Digital X-Ray and Optical Imaging," *Microelectronics Reliability* 42:735-746.

Newman et al. (2004) "Introduction to Organic Thin Film Transistors and Design of n-Channel Organic Semiconductors," *Chem. Mater.* 16:4436-4451.

Nirmal et al. (1999) "Luminescence Photophysics in Semiconductor Nanocrystals," *Acc. Chem. Res.* 32:407-414.

Noda et al. (1996) "New Realization Method for Three-Dimensional Photonic Crystal in Optical Wavelength Region," *Jpn. J. Appl. Phys.* 35:L909-L912.

Nomura et al. (2004) "Room-Temperature Fabrication of Transparent Flexible Thin-Film Transistors Using Oxide Semiconductors," *Nature* 432:488-492.

Novoselov et al. (Oct. 22, 2004) "Electric Field Effect in Atomically Thin Carbon Films," *Science* 306:666-669.

O'Connell et al. (Jul. 26, 2002) "Band Gap Fluorescence from Individual Single-Walled Caarbon Nanotubes," *Science* 297:593-596.

O'Riordan et al. (2004) "Field Configured Assembly: Programmed Manipulation and Self-Assembly at the Mesoscale," *Nano Lett.* 4:761-765.

Odom et al. (2002) "Improved Pattern Transfer in Soft Lithography Using Compasite Stamps," *Langmuir* 18:5314-5320.

Office Action Corresponding to Chinese Patent Application No. 200780049982.1, Issued May 12, 2010.

Office Action, Corresponding to Chinese Paten Application No. 200580013574.1, Issued May 11, 2010.

Office Action, Corresponding to Taiwan Patent Application No. 095121212, Issued May 7, 2010.

Office Action, Corresponding to U.S. Appl. No. 11/423,287, Mailed Feb. 13, 2008.

Office Action, Corresponding to U.S. Appl. No. 11/851,182, Mailed Apr. 1, 2010.

Office Action, Corresponding to U.S. Appl. No. 11/981,380, Mailed Sep. 23, 2010.

Office Actions, Corresponding to Chinese Patent Application No. 200580018159.5, Issued Jan. 23, 2009 and Feb. 12, 2010.

Office Actions, Corresponding to U.S. Appl. No. 11/145,542, Mailed between Apr. 5, 2007 and Dec. 23, 2008.

Office Action, Corresponding to U.S. Appl. No. 11/421,654, Mailed Sep. 23, 2010.

Ohzono et al. (2004) "Ordering of Microwrinkle Patterns by Compressive Strain," *Phys. Rev. B* 69(13):132202.

Ohzono et al. (Web Release Jul. 7, 2005) "Geometry-Dependent Stripe Rearrangement Processes Induced by Strain on Preordered Microwrinkle Patterns," *Langmuir* 21(16):7230-7237.

Ong et al. (2004) "High-Performance Semiconducting Poolythiophenes for Organic Thin-Film Transistors," *J. Am. Chem. Soc.* 126:3378-3379.

Ong et al. (2005) "Design of High-Performance Regioreular Polythiophenes for Organic Thin-Film Transistors," *Proc. IEEE* 93:1412-1419.

Origin Energy (May 2004) "Fact Sheet—Sliver Cells," www.originenergy.com.au/sliver.

Ouyang et al. (2002) "High-Performance, Flexible Polymer Light-Emitting Diodes Fabricated by a Continuous Polymer Coating Process," *Adv. Mat.* 14:915-918.

Ouyang et al. (2008) "High Frequency Properties of Electro-Textiles for Wearable Antenna Applications," *IEEE Trans. Antennas Propag.* 56(2):381-389.

Ouyang et al. (Web Release Mar. 20, 2000) "Conversion of Some Siloxane Polymers to Silicon Oxide by Uv/Ozone Photochemical Processes," *Chem. Mater.* 12(6):1591-1596.

Pan et al. (2001) "Nanobelts of Semiconducting Oxides," *Science* 291:1947-1949.

Panev et al. (2003) "Sharp Exciton Emission from Single InAs Quantum Dots in GaAs Nanowires," *Appl. Phys. Lett.* 83:2238-2240.

Pardo et al. (2000) "Application of Screen Printing in the Fabrication of Organic Ligh-Emitting Devices," *Adv. Mater.* 12(17):1249-1252.

Park et al. (1997) "Block Copolymer Lithography: Periodic Arrays of ~$10^{11}$ Holes in 1 Square Centimeter," *Science* 276:1401-1404.

Park et al. (1998) "Fabrication of Three-Dimensional Macroporous Membranes with Assemblies of Microspheres as Templates," *Chem. Mater.* 10:1745-1747.

Patton et al. (Mar. 1998) "Effect of Diamond like Carbon Coating and Surface Topography on the Performance of Metal Evaporated Magnetic Tapes," *IEEE Trans Magn.* 34(2):575-587.

Paul et al. (Apr. 2003) "Patterning Spherical Surfaces at the Two Hundred Nanometer Scale Using Soft Lithography," *Adv. Func. Mater.* 13(4):259-263.

Pearton et al. (1999) "GaN: Processing, Defects, and Devices," *J. Appl. Phys.* 86:1-78.

Peng et al. (Mar. 2, 2000) "Shape Control of CdSe Nanocrystals," *Nature* 404:59-61.

Piazza et al. (2005) "Protective Diamond-Like Carbon Coatings for Future Optical Storage Disks," *Diamond Relat. Mater.* 14:994-999.

Podzorov et al. (2005) "Hall Effect in the Accumulation Layers on the Surface of Orgaic Semiconductors," *Phys. Rev. lett.* 95:226601.

Pushpa et al. (2002) "Stars and Stripes. Nanoscale Misfit Dislocation Patterns on Surfaces," *Pure Appl. Chem.* 74(9):1663-1671.

Quake et al (2000) "From Micro- to Nanofabrication with Soft Materials," *Science* 290:1536-1540.

Radtke et al. (Feb. 5, 2007) "Laser-Lithography on Non-Planar Surfaces," *Opt. Exp.* 15(3):1167-1174.

Raman et al. (1989) "Study of Mesa Undercuts Produced in GaAs with H3PO4-Based Etchants," *J. Electrochem. Soc.* 136:2405-2410.

Razeghi et al. (1994) "High-Power Laser Diodes Based on InGaAsP Alloys," *Nature* 369:631-633.

Razouk et al. (Sep. 1979) "Dependence of Interface State Density on Silicon Thermal Oxidation Process Variables," *J. Electrochem. Soc.* 126(9):1573-1581.

Reuss et al. (2005) "Macroelectronics: Perspectives on Technology and Applications," *Proc. IEEE* 93:1239-1256.

Reuss et al. (Jun. 2006) "Macroelectronics," *MRS Bull.* 31:447-454.

Ribas et al. (1998) "Bulk Micromachining Characterization of 0.2 μm HEMT MMIC Technology for GaAs MEMS Design," *Mater. Sci. Eng. B* 51:267-273.

Ridley et al. (1999) "All-Inorganic Field Effect Transistors Fabricated by Printing," *Science* 286:746-749.

Roberts et al. (1979) "Looking at Rubber Adhesion," *Rubber Chem. Technol.* 52:23-42.

Roberts et al. (May 2006) "Elastically Relaxed Free-Standing Strained-Silicon Nanomembranes," *Nat. Mater.* 5:388-393.

Robinson et al. (1983) "GaAs Readied for High-Speed Microcircuits," *Science* 219:275-277.

Roelkens et al. (Dec. 2005) "Integration of InP/InGaAsP Photodetectors onto Silicon-on-Insulator Waveguide Circuits," *Optics Express* 13(25):10102-10108.

Rogers et al. (1997) "Using an Elastomeric Phase Mask for Sub-100 nm Photolithography in the Optical Near Field," *Appl. Phys. Lett.* 70:2658-2660.

Rogers et al. (1998) "Generating ~90 Nanometer Features Using Near Field Contact Mode Photolithography with an Elastomeric Phase Mask," *J. Vac. Sci. Technol.* 16(1):59-68.

Rogers et al. (1998) "Quantifying Distortions in Soft Lithography," *J. Vac. Sci. Technol.* 16:88-97.

Rogers et al. (1998) "Using Printing and Molding Techniques to Produce Distributed Feedback and Bragg Reflector Resonators for Plastic Lasers," *Appl. Phys. Lett.* 73:1766-1768.

Rogers et al. (1999) Printing Process Suitable for Reel-to-Reel Production of High-Performance Organic Transistors and Circuits, *Adv. Mater.* 11(9):741-745.

Rogers et al. (2000) "Organic Smart Pixels and Complementart Inverter Circuits Formed on Plastic Substrates by Casting and Rubber Stamping," *IEEE Electron Dev. Lett.* 21(3):100-103.

Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.

Rogers et al. (2002) "Printed Plastic Electronics and Paperlike Displays," *J. Polym. Sci. Part A. Polym. Chem.* 40:3327-3334.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Ruchehoeft et al. (2000) "Optimal Strategy for Controlling Linewidth on Spherical Focal Surface Arrays," *J. Vac. Sci. Technol. B* 18(6):3185-3189.
Samuelson et al. (2004) "Semiconductor Nanowires for Novel One-Dimensional Devices," *Physica E* 21:560-567.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Schermer et al. (2005) "Thin-Film GaAs Epitaxial Lift-Off Solar Cells for Space Applications," *Prog. Photovolt. Res. Appl.* 13:587-596.
Schermer et al. (2006) "Photon Confinement in High-Efficiency, Thin Film III-V Solar Cells Obtained by Epitaxial Lift-Off," *Thin Solid Films* 211-512:645-653.
Schmid et al. (2003) "Preparation of Metallic Films on Elastomeric Stamps and Their Application for Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmidt et al. (Mar. 8, 2001) "Thin Solid Films Roll up into Nanotubes," *Nature* 410:168.
Schnable et al. (1969) "Aluminum Metallization; Advantages and Limitations for Integrated Circuit Applications," *IEEE* 57:1570-1580.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Scorzoni et al. (Oct. 4, 2004) "On the Relationship Between the Temperature coefficient of Resistance and the Thermal Conductance of Integrated Metal Resistors," *Sens Actuators A* 116(1):137-144.
Search and Examination Report, Corresponding to Singapore Patent Application No. 200607372-0, Mailed Oct. 17, 2007.
Search Report, Corresponding to Republic of China (Taiwan) Patent Application No. 094118507, Dated Feb. 24, 2007.
Sekitani et al. (2005) "Bending Experimant on Pentacene Field-Effect Transistors on Plastic Films," *Appl. Phys. Lett.* 86:073511.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contacted Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (Sep. 2000) "Synthesis of Large Areas of Highly Oriented, Very Long Silicon Nanowires," *Adv. Mater.* 12(18):1343-1345.
Shi et al. (Web Release Oct. 11, 2001) "Free-Standing Single Crystal Silicon Nanoribbons," *J. Am. Chem. Soc.* 123(44):11095-11096.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Siegel et al. (Web Release Feb. 7, 2007) "Microsolidics: Fabrication of Three-Dimensional Metallic Microstructures in Poly(dimethylsiloxane)," *Adv. Mater.* 19(5):727-733.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible Pressure Sensor Matrix With Organic Field-Effect Transistors for Artificial Skin Applications," *Proc. Nat. Acad. Sci. USA* 101(27):9966-9970.
Soole et al. (Mar. 1991) "InGaAs Metal-Semiconductor-Metal Photodetectors for Long Wavelength Optical Communications," *IEEE J. Quantum Electron.* 27(3):737-752.
Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.
Stafford et al. (2004) "A Buckling-Based Metrology for Measuring the Elastic Moduli of Polymeris Thin Films," *Nature Mater.* 3:545-550.
Storm et al. (Web Release Jul. 13, 2003) "Fabrication of Solid-State Nanopores with Single-Nanometre Precision," *Nat. Mater.* 2:537-540.
Strukov et al. (2005) "CMOL FPGA: A Reconfigurable Architecture for Hybrid Digital Circuits with Two-Terminal Nanodevices," *Nanotechnology* 16:888-900.
Sumant et al. (Apr. 2005) "Toward the Ultimate Tribological Interface: Surface Chemistry and Nanotribology of Ultrananocrystalline Diamond," *Adv. Mater.* 17(8):1039-1045.
Sun et al. (2004) "Fabricating Semiconductor Nano/Microwires and Transfer Printing Ordered Arrays of them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with a Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Funct. Mater.* 15:30-40.
Sun et al. (2007) "Inorganic Semiconductors for Flexible Electronics," *Adv. Mater.* 19:1897-1916.

Sun et al. (2007) "Structural Forms of Single Crystal Semiconductor Nanoribbons for High-Performance Stretchable Electronics," *J. Mater Chem.* 17:832-840.

Sun et al. (Nov. 2006) "Buckled and Wavy Ribbons of GaAs for High-Performance Electronics on Elastomeric Substrates," *Adv. Mater.* 18(21):2857-2862.

Sun et al. (Web Release Dec. 5, 2006) "Controlled Buckling of Semiconductor Nanoribbons for Stretchable Electronics," *Nature Nanotech.* 1:201-207.

Sundar et al. (2004) "Elastomeric Transistor Stamps: Reversible Probing of CHaarge Transport in Organic Crystals," *Science* 303:1644-1646.

Suo et al. (Feb. 22, 1999) "Mechanics of Rollable and Foldable Film-on-Foil Electronics," *Appl. Phys. Lett.* 74(8):11771179.

Supplementary European Search Report, Corresponding to European Application No. EP 05 75 6327, Completed Sep. 25, 2009.

Swain et al. (2004) "Curved CCD Detector Devices and Arrays for Multi-Spectral Astrophysical Application and Terrestrial Stereo Panoramic Cameras," *Proc. SPIE* 5499:281-301.

Sze et al. (1985) *Semiconductor Devices, Physics and Technology*, $2^{nd}$ ed., Wiley, New York, pp. 190-192.

Sze, S. (1985) "Lithography and Etching," In; *Semiconductor Devices: Physics and Technology*, New York: Wiley, pp. 428-467.

Sze, S. (1988) "Ion Implantation," In; *VLSI Technology*, Mcgraw-Hill, 327-374, 566-611.

Sze, S. (1994) "Semiconductor Sensor Technologies," In; *Semiconductor Sensors*, John Wiley and Sons: New York pp. 17-95.

Takamoto et al. (Jan 20, 1997) "Over 30% Efficient InGaP/GaAs Tandem Solar Cells," *Appl. Phys. Lett.* 70(3):381-383.

Talapin et al. (Oct. 7, 2005) "PbSe Nanocrystal Solids for n- and p-Channel Thin Film Field-Effect Transistors," *Science* 310:86-89.

Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.

Tanase et al. (2002) "Magnetic Trapping and Self-Assembly of Multicomponent Nanowires," *J. Appl. Phys.* 91:8549-8551.

Tang et al. (2005) "One-Dimensional Assemblies of Nanoparticles: Preparation, Properties, and Promise," *Adv. Mater.* 17:951-962.

Tao et al. (2003) "Langmuir-Blodgett Silver Nanowire Monolayers for Molecular Sensing Using Surface-Enhanced Raman Spectroscopy," *Nano Lett.* 3:1229-1233.

Tate et al. (2000) "Anodization and Microcontact Printing on Elotroless Silver: Solution-Based Fabrication Procudures for Low-Voltage Electronic Systems with Organic Acitve Components," *Langmuir* 16:6054-6060.

Teshima et al. (2001) "Room-Temperature Deposition of High-Purity Silicon Oxide Films by Rf Plasma-Enhanced CVD," *Surf. Coat. Technol.* 146-147:451-456.

Theiss et al. (1998) "PolySilicon Thin Film Transistors Fabricated at 100° C on a Flexible Plastic Substrate," *IEDM* 98:257-260.

Toader et al. (2004) "Photonic Band Gap Architectures for Holographic Lithography," *Phy. Rev. Lett.* 043905/1-043905/4.

Toader et al. (2004) "Photonic Band Gaps Based on Tetragonal Lattices of Slanted Pores," *Phys. Rev. Lett.* 90:233901/1-233901/4.

Tong (1999) "Stresses in Bonded Wafers," In; *Semiconductor Wafer Bonding: Science and Technology*, John Wiley; New York, pp. 187-221.

Trau et al. (1997) "Microscopic Patterning of Orientated Mesoscopic Silica Through Guided Growth," *Nature* 390:674-676.

Trentler et al. (1995) "Solution-Liquid-Solid Growth of Crytalline III-V Semiconductors: An Analogy to Vapor-Liquid-Solid Growth," *Science* 270:1791-1794.

Tseng et al. (Web Release Dec. 19, 2003) "Monolithic Integration of Carbon Nanotube Devices with Silicon Mos Technology" *Nano Lett.* 4(1):123-127.

Ucjikoga, S. (2002) "Low-Temperature Polycrystalline Silicon Thin-Film Transistor Technologies ofr System-on-Glass Displays," *MRS Bull.* 27:881-886.

Urruchi et al. (2000) "Etching of DLC Films Using a Low Intensity Oxygen Plasma Jet," *Diamond Relat. Mater.* 9:685-688.

Vanhollenbeke et al. (2000) "Compliant Substrate Technology: Integration of Mismatched Materials for Opto-Electronic Applications," *Prog. Cryst. Growth Charact. Mater.* 41(1-4):1-55.

Velev et al. (1997) "Porous silica via colloidal crystallization," *Nature* 389:447-448.

Vilan et al. (2000) "Molecular Control Over Au/GaAs Diodes," *Nature* 404:166-168.

Vlasov et al. (2001) "On-Chip Natural Assembly of Silicon Photonic Bandgap Crystals," *Nature* 414:289-293.

Voss, D. (2000) "Cheap and Cheerful Circuits," *Nature* 407:442-444.

Wagner et al. (2003) "Silicon for Thin-Film Transistors," *Thin Solid Films* 430:15-19.

Wagner et al. (2005) "Electronic Skin: Architecture and Components," *Physica E* 25:326-334.

Wagner et al. (Mar. 1, 1964) "Vapor-Liquid-Solid Mechanism of Single Crystal Growth," *Appl. Phys. Lett.* 4(5):89-90.

Wang et al. (2003) "A Solution-Phase, Precursor Route to Polycrystalline $SnO_2$ Nanowores That Can Be Used for Gas Sensing under Ambient Conditions," *J. Am. Chem. Soc.* 125:16176-16177.

Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.

Wang et al. (2006) "Direct Synthesis and Characterization of CdS Nanobelts," *Appl. Phys. Lett.* 89:033102.

Weber et al. (Jan. 2004) "A Novel Low-Cost, High Efficiency Micromachined Silicon Solar Cell," *IEEE Electron Device Lett.* 25(1):37-39.

Wen et al. (Web Release Dec. 4, 2004) "Controlled Growth of Large-Area, Uniform, Vertically Aligned Arrays of $\alpha\text{-}Fe_2O_2$ Nanobelts and Nanowires," *J. Phys. Chem. B* 109(1):215-220.

Whang et al. (2003) "Large-Scale Hierarchical Organization of Nanowire Arrays for Integrated Nanosystems," *Nano Lett.* 3(9):1255-1259.

Williams et al. (Oct. 2006) "Growth and Properties of Nanocrystalline Diamond Films," *Phys. Stat. Sol. A* 203(13):3375-3386.

Williams et al. (Web Release Jan. 23, 2006) "Comparison of the Growth and Properties of Ultranocrystalline Diamond and Nanocrystalline Diamond," *Diamond Relat. Mater.* 15:654-658.

Willner et al. (2002) "Functional Nanoparticle Architectures for Senoric, Optoelectronic, and Bioelectronic Applications," *Pure Appl. Chem.* 74(9):1773-1783.

Wind et al. (May 20, 2002) "Vertical Scaling of Carbon Nanotube-Field-Effect Transitors Using Top Gate Electrodes," *Appl. Phys. Lett.* 80(20):3871-3819.

Won et al. (2004) "Effect of Mechanical and Electrical Stresses on the Performance of an a-Si:H TFT on Plastic Substrate," *J. Electrochem. Soc.* 151:G167-G170.

Wu et al. (2001) "Amorphous Silicon Crystallization and Polysilicon Thin Film Transistors on SiO2 Passivated Steel Foil Substrates," *Apple. Surf. Sci* 175-176:753-758.

Wu et al. (2001) "Thermal Oxide of Polycrystalline Silicon on Steel Foil as a Thin-Film Transitor Gate Dielectric," *Appl. Phys. Lett.* 78:3729-2731.

Wu et al. (2002) "Growth of Au-Catalyzed Ordered GaAs Nanowire Arrays by Molecular-Beam Epitaxy," *Appl. Phys. Lett.* 81:5177-5179.

Wu et al. (2002) "Inorganic Semiconductor Nanowires: Rational Growth, Assembly, and Novel Properties," *Chem. Eur. J.* 8(6):1261-1268.

Wu et al. (2003) "Growth, Branching, and Kinking of Molecular-Beam Epitaxial (110) GaAs Nanowires," *Appl. Phys. Lett.* 83:3368-3370.

Wu et al. (Jul. 1, 2004) "Single-Crystal Metallic Nanowires and Metal/Semiconductor Nanowire Heterostructures," *Nature* 430:61-65.

Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.

Wu et al. (Web Release Jan. 19, 2002) "Block-by-Block Growth of Single-Crystalline Si/SiGe Superlattice Nanowires," *Nano Lett.* 2(2):83-86.

Wu et al. (Web Release Mar. 13, 2001) "Direct Observation of Vapor-Liquid-Solid Nanowire Growth," *J. Am. Chem. Soc.* 123(13):3165-3166.

Xia et al. (1996) "Shadowed Sputtering of Gold on V-Shaped Microtrenches Etched in Silicon and Applications in Microfabrication," *Adv. Mater.* 8(9):765-768.

Xia (1998) "Soft Lithography" *Angew. Chem. Int. Ed.* 37:551-575.

Xia et al. (1998) "Soft Lithography," *Annu. Rev. Mater. Sci.* 28:153-184.

Xia et al. (1999) "Unconventional Methods for Fabricating and Patterning Nanostructures," *Chem. Rev.* 99:1823-1848.

Xia et al. (2003) "One-Dimensional Nanostructures: Synthesis, Characterization and Applications," *Adv. Mater.* 15:353-389.

Xia et al. (Jul. 19, 1996) "Complex Optical Surfaces Formed by Replica Molding Against Elastomeric Masters," *Science* 273:347-349.

Xiang et al. (Mar. 25, 2006) "Ge/Si Nanowire Heterostructures as High-Performance Field-Effect Transistors," *Nature* 441:489-493.

Xie et al. (May 2003) "Polymer-Controlled Growth of Sb2Se3 Nanoribbons Via a Hydrothermal Process," *J. Cryst. Growth* 252(4):570-574.

Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.

Yang et al. (1997) "Mesoporous Silica with Micrometer-Scale Desgns," *Adv. Mater.* 9:811-814.

Yang et al. (2000) "Stability of Low-Temperature Amorphous Silicon Thin Film Transistors Formed on Glass and Transparent Plastic Substrates," *J. Vac. Sci. Technol. B* 18:683-689.

Yang et al. (2002) "Creating Periodic Three-Dimensional Structures by Multibeam Interface of Visible Laser," *Chem. Mater.* 14:2831-2833.

Yang et al. (Dec. 2007) "RFID Tag and RF Structures on a Paper Substrate Using Inkjet-Printing Technology," *IEEE Trans. Microw. Theory Tech.* 55(12):2894-2901.

Yang, P. (2005) "The Chemistry and Physics of Semiconductor Nanowires," *MRS Bull.* 30:85-91.

Yao et al. (Mar. 2000) "High-Field Effect Electrical Transport in Single-Walled Carbon Nanotubes," *Phys. Rev. Lett.* 84(13):2941-2944.

Yeh et al. (1994) "Fluidic Self-Assembly for the Integration of GaAs Light-Emitting Diodes on Si Substrates," *IEEE Photon. Technol. Lett.* 6:706-708.

Yin et al. (2000) "A Soft Lithography Approach to the Fabrication of Nanostructures of Single Crystalline Silicon with Well-Defined Dimensions and Shapes," *Adv. Mater.* 12:1426-1430.

Yin et al. (2005) "Colloidal Nanocrystal Synthesis and the Organic-Inorganic Interface," *Nature* 437:664-670.

Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.

Yu et al. (2000) "Silicon Nanowires: preparation, Device Fabrication, and Transport Properties," *J. Phys. Chem. B* 104(50):11864-11870.

Yu et al. (2003) "Solution-Liquid-Solid Growth of Soluble GaAs Nanowires," *Adv. Mater.* 15:416-419.

Yu et al. (2003) "Two-Versus Three-Dimensional Quantum Confinement in Indium Phosphide Wires and Dots," *Nat. Mater.* 2:517-520.

Yuan et al. (2006) "High-Speed Strained-Single-Crystal-Silicon Thin-Film Transistors on Flexible Polymers," *J. Appl. Phys.* 100:013708.

Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.

Zakhidov et al. (1998) "Carbon Structure with Three-Dimensional Periodicity at Optical Wavelengths," *Science* 282:897-901.

Zaumseil et al. (2003) "Nanoscale Organic Transistors that use Source/Drain Electrodes Supported by High Resolution Rubber Stamps," *Appl. Phys. Lett.* 82(5):793-795.

Zaumseil et al. (2003) "Three-Dimensional and Multilayer Nanostructures Formed by Nanotransfer Printing," *Nano Lett.* 3(9):1223-1227.

Zhang et al. (2005) "Low-Temperature Growth and Photoluminescence Property of ZnS Nanoribbons," *J. Phys. Chem. B* 109(39):18352-18355.

Zhang et al. (Apr. 2003) "Oxide-Assisted Growth of Semiconducting Nanowires," *Adv. Mater.* 15(7-8):635-640.

Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.

Zhang et al. (Feb. 9, 2006) "Electronic Transport in Nanometre-Scale Silicon-onInsulator Membranes," *Nature* 439:703-706.

Zhang et al. (Jun. 6, 2006) "Anomalous Coiling of SiGe/Si and SiGe/Si/Cr Helical Nanobelts," *Nano Lett.* 6(7):1311-1317.

Zhao et al. (Mar. 2007) "Improved Field Emission Properties from Metal-Coated Diamond Films," *Diamond Relat Mater.* 16(3):650-653.

Zheng et al. (2004) "Shape-and Solder-Directed Self-Assembly to Package Semiconductor Device Segments," *Appl. Phys. Lett.* 85:3635-3637.

Zheng et al. (Aug. 31, 2004) "Sequential Shape-and-Solder-Directed Self Assembly of Functional Microsystems," *Proc. Natl. Acad. Sci. USA* 101(35):12814-12817.

Zhou et al. (2002) "An Efficient Two-Photon-Generated Photoacid Applied to Positive-Tone 3D Microfabrication," *Science* 296:1106-1109.

Zhou et al. (2004) "p-Channel, n-Channel Thin Film Transistors and p-n Diodes Based on Single Wall Carbon Nanotube Networks," *Nano Lett.* 4:2031-2035.

Zhou et al. (2005) "Band Structure, Phonon Scattering, and the Performance Limit of Single-Walled Carbon Nanotube Transistors," *Phys. Rev. Lett.* 95:146805.

Zhou et al. (2005) "Mechanism for Stamp Collapse in Soft Lithography," *Appl. Phys. Lett.* 87:251925.

Zhu et al. (2005) "Spin on Dopants for High-Performance Single-Crystal Silicon Transistors on Flexible Plastic Substrates," *Appl. Phys. Lett.* 86:133507.

Examination Report corresponding to European Patent Application No. 09716695.3, issued Aug. 9, 2013.

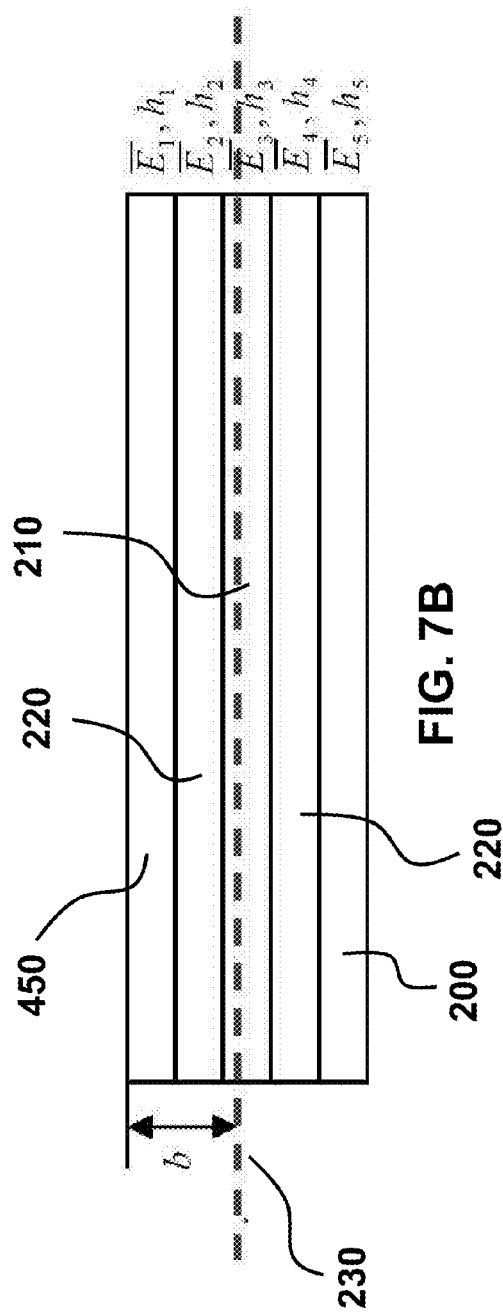
FIG. 7B
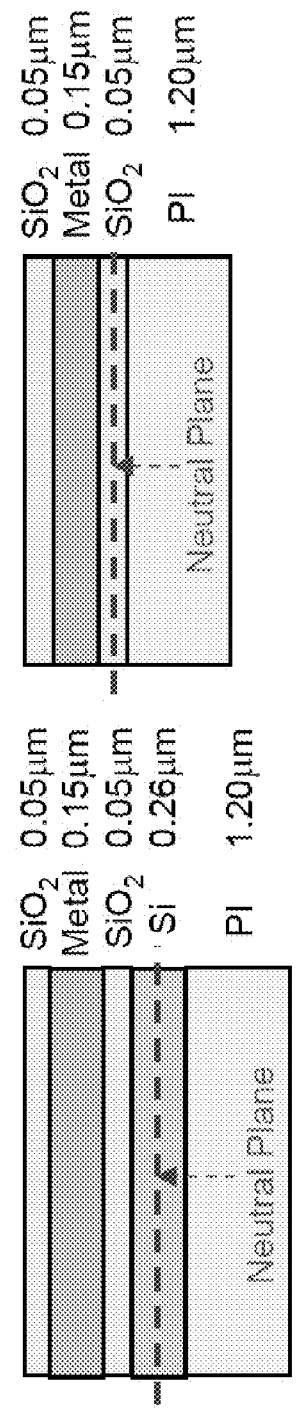
FIG. 7D
FIG. 7C

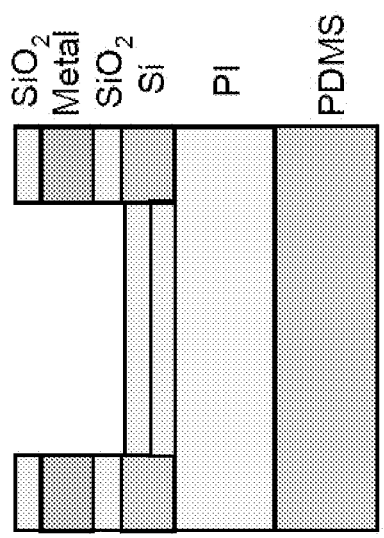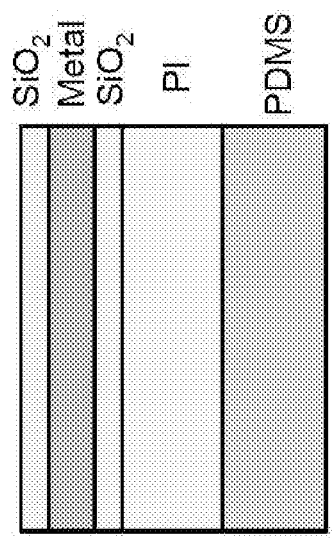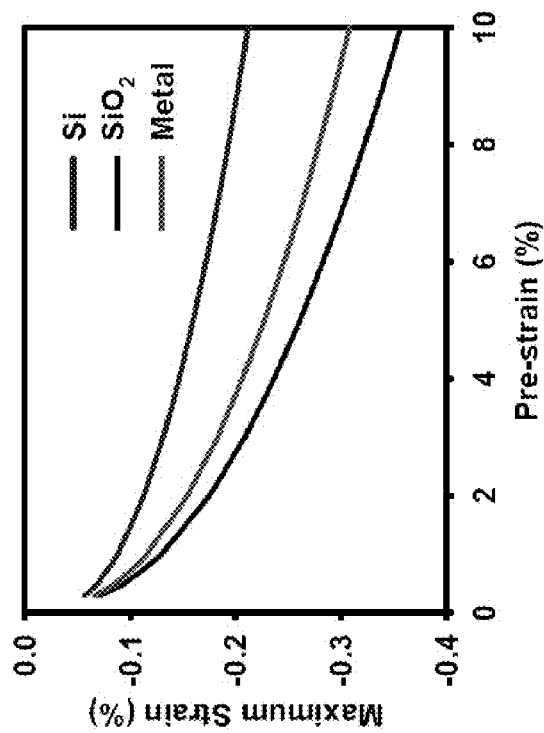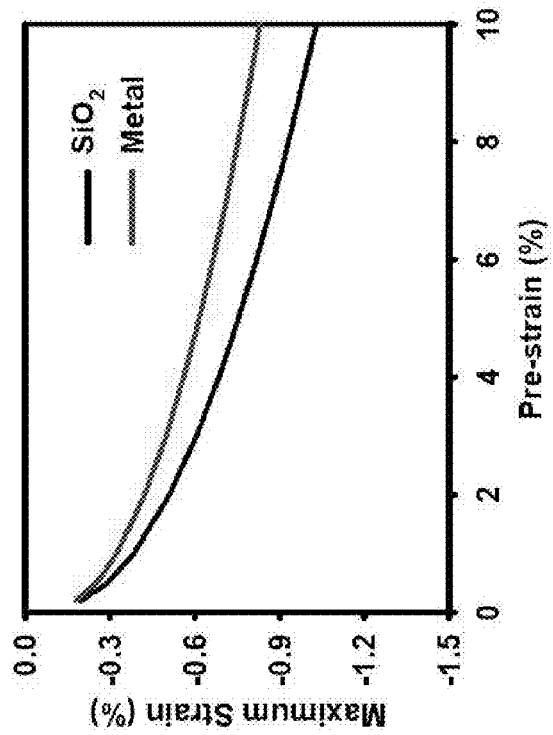
FIG. 8A
FIG. 8B

R1 and R2 = 12.9 mm, H = 5 mm
PDMS thickness at center ~ 0.5 mm
D = 25.4 mm

Screen capture of the Labview interface used for imaging.

Photograph of 16x16 focal plane array with overlaid E printed on transparency.

Original mesh

Deformed mesh

STRETCHABLE AND FOLDABLE ELECTRONIC DEVICES

CROSS-REFERENCE TO RELATED APPLICATIONS

This application claims benefit of U.S. Provisional Patent App. Nos. 61/033,886, filed Mar. 5, 2008, 61/061,978 filed Jun. 16, 2008, and 61/084,045 filed Jul. 28, 2008, each of which are specifically incorporated by reference herein to the extent not inconsistent with the present application.

STATEMENT REGARDING FEDERALLY SPONSORED RESEARCH OR DEVELOPMENT

This invention was made at least in part with U.S. government support under DMI-0328162 and ECCS-0824129 awarded by the National Science Foundation and under DEFG02-91 ER45439, DEFG02-07ER46471 and DEFG02-07ER46453 awarded by the Department of Energy. The U.S. government has certain rights in the invention.

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors elements for flexible plastic electronic devices. Progress in the field of flexible electronics, however, is not only driven by the development of new solution processable materials but also by new device component geometries, efficient device and device component processing methods and high resolution patterning techniques applicable to flexible electronic systems. It is expected that such materials, device configurations and fabrication methods will play an essential role in the rapidly emerging new class of flexible integrated electronic devices, systems and circuits.

Interest in the field of flexible electronics arises out of several important advantages provided by this technology. For example, the inherent flexibility of these substrate materials allows them to be integrated into many shapes providing for a large number of useful device configurations not possible with brittle conventional silicon based electronic devices. In addition, the combination of solution processable component materials and flexible substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well developed methods of making conventional silicon based electronic devices are incompatible with most flexible materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Second, although many amorphous silicon, organic or hybrid organic-inorganic semiconductors are compatible with incorporation into flexible substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Flexible electronic circuitry is an active area of research in a number of fields including flexible displays, electro-active surfaces of arbitrary shapes such as electronic textiles and electronic skin. These circuits often are unable to sufficiently conform to their surroundings because of an inability of the conducting components to stretch in response to conformation changes. Accordingly, those flexible circuits are prone to damage, electronic degradation and can be unreliable under rigorous and/or repeated conformation change. Flexible circuits require stretchable and bendable interconnects that remain intact while cycling through stretching and relaxation.

Conductors that are capable of both bending and elasticity are generally made by embedding metal particles in an elastomer such as silicone. Those conductive rubbers are both mechanically elastic and electrically conductive. The drawbacks of a conductive rubber include high electrical resistivity and significant resistance changes under stretching, thereby resulting in overall poor interconnect performance and reliability.

Gray et al. discuss constructing elastomeric electronics using microfabricated tortuous wires encased in a silicone elastomer capable of linear strains up to 54% while maintaining conductivity. In that study, the wires are formed as a helical spring-shape. In contrast to straight-line wires that fractured at low strains (e.g., 2.4%), tortuous wires remained conductive at significantly higher strains (e.g., 27.2%). Such a wire geometry relies on the ability of wires to elongate by bending rather than stretching. That system suffers limitations in the ability to controllably and precisely pattern in different shapes and in additional planes, thereby limiting the ability to tailor systems to different strain and bending regimes.

Studies suggest that elastically stretchable metal interconnects experience an increase in resistance with mechanical strain. (Mandlik et al. 2006). Mandlik et al. attempt to minimize this resistance change by depositing metal film on pyramidal nanopatterned surfaces. That study, however, relies on the relief feature to generate microcracks that impart stretchability to thin metal lines. The microcracks facilitate metal elastic deformation by out of plane twisting and deformation. Those metal cracks, however, are not compatible with thick metal films, and instead is compatible with a rather narrow range of thin metal films (e.g., on the order of less than 30 nm) that are deposited on top of patterned elastomer.

One manner of imparting stretchability to metal interconnects is by prestraining (e.g., 15%-25%) the substrate during conductor (e.g., metal) application, followed by spontaneous relief of the prestain, thereby inducing a waviness to the metal conductor interconnects. (see, e.g., Lacour et al. (2003); (2005); (2004), Jones et al. (2004); Huck et al. (2000); Bowden et al. (1998)). Lacour et al. (2003) report by initially compressing gold stripes to generate spontaneously wrinkled gold stripes, electrical continuity is maintained under strains of up to 22% (compared to fracture strains of gold films on elastic substrates of a few percent). That study, however, used comparatively thin layers of metal films (e.g., about 105 nm) and is relatively limited in that the system could potentially make electrical conductors that could be stretched by about 10%.

From the forgoing, it is apparent there is a need for electronic devices such as interconnects and other electronic components having improved stretchability, electrical properties and related processes for rapid and reliable manufacture of stretchable interconnects in a variety of different configurations. Progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in folded, stretched and/or contracted conformations.

SUMMARY OF THE INVENTION

Highly bendable and stretchable electronic devices, and methods for making such devices, are accessed by controlling the location of a neutral mechanical surface to correspond to strain-sensitive layers or by selective use of strain isolation layers to isolate strain-sensitive layers from applied stresses and strains. The processes and devices are useful in a wide range of applications and devices such as electronic and optoelectronic systems in curved systems and systems that undergo mechanical deformation. The processes and devices combine high quality electronic materials, such as aligned arrays of silicon nanoribbons and other inorganic nanomaterials, with ultrathin and elastomeric substrates, in multilayer neutral mechanical plane designs and with an optionally 'wavy' structural layout. Such approaches, guided by detailed mechanics models, facilitate design and manufacture of diverse classes of integrated circuits as well as highly integrated optoelectronics systems with well-developed electronic materials, whose intrinsic brittle, fragile mechanical properties would otherwise preclude their use in such applications The systems and processes are capable of providing strain-independent electrical devices at a performance level comparable to state-of-the-art devices built on brittle semiconductor wafers. For example, systems provided herein minimize or eliminate the influence of mechanical strain on device performance, thereby facilitating the use of such devices in a wide range of applications and of any arbitrary geometry. In other aspects, the systems provided herein access shape-conforming electronic devices that would otherwise undergo strain-induced mechanical failure.

Processes provided herein are optionally compatible with conventional electronics manufacturing processes that are intrinsically planar in nature due to the patterning, deposition, etching, materials growth and doping methods used in those existing fabrication processes. Stretchable and compressible systems provided herein avoid planar geometry limitations by facilitating a geometric transformation of conventional planar geometry manufacturing systems to an arbitrarily curvilinear shape for use in applications requiring non-linear geometry.

Accordingly, processes provided herein permit integration of planar device technologies onto surfaces of complex curvilinear objects.

Spatially inhomogenous layers and patterning of such layers provides the capacity to position a neutral mechanical surface (NMS) as desired, such as proximate, coincident or adjacent to a layer containing a strain-sensitive material, such as a functional layer. In this aspect, "strain-sensitive" refers to a material that fractures or is otherwise impaired in response to a relatively low level of strain. In an aspect, the NMS is coincident or proximate to a functional layer. In an aspect the NMS is coincident to a functional layer, referring to at least a portion of the NMS is located within the functional layer that contains a strain-sensitive material for all lateral locations along the NMS. In an aspect, the NMS is proximate to a functional layer, wherein although the NMS may not be coincident with the functional layer, the position of the NMS provides a mechanical benefit to the functional layer, such as substantially lowering the strain that would otherwise be exerted on the functional layer but for the position of the NMS. For example, the position of a proximate NMS is optionally defined as the distance from the strain-sensitive material that provides an at least 10%, 20%, 50% or 75% reduction in strain in the strain-sensitive material for a given folded configuration, such as a device being folded so that the radius of curvature is on the order of the millimeter or centimeter scale. In another aspect, the position of a proximate NMS can be defined in absolute terms such as a distance from the strain-sensitive material, such as less than several mm, less than 2 mm, less than 10 µm, less than 1 µm, or less than 100 nm. In another aspect, the position of a proximate layer is defined relative to the layer that is adjacent to the strain-sensitive material, such as within the 50%, 25% or 10% of the layer closest to the strain-sensitive-containing layer. In an aspect, the proximate NMS is contained within a layer that is adjacent to the functional layer.

In addition, the geometry of devices in the functional layer is used in an aspect to provide stretchability and compressibility. In an embodiment, the systems are multilayer devices that exploit inorganic semiconductor nanomaterials configured into structural shapes that can geometrically accommodate large mechanical deformations without imparting significant strains in the materials themselves. For example, interconnects that connect rigid device islands may be wavy or buckled as further described in U.S. patent application Ser. No. 11/851,182 (U.S. Pub. No. 2008/0157235), hereby incorporated by reference. Similarly, the layer upon which the device component rests may be wavy. Such geometry provides for reversible stretchability in regions that can accommodate such forces while minimizing or relieving the need for stretchability in other relatively rigid regions.

In an aspect, the invention is a method of making a stretchable and foldable electronic device by providing a multilayer device comprising a substrate layer, a functional layer and a one or more neutral mechanical surface adjusting layer, wherein the functional layer is supported by a substrate layer, with at least one layer of the multilayer having a property that is spatially inhomogeneous, wherein the spatially inhomogeneous property positions a neutral mechanical surface that is coincident or proximate to a functional layer. Examples of a property that can provide spatial inhomogeneous to effect a change in NMS position include, but are not limited to one or more of: Young's modulus; deposition of an add layer; layer thickness; recess feature; spatially patterning device components in said functional layer, and functional layer geometry. Any property that effects a change in one or more of these properties can be spatially modified. Accordingly, the porosity or cross-linking of a layer may be spatially varied to thereby spatially modify the layer's Young's modulus, thereby spatially modifying the location of the NMS.

In an embodiment, the spatial inhomogeneity is provided by a step comprising lateral patterning any of the layers. Lateral refers to a variation over an x-y plane co-ordinate system, where the layer thickness is defined in the z-axis which is orthogonal to the x-y plane. Such lateral patterning provides lateral spatial inhomogeneity to influence the position of the NMS. In an aspect the lateral patterning is provided by patterning a substrate with one or more neutral mechanical surface adjusting layers comprising thin films or add layers. The patterning optionally comprises one or more encapsulating layers, one or more recess features such as etch holes, or both.

Spatial inhomogeneity is optionally achieved by a lateral patterning that is selectively varying the thickness of a substrate layer thickness or a one or more neutral mechanical surface adjusting layers, or otherwise spatially modulating a mechanical property of a substrate layer or a one or more neutral mechanical surface adjusting layers such as by modulating porosity, extent of cross linking or Young's modulus.

In an aspect, the one or more neutral mechanical surface adjusting layers is a one or more encapsulating layer. Such encapsulating layers are further useful in device isolation in applications where the device is placed in an environment that could otherwise damage device operation. The encapsulating layer optionally has a thickness that varies selectively in a lateral direction. As used herein, encapsulating layer refers to complete coating of the device, coating of only a top surface on which the electronic device rests, or portions thereof.

In an aspect, the neutral mechanical surface has a geometrical shape, such as a shape that is planar or non-planar. In another aspect, any of the devices including a device made by any of the methods disclosed herein, has an inhomogeneous cross-section.

In an embodiment, the inhomogeneous layer is made by selective patterning of the functional layer, substrate layer or an add layer, such as a patterning step comprising transfer printing of a passive or an active electronic component on the functional layer. In one example the patterning step comprises selective placement of etch holes in one or more layers to provide corresponding localized device regions of high foldability and stretchability. In another example, any of the methods further comprise patterning a layer in one or more lateral directions to provide a neutral mechanical surface that is coincident or proximate to a functional layer, wherein the functional layer is most sensitive to strain-induced fracture.

In an embodiment, any of the methods provide a neutral mechanical surface that is coincident with a functional layer.

In anther aspect, any of the methods and devices are described in terms of a mechanical characteristic, such as foldability. In an aspect, the method provides a functional layer that is capable of folding to a radius of curvature of 1 to 5 mm or greater without adversely degrading electronic performance and without mechanical failure.

In an aspect, any of the methods disclosed herein relate to a device comprising a plurality of functional layers and substrate layers separating the functional layers, wherein the number of functional layers is greater than or equal to 2 and less than or equal to 20.

Any of the methods provided herein, in an aspect, relate to making an ultrathin device, such as a device having a thickness that is less than or equal to 10 μm. Any of the substrates disclosed herein comprise PDMS.

In an embodiment, the functional layer comprises electronic device components on which the stretchable and foldable electronic device relies. In an aspect, the device component comprises one or more of the stretchable components disclosed in U.S. patent application Ser. No. 11/851,182 and is made by one or more of the processes disclosed therein. U.S. patent application Ser. No. 11/851,182 is specifically incorporated by reference for the stretchable components, devices, and related processes for making such stretchable devices and components of use in making geometrically wavy or bent functional layers. In an aspect, the device comprises a plurality of functional layers, such as greater than 2, greater than 8, or between 2 and 20, for example.

Also provided are methods of making an electronic device having a curved surface by providing a multilayer device comprising a substrate layer, a functional layer and a one or more neutral mechanical surface adjusting layer, wherein the functional layer is supported by a substrate layer, with at least one layer of the multilayer having a property that is spatially inhomogeneous, wherein the spatially inhomogeneous property positions a neutral mechanical surface that is coincident or proximate to a functional layer. The multilayer device may be made by any of the processes disclosed herein. Because the multilayer device is foldable and bendable, the conformal wrapping of a curvilinear surface with the multilayer device provides an electronic device having a correspondingly curved surface. Because of the bendability, stretchability and foldability of the devices provided herein, any curved surface of arbitrary shape is compatible with these processes, including but not limited to an arbitrary curvilinear surface, a hemispherical or a cylindrical surface. In one example, the device is a hemispherical optical imager or an electronic eye. In addition, sophisticated cameras having curved geometries that provide comparable or improved image capture and rendering compared to conventional planar-configured cameras are provided. Such cameras, having good sensitivity and operating characteristics can be used in a number of target applications, such as for retinal implants, for example.

In an embodiment, methods are provided for making thin sheets of an electronic device, such as an ultrathin flexible and foldable circuit or CMOS circuit. One example of the method is providing a carrier layer surface, coating at least a portion of the carrier layer surface with a sacrificial layer, attaching a substrate layer to the sacrificial layer, wherein the substrate layer supports at least a component of the electronic device, patterning a plurality of sacrificial layer access openings through the substrate layer, and releasing the substrate layer from the carrier layer surface by introducing a sacrificial-removing material to the sacrificial layer via the access openings, thereby obtaining a foldable electronic device. In an aspect, the circuit is ultrathin, such as less than 10 μm, less than 5 μm or less than 2 μm. Any sacrificial layer material may be used, such as sacrificial layers that are dissolvable by introducing a solvent through the access openings. For example, a sacrificial layer that is PMMA can be dissolved with acetone to provide a free-standing sheet that is bendable. In general, thinner sheets are capable of higher bending.

In an aspect the sacrificial layer comprises PMMA and the sacrificial-removing material is a PMMA solvent. In another aspect, the foldable electronic device is ultrathin.

In another aspect, the method of making a foldable electronic device further comprises conformally contacting the released substrate layer with an elastomeric stamp having a first level of strain to bond one or more components to said stamp and applying a force to the elastomeric stamp that generates a change in a strain of the stamp from the first level to a second level of strain different than the first level. The change in the level of strain in the stamp from the first level to the second level causes the one or more components to bend, thereby generating a one or more stretchable components each having a first end and second end that are bonded to the substrate and a central region provided in a bent configuration. In an embodiment, the bonding step comprises the step of generating a pattern of bond and non-bond regions on the component, the stamp surface, or both the component and the stamp surface to generate a spatial pattern of components that are bent. In an aspect, the device is a circuit sheet.

In an embodiment, instead of a free-standing embodiment, the released electronic device may be processed to obtain a wavy configuration. One example of such a method is, as provided in U.S. Pub. No. 2008/0157235, conformally contacting the released substrate layer with an elastomeric stamp having a first level of strain to bond one or more components to the stamp, and applying a force to the elastomeric stamp that generates a change in a strain of the stamp from a first level to a second level of strain different than the first level, wherein the change in the level of strain in the stamp from the first level to the second level causes the one or more components to bend, thereby generating a one or more stretchable components each having a first end and second end that are bonded to the substrate and a central region provided in a bent configuration. This process is one means for providing electronic devices having localized regions that are relatively highly stretchable by geometric construction of wavy features. To facilitate controlled regions of bonding, an adhesive is patterned on one or both the stamp surface of the component.

In another aspect, provided are methods of making foldable electronic devices by using anchor and support structure to facilitate high-fidelity lift-off of printable elements such as an array of electronic components or pattern of elements (e.g., semiconductor). "High-fidelity" refers to greater than about 90% lift-off, greater than 95% or greater than 97% removal of printable elements, and related transfer thereof to a desired receiving substrate. This process is particularly suited for those applications where a sacrificial layer is dissolved in an etching solution to minimize loss of printable elements to the solution and/or decrease unwanted adhesive loss due to adhesion between the printable element and the underlying support substrate wafer. In this aspect, one method is providing a functional layer on a supporting substrate surface, wherein the functional layer comprises an array of electronic devices, etching one or more access openings in the functional layer, casting a polymeric material against the functional layer and access openings, wherein the cast polymer in the access openings generates anchors that facilitate high-fidelity lift-off of the array from the supporting substrate surface, and contacting an elastomeric stamp with the polymeric material, and removing the elastomeric stamp in a direction away from the supporting substrate to remove the polymeric material from the substrate and thereby removing the array anchored to the polymeric material from the supporting substrate. "Array" is used to refer to a plurality of spatially varying elements or a continuous thin film layer having distinctly-shaped elements within the layer.

In an embodiment of this aspect the access openings are etch holes. Optionally, the method further comprises printing the removed array of devices to a device substrate surface. In an embodiment, the process is repeated to make a multilayer electronic device. Any of the methods disclosed herein are optionally for a printed device that is a GaAs multilayer solar cell.

In an embodiment, the method relates to printing electronic devices or components thereof having a planar geometry to a curved surface. For example, the planar geometry device can be incorporated within a foldable device made by a process of the present invention and therein transferred to a curvilinear surface. In one aspect, the relaxed shape of a transfer stamp corresponds to the shape of a device substrate to which the devices on the curved stamp is transferred, such as a transfer element or stamp that is cast against a curved receiving substrate to which the electronic device or component thereof is transferred. One example of a method is providing a device on a substantially planar substrate surface, providing an elastomeric stamp having a curvilinear geometry, deforming the elastomeric stamp to provide a substantially flat stamp surface, contacting the substantially flat stamp surface with the device on the substrate surface, and removing the device from the substrate surface by lifting the stamp in a direction that is away from the substrate, thereby transferring the component from the substrate surface to the substantially flat stamp surface, and relaxing the elastomeric stamp, thereby transforming the substantially flat stamp surface to a surface having a curved geometry.

In another aspect, the invention is a device for transforming a curved surface to substantially planar surface. "Substantially planar" refers to a contact surface that has a maximum deviation less than 10%, less than 5% or less than 1% from truly planar. The device optional comprises a holder for secureably receiving an elastomeric stamp, and a force generator operably connected to the holder for generating a force on a secureably received elastomeric stamp, the force capable of substantially flattening the curvilinear stamp. Any means for flattening the surface may be used. In one example, a tensioning stage that is adjusted to adjust the footprint area defined by the holder provides the corresponding geometry. The geometry of the holder may be selected depending on the geometry of the curved surface. For a hemispherically-curved surface, the footprint area may be circular to provide a radial force to flatten the hemispherical surface. A partially cylindrically-shaped surface may have a uniaxial force generator with a rectangular footprint area to flatten the curved surface.

The device optionally further comprises a vertical translator operably connected to the holder for establishing conformal contact between the secureably received elastomeric stamp and an electronic component on a substantially flat substrate. In an aspect, the holder has a circular geometry. In an aspect the force generator comprises a tensioning stage operably connected to the holder. In an aspect the tensioning stage comprises a plurality of paddle arms for securing the elastomeric stamp to the holder and for transmitting a radially-directed force to flatten the curved surface.

In another aspect, the invention is stretchable and foldable devices having a support layer, wherein the layer is elastomeric, a functional layer supported by the support layer, and a one or more neutral mechanical surface adjusting layer, wherein at least one or more of any of the layers has a property that is spatially inhomogenous, thereby generating a neutral mechanical surface coincident or proximate to the functional layer.

In an aspect, the inhomogeneous property is selected from one or more of Young's modulus, layer thickness, spatially patterned add layer, recess feature, functional layer element placement, and functional layer geometry.

In an aspect, the device is selected from the group consisting of an integrated circuit; semiconductor; transistor; diode; logic gate; arrays of electronic components; and an optical system.

In an aspect, the functional layer may have an array of nanoribbons, such as nanoribbons that are buckled with ends bonded to the substrate or a rigid island (such as a contact pad for receiving an electronic device) and middle region that is not bonded. This imparts further stretchability to the functional layer.

In another embodiment, the invention is a method of making a stretchable, bendable and/or foldable electronic device on a range of unconventional substrates. The devices can be high performance and are achieved by use of a strategically placed strain isolation layer that relieves otherwise undue strains and stresses on the electronic device, and specifically on a functional layer of the device that is vulnerable to strain-induced failure. In an aspect, the method comprises coating a receiving substrate having a first Young's modulus with an isolation layer having a second Young's modulus, the isolation layer having a receiving surface for receiving the electronic device, and the second Young's modulus is less than the first Young's modulus. In an embodiment, the isolation layer is a polymer or an elastomer. The electronic device is provided on a support substrate in a printable configuration. A "printable electronic device" refers to an electronic device or a component thereof (e.g., circuits, CMOS circuit, interconnects, device islands, semiconductor elements/layers, transistors, logic circuits and arrays thereof) capable of transfer from one substrate to another substrate, such as by contact transfer printing, for example. The printable electronic device is transferred from the support substrate to the isolation layer receiving surface, such as by contact transfer printing. The isolation layer isolates at least a portion of the transferred electronic device from an applied strain, such as a strain applied to the device's receiving substrate.

In an aspect, the method is used to provide electronic devices, and components thereof, on an unconventional substrate including, but not limited to, a receiving substrate that is fabric, vinyl, leather, latex, spandex, paper, for example. In this aspect, high performance electronic circuits can be incorporated into a number of different applications ranging from gloves, clothing, building materials such as windows, roofs, wallpaper, manufacturing systems and other applications requiring electronics in a curvilinear geometry and/or a repetitively strained system. In an embodiment, the substrate comprises fabric. In another aspect, the method relates to more conventional substrate materials such as polymers, inorganic polymers, organic polymers, semiconductor materials, elastomers, wafers, ceramics, glass, or metals.

In an aspect the polymer comprises PDMS. In an aspect, the isolation layer Young's modulus ("second Young's modulus") is described relative to the receiving substrate Young's modulus ("first Young's modulus"), such as a ratio of first Young's modulus to second Young's modulus that is greater than or equal to about 10 (e.g., the isolation layer has a Young's modulus that is at least ten times less than the Young's modulus of the receiving substrate). In an aspect, the isolation layer has a Young's modulus less than or equal to 5 MPa, less than or equal to 1 MPa, between 0.01 MPa and 100 MPa, or between about 0.1 MPa and 5 MPa. In an aspect, the isolation layer has a thickness that is less than or equal to 2 mm, less than or equal to 200 μm, less than or equal to 100 μm or less than or equal to 20 μm. In an aspect, the isolation layer has a thickness selected from a range that is between 10 μm and 2 mm, between 40 μm and 200 μm or between 50 μm and 150 μm.

In an embodiment, the methods and devices described herein relate to providing a certain level of strain isolation. In an aspect, the isolation layer provides at least 20% or greater, or 90% or greater strain isolation compared to a corresponding system without the strain isolation layer. In an aspect, the upper limit of strain isolation is a value that is practicably achievable. In an aspect, the strain isolation on a strain-sensitive component is less than or equal to about a factor of 100 compared to systems without the strain isolation layer (e.g., up to about 99% strain isolation).

In an aspect the printable electronic device is one component of an electronic device, such as a circuit is one part of an electronic device having additional circuitry or other components to form the overall electronic device. In an aspect the component comprises a plurality of interconnects, such as a plurality of interconnects having a curved geometry, with the interconnects operably connected to strain-sensitive regions such as device islands, for example. The curve may be in plane, out of plane, or a combination thereof with respect to the isolation layer receiving surface.

In an embodiment, the isolation layer at least partially penetrates the receiving substrate. Such penetration may be useful for applications where it is desirable to have a higher adhesive force between the isolation layer and the underlying substrate, such as in situations where the mechanical strain and stresses are relatively high, thereby elevating the risk of delamination during operation. In an aspect, the receiving substrate has a surface texture to increase contact area between the isolation layer and the receiving substrate. "Surface texture" is used broadly to refer to any technique that functionally results in increased surface area. For example, the substrate may have relief features or other surface roughness, either intrinsically or extrinsically. In an aspect, the receiving substrate has pores, wherein the pores facilitate penetration of the isolation layer into the receiving substrate, such as a receiving substrate having a surface porosity that is greater than or equal to 10%, greater than or equal to 5%, or greater than or equal to 1%, or between about 1% and 10%. Percent porosity refers to the percentage of the total surface area having a pore or an opening. In another aspect, the receiving substrate comprises fibers, thereby facilitating penetration of the polymer into the receiving substrate. In an embodiment of this aspect, at least a portion of the fibers are embedded in the polymer layer, such as at least a portion of the fibers closer to the substrate surface that are completely embedded in polymer that has penetrated the substrate surface.

Any of the devices and methods disclosed herein optionally include an encapsulation layer, such as an encapsulation layer that partially covers portions of the device or that completely encapsulates the device. In an aspect, the encapsulation layer has a selected Young's modulus, such as a Young's modulus that is less than the receiving substrate Young's modulus or less than the isolation layer Young's modulus. In an aspect, the encapsulation layer has a Young's modulus that is inhomogeneous. In this aspect, an "inhomogeneous Young's modulus" refers to a Young's modulus that spatially varies, such as by introduction of features (e.g., relief features), or selective positioning of other structures on a surface of or within the encapsulation layer.

In another embodiment, the invention is a stretchable and foldable electronic device, such as devices made by any of the methods disclosed herein, including a combination of methods. For example, methods utilizing neutral mechanical plane mechanics may be combined with strain-isolation layers that are thin layers of polymer to further improve electronic device mechanics.

In one embodiment, the stretchable and foldable electronic device comprises a receiving substrate, an isolation layer that at least partially coats one surface of the receiving substrate, and an electronic device that is at least partially supported by the isolation layer. The isolation layer is configured so that the electronic device (such as a functional layer thereof) experiences a strain isolation, such as a strain isolation that is reduced by at least 20% or at least 90%, compared to the strain in a device without the isolation layer. In an aspect, the isolation layer has thickness less than or equal to 2 mm and a Young's modulus less than or equal to 100 MPa. Examples of useful devices include electronic devices or functional layers having bond regions with the isolation layer, such as covalent bonds corresponding to backsides of device islands coated with an adhesive or adhesive-precursor. For example, the back-side of an active device island may be coated with a bilayer of $Cr/SiO_2$ to form covalent bonds comprising Si—O—Si bonds between an isolation layer made of PDMS polymer and the electronic device bond regions. Accordingly, non-bond regions refer to regions where the adhesive force (per unit contact area) between the electronic device and the isolation layer is substantially less than that in the bond region. For example, the non-bond regions may not be coated with an adhesive or adhesive precursor (such as $Cr/SiO_2$). The non-bond region optionally corresponds to bent interconnects that connect relatively rigid adjacent device islands that are strain-sensitive. Such bent configuration further isolates functional layers, such as relatively rigid device islands, from strain or strain-induced stresses. Any of the devices optionally further comprise an encapsulation layer, such as an encapsulation layer having an inhomogeneous Young's modulus.

BRIEF DESCRIPTION OF THE DRAWINGS

FIG. 8. Maximum strains versus the prestrain in various layers of the circuits (A) Metal interconnect (B) p-MOSFET and n-MOSFET regions.

DETAILED DESCRIPTION OF THE INVENTION

Figure 1:
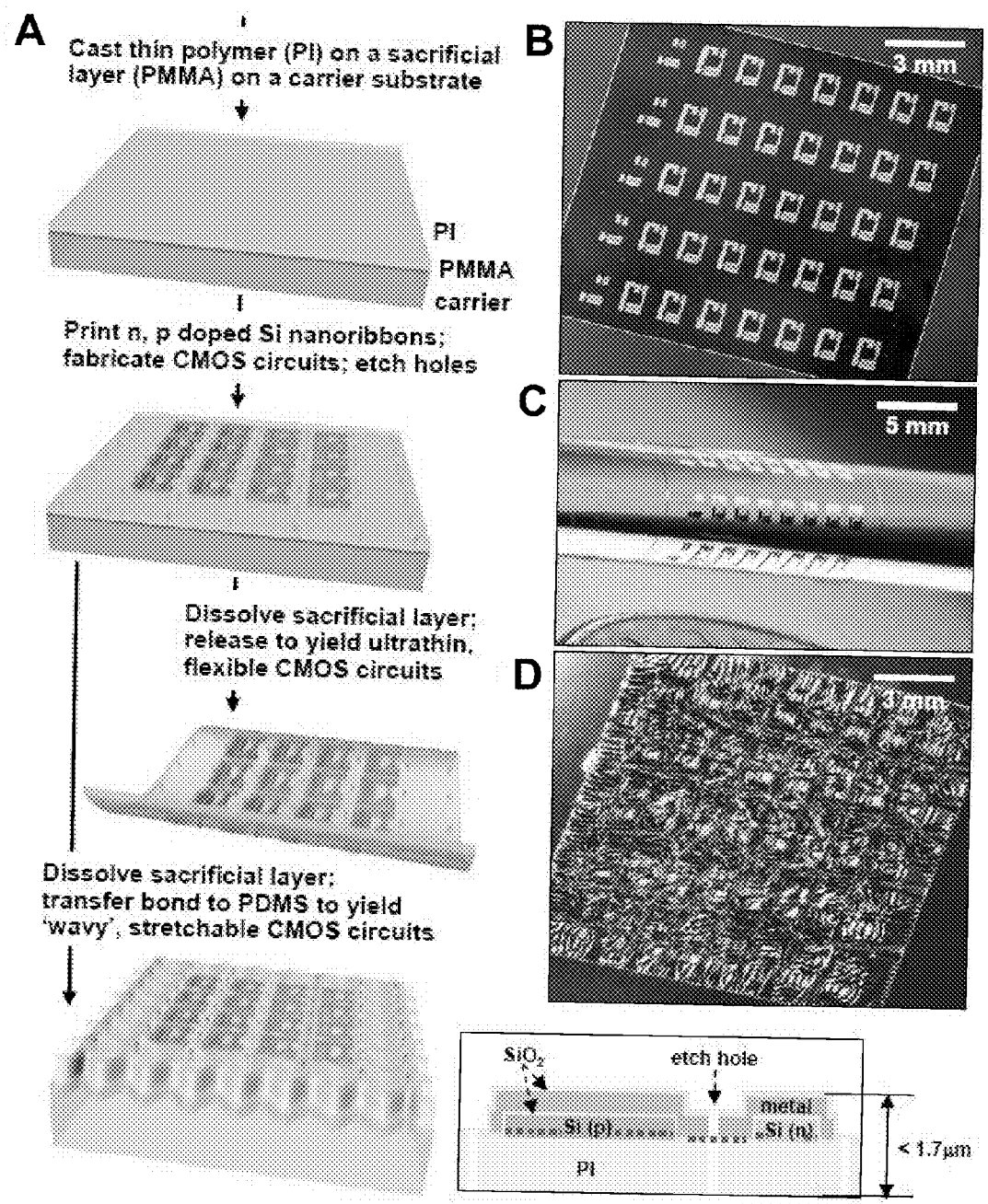
FIG. 1. (A) Overview of the fabrication process for ultrathin CMOS circuits that exploit silicon nanoribbons, and enable extreme levels of bendability (third frame from the top) or fully reversible stretchability/compressibility (bottom frame on the right). (B-D) Optical images circuits on the carrier wafer and doped nanoribbons (inset) (B), on a thin rod after removal from this carrier (C) and in a wavy configuration on PDMS (D).

The terms "foldable", "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5% in strain-sensitive regions.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

"Functional layer" refers to a device-containing layer that imparts some functionality to the device. For example, the functional layer may be a thin film such as a semiconductor layer. Alternatively, the functional layer may comprise multiple layers, such as multiple semiconductor layers separated by support layers. The functional layer may comprise a plurality of patterned elements, such as interconnects running between device-receiving pads or islands. The functional layer may be heterogeneous or may have one or more properties that are inhomogeneous. "Inhomogeneous property" refers to a physical parameter that can spatially vary, thereby effecting the position of the neutral mechanical surface (NMS) within the multilayer device.

"Coincident" refers to a surface such as a NMS that is positioned within or is adjacent to a layer, such as a functional layer, substrate layer, or other layer. In an aspect, the NMS is positioned to correspond to the most strain-sensitive layer or material within the layer.

"Proximate" refers to a NMS that closely follows the position of a layer, such as a functional layer, substrate layer, or other layer while still providing desired foldability or bendability without an adverse impact on the strain-sensitive material physical properties. In general, a layer having a high strain sensitivity, and consequently being prone to being the first layer to fracture, is located in the functional layer, such as a functional layer containing a relatively brittle semiconductor or other strain-sensitive device element. A NMS that is proximate to a layer need not be constrained within that layer, but may be positioned proximate or sufficiently near to provide a functional benefit of reducing the strain on the strain-sensitive device element when the device is folded.

"Electronic device" is used broadly herein to refer to devices such as integrated circuits, imagers or other optoelectronic devices. Electronic device also refers to a component of an electronic device such as passive or active components such as a semiconductor, interconnect, contact pad, transistors, diodes, LEDs, circuits, etc. The present invention relates to the following fields: collecting optics, diffusing optics, displays, pick and place assembly, vertical cavity surface-emitting lasers (VCSELS) and arrays thereof, LEDs and arrays thereof, transparent electronics, photovoltaic arrays, solar cells and arrays thereof, flexible electronics, micromanipulation, plastic electronics, displays, pick and place assembly, transfer printing, LEDs, transparent electronics, stretchable electronics, and flexible electronics.

A "component" is used broadly to refer to a material or individual component used in a device. An "interconnect" is one example of a component and refers to an electrically conducting material capable of establishing an electrical connection with a component or between components. In particular, the interconnect may establish electrical contact between components that are separate and/or can move with respect to each other. Depending on the desired device specifications, operation, and application, the interconnect is made from a suitable material. For applications where a high conductivity is required, typical interconnect metals may be used, including but not limited to copper, silver, gold, aluminum and the like, alloys. Suitable conductive materials may include a semiconductor like silicon, indium tin oxide, or GaAs.

An interconnect that is "stretchable" is used herein to broadly refer to an interconnect capable of undergoing a variety of forces and strains such as stretching, bending and/or compression in one or more directions without adversely impacting electrical connection to, or electrical conduction from, a device component. Accordingly, a stretchable interconnect may be formed of a relatively brittle material, such as GaAs, yet remain capable of continued function even when exposed to a significant deformatory force (e.g., stretching, bending, compression) due to the interconnect's geometrical configuration. In an exemplary embodiment, a stretchable interconnect may undergo strain larger than about 1%, 10% or about 30% or up to about 100% without fracturing. In an example, the strain is generated by stretching an underlying elastomeric substrate to which at least a portion of the interconnect is bonded.

A "device component" is used to broadly refer to an individual component within an electrical, optical, mechanical or thermal device. Component can be one or more of a photodiode, LED, TFT, electrode, semiconductor, other light-collecting/detecting components, transistor, integrated circuit, contact pad capable of receiving a device component, thin film devices, circuit elements, control elements, microprocessors, transducers and combinations thereof. A device component can be connected to one or more contact pads as known in the art, such as metal evaporation, wire bonding, application of solids or conductive pastes, for example. Electrical device generally refers to a device incorporating a plurality of device components, and includes large area electronics, printed wire boards, integrated circuits, device components arrays, biological and/or chemical sensors, physical sensors (e.g., temperature, light, radiation, etc.), solar cell or photovoltaic arrays, display arrays, optical collectors, systems and displays.

"Substrate" refers to a material having a surface that is capable of supporting a component, including a device, component or an interconnect. An interconnect that is "bonded" to the substrate refers to a portion of the interconnect in physical contact with the substrate and unable to substantially move relative to the substrate surface to which it is bonded. Unbonded portions, in contrast, are capable of substantial movement relative to the substrate. The unbonded portion of the interconnect generally corresponds to that portion having a "bent configuration," such as by strain-induced interconnect bending.

A "NMS adjusting layer" refers to a layer whose primary function is adjusting the position of the NMS in the device. For example, the NMS adjusting layer may be an encapsulating layer or an add layer such as an elastomeric material.

In the context of this description, a "bent configuration" refers to a structure having a curved conformation resulting from the application of a force. Bent structures in the present invention may have one or more folded regions, convex regions, concave regions, and any combinations thereof. Bent structures useful in the present invention, for example, may be provided in a coiled conformation, a wrinkled conformation, a buckled conformation and/or a wavy (i.e., wave-shaped) configuration.

Bent structures, such as stretchable bent interconnects, may be bonded to a flexible substrate, such as a polymer and/or elastic substrate, in a conformation wherein the bent structure is under strain. In some embodiments, the bent structure, such as a bent ribbon structure, is under a strain equal to or less than about 30%, a strain equal to or less than about 10%, a strain equal to or less than about 5% and a strain equal to or less than about 1% in embodiments preferred for some applications. In some embodiments, the bent structure, such as a bent ribbon structure, is under a strain selected from the range of about 0.5% to about 30%, a strain selected from the range of about 0.5% to about 10%, a strain selected from the range of about 0.5% to about 5%. Alternatively, the stretchable bent interconnects may be bonded to a substrate that is a substrate of a device component, including a substrate that is itself not flexible. The substrate itself may be planar, substantially planar, curved, have sharp edges, or any combination thereof. Stretchable bent interconnects are available for transferring to any one or more of these complex substrate surface shapes.

A "pattern of bond sites" refers to spatial application of bonding means to a supporting substrate surface and/or to the interconnects so that a supported interconnect has bond regions and non-bond regions with the substrate. For example, an interconnect that is bonded to the substrate at its ends and not bonded in a central portion. Further shape control is possible by providing an additional bond site within a central portion, so that the not-bonded region is divided into two distinct central portions. Bonding means can include adhesives, adhesive precursors, welds, photolithography, photocurable polymer. In general, bond sites can be patterned by a variety of techniques, and may be described in terms of surface-activated ($W_{act}$) areas capable of providing strong adhesive forces between substrate and feature (e.g., interconnect) and surface-inactive ($W_{in}$) where the adhesive forces are relatively weak. A substrate that is adhesively patterned in lines may be described in terms of $W_{act}$ and $W_{in}$ dimensions. Those variables, along with the magnitude of prestrain, $\epsilon_{pre}$ affect interconnect geometry.

"Ultrathin" refers to devices of thin geometries that exhibit extreme levels of bendability. In an aspect, ultrathin refers to circuits having a thickness less than 1 µm, less than 600 nm or less than 500 nm. In an aspect, a multilayer device that is ultrathin has a thickness less than 200 µm, less than 50 µm, or less than 10 µm.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. Elastomers provide elastomeric stamps useful in the present methods.

"Elastomeric stamp" or "elastomeric transfer device" are used interchangeably and refer to an elastomeric material having a surface that can receive as well as transfer a feature. Exemplary elastomeric transfer devices include stamps, molds and masks. The transfer device affects and/or facilitates feature transfer from a donor material to a receiver material. "Elastomer" or "elastomeric" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, silicon-based organic polymers including polydimethylsiloxane (PDMS), polybutadiene, polyisobutylene, poly(styrene-butadiene-styrene), polyurethanes, polychloroprene and silicones.

"Conformal wrapping" refers to contact established between surfaces, coated surfaces, and/or surfaces having materials deposited thereon which may be useful for transferring, assembling, organizing and integrating structures (such as printable semiconductor elements) on a substrate surface. In one aspect, conformal contact involves a macroscopic adaptation of one or more contact surfaces of a conformable transfer device to the overall shape of a substrate surface or the surface of an object such as a printable semiconductor element. In another aspect, conformal contact involves a microscopic adaptation of one or more contact surfaces of a conformable transfer device to a substrate surface leading to an intimate contact with out voids. The term conformal contact is intended to be consistent with use of this term in the art of soft lithography. Conformal contact may be established between one or more bare contact surfaces of a foldable device and a substrate surface. Alternatively, conformal contact may be established between one or more coated contact surfaces, for example contact surfaces having a transfer material, printable semiconductor element, device component, and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Low modulus" refers to materials having a Young's modulus less than or equal to 10 MPa, less than or equal to 5 MPa, or less than or equal to 1 MPa.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad (II)$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad (III)$$

wherein $\lambda$ and $\mu$ are Lame constants. High Young's modulus (or "high modulus") and low Young's modulus (or "low modulus") are relative descriptors of the magnitude of Young's modulus in a give material, layer or device. In the present invention, a high Young's modulus is larger than a low Young's modulus, preferably about 10 times larger for some applications, more preferably about 100 times larger for other applications and even more preferably about 1000 times larger for yet other applications. "Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire layer of material.

"Thin layer" refers to a material that at least partially covers an underlying substrate, wherein the thickness is less than or equal to 300 μm, less than or equal to 200 μm, or less than or equal to 50 μm. Alternatively, the layer is described in terms of a functional parameter, such as a thickness that is sufficient to isolate or substantially reduce the strain on the electronic device, and more particularly a functional layer in the electronic device that is sensitive to strain. "Isolate" refers to the presence of an elastomer layer that substantially reduces the strain or stress exerted on a functional layer when the device undergoes a stretching of folding deformation. In an aspect, strain is said to be "substantially" reduced if the strain is at least a factor of 20, at least a factor of 50. or at least a factor of 100 times reduced compared to the strain in the same system without the elastomer layer.

EXAMPLE 1

Stretchable and Foldable Silicon Integrated Circuits

Disclosed herein are approaches to access high performance, stretchable and foldable integrated circuits (ICs). The systems integrate inorganic electronic materials, including aligned arrays of nanoribbons of single crystalline silicon, with ultrathin plastic and elastomeric substrates. The designs combine multilayer neutral mechanical plane layouts and 'wavy' structural configurations in silicon complementary logic gates, ring oscillators and differential amplifiers. Three dimensional analytical and computational modeling of the mechanics of deformations in these ICs, together with circuit simulations, illuminate aspects that underlie the measured behaviors. The strategies represent general and scalable routes to high performance, foldable and stretchable optoelectronic devices that can incorporate established, high performance inorganic electronic materials whose fragile, brittle mechanical properties would otherwise preclude their use in such systems.

Realization of electronics with performance equal to established technologies that use rigid semiconductor wafers, but in lightweight, foldable and stretchable formats facilitates development of new applications. Examples include wearable systems for personal health monitoring and therapeutics, 'smart' surgical gloves with integrated electronics and electronic eye type imagers that incorporate focal plane arrays on hemispherical substrates[1-3]. Circuits that use organic[4,5] or certain classes of inorganic[6-13] electronic materials on plastic or steel foil substrates can provide some degree of mechanical flexibility, but they cannot be folded or stretched. Also, with few exceptions[11-13] such systems offer only modest electrical performance. Stretchable metal interconnects with rigid[14] or stretchable[15-17] inorganic device components represent alternative strategies that can also, in certain cases, provide high performance. In their existing forms, however, none of these approaches allows scaling to circuit systems with practically useful levels of functionality.

This example presents routes to high performance, single crystalline silicon complementary metal oxide semiconductor (Si-CMOS) integrated circuits (ICs) that are reversibly foldable and stretchable. These systems combine high quality electronic materials, such as aligned arrays of silicon nanoribbons, with ultrathin and elastomeric substrates, in multilayer neutral mechanical plane designs and with 'wavy' structural layouts. High performance n and p channel metal oxide semiconductor field effect transistors (MOSFETs), CMOS logic gates, ring oscillators and differential amplifiers, all with electrical properties as good as analogous systems built on conventional silicon-on-insulator (SOI) wafers, demonstrate the concepts. Analytical and finite element method (FEM) simulation of the mechanics, together with circuit simulations, reveal the key physics. These approaches are important not only for the Si-CMOS, but also for their straightforward scalability to much more highly integrated systems with other diverse classes of electronic materials, whose intrinsic brittle, fragile mechanical properties would otherwise preclude their use in such applications.

Figure 5:
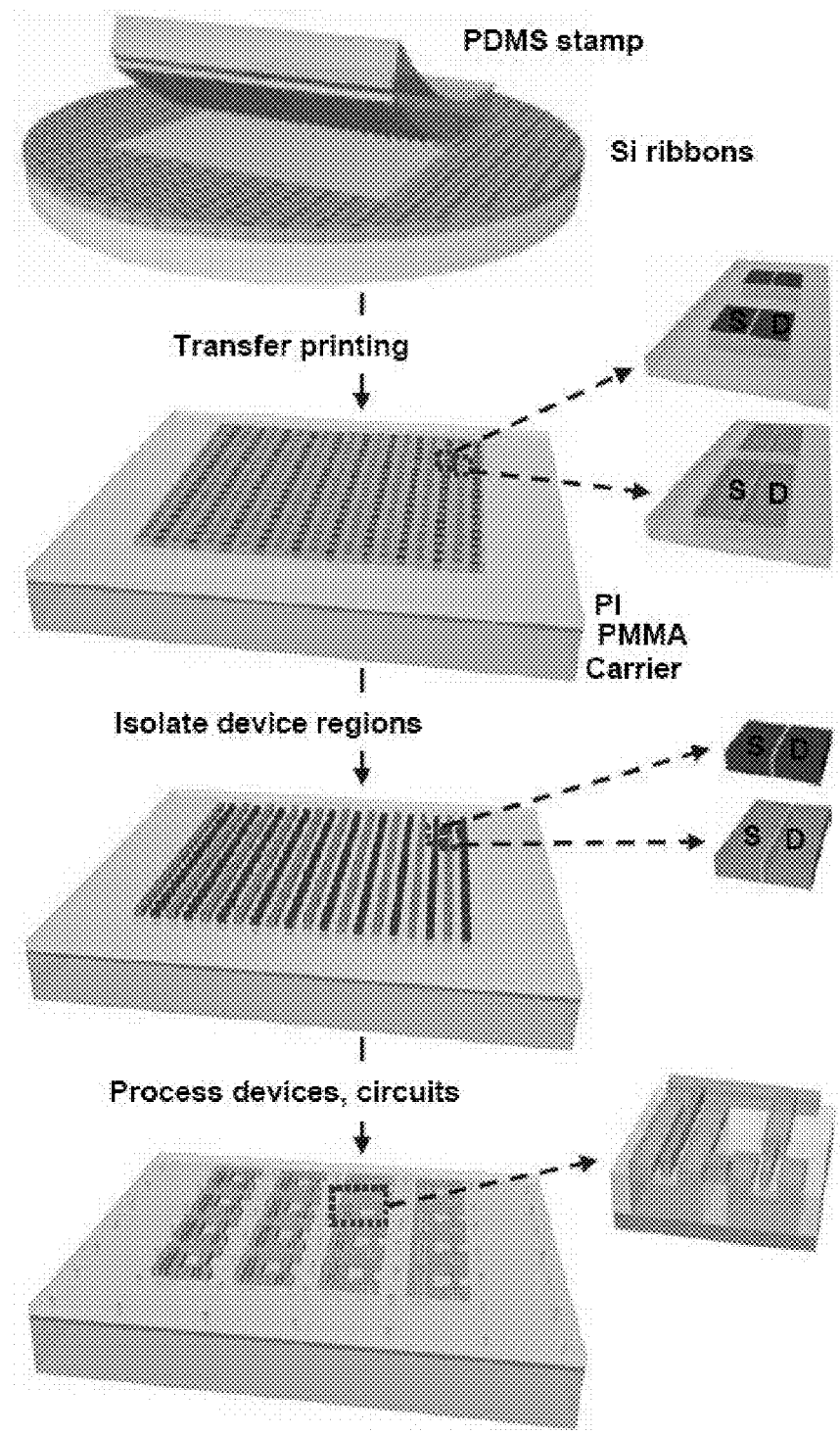
FIG. 5. Schematic diagram for circuit preparation procedures.
Figure 6:
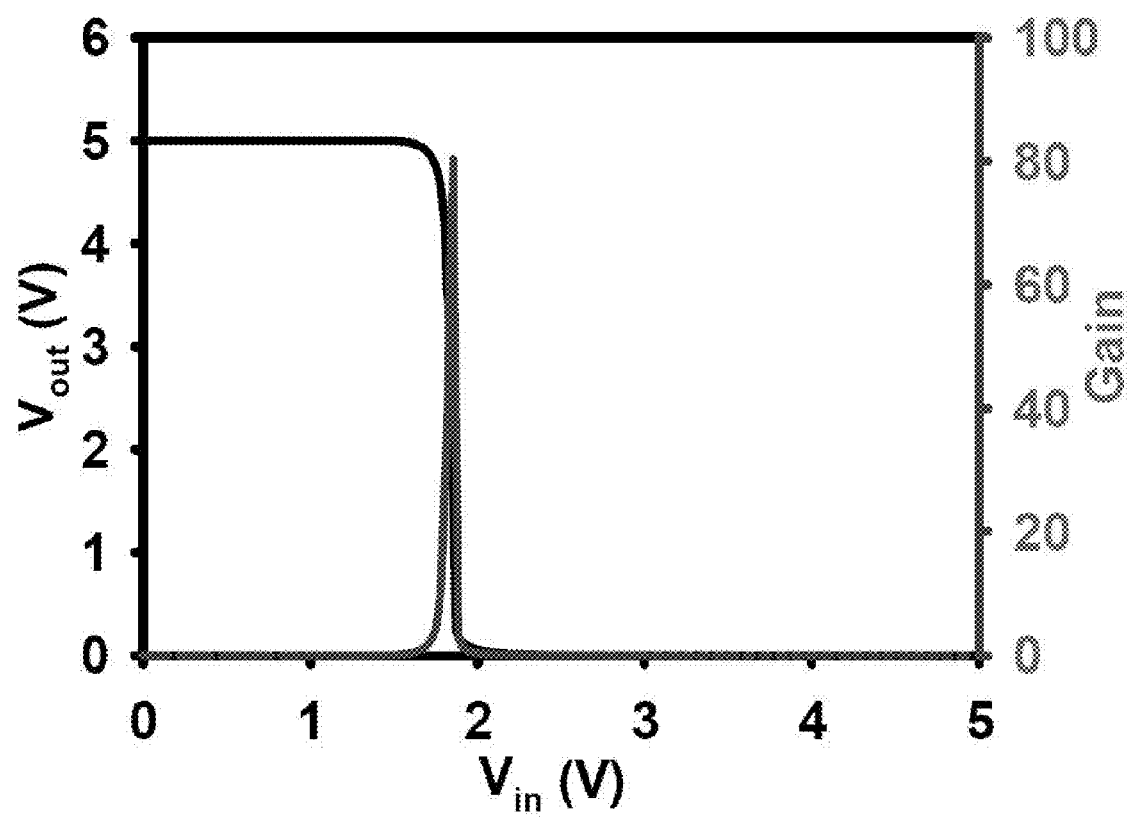
FIG. 6. Voltage transfer curve for ultrathin device attached on thin rod.

FIG. 1A schematically summarizes steps fofororming ultrathin, foldable and stretchable circuits, and presents optical images of representative systems at different stages of the process. The procedure begins with spin-casting a sacrificial layer of poly(methylmethacrylate) (PMMA) (~100 nm) followed by a thin, substrate layer of polyimide (PI) (~1.2 µm) on a Si wafer that serves as a temporary carrier. A transfer printing process with a poly(dimethylsiloxane) (PDMS) stamp[18,19] delivers to the surface of the PI organized arrays of n and p doped Si nanoribbons (inset of FIG. 1B) with integrated contacts, separately formed from n-type source wafers. Depositing and patterning $SiO_2$ (~50 nm) for gate dielectrics and interconnect crossovers, and Cr/Au (5/145 nm) for source, drain and gate electrodes and interconnects yield fully integrated Si-CMOS circuits with performance comparable to similar systems formed on SOI wafers (FIG. 5). FIG. 1C shows an image of an array of Si-CMOS inverters and isolated n and p channel MOSFETs (n-MOSFETs and p-MOSFETs, respectively) formed in this manner, still on the carrier substrate. In the next step, reactive ion etching forms a square array of small holes (~50 µm diameters, separated by 800 µm) that extend through the nonfunctional regions of the circuits and the thin PI layer, into the underlying PMMA. Immersion in acetone dissolves the PMMA by flow of solvent through the etch holes to release ultrathin, flexible circuits in a manner that does not degrade the properties of the devices. These systems can be implemented as flexible, free-standing sheets, or they can be integrated in wavy layouts on elastomeric substrates to provide fully reversible stretchability/compressibility. The frames of FIG. 1A show these two possibilities. The schematic cross sectional view at the bottom right illustrates the various layers of this Si-CMOS/PI system (total thickness ~1.7 µm). Such ultrathin circuits exhibit extreme levels of bendability, as illustrated in FIG. 1C, without compromising the electronic properties (FIG. 6). There are two primary reasons for this behavior. The first derives from elementary bending mechanics in thin films, where the surface strains are determined by the film thickness, t, divided by twice the radius of curvature associated with the bending, r[20]. Films with t=1.7 µm can be bent to r as small as ~85 µm before the surface strains reach a typical fracture strain (~1% in tension) for the classes of high performance inorganic electronic materials used here. A second, and more subtle, feature emerges from full analysis of the bending mechanics in the actual material stacks of the circuits. The results indicate that the neutral mechanical plane (NMP) or neutral mechanical surface (NMS), which defines the position through the thickness of the structure where strains are zero for arbitrarily small r, lies in the electronic device layers for the designs implemented here (FIG. 7). In other words, the high moduli of the electronic materials move the neutral mechanical plane from the geometric mid plane, which lies in the PI, to the device or "functional" layers. The illustration at the bottom right of FIG. 1 indicates with dashed lines the approximate locations of this neutral mechanical plane in different regions of the system. This situation is highly favorable because the fracture strains of the materials used in the circuits are substantially lower than those for fracture or plastic deformation in the PI (~7%). Two disadvantages of such circuits are their lack of stretchability and, for certain applications, their low flexural rigidity. These limitations can be circumvented by implementing extensions of concepts that achieve stretchable, 'wavy' configurations of sheets and ribbons of silicon and gallium arsenide[15,16], in a procedure illustrated in the bottom frame of FIG. 1A. The fabrication begins with removal of the ultrathin circuits from the carrier substrate using a PDMS stamp, evaporating a thin layer of $Cr/SiO_2$ (3/30 nm) onto the exposed PI surface (i.e. the surface that was in contact with the PMMA), and then generating —OH groups on the surfaces of the $SiO_2$ and a biaxially prestrained PDMS substrate ($\epsilon_{pre}=\epsilon_{xx}=\epsilon_{yy}$, where the x and y coordinates lie in the place of the circuit) by exposure to ozone induced with an ultraviolet lamp. Transfer printing the circuit onto the PDMS substrate, followed by mild heating creates covalent linkages to form strong mechanical bonding between the Si CMOS/PI/Cr/$SiO_2$ and the PDMS. Relaxing the prestrain induces compressive forces on the circuits that lead to the formation of complex 'wavy' patterns of relief via nonlinear buckling processes. The location of the neutral mechanical plane in the device layers, as noted previously, facilitates the nondestructive bending that is required to form these wavy patterns. Circuits in this geometry offer fully reversible stretchability/compressibility without substantial strains in the circuit materials themselves. Instead, the amplitudes and periods of the wave patterns change to accommodate applied strains ($\epsilon_{appl}$, in any direction in the plane of the circuit), with physics similar to an accordion bellows[21]. FIG. 1D presents an optical image of a wavy Si-CMOS circuit on PDMS, formed with a biaxial prestrain of ~5.6%. The thickness of the PDMS can be selected to achieve any desired level of flexural rigidity, without compromising stretchability.

Figure 2A:
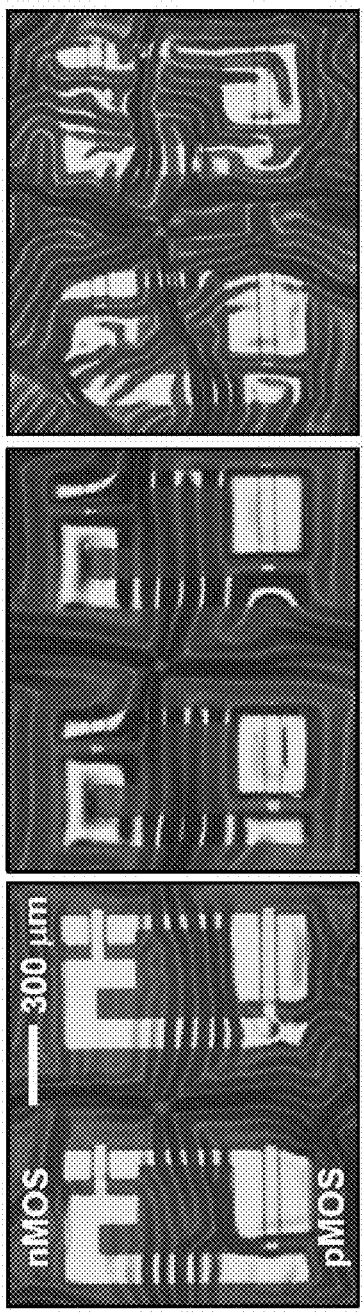
FIG. 2. (A) Wavy Si-CMOS inverters on PDMS, formed with various levels of prestrain, $\epsilon_{pre}$. (left: $\epsilon_{pre}$=2.7%, center: $\epsilon_{pre}$=3.9%, right: $\epsilon_{pre}$=5.7%) (B) Structural configuration determined by full, three dimensional finite element modeling of a system formed with $\epsilon_{pre}$=3.9% (left) and perspective scanning electron micrograph of a sample fabricated with a similar condition (right). (C) Optical images of wavy Si-CMOS inverters under tensile strains along the x and y directions. (D) Measured (red and black) and simulated (blue) transfer characteristics of wavy inverters (left), and n and p channel MOSFETs (solid and dashed lines, respectively, in the left inset). Measured (solid circles) and simulated (open squares) inverter threshold voltages for different applied strains along x and y (right).
Figure 2B:
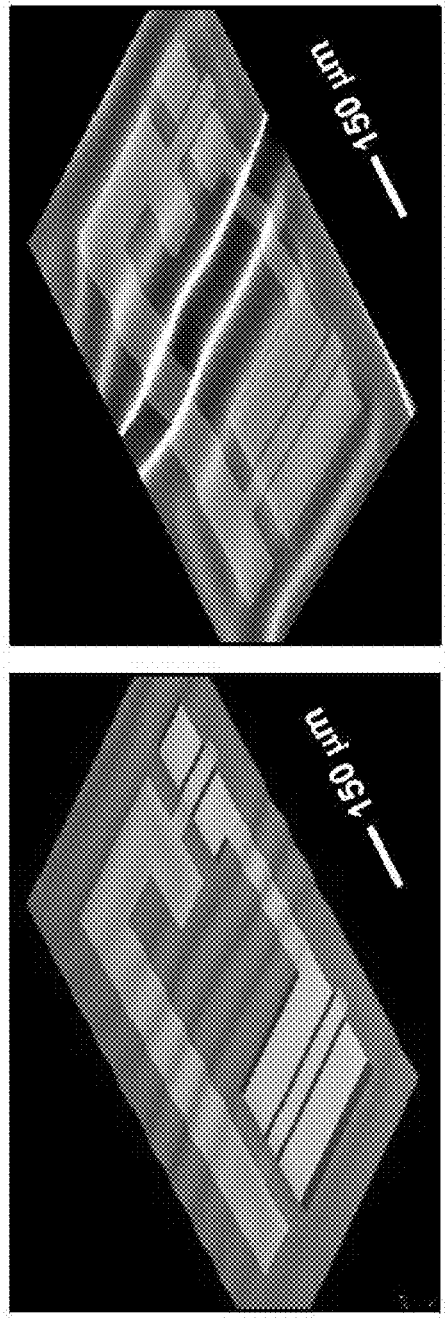

The left, middle and right frames of FIG. 2A show optical micrographs of wavy Si-CMOS inverters formed with $\epsilon_{pre}$=2.7%, 3.9% and 5.7%, respectively. The wave structures have complex layouts associated with nonlinear buckling physics in a mechanically heterogeneous system. Three features are notable. First, the waves form most readily in the regions of smallest flexural rigidity: the interconnect lines between the p-MOSFET and n-MOSFET sides of the inverter and the electronically inactive parts of the circuit sheet. Second, as $\epsilon_{pre}$ increases, the wave structures begin to extend from these locations to all parts of the circuit, including the comparatively rigid device regions. Third, the etch holes, representative ones of which appear near the centers of these images, have a strong influence on the waves. In particular, waves tend to nucleate at these locations; they adopt wave vectors oriented tangential to the perimeters of the holes, due to the traction-free edges at these locations. The first two behaviors can be quantitatively captured using analytical treatments and FEM simulation; the third by FEM. Analysis indicates, for example, that the p-MOSFET and n-MOSFET regions (SiO$_2$/metal/SiO$_2$/Si/PI: ~0.05 µm/0.15 µm/0.05 µm/0.25 µm/1.2 µm) adopt periods between 160 and 180 µm and that the metal interconnects (SiO$_2$/metal/SiO$_2$/PI: ~0.05 µm/0.15 µm/0.05 µm/1.2 µm) adopt periods between 90 and 110 µm, all quantitatively consistent with experiment. FIG. 2B shows the results of full, three dimensional FEM modeling, together with a scanning electron micrograph of a sample. The correspondence is remarkably good, consistent with the deterministic, linear elastic response of these systems. (Slight differences are due to the sensitivity of the buckling patterns to the precise location and detailed shapes of the etch holes, and some uncertainties in the mechanical properties of the various layers.) Both the analytics and the FEM indicate that for $\epsilon_{pre}$ up to 10% and 0%<$\epsilon_{appl}$-$\epsilon_{pre}$<10% the material strains in the device layers remain below 0.4% and 1%, depending on the region of the circuit and the metal, respectively (FIG. 8). This mechanical advantage underlies the ability to achieve reversible stretchability/compressibility in systems that contain intrinsically brittle electronic materials such as SiO$_2$ and Si.

Figure 2C:
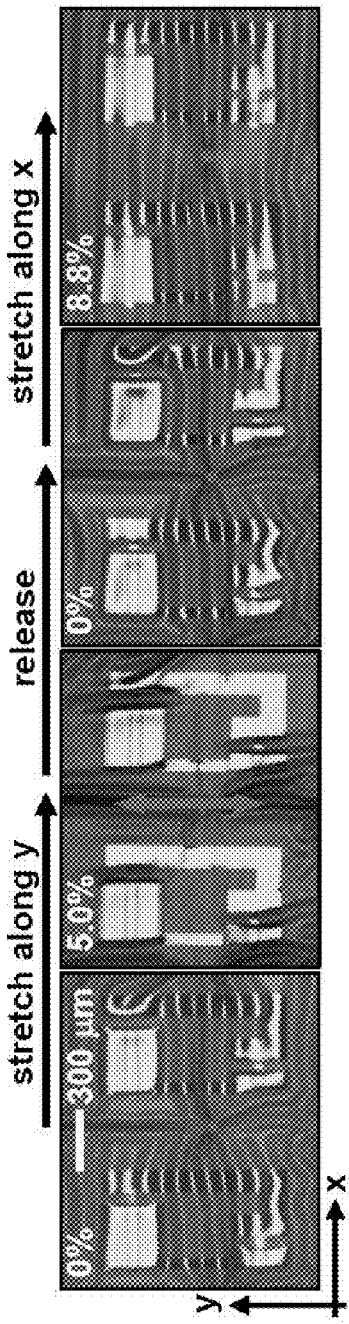
Figure 2D:
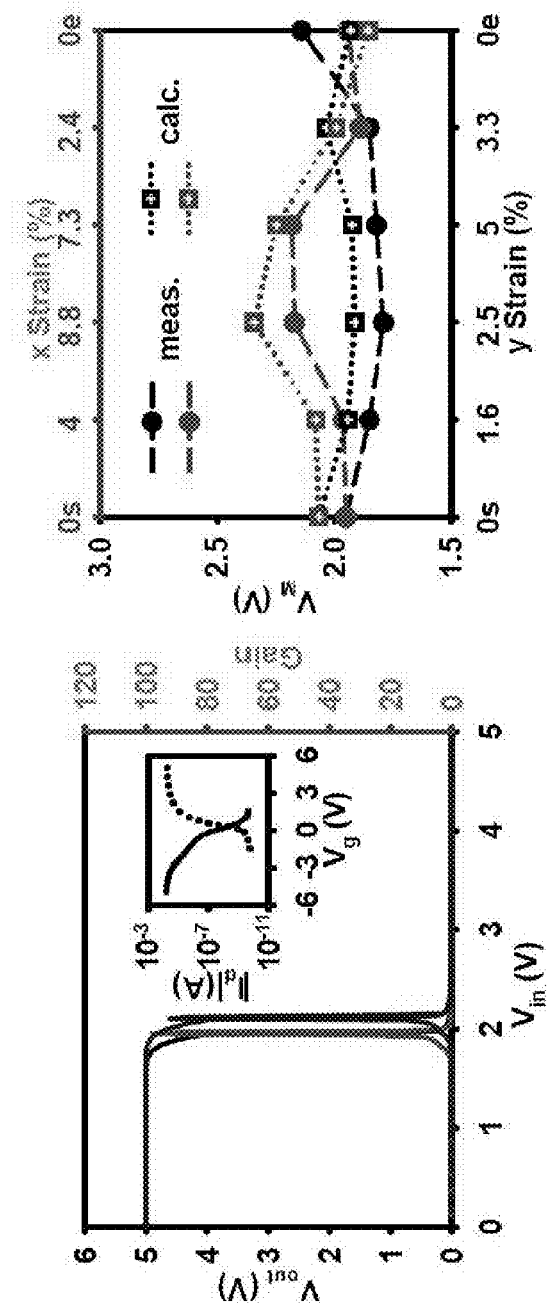
Figure 10A:
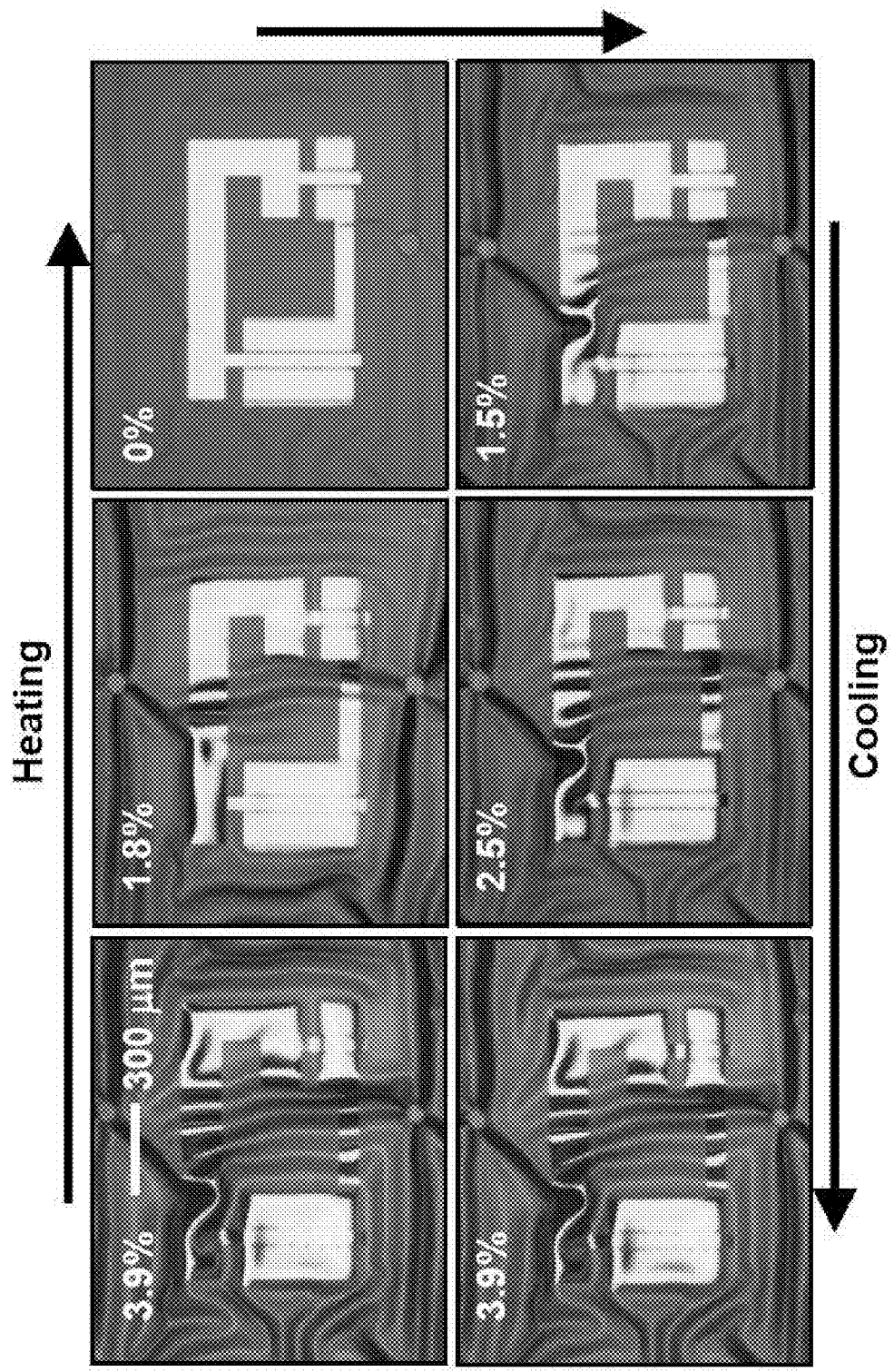
FIG. 10. (A) Optical images of fatigue tests. (B) Voltage transfer curves (left) and variation of gain values during the fatigue test.
Figure 10B:
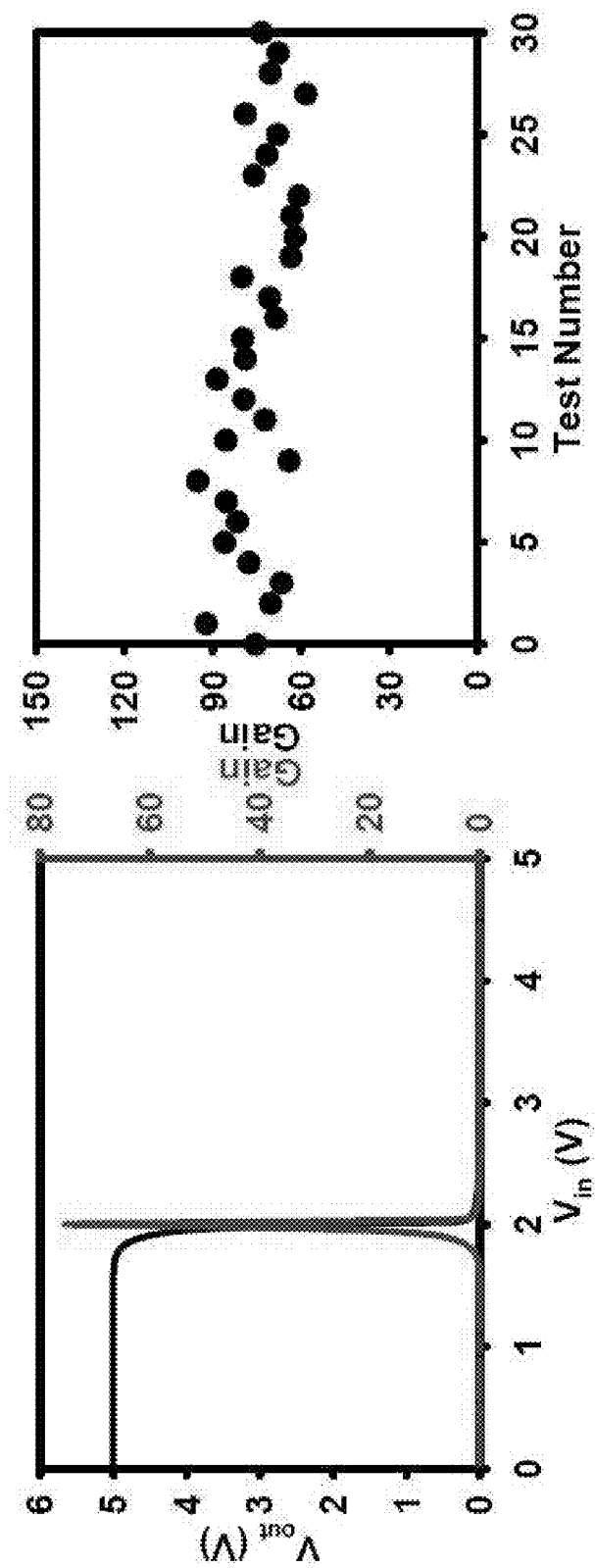

FIGS. 2C and D show images and electrical measurements of inverters under different tensile, uniaxial applied strains, for a wavy circuit fabricated with $\epsilon_{pre}$=3.9%. As might be expected, the amplitudes and periods of waves that lie along the direction of applied force decrease and increase, respectively, to accommodate the resulting strains (FIG. 9). The Poisson effect causes compression in the orthogonal direction, which leads to increases and decreases in the amplitudes and periods of waves with this orientation, respectively. Electrical measurements indicate that the Si-CMOS inverters work well, throughout this range of applied strains. The left frame of FIG. 2D shows measured and simulated transfer curves, with an inset graph that presents the electrical properties of individual n-MOSFET and p-MOSFET devices with channel widths (w) of 300 µm and 100 µm, respectively, to match current outputs, and channel lengths (L$_c$) of 13 µm. These data indicate effective mobilities of 290 cm$^2$/Vs, 140 cm$^2$/Vs for the n and p channel devices, respectively; the on/off ratios in both cases are >10$^5$. The gains exhibited by the inverters are as high as 100 at supply voltages (V$_{DD}$) of 5V, consistent with circuit simulations that use the individual transistor responses. The right frame of FIG. 2D summarizes the voltage at maximum gain, (V$_M$) for different $\epsilon_{appl}$ along x and y. Tensile strains parallel to the transistor channels (i.e. along y) tend to reduce the compressive strains associated with the wavy structures in these locations, thereby increasing and decreasing the currents from the n-MOSFETs and p-MOSFETs, respectively. Perpendicular tensile strains cause opposite changes, due to the Poisson effect. The results are decreases and increases in V$_M$ with parallel and perpendicular strains, respectively. Individual measurements of the transistors at these various strain states enable simulations of changes in the inverters (FIG. 9); the results, also included in the right frame of FIG. 2D, are consistent with experiment. The devices also show good behavior under mechanical/thermal cycling (up to 30 cycles) (FIG. 10).

Figure 3A:
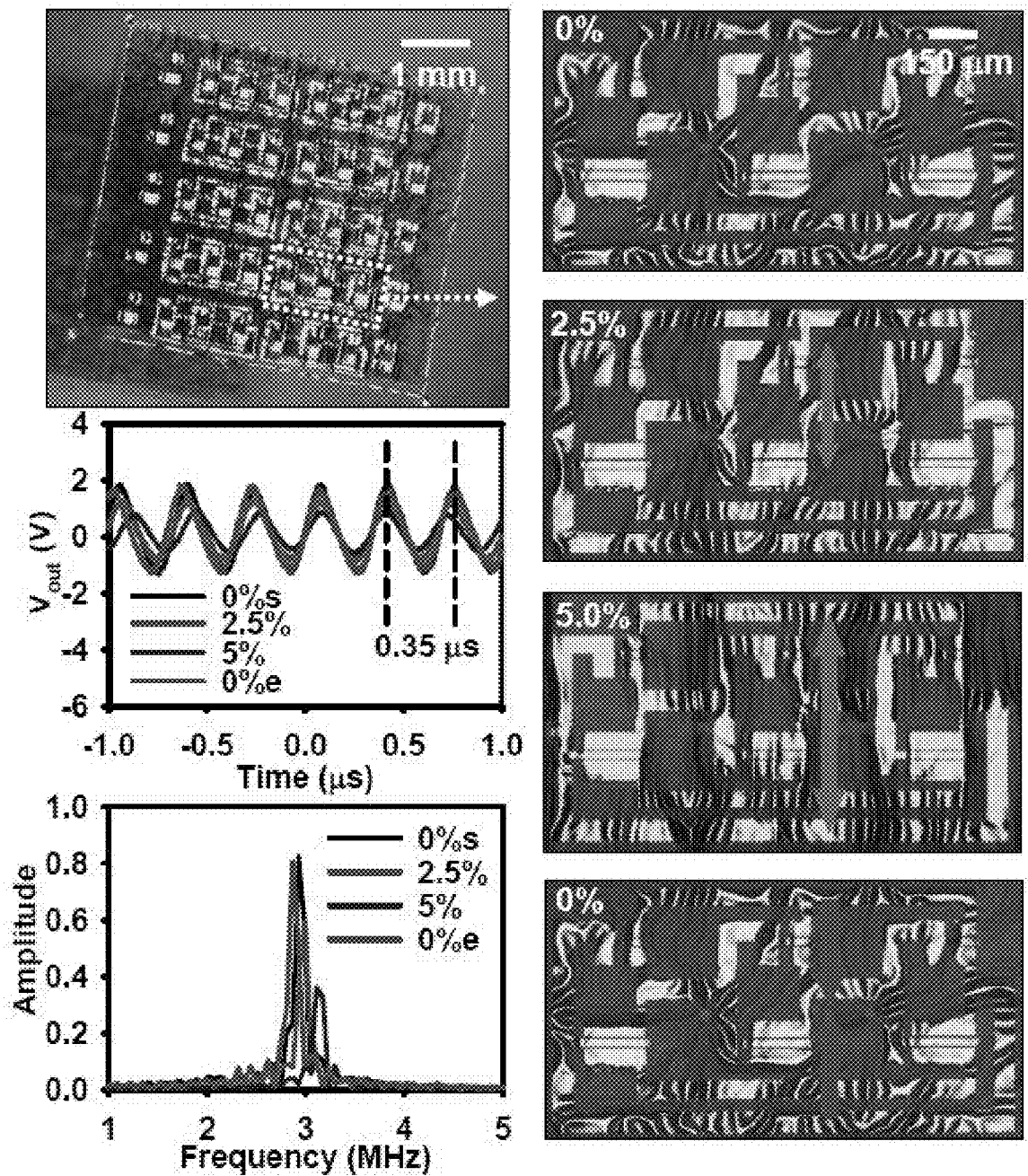
FIG. 3. (A) Optical image of an array of stretchable, wavy three stage CMOS ring oscillators (top left) and magnified views of a typical oscillator at different applied strains oriented along the direction of the red arrow (right frames). Measured time and frequency domain responses of an oscillator at different applied strains. (B) Circuit diagram of a differential amplifier (top left); output characteristics for various strain values (bottom left); optical images of a wavy differential amplifier in its as-fabricated state (top right) and under applied strain in a direction along the red arrow (bottom right).
Figure 3B:
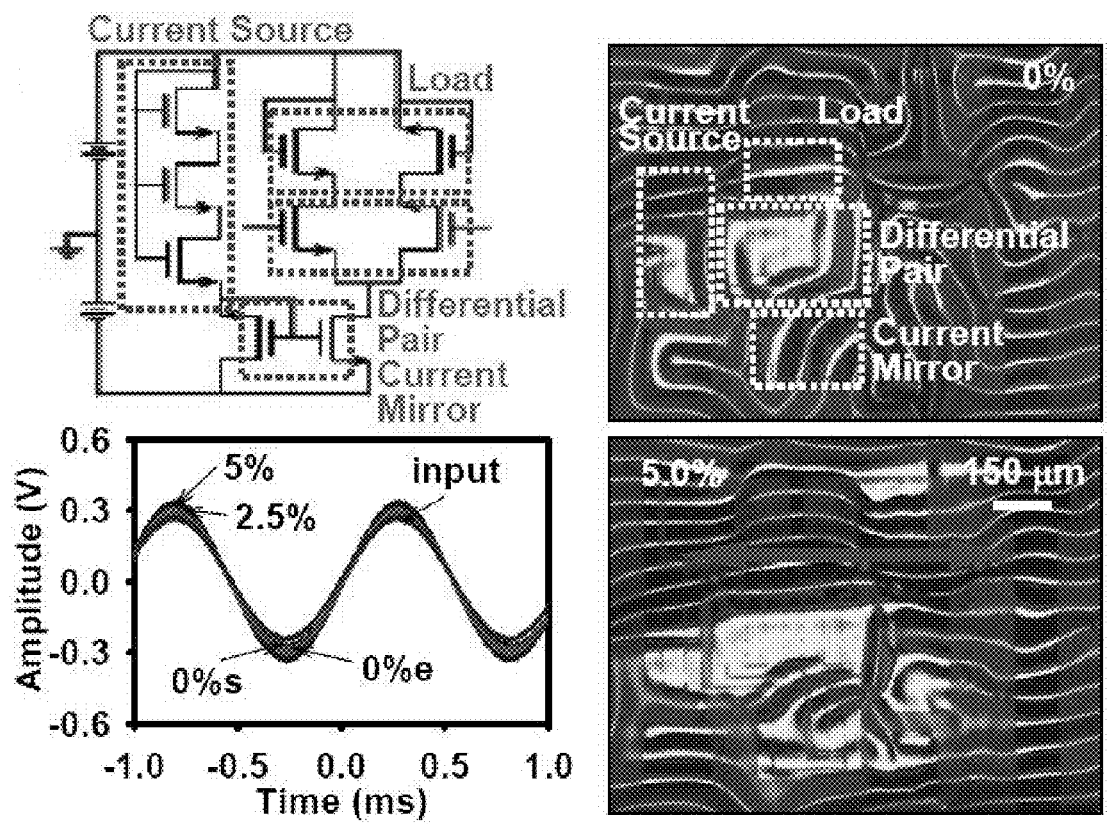
Figure 11:
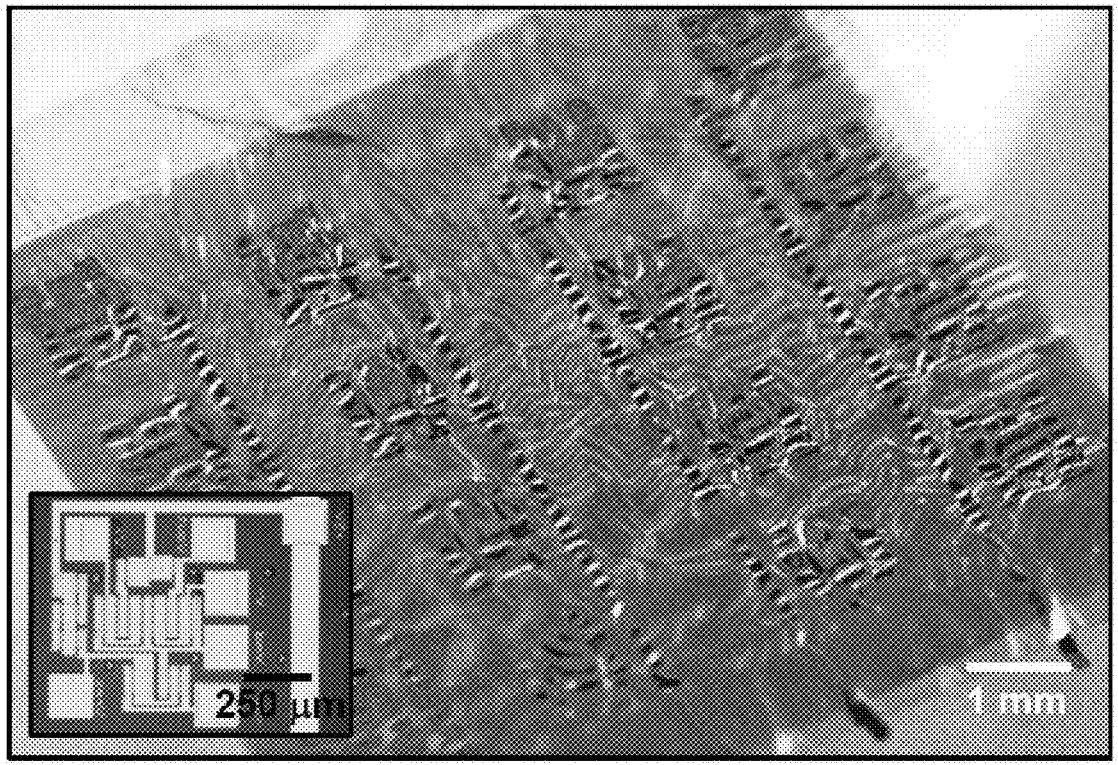
FIG. 11. Image of ultrathin wavy differential amplifiers; Magnified image of differential amplifier before applying strain (inset).
Figure 12A:
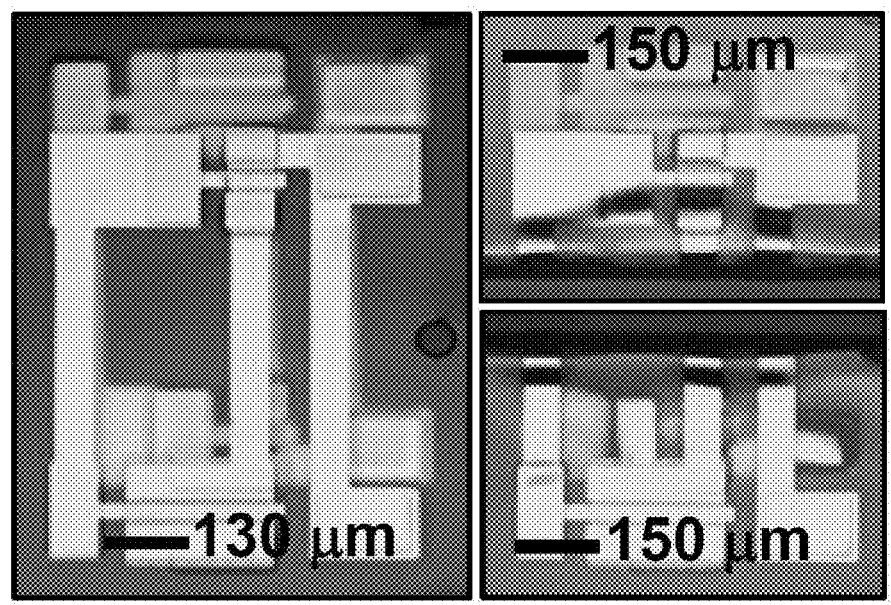
FIG. 12. (A) Magnified view of inverter before and after folding. (B) Voltage transfer characteristics of folded inverter. (C) Cross-sectional view of folded metal interconnect region. (D) Schematic wavy structure with neutral mechanical plane.
Figure 12B:
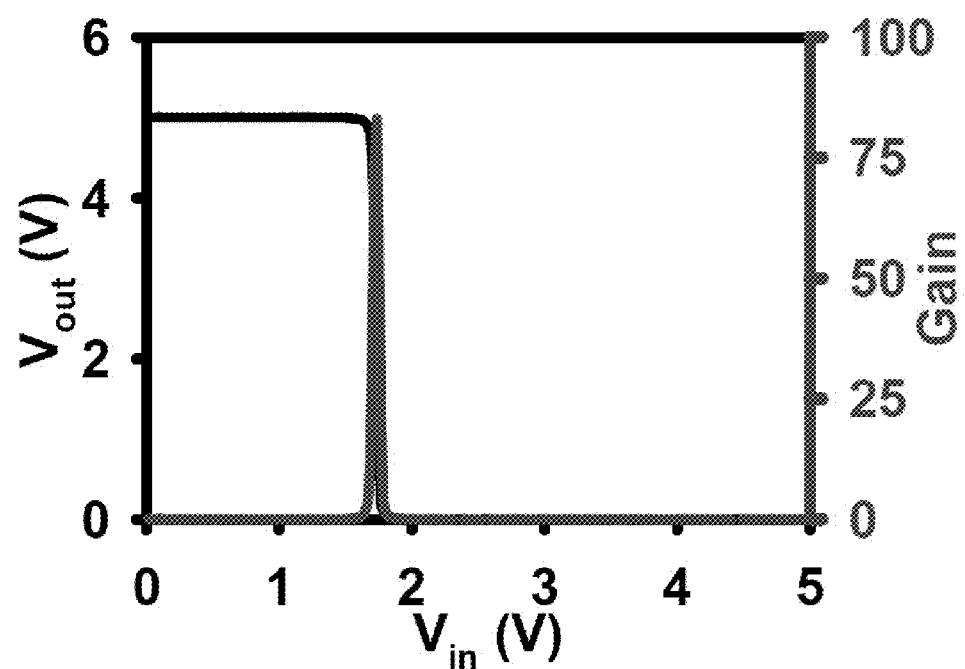
Figure 12C:
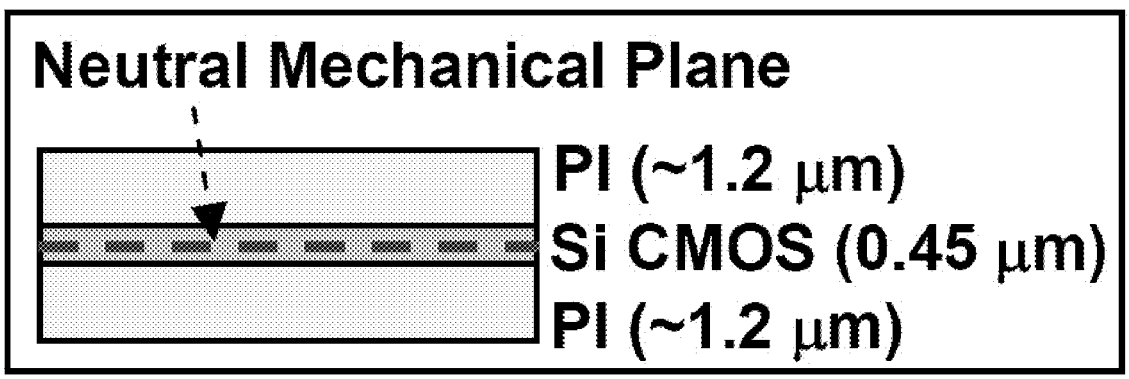
Figure 12D:
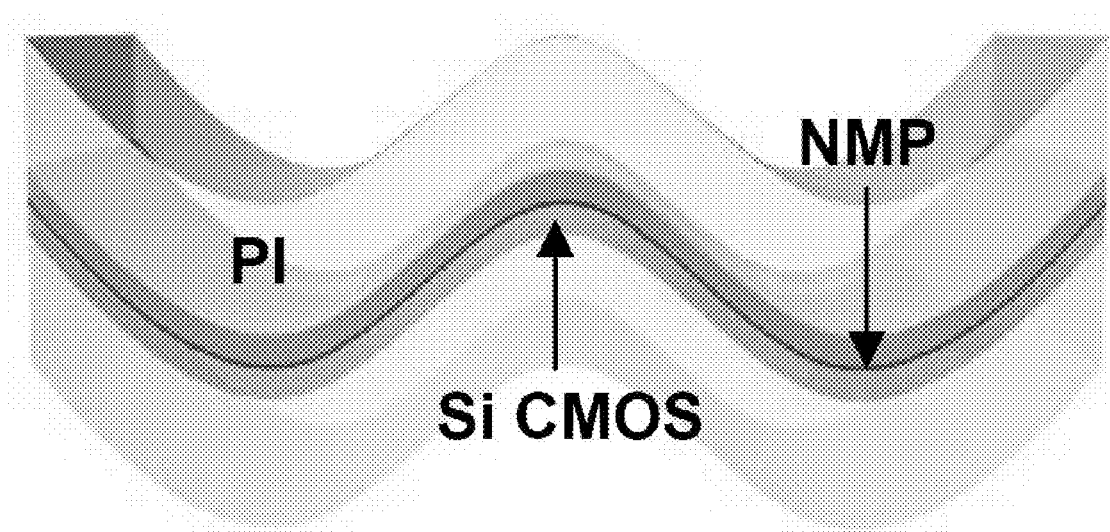

More complex stretchable circuits can be fabricated using these inverters as building blocks. FIG. 3A shows, for example, optical images, electrical measurements and stretching tests on Si-CMOS ring oscillators that use three inverters identical to those in FIG. 2. The mechanical responses are qualitatively consistent with considerations described in the discussion of the inverters. The electrical measurements indicate stable oscillation frequencies of ~3.0 MHz at supply voltages of 10 V, even under severe buckling deformations and strains of 5% and larger. We believe the oscillation frequency shows little change because variations in mobilities of the p and n channel devices effectively compensate one another, such that the delay through the inverter remains roughly the same. Other, more general, classes of circuits are compatible with the processes disclosed herein. FIG. 3B shows, as an example, a differential amplifier[22] for a structural health monitor that integrates four components: a current source (three transistors with L$_c$=30 µm and W=80 µm), a current mirror (two transistors with L$_c$=40 µm, W=120 µm and L$_c$=20 µm, W=120 µm), a differential pair (two transistors with L$_c$=30 µm and W=180 µm), and a load (two transistors with L$_c$=40 µm and W=80 µm). The right frame shows an optical image of the corresponding wavy circuit (FIG. 11). This amplifier is designed to provide a voltage gain of ~1.4 for a 500 mV peak-to-peak input signal. Measurements at various tensile strains along the red arrow show gains that vary by less than ~15%: 1.01 without applied strain (0% s; black), 1.14 at 2.5% strain (red), 1.19 at 5% strain (blue) and 1.08 after release (0% e; green).

Figure 4A:
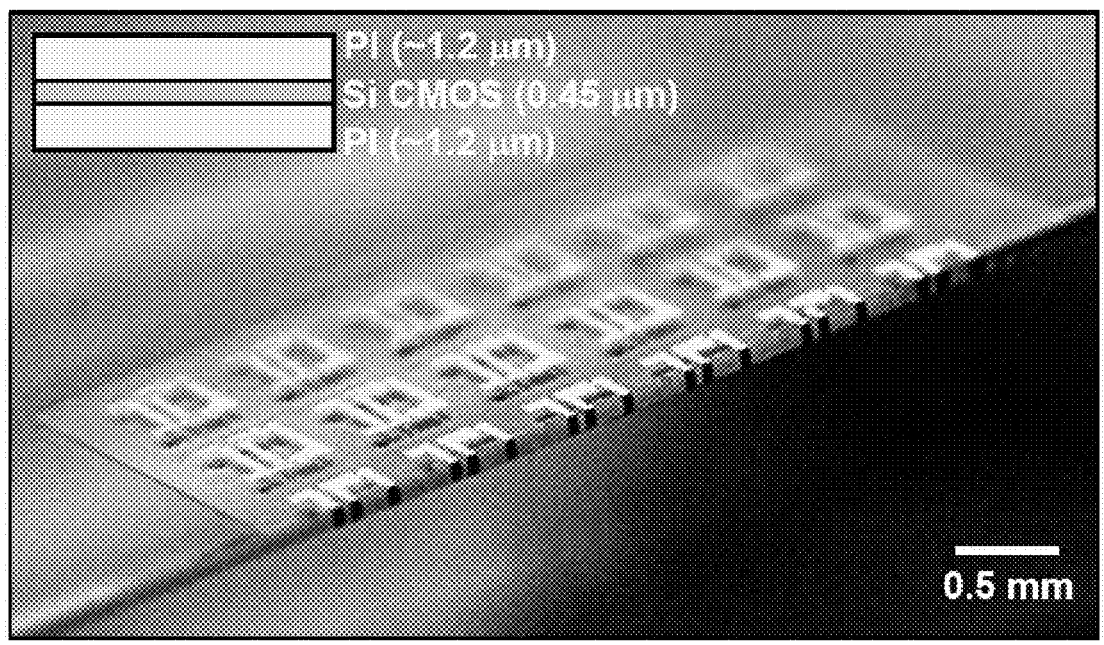
FIG. 4. (A) Image of a 'foldable' ultrathin Si-CMOS circuit that uses an encapsulating layer of PI, wrapped around the edge of a microscope cover slip. The inset shows a coarse cross sectional schematic view. (B) Images of twisted (top) and bent (bottom inset) wavy Si-CMOS circuit that uses a dual neutral plane design. The inset at the top shows a coarse cross sectional view. Optical micrographs of inverters at the center (bottom left) and edge (bottom right) of the sample in the twisted configuration shown in the top frame.
Figure 4B:
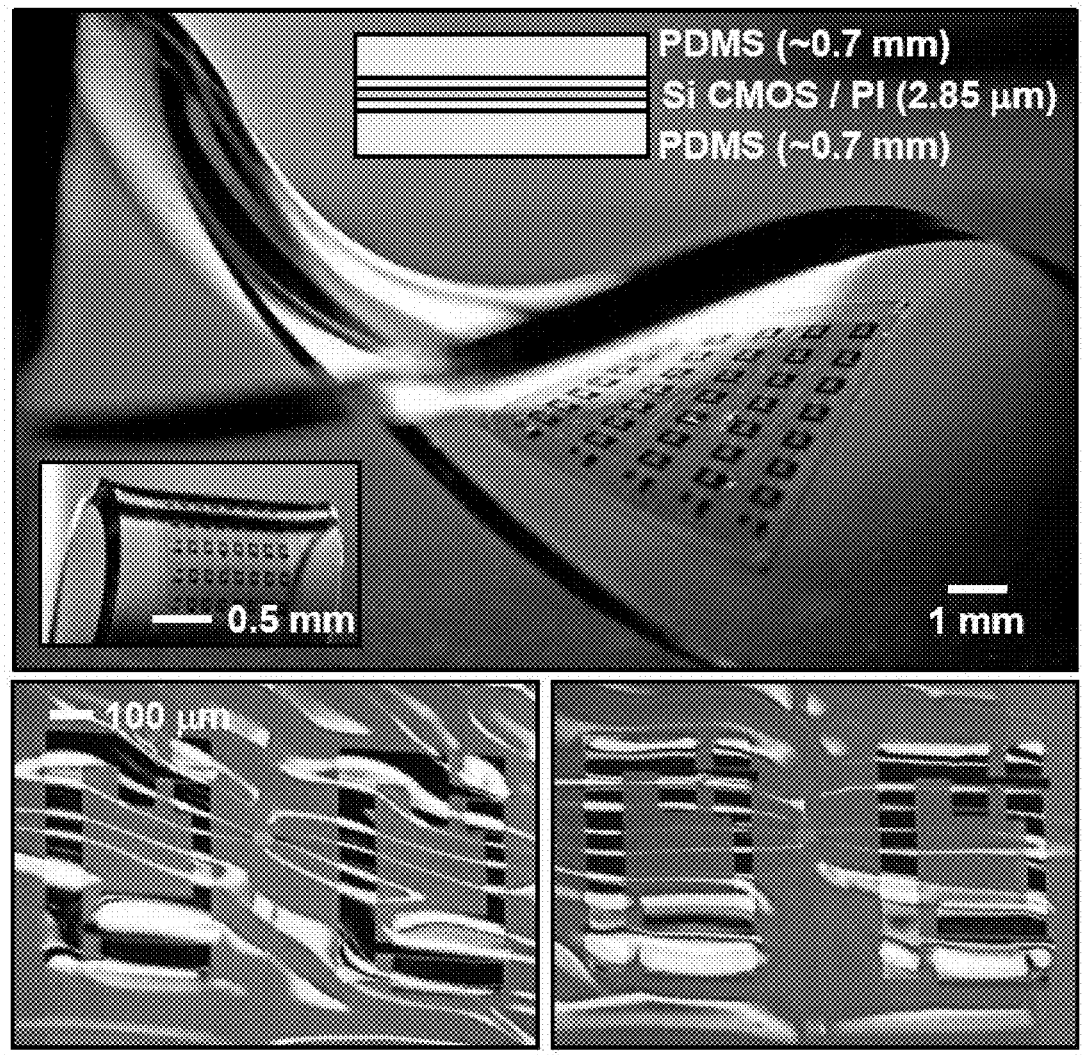

Although the ultrathin and wavy circuit designs described above provide unusually good mechanical properties, two additional optimizations provide further improvements. Dominant failure modes observed at high applied strains ($\epsilon_{appl}$-$\epsilon_{pre}$>~10%) or degrees of bending (r<~0.05 mm) are (i) delamination of the device layers and/or (ii) fracture of the metal interconnects. A design modification that addresses these failures involves the deposition of an encapsulating layer on top of the completed circuits. FIG. 4 illustrates a representative layout that includes a thin (~1.2 µm) layer of PI on top of an ultrathin Si-CMOS/PI circuit. The resulting systems are extremely bendable, which we refer to as 'foldable', as demonstrated in the PI/Si-CMOS/PI circuit tightly wrapped over the edge of a microscope cover slip (thickness ~100 µm) in FIG. 4A. Even in this configuration, the inverters are operational and exhibit good electrical properties (FIG. 12). Such foldability is enabled by two primary effects of the top PI layer: (i) its good adhesion and encapsulation of the underlying layers prevents their delamination and (ii) it locates the metal interconnects at the neutral mechanical plane without moving this plane out of the silicon layers in other regions of the circuits (FIG. 12). Such designs can also be incorporated in stretchable, wavy configurations to enable stretchability/compressibility. The stretchable system presents, however, another challenge. As mentioned previously, the bendability of the Si-CMOS/PI/PDMS is influenced strongly by the thickness of the PDMS. Systems that are both stretchable and highly bendable in this example require the use of thin PDMS. Relaxing the prestrain when using a thin PDMS substrate results in an unwanted, overall bowing of the system rather than the formation of wavy circuit structures. This response occurs due to the very low bending stiffness of thin PDMS, which in turn results from the combined effects of its small thickness and extremely low modulus compared to the PI/Si-CMOS/PI. Neutral mechanical plane concepts that involve the addition of a compensating layer of PDMS on top of the PI/Si-CMOS/PI/PDMS system, can avoid this problem. FIG. 4B illustrates this type of fully optimized, dual neutral mechanical plane layout (i.e. PDMS/PI/Si-CMOS/PI/PDMS), and its ability to be stretched and bent. The optical micrographs at the bottom left and right of FIG. 4B illustrate the various configurations observed under extreme twisting and stretching of this system.

The strategies presented in this example demonstrate the degree to which extreme mechanical properties (i.e. stretchability, foldability) can be achieved in fully formed, high performance integrated circuits by use of optimized structural configurations and multilayer layouts, even with intrinsically brittle but high performance inorganic electronic materials. In this approach, the desired mechanical properties are enabled by materials (e.g. PDMS, thin PI and their multilayer assemblies) that do not need to provide any active electronic functionality. Such designs offer the possibility of direct integration of electronics with biological systems, medical prosthetics and monitoring devices, complex machine parts, or with mechanically rugged, lightweight packages for other devices.

Example 1 References
1. R. Reuss, et al., *Proc. IEEE* 93, 1239 (2005).
2. T. Someya, T. Sekitani, S. Iba, Y. Kato, H. Kawaguchi, T. Sakurai, *Proc. Nat. Acad. Sci. USA* 101, 9966 (2004).
3. X. Lu and Y. Xia, *Nat. Nanotechnol.* 1, 161 (2006).
4. A. Dodabalapur, *Mater. Today* 9, 24 (2006).
5. B. Crone et al., *Nature* 403, 521 (2000).
6. Y. Sun and J. A. Rogers, *Adv. Mater.* 19, 1897 (2007).
7. W. Ming, B. Xiang-Zheng, J. C. Sturm, S. Wagner, *IEEE Electron Device Lett.* 49, 1993 (2002).
8. M. C. McAlpine, R. S. Friedman, S. Jin, K.-H. Lin, W. U. Wang, C. M. Lieber, *Nano Lett.* 3, 1531 (2003).
9. D. V. Talapin, C. B. Murray, *Science* 310, 86 (2005).
10. H. O. Jacobs, A. R. Tao, A. Schwartz, D. H. Gracias, G. M. Whitesides, *Science* 296, 323 (2002).
11. H.-C. Yuan, Z. Ma, M. M. Roberts, D. E. Savage, M. G. Lagally, *J. Appl. Phys.* 100, 013708 (2006).
12. J.-H. Ahn et al., *Science* 314, 1754 (2006).
13. T. Serikawa, F. Omata, *Jpn. J. Appl. Phys.* 39, 393 (2000).
14. S. P. Lacour, J. Jones, S. Wagner, T. Li, Z. Suo, *Proc. IEEE.* 93, 1459 (2005).
15. D. Y. Khang, H. Jiang, Y. Huang, J. A. Rogers, *Science* 311, 208 (2006).
16. Y. Sun, V. Kumar, 1. Adesida, J. A. Rogers, *Adv. Mater.* 18, 2857 (2006).
17. Y. Sun, J. A. Rogers, *J. Mater. Chem.* 17, 832 (2007).
18. E. Menard, K. J. Lee, D. Y. Khang, R. G. Nuzzo, J. A. Rogers, *Appl. Phys. Lett.* 84, 5398 (2004).
19. M. A. Meitl et al., *Nat. Mater.* 5, 33 (2006).
20. V. D. da Silva, *Mechanics and Strength of Materials* (Springer, New York, 2005).
21. H. Jiang et al., Proc. Natl. Acad. Sci. USA 104, 15607 (2007).
22. J.-H. Ahn et al., *Appl. Phys. Lett.* 90, 213501 (2007).
23. Y. Sun, W. M. Choi, H. Jiang, Y. Huang, J. A. Rogers, *Nat. Nanotechnol.* 1, 201 (2007).

Device Fabrication: The transistors use doped silicon nanoribbons for the semiconductor. The fabrication involves three steps. First, an n-type silicon-on-insulator (Si (260 nm)/SiO$_2$(1000 nm)/Si with doping of 2.7-5.2×10$^{15}$ cm$^{-3}$, SOI wafer (SOITEC, France) is lightly doped with Boron via a spin-on-dopant (B153, Filmtronics, USA) at a diffusion temperature around 550~600° C. to define p-wells. SiO$_2$ (~300 nm) formed by plasma enhanced chemical vapor deposition (PECVD) was used as a diffusion mask. For this lithography procedure, AZ5214 photoresist (Clariant, USA) was spin coated at 3000 rpm for 30 sec. Next, highly doped p-type source/drain electrodes are formed beside the p-wells using the same Boron spin-on-dopant, this time at a temperature of 1000~1050° C. Then, heavily doped n-type source and drain regions are defined inside the p-well with Phosphorous spin-on-dopant (P509, Filmtronics, USA) at 950° C. by using the same diffusion mask and photolithography procedure. After doping, the desired structure of Si ribbons is defined by lithographic and dry etching steps with a SF$_6$ plasma (Plasmatherm RIE system, 40 Sccm SF$_6$ flow with a chamber pressure of 50 mTorr, 100 W rf power for 30 s.). The underlying SiO$_2$ is removed by concentrated (49%) HF to release thin semiconductor ribbons. These released Si ribbons can then be transferred in organized arrays from the SOI wafer to the carrier wafer coated with thin layers of PMMA (MicroChem, USA) (~100 nm, spin coat at 3000 rpm for 30 s) and poly(amic acid), precursor of PI [Poly(amic acid), Sigma Aldrich] (~1.2 µm, spin coat at 4000 rpm for 60 sec) using an elastomeric stamp as the transfer element. After complete curing of PI at 300° C. for 1~1.5 h, the active regions of the devices are isolated by SF$_6$ plasma and a thin gate oxide of SiO$_2$ (~50 nm) is deposited with PECVD. The PECVD SiO$_2$ on the source/drain contact regions is then removed by RIE or buffered oxide etchant through openings in a layer of photoresist pattern by photolithography. Cr/Au (~5 nm/~145 nm) for source, drain and gate electrodes and metal interconnects are deposited with e-beam evaporation and then are patterned by photolithography and wet etching. A uniform layer SiO$_2$ (~50 nm) is deposited by PECVD to form a passivation layer. Etching away this layer for contact windows enables electrical contact with the devices and circuits, to complete the fabrication.

Removal of Ultrathin Circuit Sheets and Integration in Wavy Layouts on PDMS: After circuit fabrication, an array of holes, whose radius is 30 µm and distance is 800 µm, is defined in nonfunctional areas, to expose the underlying PMMA to acetone. Immersion in acetone removes the sacrificial PMMA layer to free an ultrathin circuit with PI substrate from the carrier substrate. Such a circuit can either be used in a free-standing form, or it can be manipulated and transferred to another substrate by use of transfer printing techniques. For formation of stretchable, wavy layouts, the circuit is transferred to an elastomeric substrate of PDMS, typically pre-strained biaxially by thermal expansion. To enhance adhesion between the circuit and PDMS, thin layers of Cr (~3 nm) and SiO$_2$ (~30 nm) are deposited on the bare PI at the opposite side of active devices. Surface activation can be accelerated by exposure to UV/ozone for 3 min. Strong chemical bonding can then be accomplished by reacting —OH groups on this SiO$_2$ layer with those on the surface of the thermally pre-strained PDMS. After transfer printing onto the pre-strained PDMS, the natural cooling can make PDMS and ultrathin devices shrink and wavy structure will be formed.

Stretching Test and Measurement: Stretching tests are performed with mechanical bending stages that are capable of applying uniaxial tensile or compressive strains in any direction. These stages mount directly in electrical probing stations that are coupled with semiconductor parameter analyzers (Agilent, 5155C).

Measurement of Profile: In order to measure the wavelength and amplitude, a surface profiler (Sloan Dektak$^3$) was used. A diamond stylus which is in contact with a sample surface moves and follows the profile of sample surface and measures physical surface variation at different positions.

Fatigue Test: To evaluate the performance of wavy circuit under repetitive stretching and releasing, multiple cycling of heating and cooling test was performed. The wavy circuit was heated 160° C. for 5 minutes and then cooled down for 10 minutes before each electrical measurement.

Figure 64:
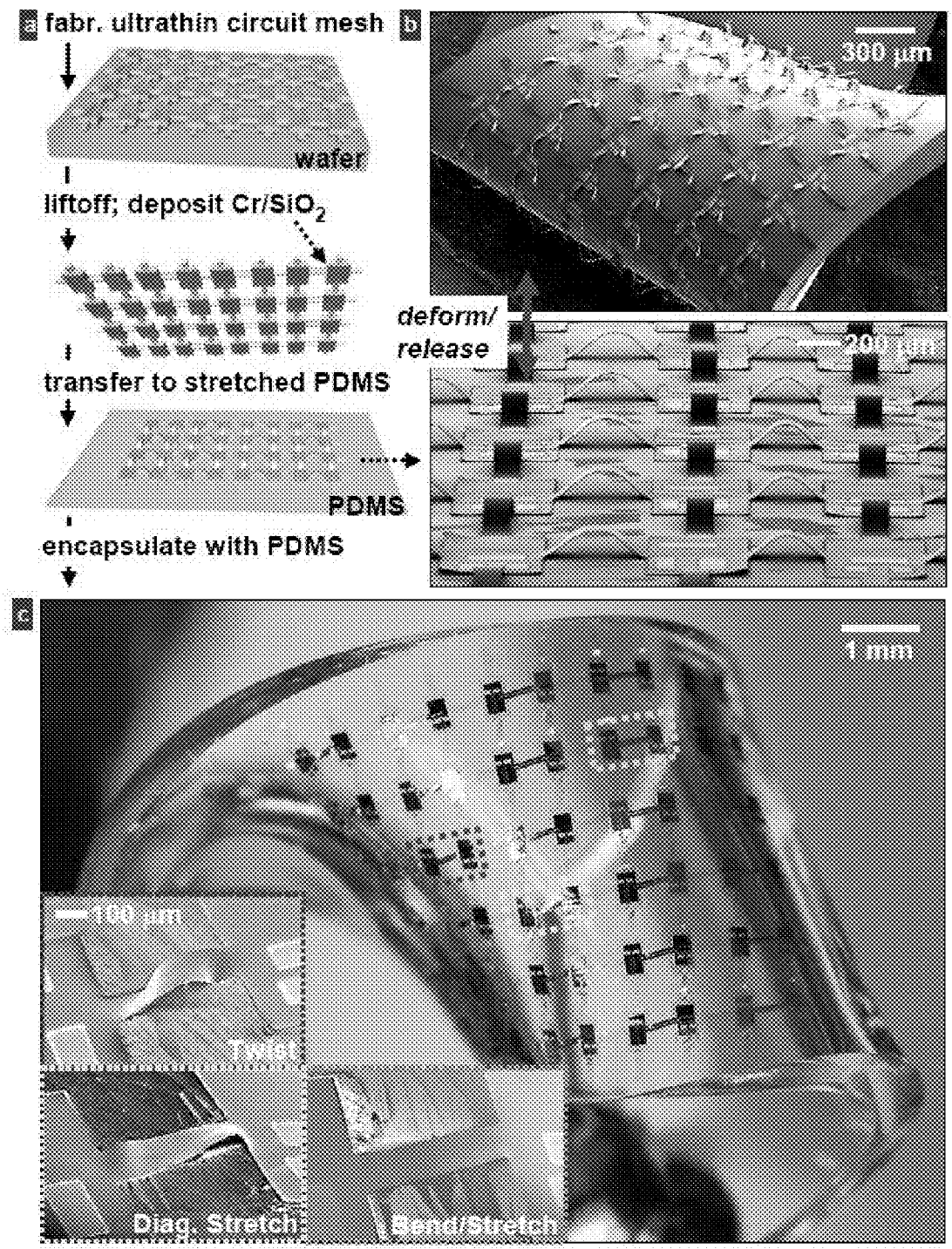
FIG. 64. (a) Schematic overview of the fabrication process for representative circuits that accomplish high levels of stretchability through the use of non-coplanar mesh designs integrated with elastomeric substrates (For the case shown here, poly(dimethylsiloxane); PDMS). (b) SEM images of an array of CMOS inverters that result from this process, in an undeformed state (bottom; ~20% prestrain) and in a configuration corresponding that results from a complex twisting motion (top). (c) Optical image of a freely deformed stretchable array of CMOS inverters, highlighting three different classes of deformation: diagonal stretching, twisting and bending. The insets provide SEM images for each case (colorized for ease of viewing). (d) is a close-up view of the device configuration.
Figure 64D:
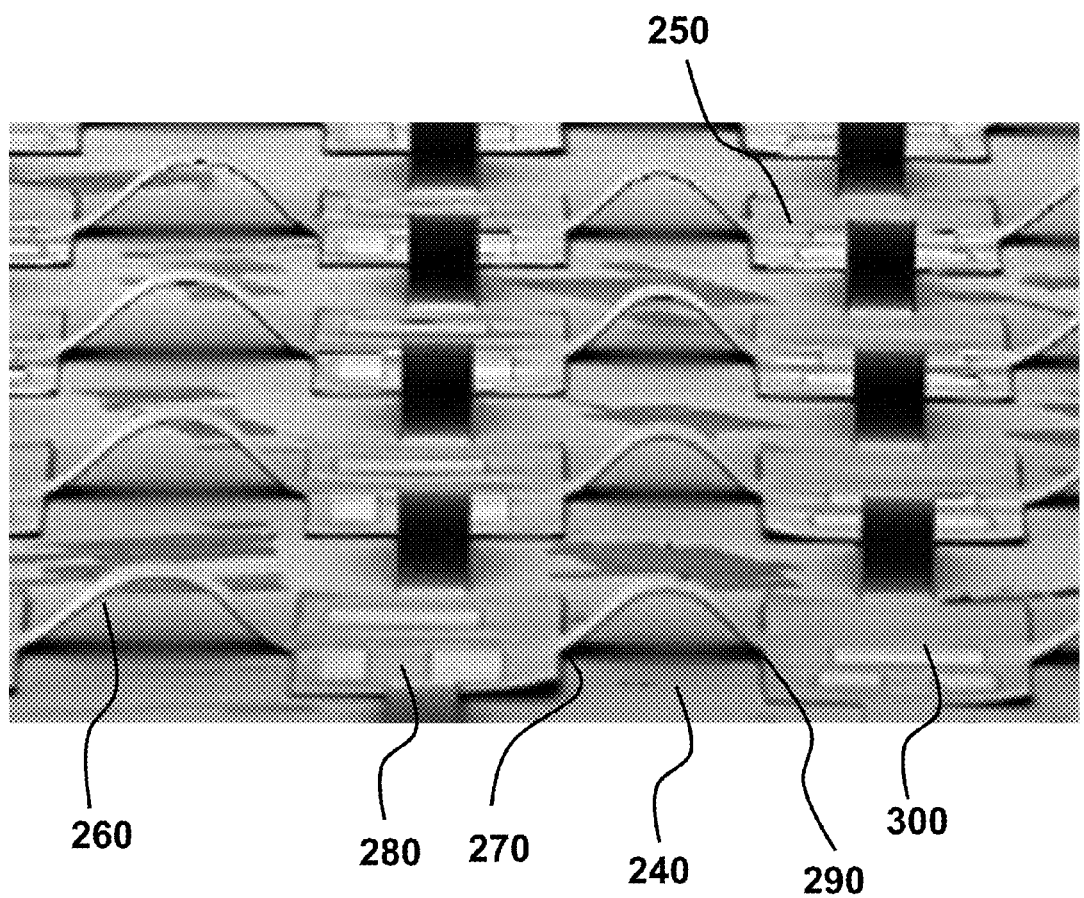

Neutral Mechanical Plane of Multilayer Stacks: The neutral mechanical plane or NMS defines the position where the strains are zero. FIG. 7B shows the multilayer stacks with the 1st layer on top and nth layer at the bottom. In an aspect, the different layers include a support layer 200, a functional layer 210, a neutral mechanical surface adjusting layer 220 and an encapsulation layer 450 with a resultant neutral mechanical surface 230 that is, in this example, coincident with the functional layer 210. In an aspect, the functional layer comprises flexible or elastic device regions 240 and relatively mechanically rigid island regions 250 (see, e.g., FIG. 64). Referring to FIG. 64, an array of nanoribbons 260 having a first end 270 connected to a first rigid region 280 and a second end 290 connected to a second rigid region 300 provides additional device stretchability, foldability and bendability.

With respect to positioning of the neutral mechanical surface 230 (indicated by the dashed line), each layer's (plane-strain) moduli and thicknesses are denoted by $\bar{E}_1, \ldots \bar{E}_n$ and $h_1, \ldots h_n$, respectively. The neutral plane is characterized by the distance b from the top surface, and b is given by:

$$b = \frac{\sum_{i=1}^{n} \bar{E}_i h_i \left[ \left( \sum_{j=1}^{i} h_j \right) - \frac{h_i}{2} \right]}{\sum_{i=1}^{n} \bar{E}_i h_i}. \tag{1}$$

Figure 7A:
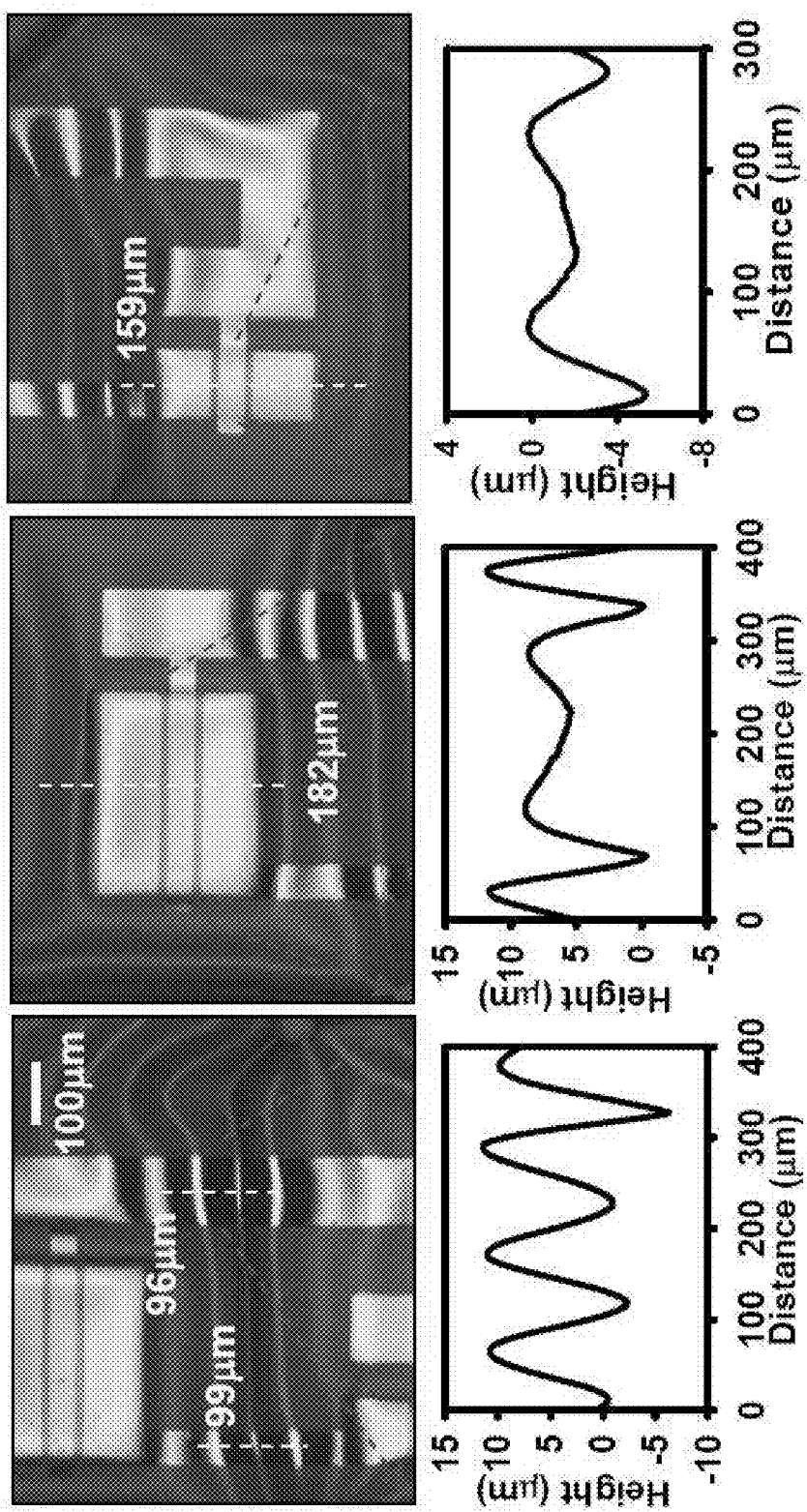
FIG. 7. (A) Wavelength and amplitude measurement of wavy ultrathin devices using surface profilometry (Sloan Dektak[3]); thin metal electrode part (left), thick device part for pmos (center) and nmos (right). (B) Schematic diagram of multilayer stacks. (C) and (D) Positions of the neutral plane for p-MOSFET and n-MOSFET regions and the metal interconnect. (E) and (F) Positions of the neutral plane for p-MOSFET and n-MOSFET regions and the metal interconnect with PI capping layer.

For the p-MOSFET and n-MOSFET regions (n=5, SiO$_2$/metal/SiO$_2$/Si/PI: ~0.05 μm/0.15 μm/0.05 μm/0.25 μm/1.2 μm, see the center and right figures in FIG. 7A), FIG. 7C shows the position of the neutral plane. Their elastic moduli and Poisson's ratios are $E_{SiO_2}$=70 GPa, $v_{SiO_2}$=0.17, $E_{metal}$=78 GPa, $v_{metal}$=0.44, $E_{Si}$=130 GPa, $v_{Si}$=0.27, $E_{PI}$=2.5 GPa, and $v_{PI}$=0.34. FIG. 7D shows the position of the neutral plane for the metal interconnect (n=4, SiO$_2$/metal/SiO$_2$/PI: ~0.05 μm/0.15 μm/0.05 μm/1.2 μm) corresponding to the left figure in FIG. 7A.

Figures 7E, 7F:
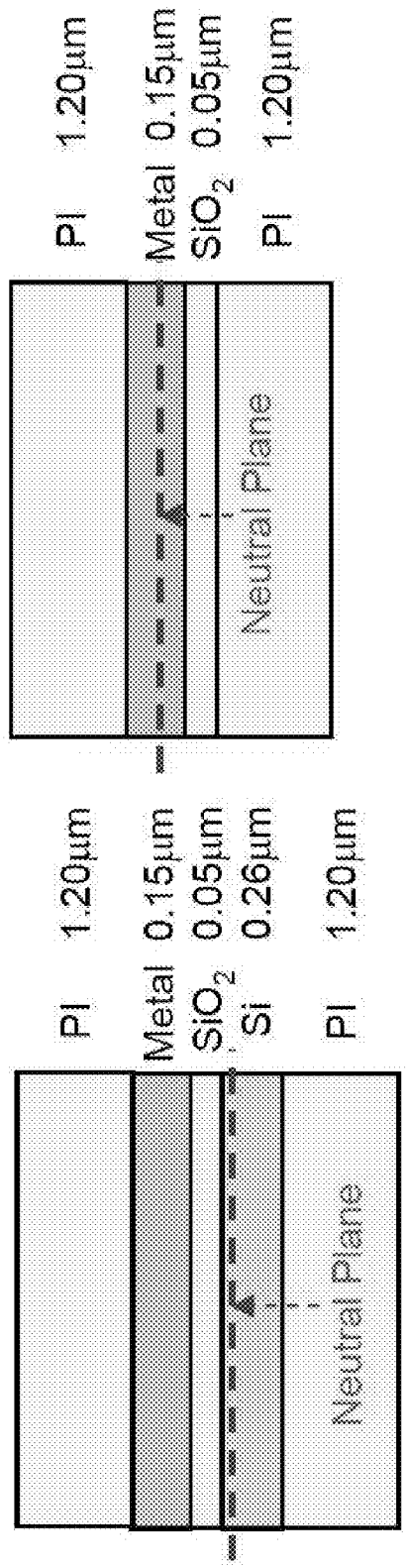
Figure 9A:
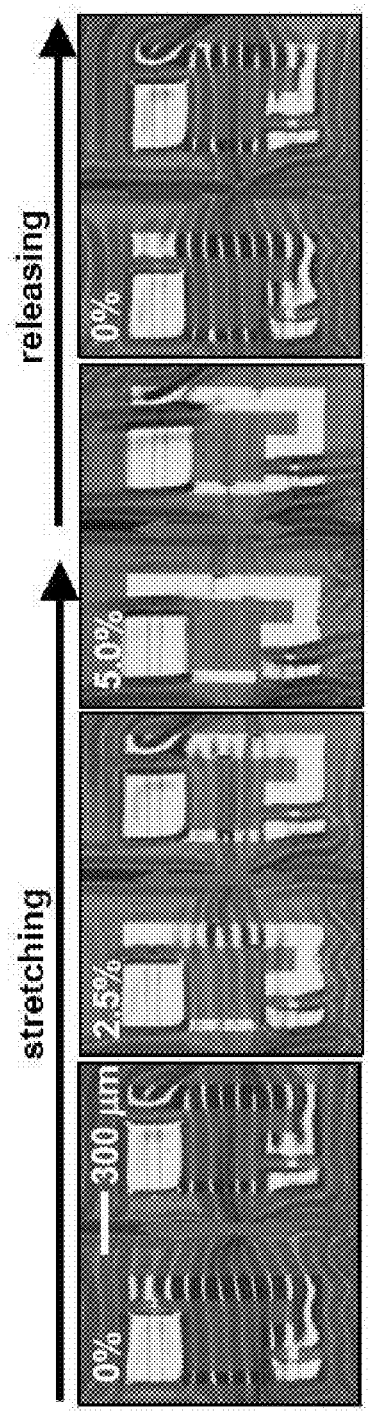
FIG. 9. (A) Optical images for stretching tests in the y direction. (B) Optical images for stretching tests in the x direction. (C) transfer curves and mobility changes for NMOS (left) and PMOS (right) devices at different applied strain values. (D) IV curves for NMOS (left) and PMOS (right) at 0% strain; solid lines are for measurement and dot lines are for simulation.
Figure 9B:
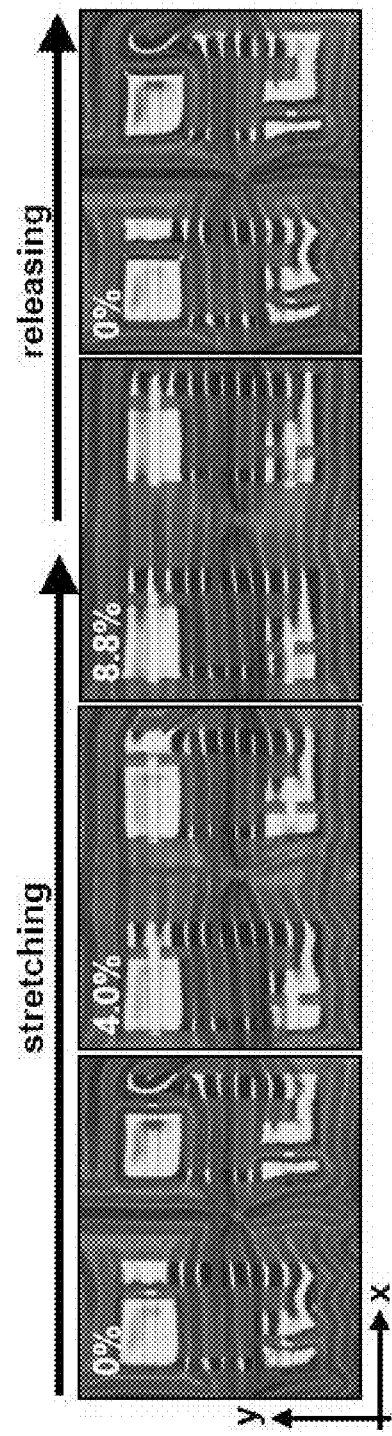
Figure 9C:
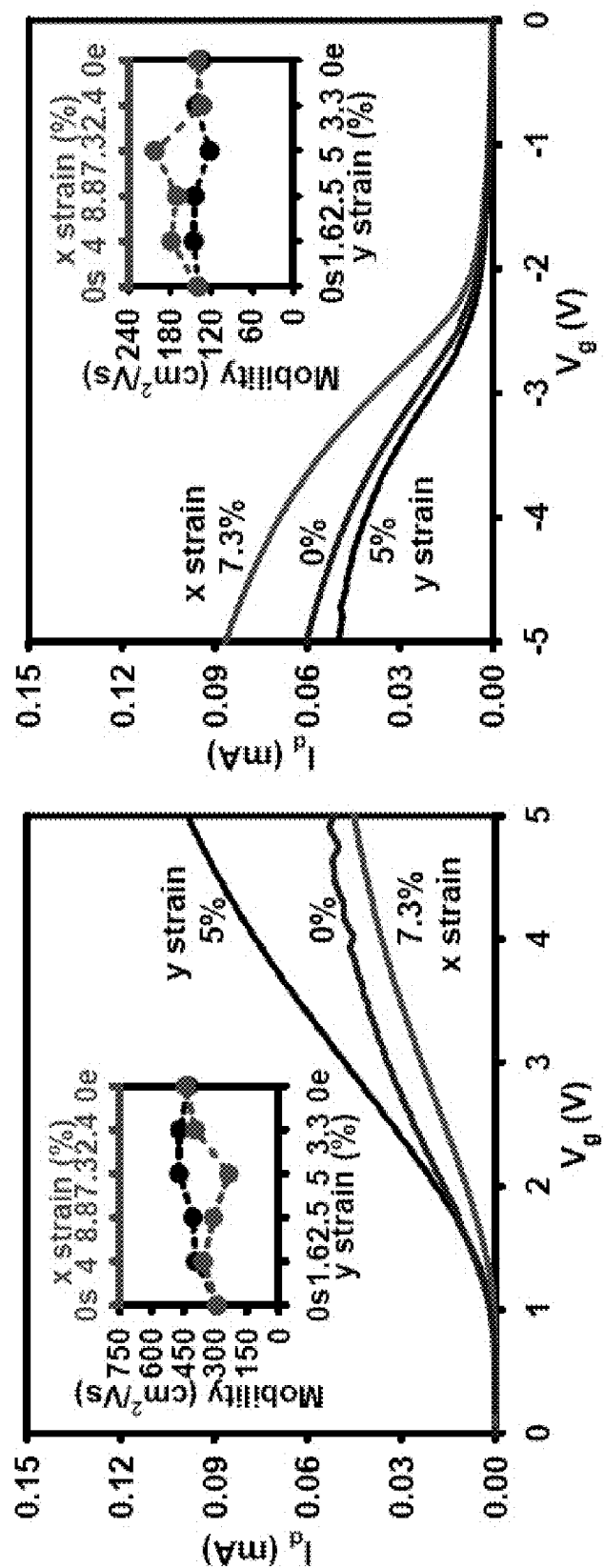
Figure 9D:
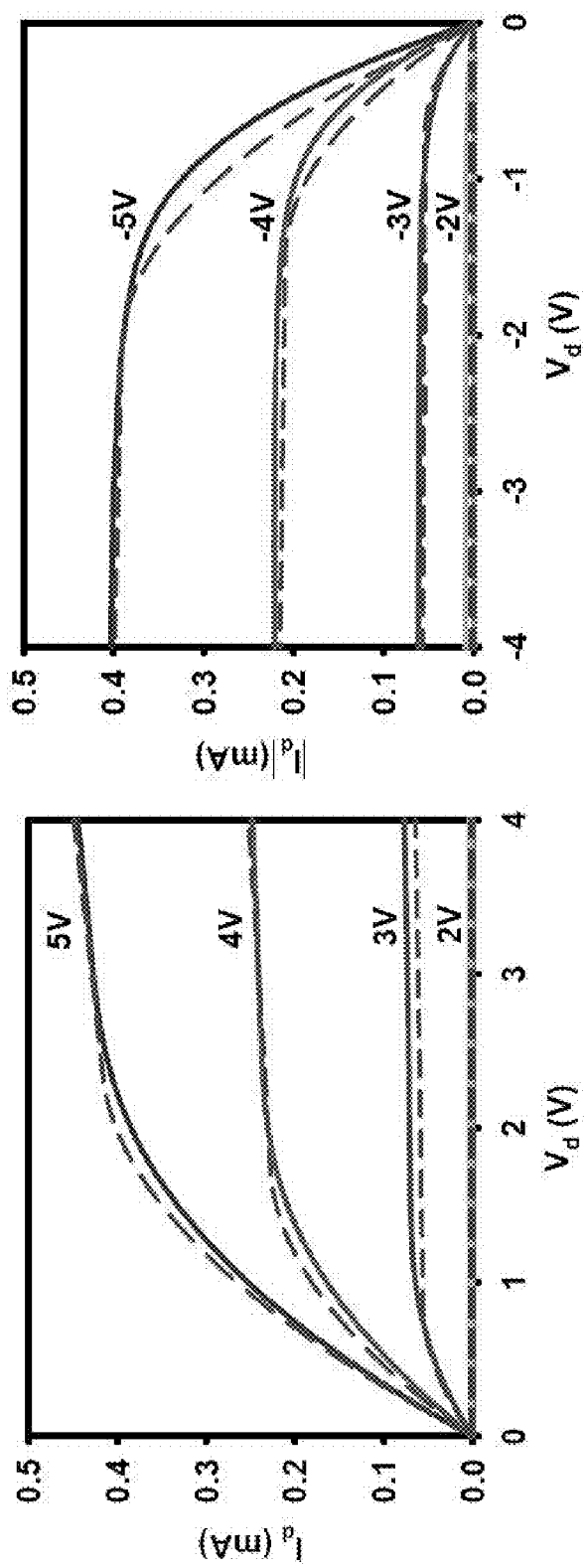

For the Si-CMOS sandwiched by the PI layers shown in FIG. 4A, FIG. 7E shows the position of the neutral plane for the p-MOSFET and n-MOSFET regions (n=5, PI/metal/SiO$_2$/Si/PI: ~1.2 μm/0.15 μm/0.05 μm/0.25 μm/1.2 μm). The top PI capping layer moves the neutral mechanical plane towards the SiO$_2$/Si interface, and therefore reduces the device failure of delamination. FIG. 7F shows the position of the neutral plane for the metal interconnect (n=4, PI/metal/SiO$_2$/PI: 1.2 μm/0.15 μm/0.05 μm/1.2 μm). The top PI capping layer moves the neutral mechanical plane towards the center of the metal layer, and therefore reduces the failure of metal interconnect. The thickness of the top PI capping layer can be optimized to reduce the delamination of device layers and fracture of metal interconnect.

Buckling Wavelengths and Amplitudes of the Wavy Systems. Equivalent tension and bending rigidities: The multilayer stacks are modeled as a beam. Its equivalent tension rigidity is:

$$\overline{Eh} = \sum_{i=1}^{n} \bar{E}_i h_i, \tag{2}$$

where the 1st layer is on top and the nth layer is at the bottom as shown in FIG. S8a, and their moduli and thicknesses are denoted by $\bar{E}_1, \ldots \bar{E}_n$ and $h_1, \ldots h_n$, respectively. The equivalent bending rigidity is given by:

$$\overline{EI} = \sum_{i=1}^{n} \bar{E}_i h_i \left( b - \sum_{j=1}^{i} h_j \right)^2 + \sum_{i=1}^{n} \bar{E}_i h_i^2 \left( b - \sum_{j=1}^{i} h_j \right) + \frac{1}{3} \sum_{i=1}^{n} \bar{E}_i h_i^3, \tag{3}$$

where b is the distance of the neutral mechanical plane to the top surface given in Eq. (1).

Metal interconnect on PDMS substrate: The equivalent tension rigidity $\overline{Eh}$ and bending rigidity $\overline{EI}$ of the metal interconnect are obtained from Eqs. (2) and (3) for n=4 (SiO$_2$/metal/SiO$_2$/PI). The PDMS substrate is modeled as a semi-infinite solid since its thickness is about 4 orders of magnitude thicker than the metal interconnect. FIG. 5 (left figure) shows that the buckling pattern is mainly one dimensional, and therefore the out-of-plane displacement can be represented by w=A cos(kx$_1$), where x$_1$ is the coordinate along the direction of interconnect, and the amplitude A and wave number k are to be determined by the minimization of total energy of the system, which consists of the bending and membrane energy of the thin film and the strain energy in the substrate. This gives the analytical expression of wave number and amplitude as $$k = \sqrt{\frac{\overline{Eh}}{12\overline{EI}}} \left[ 3\bar{E}_s / \overline{Eh} \sqrt{\frac{\overline{Eh}}{12\overline{EI}}} \right]^{1/3}, \tag{4}$$

$$A = \sqrt{\frac{12\overline{EI}}{\overline{Eh}}} \sqrt{\frac{\varepsilon_{pre}}{\varepsilon_c} - 1},$$

where $\bar{E}_s$ is the plane-strain modulus of the substrate, $\epsilon_{pre}$ is the equi-biaxial prestrain, and $$\varepsilon_c = \frac{1}{6} \left[ 3\bar{E}_s / \overline{Eh} \sqrt{\frac{\overline{Eh}}{12\overline{EI}}} \right]^{2/3}$$

is the critical buckling strain. For the PDMS modulus $E_s$=1.8 MPa and Poisson's ratio $v_s$=0.48, the wavelength in Eq. (4) is 96 μm, which agrees well with experiments (~100 μm).

The maximum strain in the metal interconnect is the sum of membrane strain and bending strain induced by the buckled geometry. FIG. 8A shows the maximum strains in different device layers versus the prestrain. The material strains in metal and SiO$_2$ layers are below 1% even for the 10% prestrain.

p-MOSFET and n-MOSFET on PDMS substrate: The p-MOSFET and n-MOSFET regions (SiO$_2$/metal/SiO$_2$/Si/PI, n=5) are next to the non-metal regions (SiO$_2$/SiO$_2$/PI, n=3) as illustrated in FIG. 8. Their buckling is coupled and therefore rather complex. Within each region the out-of-plane displacement has its own wavelength and amplitude, and across the regions the displacement and rotation are continuous. The minimization of total energy, which consists of the bending and membrane energy of the thin film and the strain energy in the substrate, gives the wavelengths and amplitudes in all regions. The wavelength in the p-MOSFET and n-MOSFET regions is about 140 μm, which agrees reasonably well with experiments (~180 μm).

FIG. 8B shows the maximum strains in different device layers versus the prestrain. The material strains in metal, $SiO_2$ and Si layers are below 0.5% even for 10% prestrain such that the circuits are stretchable.

Figure 13:
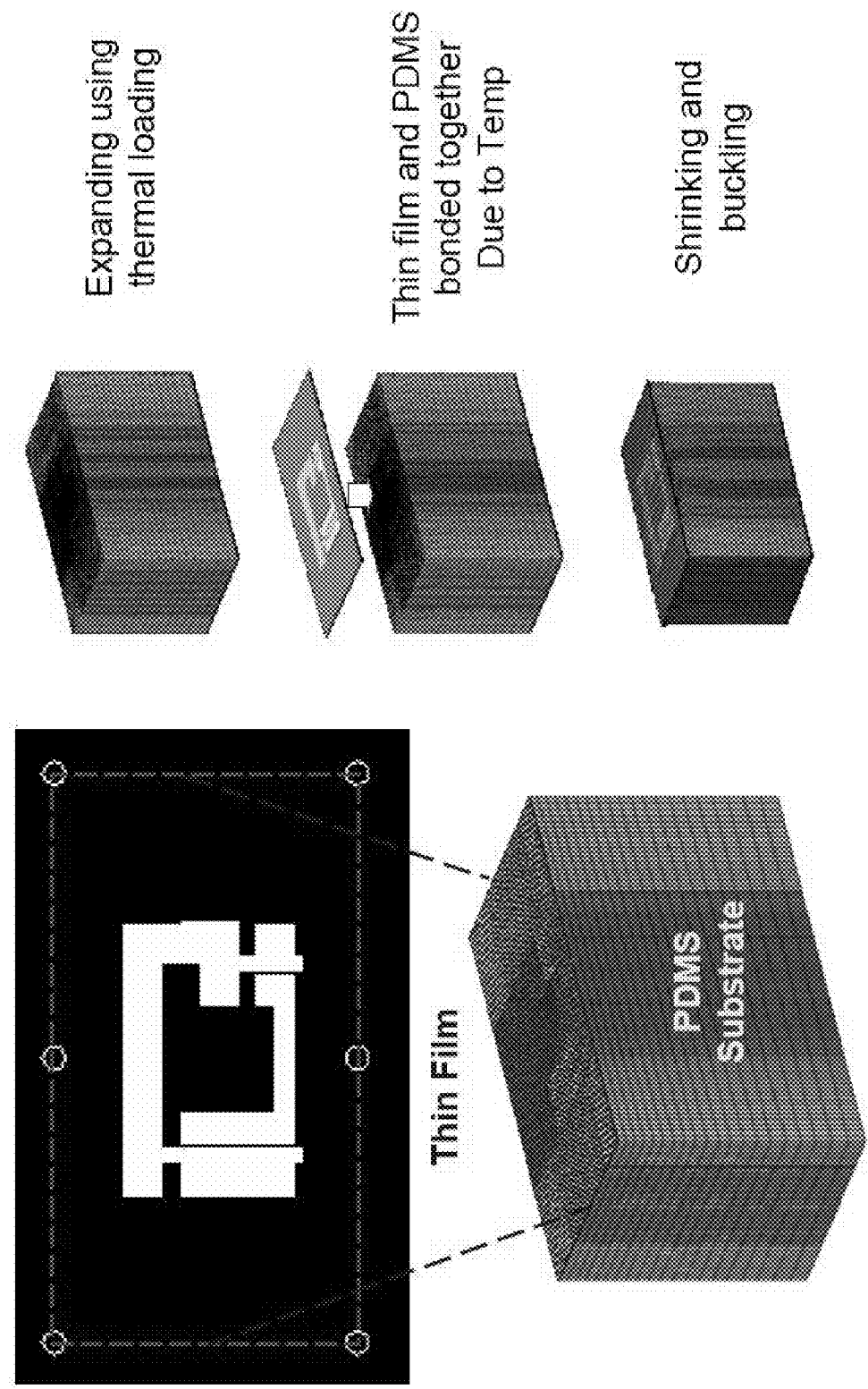
FIG. 13. Finite element simulation modeling and process.

Finite Element Simulations: Three dimensional finite element modeling (FEM) simulations of the system were performed using the commercial ABAQUS® package. Eight-node, hexahedral brick elements with four-node multi-layer shell elements were used for the substrate and the thin film, respectively. Suitable model dimensions were chosen to correspond to the inverter circuit element and surrounding substrate, as in FIG. 13. Experimental observations indicate that these elements exhibit similar buckling patterns and that they are sufficiently far apart to behave in a mechanically independent fashion. As a result the periodical boundary conditions are applied to the external boundaries of the substrate. The multi-layer shell is bonded to the substrate surface through shared nodes. The nodes of the bottom substrate are constrained along the vertical direction. Each layer of thin film (Si-CMOS/PI system) is modeled as a linear elastic material; the soft, elastomeric substrate is modeled as an incompressible hyperelastic material. This hyperelastic material model uses the neo-Hookean constitutive law which accounts for the nonlinearity in the stress-strain relation in a simple way.

The simulations are performed to correspond exactly both to the material layouts as well as the fabrication procedures for the ultrathin CMOS circuits. The buckling mode shape was determined by perturbation analysis of the three-dimensional model with a multi-layer thin film (Si-CMOS/PI system) and a soft PDMS substrate. The substrate (without the thin film), with the effect of an imperfection introduced by perturbation in the geometry, expands due to an increase in temperature (thermal loading). When the temperature reaches 160° C. (~3.9% strain), the multi-layer thin film (shell elements) is bonded to the PDMS substrate (solid elements). As the temperature decreases, simulations show that the thin film buckles with the substrate, consistent with non-linear buckling analysis. This model requires a large number of elements to achieve reasonably good accuracy. The current model includes ~200,000 elements and is large enough to accommodate buckling waves. The buckling pattern, wavelength and amplitude and their spatial distribution can be found from this analysis. These simulations give insights into the formation of buckling patterns, the mechanics behavior of the thin film and the nested hierarchy of the structure.

EXAMPLE 2

A Hemispherical Electronic Eye Camera Based on Compressible Silicon Optoelectronics The human eye represents a remarkable imaging device, with many attractive design features.[1,2] Prominent among these is a hemispherical detector geometry, similar to that found in many other biological systems, that enables wide field of view and low aberrations with simple, few component, imaging optics. This type of configuration is extremely difficult to achieve using established optoelectronics technologies, due to the intrinsically planar nature of the patterning, deposition, etching, materials growth and doping methods that exist for fabricating such systems. This example provides processes and related systems that avoid these apparent limitations. The devices and processes are used to yield high performance, hemispherical electronic eye cameras based on single crystalline silicon technology. The approach uses wafer-scale optoelectronics formed in unusual, two dimensionally compressible configurations and elastomeric transfer elements capable of transforming the planar layouts in which the systems are initially fabricated into hemispherical geometries for their final implementation. The processes provided herein, together with the computational analyses of their associated mechanics, provide practical routes for integrating well developed planar device technologies onto the surfaces of complex curvilinear objects, suitable for diverse applications that cannot be addressed using conventional means.

The ability to implement electronic and optoelectronic systems on nonplanar surfaces is useful not only for hemispherical cameras and other classes of bioinspired device designs, but also for conformal integration on or in biological systems as monitoring devices, prosthetics and others. Unfortunately, existing technologies have been developed only for surfaces of rigid, semiconductor wafers or glass plates and, in more recent work, flat plastic sheets. None is suitable for the sorts of applications contemplated here because the mechanical strains needed to accomplish the planar to hemispherical geometrical transformation, for example up to ~40% for compact eye-type cameras, greatly exceed the fracture strains (e.g. a few percent) of all known electronic materials, particularly the most well developed inorganics.[3,4], even in wavy structural layouts. One strategy to circumvent these limitations involves adapting all of semiconductor processing and lithography for direct use on curvilinear surfaces. Even a single piece of this type of multifaceted effort (e.g. lithographic patterning on such surfaces[5-14] with levels of resolution and multilevel registration that begin to approach those that can be easily achieved on planar surfaces) requires solutions to extremely difficult technical challenges. Although some work based on plastic deformation of planar sheets,[15,16] self-assembly of small chips[17,18] and folding of elastic membranes,[19,20] have shown some promise, each has drawbacks and all require certain processing steps to be performed on a hemispherical or curved surface. Partly as a result, none have been used to achieve the type of cameras contemplated here. This example introduces a route to curvilinear optoelectronics and electronic eye imagers that begins with well-established electronic materials and planar processing approaches to create optoelectronic systems on flat, two dimensional surfaces, in unusual designs that allow full compressibility/stretchability to large levels of strain (~50% or more). This feature enables planar layouts to be geometrically transformed (i.e. conformally wrapped) to nearly arbitrary curvilinear shapes. This example uses a hemispherical, elastomeric transfer element to accomplish this transformation with an electrically interconnected array of single crystalline silicon photodiodes and current blocking p-n junction diodes assembled in a passive matrix layout. The resulting hemispherical focal plane arrays, when combined with imaging optics and hemispherical housings, yield electronic cameras that have overall sizes and shapes comparable to the human eye. Experimental demonstrations and theoretical analyses reveal the key aspects of these systems.

Figure 14:
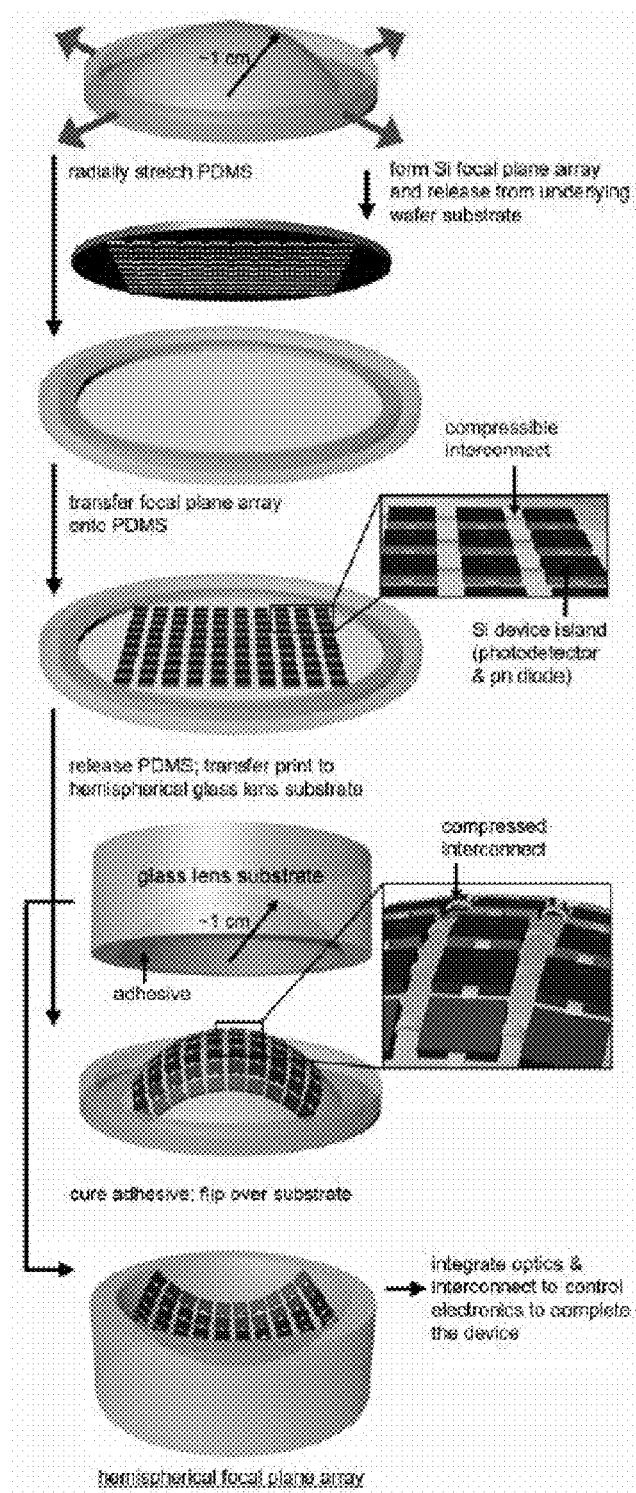
FIG. 14. Schematic illustration of steps for using compressible silicon focal plane arrays and hemispherical, elastomeric transfer elements to fabricate electronic eye cameras. The top frame shows such a transfer element, fabricated in PDMS by casting and curing against an appropriately designed template. Stretching in the radial direction forms a flat drumhead membrane in which all points in the PDMS are in tension. Lifting a prefabricated focal plane array and associated electronics from a source wafer onto the surface of this drumhead, and then allowing the PDMS to relax back to its initial shape transforms the planar device layout into a hemispherical shape. Transfer printing onto a matching hemispherical glass substrate coated with a thin layer of a photocurable adhesive (pink), adding a hemispherical cap with integrated imaging lens and interfacing to external control electronics (not shown here) completes the camera system.

FIG. 14 schematically illustrates the main steps in the fabrication. The process begins with the formation of a hemispherical, elastomeric transfer element by casting and curing a liquid prepolymer to poly(dimethylsiloxane) (PDMS; Dow Corning) in the gap between opposing convex and concave lenses with matching radii of curvature (~1 cm). A specially designed jig to hold these lenses also provides a raised rim around the perimeter of the resulting piece of PDMS. This transfer element mounts into a mechanical fixture that provides coordinated radial motion of ten independent paddle arms that each insert into the rim. Translating the arms of this radial tensioning stage outward expands the hemisphere. The associated reversible, elastic deformations in the PDMS transform this hemisphere, at sufficiently large tensioning, into the planar shape of a 'drumhead', such that all points in the PDMS are in biaxial tension. The extent of expansion and the underlying mechanics determine the overall magnitude of this tension. Separately, conventional planar processing forms a passive matrix focal plane array on a silicon-on-insulator (SOI; Soitec) wafer, comprised of single crystalline silicon photodetectors, current blocking p-n junction diodes, metal (Cr/Au/Cr) for interconnects, with films of polymer (polyimide) to support certain regions and to encapsulate the entire system. An important design feature is the use of thin, narrow lines to connect nearest neighbor pixel elements; these structures facilitate elastic compressibility in the system, as described subsequently. Removing the buried oxide layer of the SOI wafer by etching with concentrated HF in a manner that leaves the focal plane array supported by polymer posts but otherwise raised above the underlying silicon 'handle' wafer completes the device processing. Fabrication of the interconnected pixel arrays on rigid, planar substrates using established processing techniques avoids limitations, e.g. in registration, that are often encountered in soft electronics.

Contacting the transfer element in its tensioned, planar 'drumhead' shape against this wafer and then peeling it away lifts up the focal plane array, leaving it adherent to the soft surface of the elastomer through non-specific van der Waals interactions.[21,22] In the next step, moving the leaf arms of the tensioning stage inward to their initial positions causes the elastomer to relax back, approximately, to its initial hemispherical shape but with a slightly (~10% for the systems investigated here) larger radius of curvature. In this process, compressive forces act on the focal plane array to bring the pixel elements closer together, with magnitudes that correspond to significant compressive strains (i.e. up to 10-20%, depending on the tensioning). The narrow, thin connecting lines accommodate these large strains by delaminating locally from the surface of the elastomer to adopt arc shapes pinned on the ends by the detector pixels (i.e. the strains accommodated in the interconnects are greater and are up to ~30-40%), with a mechanics conceptually similar to related responses in stretchable semiconductor ribbons.[23] This process allows the planar-to-spherical geometrical transformation to be accomplished without creating substantial strains in any of the active components of the focal plane array, as discussed subsequently. The hemispherical, elastomeric transfer element, 'inked' with the focal plane array in this manner, then enables transfer 'printing' onto a hemispherical glass substrate with a matching radius of curvature and coated with a thin layer of a photocurable adhesive (NOA 73, Norland). Mounting the resulting system on a printed circuit board with bus lines to external control electronics, establishing electrical connections to pinouts located along the perimeter of the detector array, and integrating with a hemispherical cap fitted with a simple imaging lens completes the hemispherical electronic eye camera.

Figure 15B:
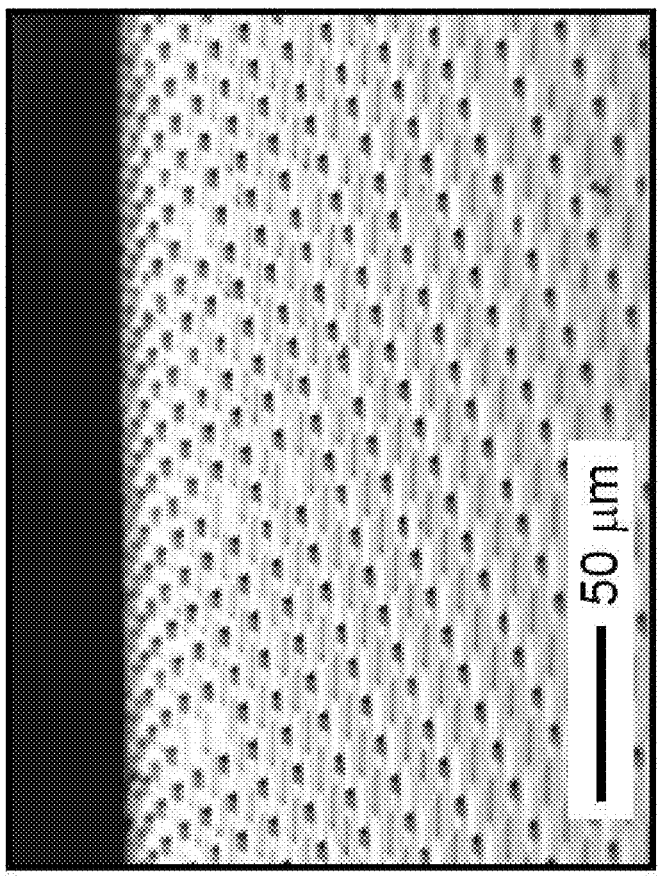
FIG. 15. Mechanics of compressible silicon and elastomeric elements suitable for planar to hemispherical transformation. A, Optical image of a compressible silicon structure on a PDMS hemisphere (center; a tall, raised rim lies around the perimeter). The silicon covers the central region of the hemisphere, and appears light grey in this image; the straight edges of the overall structure can be seen clearly (arrow). This system consists of 163,216 square elements of silicon (20×20 µm; 50 nm thick) connected by ribbons of silicon (20×5 µm; 50 nm thick) in a 16.14×16.14 mm square array, initially formed on the planar surface of a silicon-on-insulator wafer. B, Scanning electron micrograph (SEM) of a small region of the sample shown in A. The out-of-plane deformations in the connecting ribbons that yield the arc shapes visible here provide the compressibility necessary to accommodate the planar to hemispherical transformation. C, Experimentally measured map (black dots) of spatial positions of silicon elements (500×500 µm; 1.2 µm thick) across a similar hemispherical array, with coarser features and fewer elements. The overlaid mesh represents predictions for the planar to hemispherical transformation from the analytical mechanics model; the mesh nodes are the predicted spatial positions of the array and the segment colors indicate the percentage change of the distance between neighboring elements across the array, compared to those designed in the planar configuration. The results indicate less than a ~3% variation, from minimum to maximum. D, SEM highlighting a single element in the array, with theoretical results for the arc shapes and the distribution of strains, overlaid in color.
Figure 15A:
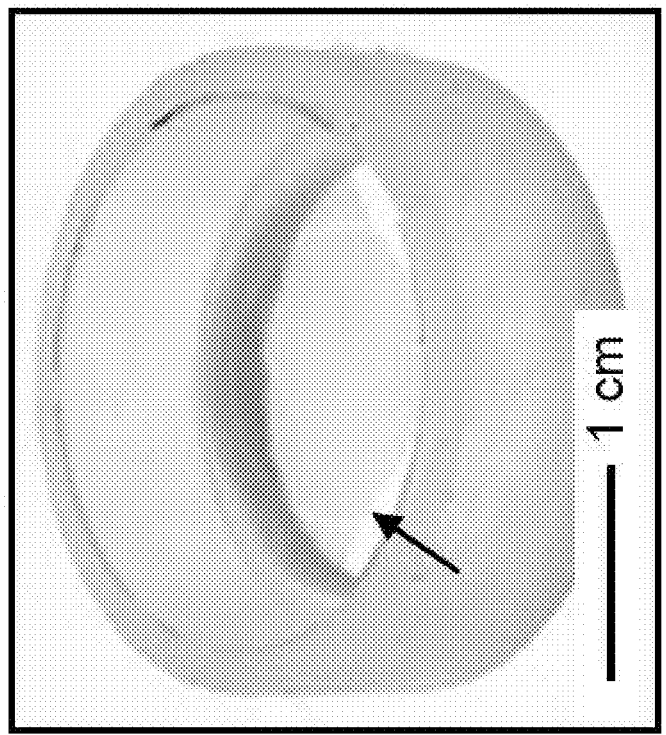
Figures 15C, 15D:
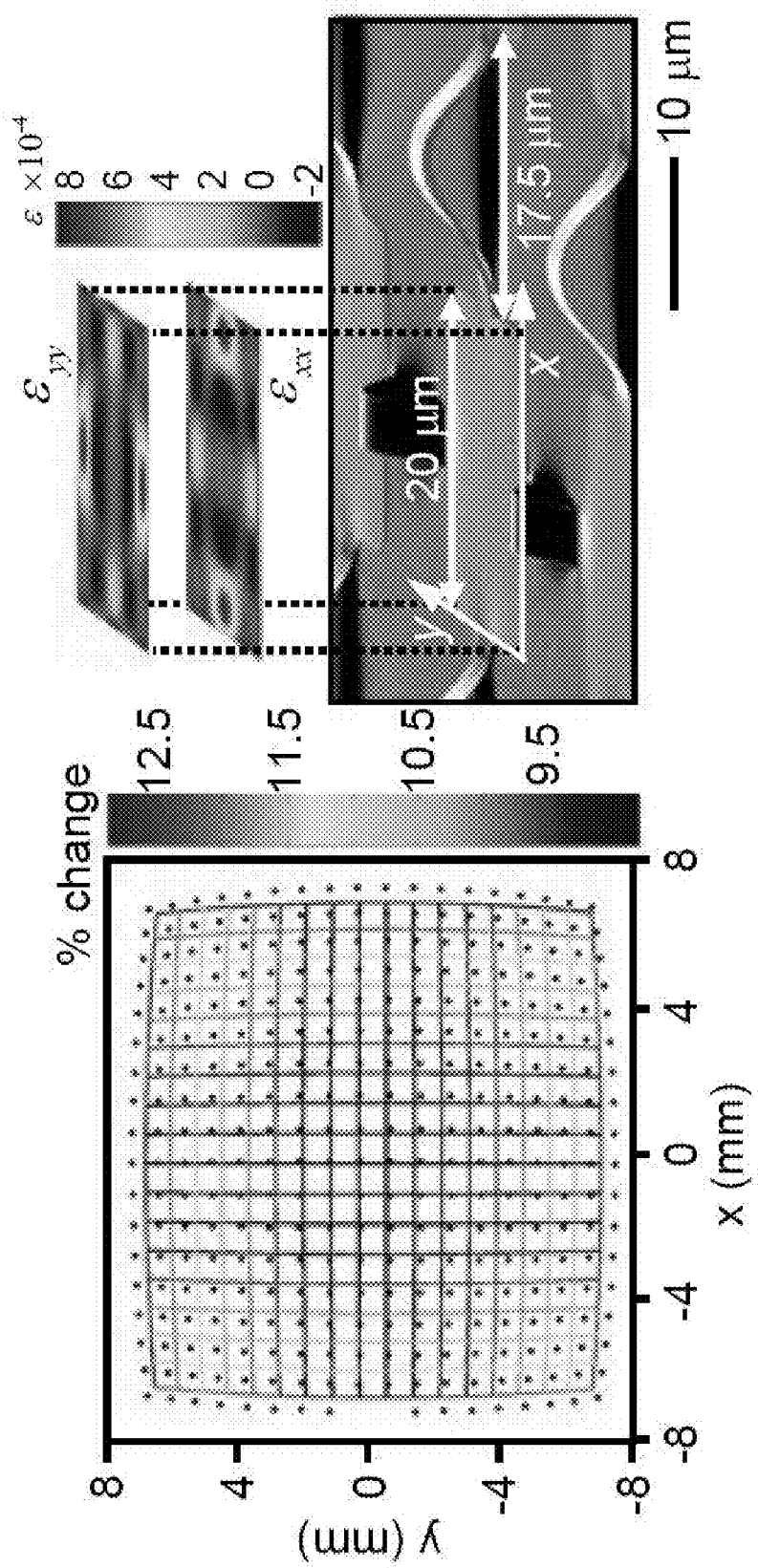

The fabrication approach summarized in FIG. 14 can be applied to planar electronics and optoelectronics technologies with nearly arbitrary materials classes and devices (e.g., sophisticated cameras, retinal implants), provided that they incorporate appropriately configured compressible interconnects. A key advantage of the strategy is that the most labor-intensive part of the process (i.e. formation of the pixel arrays themselves) is fully compatible with the capabilities of existing, planar silicon device manufacturing facilities. FIG. 15 summarizes key aspects of the mechanics of this process, as revealed with a high density array of passive silicon elements (20×20 µm, with 50 nm thickness) and nearest neighbor connections (20×4 µm, with 50 nm thickness), all designed for simplicity of illustration. FIG. 15A shows an optical image of such an array transferred onto the surface of a hemispherical, elastomeric transfer element, corresponding to the next to last frame in FIG. 14. The high level of engineering control on the process is evident from the uniformity of the structure shown in this image. FIG. 15B presents a scanning electron micrograph (SEM) of a small region of the array, collected from the sample in FIG. 15A. The arc shaped connections responsible for the compressibility can be seen clearly. The yields associated with the transfer and the formation of these types of connections can be high; only ~5 defects, corresponding to a yield of >90% for this field of view, are presented in FIG. 15B. FIG. 15C shows the spatial distribution of elements in a similar transferred array. A simple mechanics model, based on plate theory,[23] and confirmed using established finite element analysis techniques,[24-26] shows how the silicon elements are mapped from the flat to hemisphere. The pixel positions given by these models, also shown in FIG. 15C, agree well with the experiments without parameter fitting. These mechanics models indicate very small, ~3%, changes (maximum to minimum) in the local pitch across the entire area, with smooth, deterministic variations in this quantity. The relatively uniform pitch is ~10% smaller than the initial value before the PDMS is relaxed. As with this part of the mechanics of the process, the nature of the compressibility provided by the narrow, thin interconnects between adjacent unit cells can be understood through theoretical analysis. The SEM of FIG. 15D provides a high magnification view of the array shown in FIGS. 15A and B, with analysis results in the form of overlays of the arc shapes and the distributions of strain. The out-of-plane displacement, w, of the arc-shaped connections takes the form $$w = \frac{A}{2}\left(1 + \cos\frac{2\pi x}{L}\right),$$

where A is the amplitude, x is the position along the connection and L is the lateral separation distance between adjacent pixel elements; this distance is $L_0$=20 µm as measured in the as-fabricated planar configuration. Minimizing the membrane and bending energy in the connection strips yields an analytical expression for the amplitude $$A = \frac{2L_0}{\pi}\sqrt{\frac{L_0 - L}{L_0} - \varepsilon_c},$$

where, $\varepsilon_c$, the critical buckling strain, is given by $\varepsilon_c = \pi^2 h^2/(3L_0^2)$, where h is the thickness; its value is 0.0021% for the system shown here. For L=17.5 µm, the amplitude A=4.50 µm agrees well with the experiments A=4.76 µm. The maximum strain in the connections is ~0.5%, substantially below the fracture strain for the silicon. Mechanics models also reveal the distribution of strains and displacements in the square silicon elements. The maximum out-of-plane displacements are very small (<0.1 µm), as are the strains $\varepsilon_{xx}$ and $\varepsilon_{yy}$ (<0.08%), as shown in FIG. 15D. The strain $\varepsilon_{xx}$ in the Si element reaches the peak near the interconnections in the x-direction, while the peak of $\epsilon_{yy}$ occurs near those in the y-direction.

The approaches and associated mechanics summarized in FIGS. 14 and 15 can be applied to planar electronics and optoelectronics technologies with nearly arbitrary materials classes and devices, provided that they incorporate appropriately configured compressible interconnects. FIG. 16 outlines the designs implemented for the cameras described here. Each pixel in the array supports two devices—a photodetector and a pn junction diode—monolithically formed in a single piece of single crystalline silicon (500×500 μm; 1.2 μm thick) with a capping layer of polyimide (560×560 μm; 1-1.5 μm thick): The first device provides local light detection; the second enables current blocking and enhanced isolation for passive matrix readout. We refer to these devices as PDs (photodiodes) and BDs (blocking diodes), respectively. Layers of metal above each of the BDs shield them from light, thereby removing their photoresponse. The layouts of this metal, the two devices and the electrical connections are illustrated in the 'exploded' schematic view of FIG. 16A. The pixel-to-pixel interconnects consist of thin layers of patterned metal (360×50 μm width; Cr/Au/Cr 3/150/3 nm thick) on thin layers of polyimide (360×110 μm; 1-1.5 μm thick), spin-cast and patterned in conventional ways.

Figure 16A:
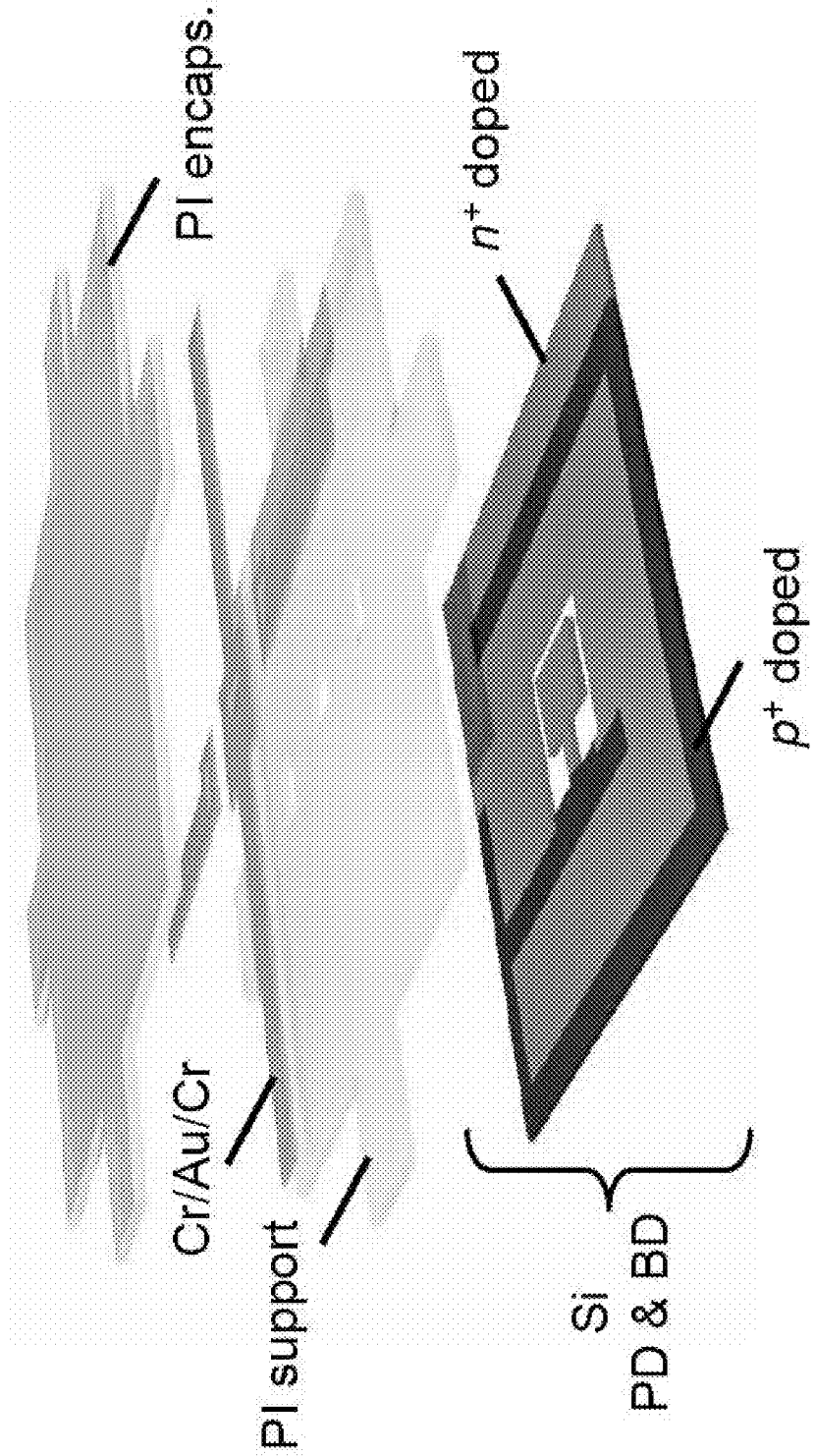
FIG. 16. Layouts and electrical properties of a hemispherical electronic eye camera based on single crystalline silicon photodetectors and current blocking p-n junction diodes in a compressible, passive matrix layout. A, Exploded view schematic illustration of the layout of the silicon, metal, and polymer associated with a single unit cell in the array. The blocking diode (BD) is the in the center of the cell; the photodetector (PD) is in a serpentine geometry around the BD. B, Electrical properties and optical micrograph of a unit cell. The data were measured by contacting the row and column electrodes that address this position in the hemispherical array, via pads at the perimeter of the system. The data (red: exposed to light; black: in the dark) show high contrast response to light exposure. Equally important, the reverse bias current and leakage from other pixels in the array are both minimal, as illustrated in the inset on the right. C, Photograph of the array integrated on a hemispherical glass substrate (main frame), optical micrograph of a part of the array (upper right inset) and circuit diagram showing the BDs (black), PDs (red) and electrode crossovers (arcs) in a 2×2 section of the system. D Photograph of a hemispherical PDMS transfer element with a compressible focal plane array on its surface. E SEM image of a portion of the array in D, illustrating the compressible interconnects.
Figure 16B:
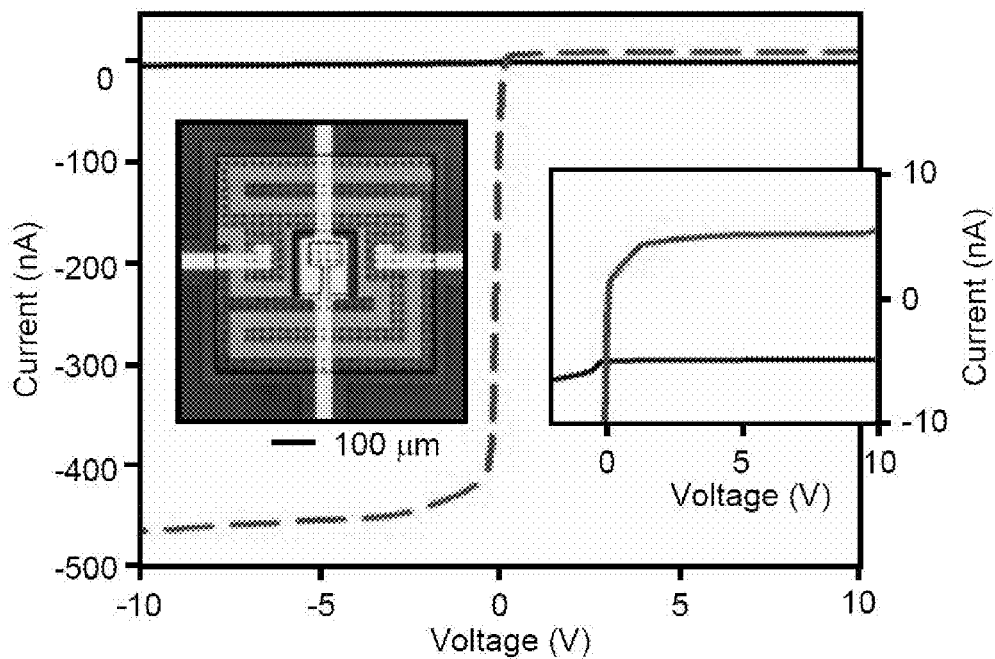
Figure 16C:
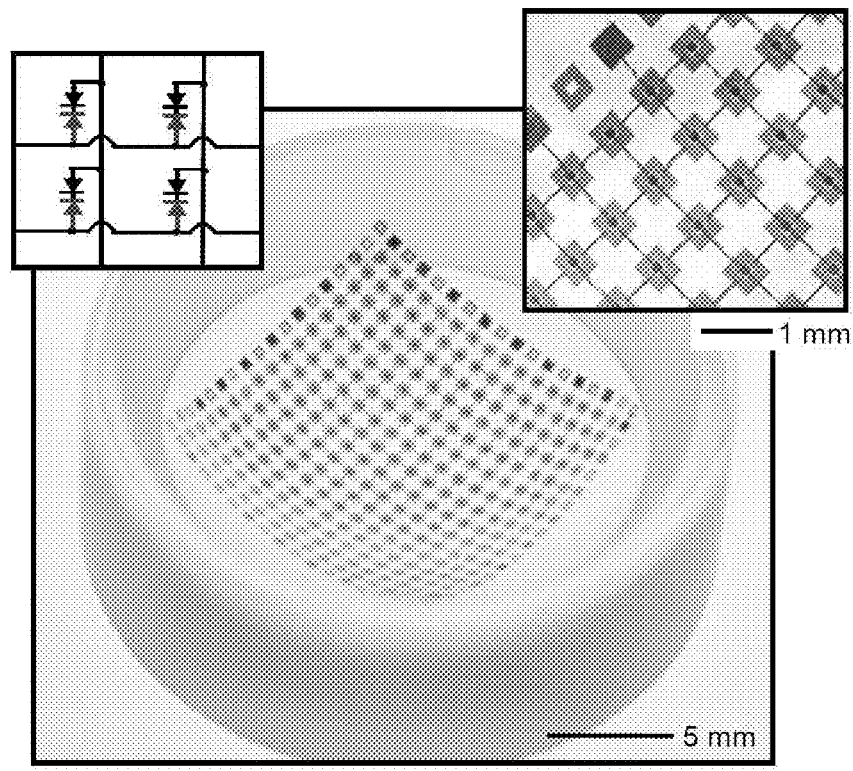
Figure 16D:
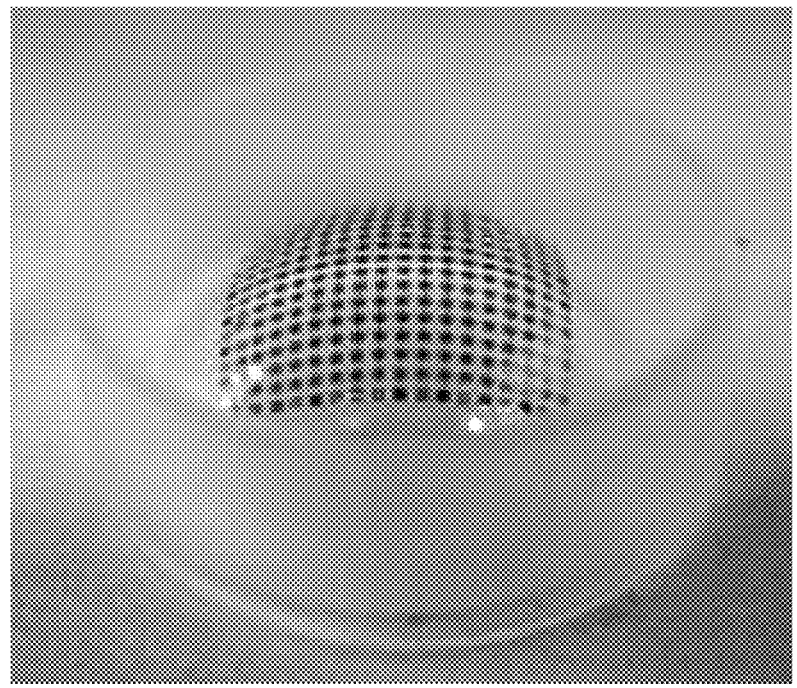
Figure 16E:
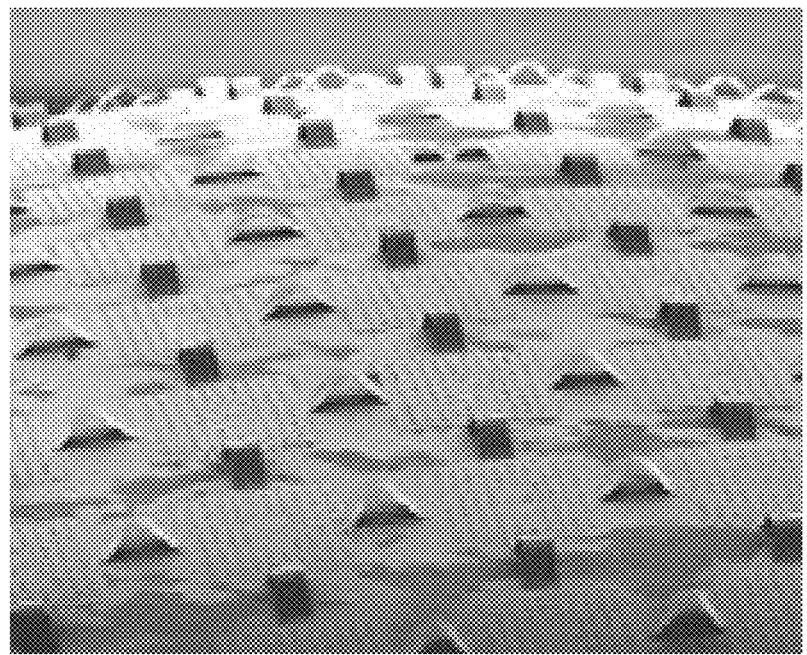
Figure 52:
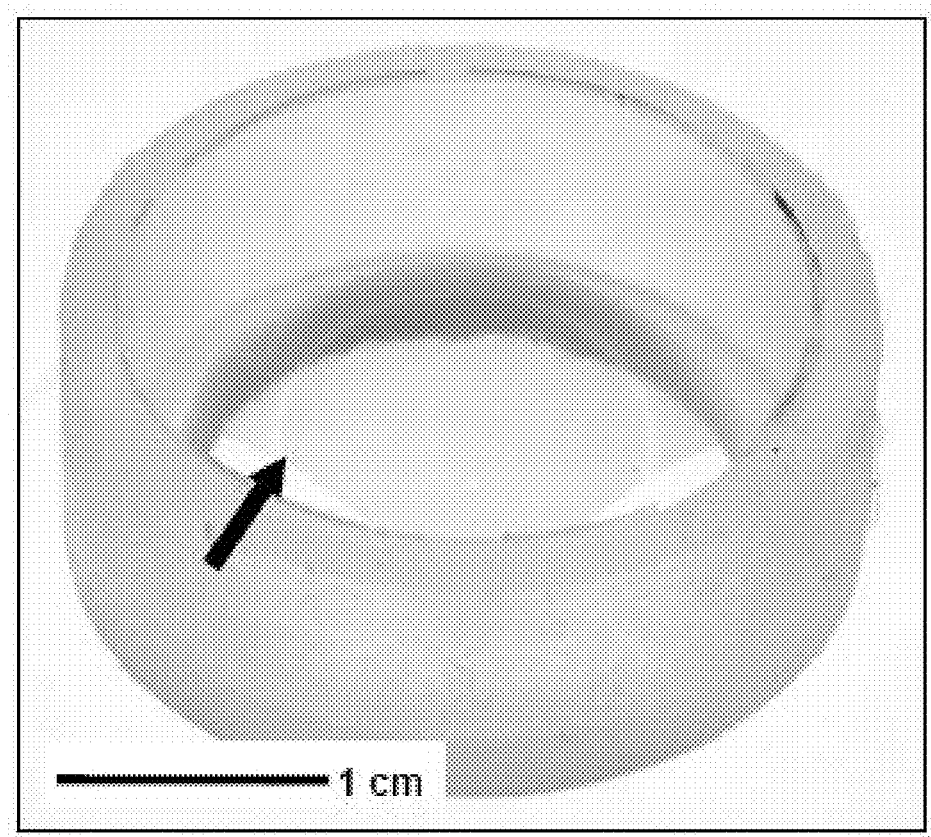
FIG. 52 Photograph of a compressible silicon structure on a PDMS hemisphere (center; a tall, raised rim lies around the perimeter) (top image). The silicon covers the central region of the hemisphere, and appears light grey in this image; the straight edges of the overall structure can be seen clearly (arrow). This system comprises 163,216 square elements of silicon (20 by 20 µm; 50 nm thick) connected by ribbons of silicon (20 by 4 µm; 50 nm thick) in a 16.14 by 16.14 mm square array, initially formed on the planar surface of a silicon-on-insulator wafer. A scanning electron micrograph (SEM) of a small region of the sample is shown in the bottom image. The out-of-plane deformations in the connecting ribbons that yield the arc shapes visible here provide the compressibility necessary to accommodate the planar to hemispherical transformation.
Figure 52:
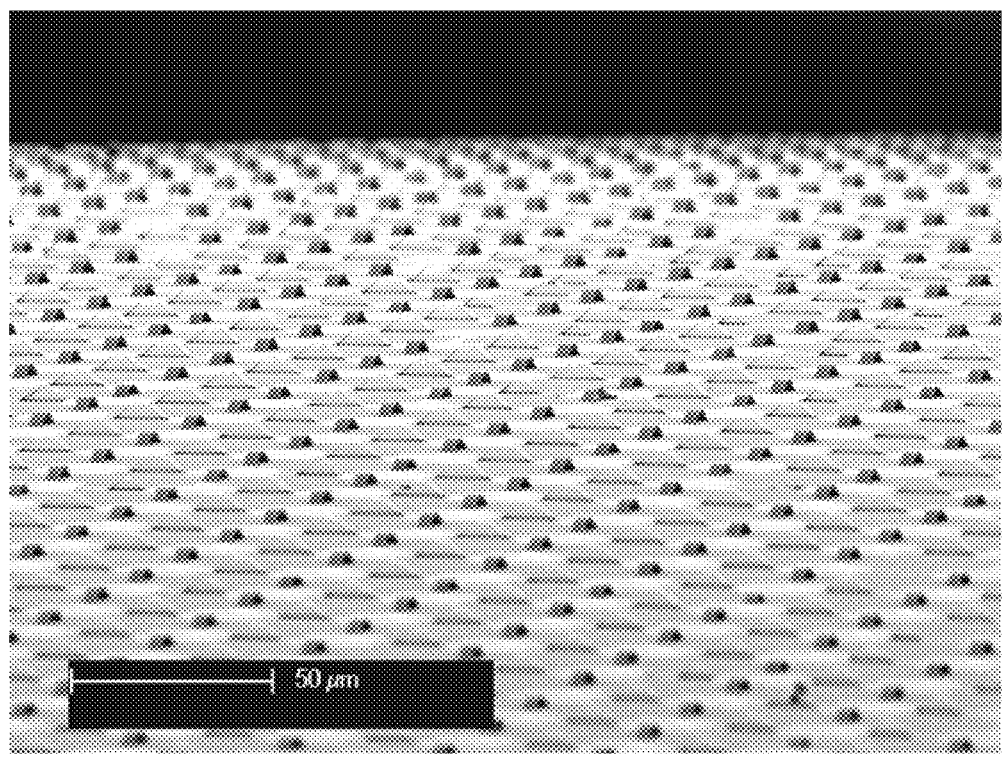

SEM images in FIGS. 16D, 16E show a 16 by 16 array of PD-BD pixels transferred onto the surface of a hemispherical, elastomeric transfer element, corresponding to the next-to-last frame in FIG. 14. The arc-shaped interconnections that enable the planar to hemispherical transformation can be seen clearly. The yields associated with the transfer process and the formation of these types of stretchable connections are high; 100% of the pixels and interconnections in the case of the 16 by 16 arrays have been reproducibly transferred. Greater than 95% yields have also been demonstrated for the transfer of higher density arrays of passive silicon elements (20 by 20 μm, with 50 nm thickness) and nearest neighbor connections (20 by 4 μm, with 50 nm thickness) (see FIG. 52).

Significant mechanical deformations in the imaging arrays are generated during the transfer process, specifically during the planar to hemispherical transformation of the elastomeric transfer element. Simple mechanics models, based on plate theory and confirmed using established finite element analysis techniques, have been developed to determine the spatial distributions of pixels during the transfer process, as well as the distributions of stresses and displacements in the interconnections and silicon pixels. These models indicate that the imaging arrays on the hemispherical surface have 1) very small variations (~3% maximum to minimum) in the local pitch and 2) the relatively uniform pitch is ~10% smaller than the arrays in the planar, as-fabricated geometry. In addition, the mechanics models predict maximum strains of ~0.01% in the Si pixels and ~0.3% in the metal of the arc-shaped interconnects for the ~20% change in interconnection length (~10% change in pitch) observed in these systems. FIG. 16C presents an optical image of a completed array on a hemispherical glass substrate, corresponding to the last frame in FIG. 14. The high level of engineering control on the fabrication process is evident from the uniformity of the structures that can be transferred to the hemispherical substrate.

FIG. 16B shows the current/voltage response of a representative individual pixel in a hemispherical detector array (black solid curve: in the dark; red dashed curve: exposed to light), addressed via row and column electrodes through contact pads at the perimeter of the 16×16 array. Similar responses are achieved for individual pixels in planar imaging arrays. Key features are the strong photoresponse (main frame), the very low reverse bias current (right inset), and low crosstalk (right inset) between pixels in passive matrix addressing. FIG. 16C shows optical images of a completed array on a hemispherical glass substrate. The upper left and right insets provide circuit schematics (red: PD; black: BD) and a magnified view of part of the array, respectively. The mechanics model for the Si system (FIG. 15) as applied to the device shown in FIG. 16, gives maximum strains ($\epsilon_{xx}$ or $\epsilon_{yy}$) in the Si of ~0.01% for the ~12.5% change in connection length observed in these systems. The maximum strain in the metal of the arc-shaped interconnects is ~0.3%.

Figure 17A:
FIG. 17. Photographs of a hemispherical electronic eye camera and representative output image. A, Photograph of a hemispherical focal plane array (center) mounted on a printed circuit board (green), with external connection to a computer (not shown) through a ribbon cable (upper left). B, Photograph of the camera after integration with a transparent (for ease of viewing) hemispherical cap with a simple, single component imaging lens (top). C, Close-up photograph of the system in B, as viewed directly through the imaging lens. For the parameters used here, this lens magnifies the focal plane array to show a small, 3×3 cluster of pixels. D,E Grayscale images acquired using D, planar and E, hemispherical cameras with 16×16 pixels as plotted on surfaces that match those of the focal plane arrays. The bottom image in the planar case shows a photograph, from a commercial 10 MPixel digital camera, of the image projected on a planar screen, as taken along the optical axis and from behind the sample. Geometric, pincushion distortions are observed for this optics setup. F Greyscale images of the first two rows in an eye chart acquired using a hemispherical camera with 16×16 pixels as displayed on a hemispherical surface matching the detector surface (top) and projected onto a plane (bottom). The images on the left and right were acquired without scanning and with scanning (from −2 to 2° in the θ and φ directions in 0.4° increments), respectively. The axes scales are in mm and are identical in each image.

Evaporating metal over the edge of the glass substrate through a flexible shadow mask provides electrical connections to the row and column contacts at the periphery of the passive matrix array. These connections lead to prepatterned lines on a printed circuit board, which terminate in a 34 pin connector that provides a ribbon cable interface to a computer with specially designed software for acquiring images from the camera. The resulting system appears in FIG. 17A Presently, the electrode lines that connect the periphery of the pixel arrays to separate control electronics limit yields and set practical bounds on pixel counts. With unoptimized manual systems, the interconnects from the periphery of the pixel array to the printed circuit board can be registered to an accuracy of ±200 μm. Integration with a hemispherical cap fitted with a simple, single element lens that provides the imaging optics completes the camera, as illustrated in the images of FIGS. 17B, C.

Figure 17C:
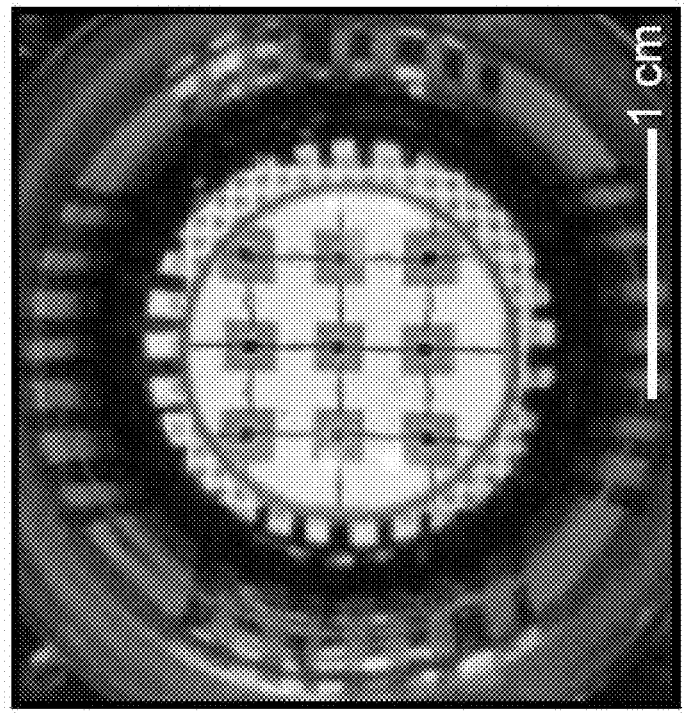
Figure 17B:
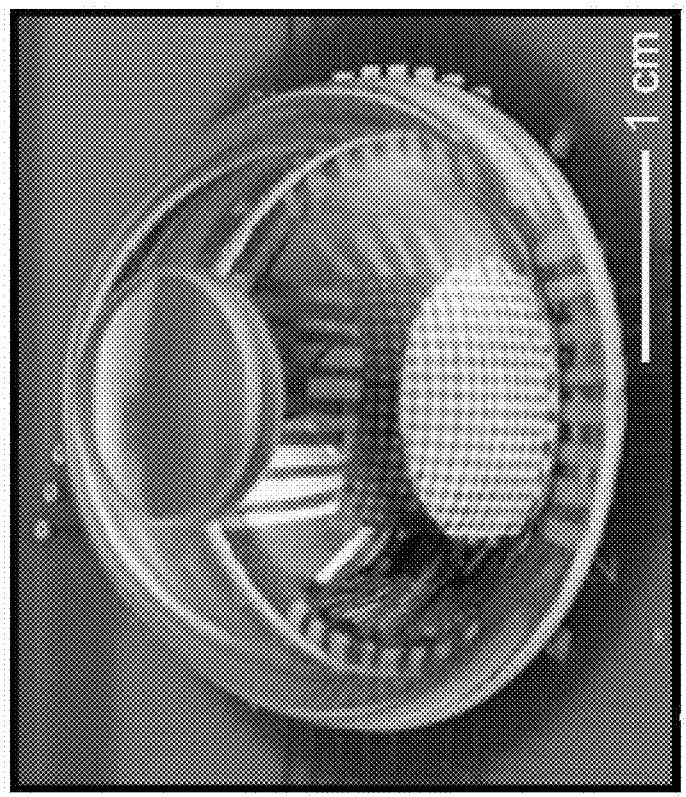
Figures 17D, 17E:
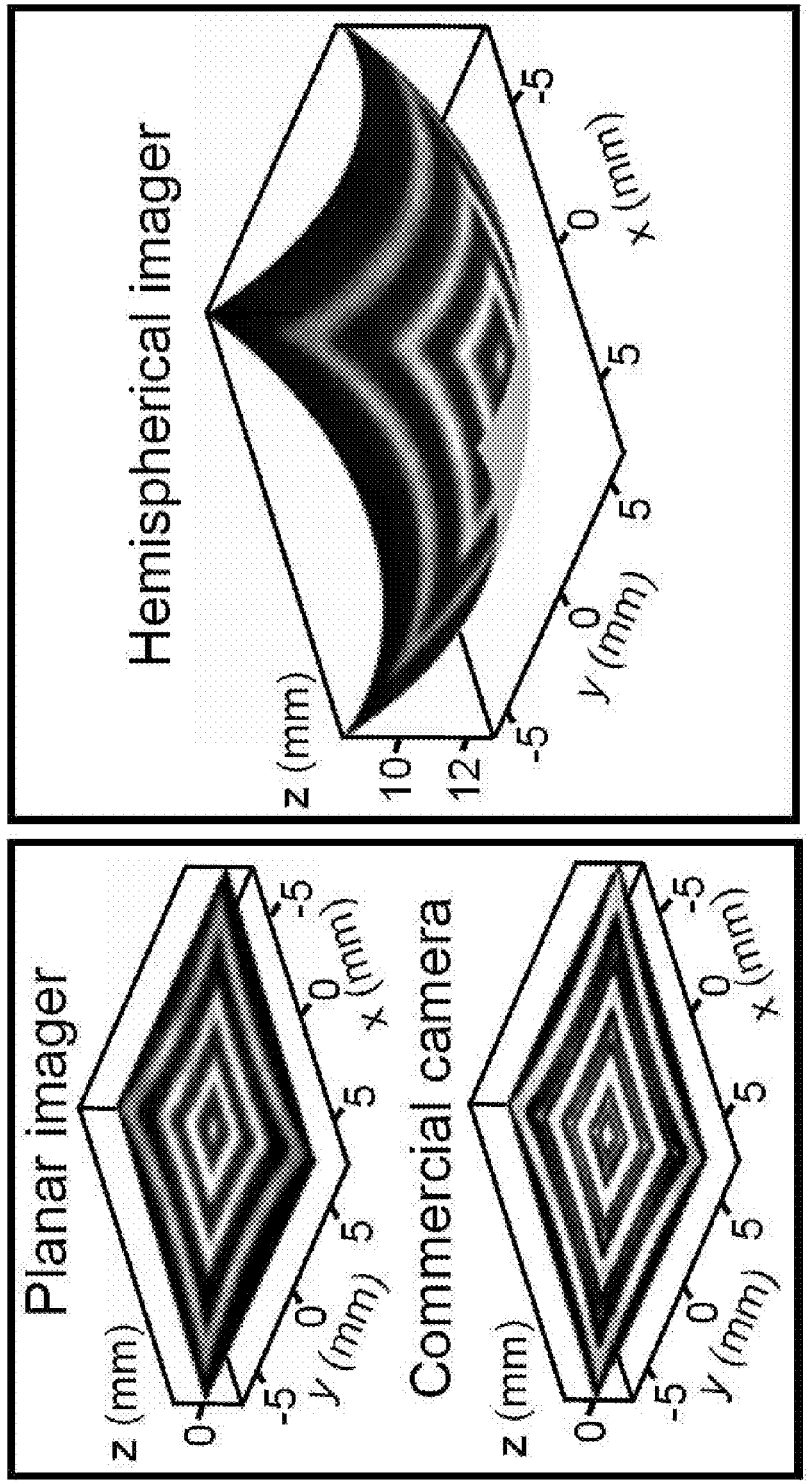

FIGS. 17D, E show an image of a test pattern collected with a camera having this design ("hemispherical electronic eye camera") and a similar one in a conventional planar layout, presented as grayscale representations on surfaces with the geometries of the focal plane arrays. These results implement a strategy adapted from biology to overcome limited resolution and pixel defects. In particular, a sequence of images are collected as the cameras are moved (translated in the planar case, and rotated in the hemispherical case) relative to the object. The images of FIG. 17D, E correspond to combined sets of individual images from a few pixels obtained in this manner.

Figure 17F:
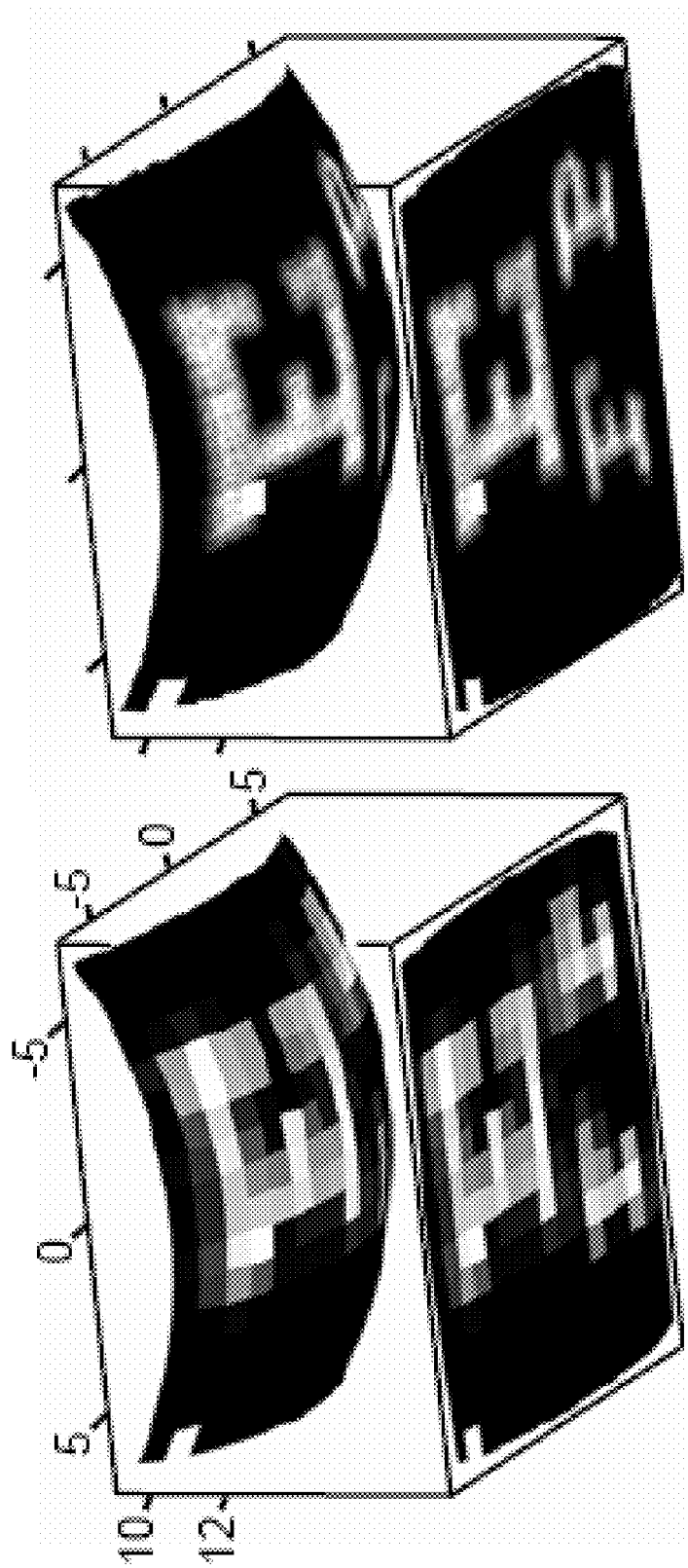

FIG. 17F shows images collected with the hemispherical electronic eye camera of FIG. 17A-C. The optical setup for these results used collimated green light (Ar ion laser) to illuminate a printed pattern on a transparency film. The transmitted light passed through a simple plano-convex lens (diameter=25.4 mm; focal length=35 mm) to form an image on the hemispherical camera (see FIG. 31). The left frame of FIG. 17F shows the direct output of the camera for the case of an image of the top two rows of the standard eye chart. Although the shapes of the letters are clearly resolved, the fine spatial features of the smaller text are not accurately represented due to the relatively low numbers of pixels in these cameras. The image quality can be improved by implementing a strategy adapted from biological systems, in which a sequence of images are collected as the camera is eccentrically rotated in θ and φ directions relative to the object. Reconstruction, using pixel positions on the hemispherical surface predicted with mechanics models described herein, yields high resolution images. The right frame of FIG. 17F is a picture acquired by rapidly scanning a small range of angles (from −2 to 2° in both θ and φ directions) in 0.4° increments.

Figure 53:
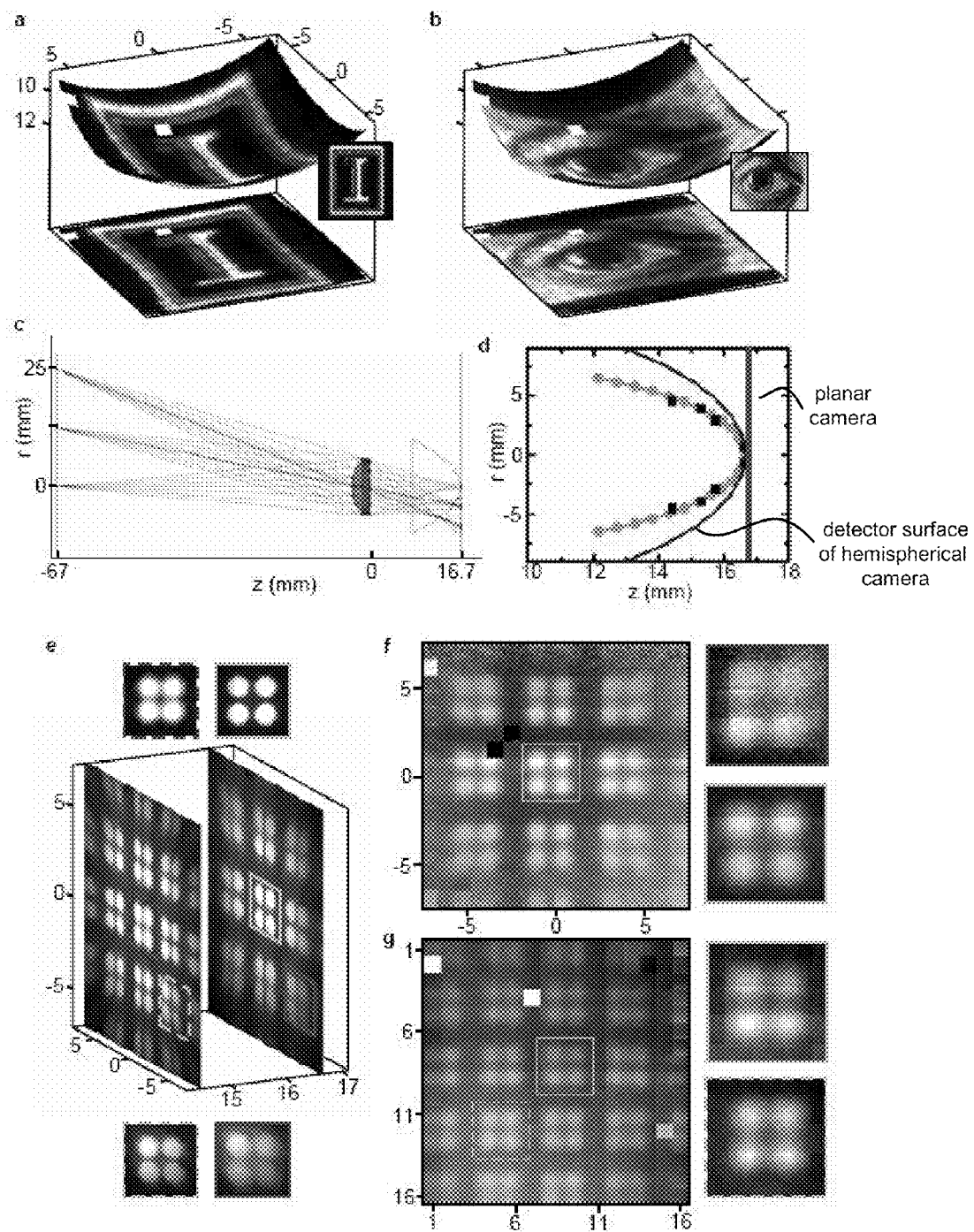
FIG. 53 Enhanced imaging in hemispherical cameras compared to planar cameras. High resolution images of A, the University of Illinois "I" logo and B, a drawing of an eye acquired with a hemispherical camera (insets on right show the original images scanned from the transparency films). C, Optics setup used for imaging and sample ray traces showing a pattern of rays passing through the image and lens onto the detector screens (optimal focal surface and planar camera). D, Ray tracing predictions of the optimal focal surface (green circles—calculated focal points, green curve—parabolic fit), the detector surface of the hemispherical camera (blue curve), and a planar camera (red curve). E, High-resolution photographs of projected images on a planar screen positioned at varying distances from the lens. The left and right images were acquired at 14.40 and 16.65 mm from the lens, respectively, and demonstrate a shift in optimal focus as a function of detector position. A series of such images were used to estimate the optimal curvilinear focal surface as shown in D, as black squares. F, G, High resolution images acquired with F, planar and G, hemispherical cameras positioned at 16.65 mm (along the optical axis) from the lens. All axes scales are in mm, except for G which is plotted versus pixel number, and the axes normal to the image planes represent the z-directions (optical axis).

Even more complex pictures, as shown in FIGS. 53A-B, can be obtained in high resolution using this simple scanning approach (from −2 to 2° in θ and φ directions, 0.4° increments). Inspection of the images suggests that the stitching errors associated with this process are <40 μm, thereby validating the accuracy of these models. The nearest neighbor pixels in the hemispherical camera are separated by ~4° leading to zero redundancy in generating the tiled picture. These results also demonstrate the high yield of functional pixels, >99% (254 out of 256). Provided are images acquired from each pixel when scanned over the entire projected image (from −40 to 40° in both θ and φ directions), further demonstrating the high quality and uniformity of the pixels in the array.

The simple, single-lens system considered here provides a clear example of how curved detectors can improve camera performance. The focusing ability of hemispherical and planar cameras is compared in FIGS. 53c-53f using fabricated devices, ray tracing software, and commercial cameras. An ideal imaging system would perfectly reproduce the image on the detector surface; however, the lens introduces aberrations that degrade the image quality. Complex and expensive optics can reduce the third-order Seidel aberrations for planar detector surfaces, but such aberrations play a significant role in the focusing ability of the simple, single-lens arrangements of interest here. A demonstration of focusing abilities requires non-collimated light sources and a wide aperture for a large field of view; thus the optical test setup for FIG. 53c-f uses rear-illumination of a pattern printed on paper with halogen lamps and a high numerical aperture plano-convex lens (diameter=12 mm; focal length=12 mm). Use of optical filters to limit the incident light wavelength to ~620-700 nm minimizes contributions from chromatic aberrations. FIG. 53c shows the optics arrangement and representative ray traces used to calculate the curvilinear image surface. The calculated surface corresponds, to good approximation, to a paraboloid of revolution (see FIG. 53d) and is much closer in shape to the hemispherical detector than the planar detector. FIG. 53e shows images projected on a planar screen (photographic plastic film) obtained with a commercial camera at two different distances (z; left, 14.40 mm and right, 16.65 mm) between the screen and lens. The position of best focus shifts from the center to the edge of the image with decreasing z. The image surface estimated using a series of such photographs is similar to that predicted by the ray tracing theory (see FIGS. 53d and 56). FIGS. 53f and 53g compare images acquired with the fabricated planar and hemispherical cameras, respectively. The hemispherical system has a number of advantages including more uniform focus from the center to the edge, a wider field of view, more homogeneous intensity throughout the image, and reduced geometric distortions. Many of these features are evident in FIG. 53f,g, even with the modest levels of resolution associated with these particular devices.

In conclusion, the compressible optoelectronics and elastomeric transfer element strategies introduced here are compatible with high resolution focal plane arrays, other more advanced materials systems and device designs, as well as refined substrate shapes (e.g. aspherical surfaces).

References

1. Land, M. F. & Nilsson, D.-E. Animal Eyes. Oxford University Press, New York (2002).
2. Goldsmith, T. H. Optimization, constraint, and history in the evolution of eyes. Quart. Rev. Biol. 65, 281-322 (1990).
3. Swain, P. & Mark, D. Curved CCD detector devices and arrays for multi-spectral astrophysical applications and terrestrial stereo panoramic cameras. Proc. SPIE 5499, 281-301 (2004).
4. Grayson, T. Curved focal plane wide field of view telescope design. Proc. SPIE 4849, 269-274 (2002).
5. Jackman, R. J., Wilbur, J. L. & Whitesides, G. M. Fabrication of submicrometer features on curved substrates by microcontact printing. Science 269, 664-666 (1995).
6. Paul, K. E, Prentiss, M. & Whitesides, G. M. Patterning spherical surfaces at the two hundred nanometer scale using soft lithography. Adv. Func. Mater. 13, 259-263 (2003).
7. Miller, S. M., Troian, S. M. & Wagner, S. Direct printing of polymer microstructures on flat and spherical surfaces using a letterpress technique. J. Vac. Sci. Technol. B 20, 2320-2327 (2002).
8. Childs, W. R. & Nuzzo, R. G. Patterning of thin-film microstructures on non-planar substrate surfaces using decal transfer lithography. Adv. Mater. 16, 1323-1327 (2004).
9. Lee, K. J., Fosser, K. A. & Nuzzo, R. G. Fabrication of stable metallic patterns embedded in poly(dimethylsiloxane) and model applications in non-planar electronic and lab-on-a-chip device patterning. Adv. Func. Mater. 15, 557-566 (2005).
10. Lima, O., Tan, L., Goel, A. & Negahban, M. Creating micro- and nanostructures on tubular and spherical surfaces. J. Vac. Sci. Technol. B 25, 2412-2418 (2007).
11. Radtke, D. & Zeitner, U. D. Laser-lithography on non-planar surfaces. Opt. Expr. 15, 1167-1174 (2007).
12. Ruchehoeft, P. & Wolfe, J. C. Optimal strategy for controlling linewidth on spherical focal surface arrays. J. Vac. Sci. Technol. B18, 3185-3189 (2000).
13. Xia, Y. et al. Complex optical surfaces formed by replica molding against elastomeric masters. Science 273, 347-349 (1996).
14. See, Ball Semiconductor at http://www.ballsemi.com/.
15. Hsu, P. I. et al. Spherical deformation of compliant substrates with semiconductor device islands. J. Appl. Phys. 95, 705-712 (2004).
16. Hsu, P. I. et al. Effects of mechanical strain on TFTs on spherical domes. IEEE Trans. Electron. Dev. 51, 371-377 (2004).
17. Jacobs, H. O., Tao, A. R., Schwartz, A., Gracias, D. H. & Whitesides, G. M. Fabrication of a cylindrical display by patterned assembly. Science 296, 323-325 (2002).
18. Zheng, W., Buhlmann, P. & Jacobs, H. O, Sequential shape-and-solder-directed selfassembly of functional Microsystems. Proc. Nat. Acad. Sci. USA 101, 12814-12817 (2004).
19. Boncheva, M. et al. Magnetic self-assembly of three-dimensional surfaces from planar sheets. Proc. Nat. Acad. Sci. USA 102, 3924-3929 (2005).
20. Boncheva, M. & Whitesides, G. M. Templated self-assembly: Formation of folded structures by relaxation of pre-stressed, planar tapes. The path to ubiquitous and low-cost organic electronic appliances on plastic. Adv. Mater. 17, 553-557 (2005).
21. Huang, Y. Y., Zhou, W. X., Hsia, K. J., Menard, E., Park, J. U., Rogers, J. A. & Alleyne, A. G. Stamp Collapse in Soft Lithography. Langmuir 21, 8058-8068 (2005).
22. Zhou, W., Huang, Y., Menard, E., Aluru, N. R., Rogers, J. A. & Alleyne, A. G. Mechanism for Stamp Collapse in Soft Lithography. Appl. Phys. Lett. 87, 251925 (2005).
23. Sun, Y. et al. Controlled buckling of Semiconductor Nanoribbons for Stretchable Electronics. Nat. Nanotechnol. 1, 201-207 (2006).
24. Timoshenko, S. Theory of Plates and Shells. McGraw-Hill, New York (1940).
25. Belytschko, T., Liu, W. K. & Moran, B. Nonlinear Finite Elements for Continua and Structures. Wiley, New York (2000).
26. ABAQUS Inc., ABAQUS Analysis User's Manual V6.5 (2004).

Khang, D. Y., Jiang, H., Huang, Y. & Rogers, J. A. A Stretchable form of single crystal silicon for high performance electronics on rubber substrates. Science 311, 208-212 (2006).

Begbie, G. H. Seeing and the Eye. Natural History Press, Garden City, N.Y. (1969).

Born, M. and Wolf, E. Principles of Optics 7th Ed. Cambridge University Press, New York (1999).

Materials and Methods: Nearly all of the materials and methods use setups specifically designed for this specific example, including certain of the planar processing steps and circuit liftoff strategies, the compressible interconnect layouts, the hemispherical PDMS transfer elements, the radial tensioning stages, the fixtures and lens systems, the mux/demux interfaces and the computer software control and are further described herein.

Figure 18:
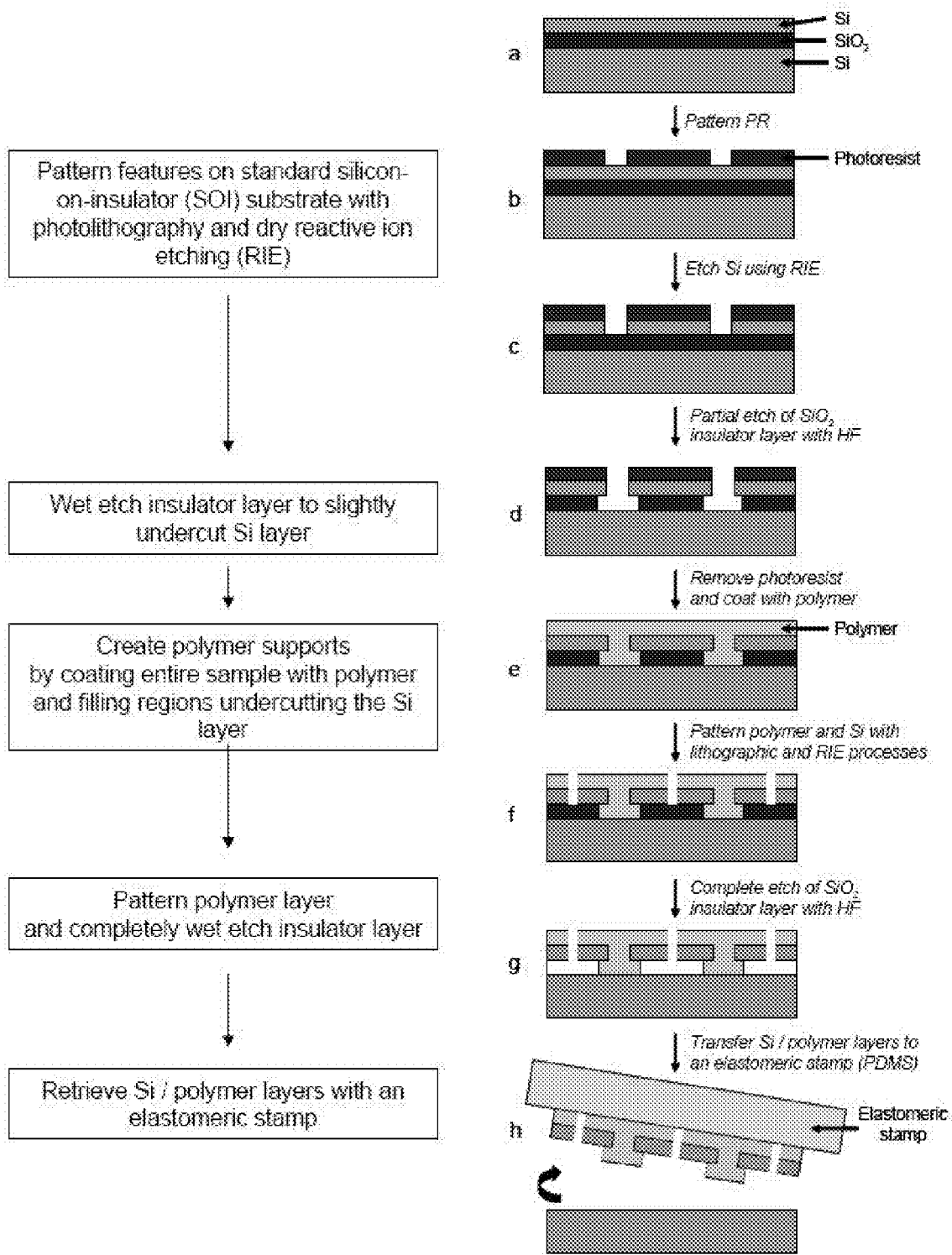
FIG. 18. Process flow for efficient removal of the focal plane array from the SOI wafer. The key steps are d-h, in which a spin cast layer of polymer (polyimide for the results presented here) penetrates through predefined etch holes to keep most of the array suspended from the underlying silicon handle wafer after HF undercut etching of the buried oxide. This strategy avoids stiction that would otherwise frustrate the ability to lift off the array. The posts formed by the polymer prevent unwanted slipping or wrinkling of the array during the HF etching.
Figure 19:
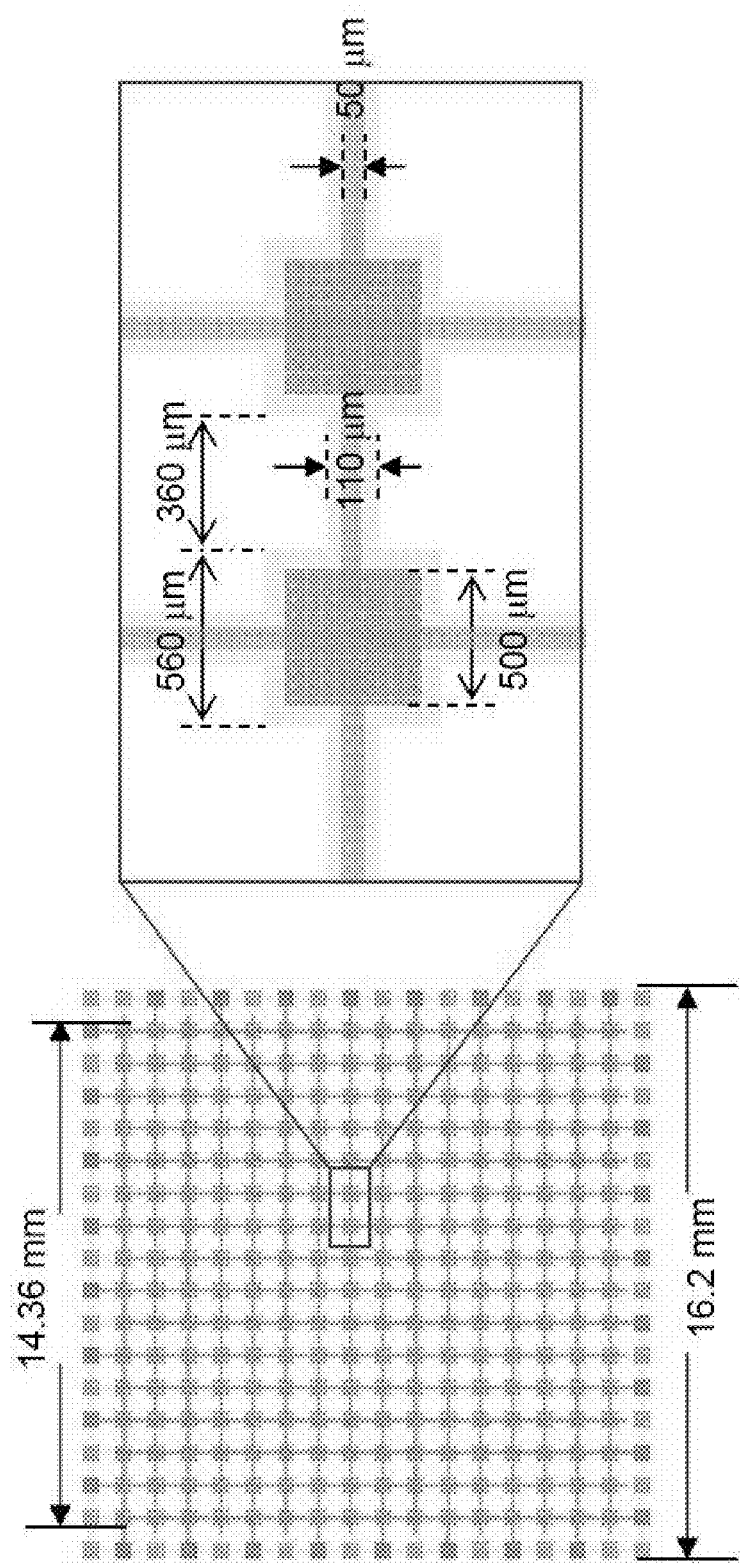
FIG. 19. Schematic illustration of the layout of the focal plane array, with key dimensions indicated. The light brown, dark brown and grey regions correspond to polyimide, Cr/Au and silicon, respectively.
Figure 20:
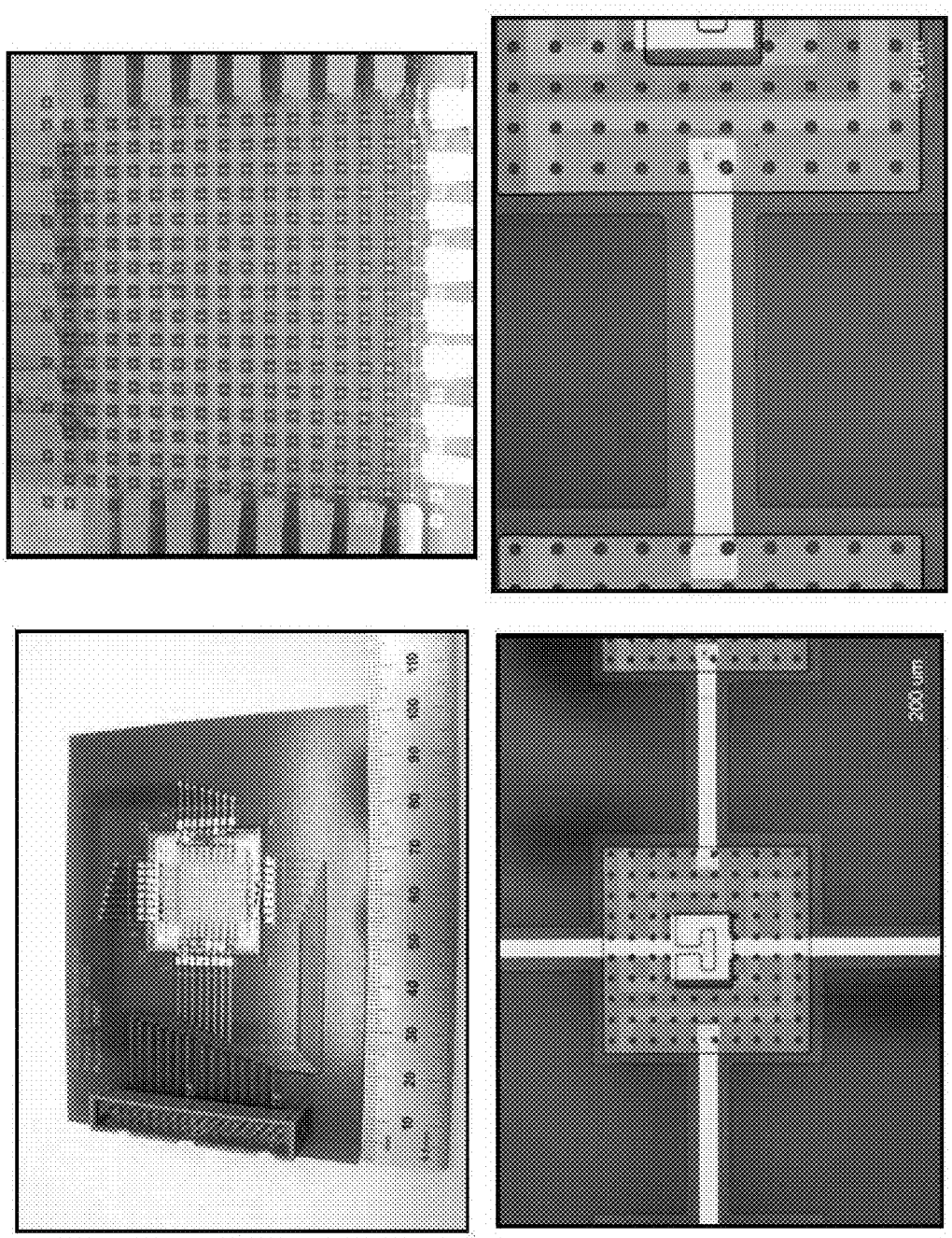
FIG. 20. Photographs (top frames) and optical micrographs (bottom frames) of a planar camera that uses processing approaches, focal plane array designs, interconnect schemes and other features similar to those used for the hemispherical camera. This system was used to evaluate various aspects of the designs and fabrication techniques. These images provide views of certain features that are difficult to show clearly in the hemispherical geometry, due to limited depth of focus associated with optical microscopes.

Planar Processing of the Focal Plane Array: The sequence of processing steps used to form the focal plane arrays appears below in TABLEs 1 and 2. A key part of the fabrication is the formation of polymer posts that support the array during undercut etching of the buried oxide (steps 34-37). FIG. 18 highlights this processing. FIG. 19 schematically illustrates the layout of the array, and provides key dimensions. FIG. 20 presents images of a complete array and micrographs of features of the unit cell, for the simple system of a planar camera with designs that are otherwise similar to those used for the hemispherical system.

TABLE 1

Processing Scheme for Focal Plane Arrays on SOI

1. Clean a 1.2 μm SOI wafer chip (Soitec) (acetone, IPA, water → drying 5 min at 110° C.).
2. HMDS pretreatment for 1.5 min.
3. Pattern photoresist (PR; Clariant AZ5214, 3000 rpm, 30 s) with 365 nm optical lithography through chrome mask (Karl Suss MJB3). Develop in aqueous base developer (MIF 327).
4. Reactive ion etch (RIE; PlasmaTherm 790 Series, 50 mTorr, 40 sccm $SF_6$, 100 W, 20 s).
5. Remove PR. Acetone rinse and then piranha treatment (~1:1 $H_2SO_4$:$H_2O_2$ for 1 min).

} Pattern alignment marks

6. HF cleaning (Fisher, concentrated 49%, 2 sec).
7. Plasma enhanced chemical vapor deposition (PECVD: PlasmaTherm SLR) of 600 nm $SiO_2$.
8. HMDS 1.5 min.
9. Pattern PR.
10. Anneal 5 min.
11. Etch oxide with buffered oxide etch (BOE, 2 min).
12. Remove PR. Acetone rinse and then piranha treatment for 3 min.
13. BOE for 2 s.
14. Anneal at 200° C. for 10 min.
15. Spin-on-dopant (p-type, Boron, Filmtronics B219, 3000 rpm, 30 s).
16. Anneal at 200° C. for 10 min.
17. Anneal at 1050° C. for 30 min.
18. Cleaning (HF for 30 s, 1:1 $HNO_3$:$H_3SO_4$ for 5 min, BOE for 1 min).

} $p^+$ doping

19. PECVD 600 nm $SiO_2$.
20. HMDS 1.5 min.
21. Pattern PR.
22. Anneal 5 min.
23. Etch oxide with buffered oxide etch (BOE, 2 min).
24. Remove PR. Acetone rinse and then piranha treatment for 3 min.
25. BOE for 2 s.
26. Anneal at 200° C. for 10 min.
27. Spin-on-dopant (n-type, Phosphorous, Filmtronics P506, 3000 rpm, 30 s).
28. Anneal at 200° C. for 10 min.
29. Anneal at 950° C. for 20 min.
30. Cleaning (BOE for 4 min, piranha for 3 min, BOE for 1 min).

} $n^+$ doping

31. Pattern PR.
32. RIE (50 mTorr, 40 sccm $SF_6$, 100 W, 4 min.)

} Define PD and BD structures

33. Remove PR. Acetone rinse and then piranha treatment for 3 min.
34. HF for 90 s.

} Pre-treatment

35. Spin coat with polyimide (PI, poly(pyromellitic dianhydride-co-4,4'-oxydianiline), amic acid solution, Sigman-Aldrich, spun at 4,000 rpm for 60 s).
36. Anneal at 110° C. for 3 min and 150° C. for 10 min.
37. Anneal at 250° C. for 2 h in $N_2$ atmosphere.
38. Ultraviolet ozone (UVO) treatment for 5 min.
39. PECVD 200 nm $SiO_2$.
40. HMDS 1.5 min.
41. Pattern PR.
42. RIE (50 mTorr, 40:1.2 sccm $CF_4$:$O_2$, 150 W, 10 min).
43. Remove PR. Acetone rinse.
44. RIE (50 mTorr, 20 sccm $O_2$, 150 W, 15 min.)

} Deposit and pattern PI support layer

TABLE 1-continued

Processing Scheme for Focal Plane Arrays on SOI

45. BOE for 40 s.
46. Sputter 3/150/3 nm of Cr/Au/Cr.
47. PECVD 200 nm $SiO_2$.
48. HMDS 1.5 min.
49. Pattern PR.
50. RIE (50 mTorr, 40:1.2 sccm $CF_4$:$O_2$, 150 W, 10 min).
51. Wet etch Cr/Au/Cr for 20/40/20 s (Transene etchants).
52. Remove PR. Acetone rinse.
53. Remove $SiO_2$. BOE for 60 s.
54. Spin coat with PI.
} Deposit and pattern metal layer 55. Anneal at 110° C. for 3 min, at 150° C. for min.
56. Anneal at 250° C. for 2 h in $N_2$ atmosphere.
57. UVO treatment for 5 min.
58. PECVD 200 nm $SiO_2$.
59. HMDS 1.5 min.
60. Pattern PR.
61. RIE (50 mTorr, 40:1.2 sccm $CF_4$:$O_2$, 150 W, 10 min).
62. Remove PR. Acetone rinse.
63. RIE (50 mTorr, 20 sccm $O_2$, 150 W, 10 min).
64. BOE for 60 s.
} Deposit and pattern PI encapsulation layer 65. UVO treatment for 5 min
66. PECVD 200 nm $SiO_2$.
67. HMDS 1.5 min.
68. Pattern PR.
69. RIE (50 mTorr, 40:1.2 sccm $CF_4$:$O_2$, 150 W, 10 min).
70. RIE (50 mTorr, 20 sccm $O_2$, 150 W, 10 min).
71. Wet etch Cr/Au/Cr for 8/20/8 s.
72. RIE (50 mTorr, 20 sccm $O_2$, 150 W, 15 min).
73. RIE (50 mTorr, 40 sccm $SF_5$, 100 W, 5 min).
74. Remove PR. Acetone rinse.
75. HF for 30 min to etch oxide box layer and release array from handle wafer.
} Pattern holes for oxide box layer etch.

76. Transfer and printing processes.

TABLE 2

Processing Scheme for Focal Plane Arrays on SOI

1. Clean a 1.2 μm SOI wafer chip (Soitec) (acetone, IPA, water → drying 5 min at 110° C.).
2. HMDS pretreatment for 1.5 min.
3. Pattern photoresist (PR; Clariant AZ5214, 3000 rpm, 30 s) with 365 nm optical lithography through chrome mask (Karl Suss MJB3). Develop in aqueous base developer (MIF 327).
4. Reactive ion etch (RIE; PlasmaTherm 790 Series, 50 mTorr, 40 sccm $SF_6$, 100 W, 20 s).
5. Remove PR. Acetone rinse and then piranha treatment (~3:1 $H_2SO_4$:$H_2O_2$ for 1 min).
} Pattern alignment marks 6. HF cleaning (Fisher, concentrated 49%, 2 sec).
7. Plasma enhanced chemical vapor deposition (PECVD; PlasmaTherm SLR) of 600 nm $SiO_2$.
8. HMDS 1.5 min.
9. Pattern PR.
10. Anneal 5 min.
11. Etch oxide with buffered oxide etch (BOE, 2 min).
12. Remove PR. Acetone rinse and then piranha treatment for 3 min.
13. BOE for 2 s.
14. Anneal at 200° C. for 10 min.
15. Spin-on-dopant (p-type, Boron, Filmtronics B219, 3000 rpm, 30 s).
16. Anneal at 200° C. for 10 min.
17. Anneal at 1050° C. for 30 min. in 4:1 $N_2$:$O_2$.
18. Cleaning (HF for 30 s, 1:1 $HNO_3$:$H_2SO_4$ for 5 min, BOE for 1 min).
} $p^+$ doping 19. PECVD 600 nm $SiO_2$.
20. HMDS 1.5 min.
21. Pattern PR.
22. Anneal 5 min.
23. Etch oxide with buffered oxide etch (BOE, 2 min).
24. Remove PR. Acetone rinse and then piranha treatment for 3 min.
25. BOE for 2 s.
26. Anneal at 200° C. for 10 min.
27. Spin-on-dopant (n-type, Phosphorous, Filmtronics P506, 3000 rpm, 30 s).
28. Anneal at 200° C. for 10 min.
29. Anneal at 950° C. for 20 min in 4:1 $N_2$:$O_2$.
30. Cleaning (BOE for 4 min, piranha for 3 min, BOE for 1 min).
} $n^+$ doping TABLE 2-continued Processing Scheme for Focal Plane Arrays on SOI 31. Pattern PR.
32. RIE (50 mTorr, 40 sccm $SF_6$, 100 W, 4 min.)
33. Remove PR. Acetone rinse and then piranha treatment for 3 min.
} Define PD and BD structures 34. HF for 90 s.
35. PECVD 100 $SiO_2$.
36. Pattern PR.
37. BOE for 30 s.
38. Remove PR. Acetone rinse and then piranha treatment for 3 min.
} Pre-treatment with sacrificial oxide layer.

39. Spin coat with polyimide (PI, poly(pyromellitic dianhydride-co-4,4'-oxydianiline), amic acid solution, Sigman-Aldrich, spun at 4,000 rpm for 60 s).
40. Anneal at 110° C. for 3 min and 150° C. for 10 min.
41. Anneal at 250° C. for 2 h in $N_2$ atmosphere.
42. Ultraviolets ozone (UVO) treatment for 5 min.
43. PECVD 200 nm $SiO_2$.
44. HMDS 1.5 min.
45. Pattern PR.
46. RIE (50 mTorr, 40:1.2 sccm $CF_4:O_2$, 150 W, 10 min).
47. Remove PR. Acetone rinse.
48. RIE (50 mTorr, 20 sccm $O_3$, 150 W, 13 min.)
49. BOE for 40 s.
} Deposit and pattern PI support layer 50. Sputter 3/150/3 nm of Cr/Au/Cr.
51. PECVD 200 nm $SiO_2$.
52. HMDS 1.5 min.
53. Pattern PR.
54. RIE (50 mTorr, 40:1.2 sccm $CF_4:O_2$, 150 W, 10 min).
55. Wet etch Cr/Au/Cr for 20/40/20 s (Transene etchants).
56. Remove PR. Acetone rinse.
57. Remove $SiO_2$. BOE for 60 s.
58. Spin coat with PI.
} Deposit and pattern metal layer 59. Anneal at 110° C. for 3 min, at 150° C. for 10 min.
60. Anneal at 250° C. for 2 h in $N_2$ atmosphere.
61. UVO treatment for 5 min.
62. PECVD 200 nm $SiO_2$.
63. HMDS 1.5 min.
64. Pattern PI.
65. RIE (50 mTorr, 40:1.2 sccm $CF_4:O_2$, 150 W, 10 min).
66. Remove PR. Acetone rinse.
67. RIE (50 mTorr, 20 sccm $O_2$, 150 W, 10 min).
68. Wet etch Cr/Au/Cr for 8/20/8 s.
69. RIE (50 mTorr, 20 sccm $O_2$, 150 W, 13 min).
70. RIE (50 mTorr, 40 sccm $SF_6$, 100 W, 5.5 min).
} Deposit PI and pattern holes for oxide box layer etch.

71. BOE for 40 s.
72. UVO treatment for 5 min
73. PECVD 200 nm $SiO_2$.
74. HMDS 1.5 min.
75. Pattern PR.
76. RIE (50 mTorr, 40:1.2 sccm $CF_4:O_2$, 150 W, 10 min).
77. Remove PR. Acetone rinse.
78. RIE (50 mTorr, 20 sccm $O_2$, 150 W, 16 min).
} PI isolation 79. HF for 30 min to etch oxide box layer and release array from handle wafer.
80. Transfer and printing processes.

Figure 21:
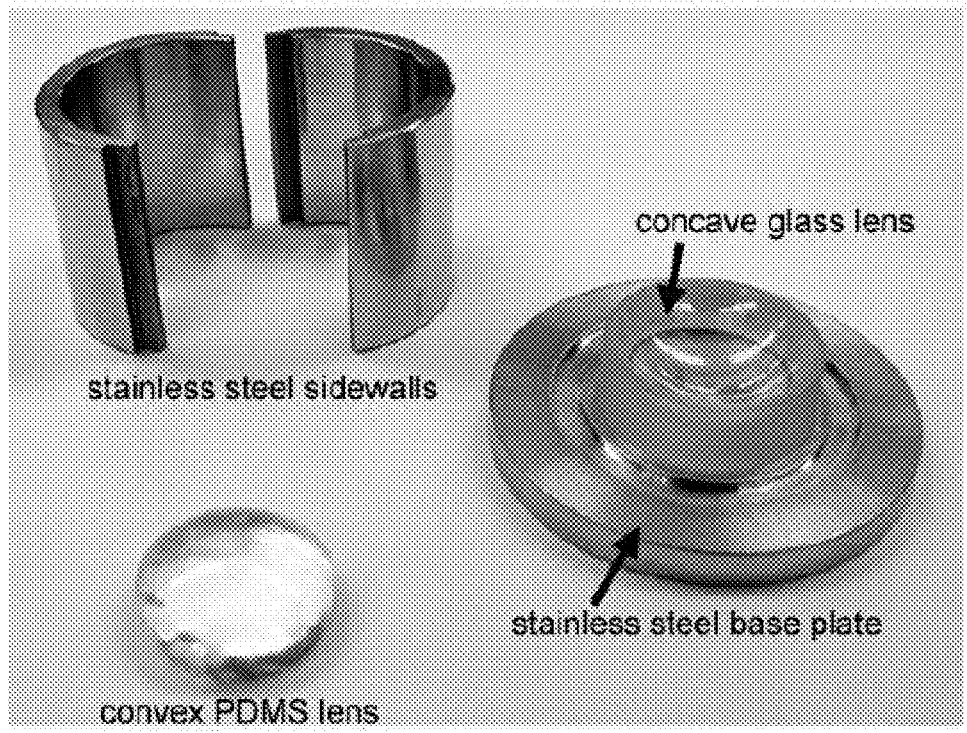
FIG. 21. Optical images of the mounting jig used for casting and curing the hemispherical PDMS transfer elements.
Figure 21:
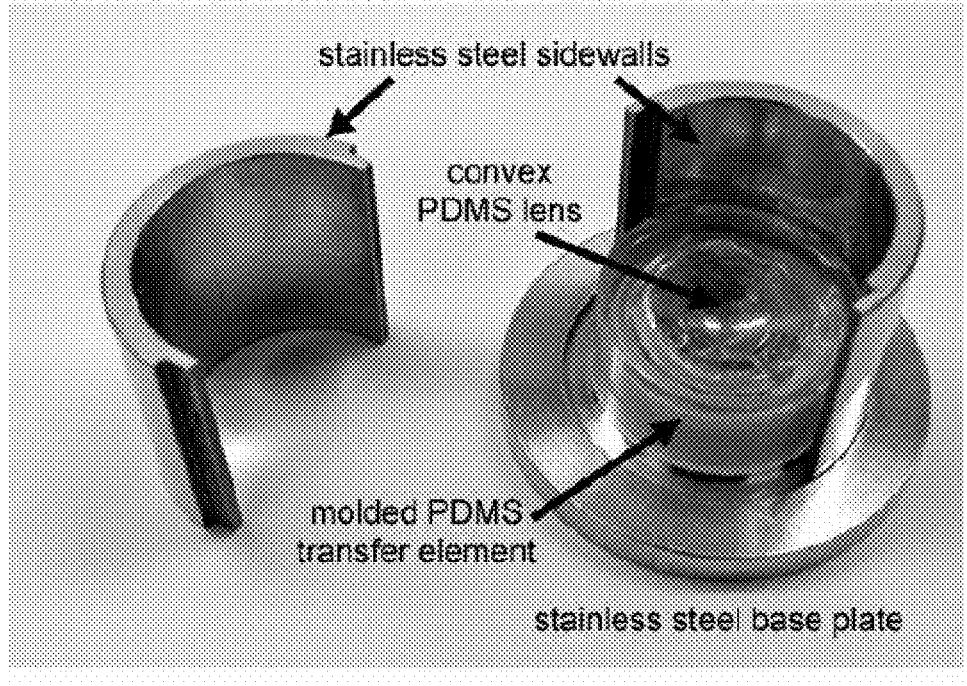
Figure 22:
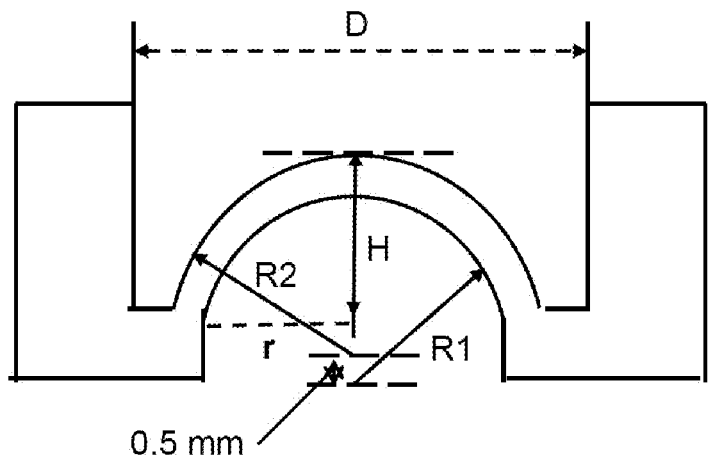
FIG. 22. Cross sectional schematic illustration of the layout of the hemispherical PDMS transfer element, with key dimensions.
Figure 23:
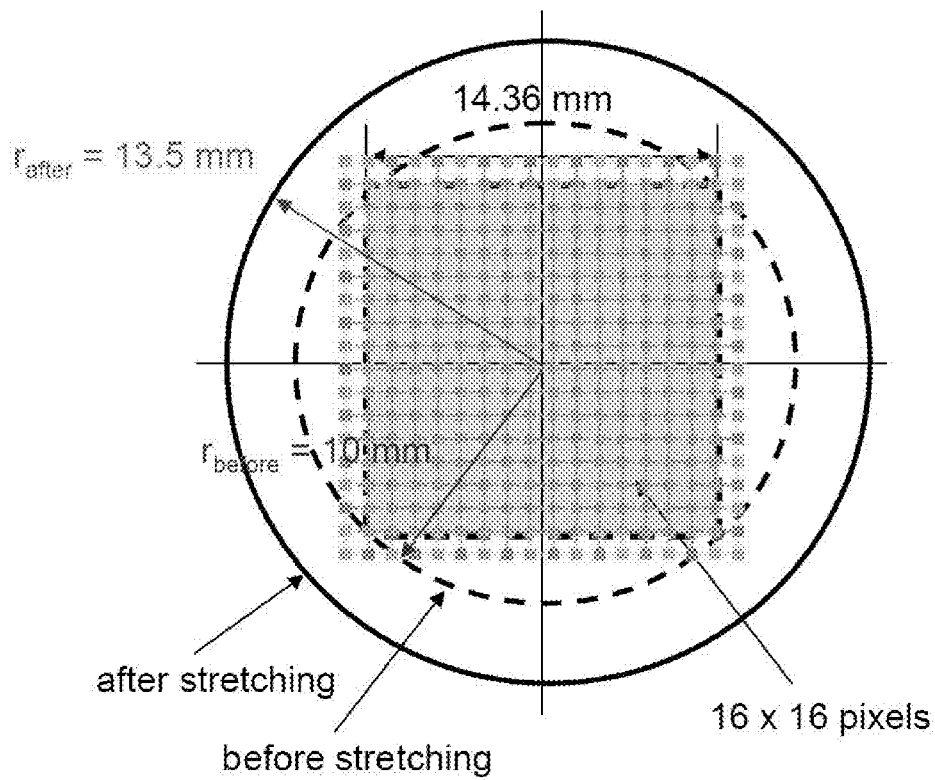
FIG. 23. Top view schematic illustration of the layout of the hemispherical PDMS transfer element, with key dimensions in the as-fabricated and radially tensioned configurations. An overlay in the center portion of this image shows the layout of the passive matrix array, illustrated to scale.

Fabricating the Hemispherical PDMS Transfer Element: Casting and curing procedures form these transfer elements or stamps out of PDMS obtained from a commercial vendor (Sylgard 184, Dow Corning). FIG. 21 shows the jig and the opposing convex and concave lenses (radius of curvature of 12.9 mm and diameter of 25.4 mm) used for this purpose. The convex lens was made of PDMS and was molded from the concave glass lens. FIG. 22 provides a cross sectional illustration of the hemispherical transfer element with the important dimensions. Note the large, raised rim around the perimeter of the element (rim width is 1.5, 2.0 or 2.5 mm). This feature matches paddle arms in the tensioning stage described next. FIG. 23 shows a top view illustration of the PDMS transfer element in its relaxed and tensioned state, with a to-scale illustration of the focal plane array overlaid.

Figure 24:
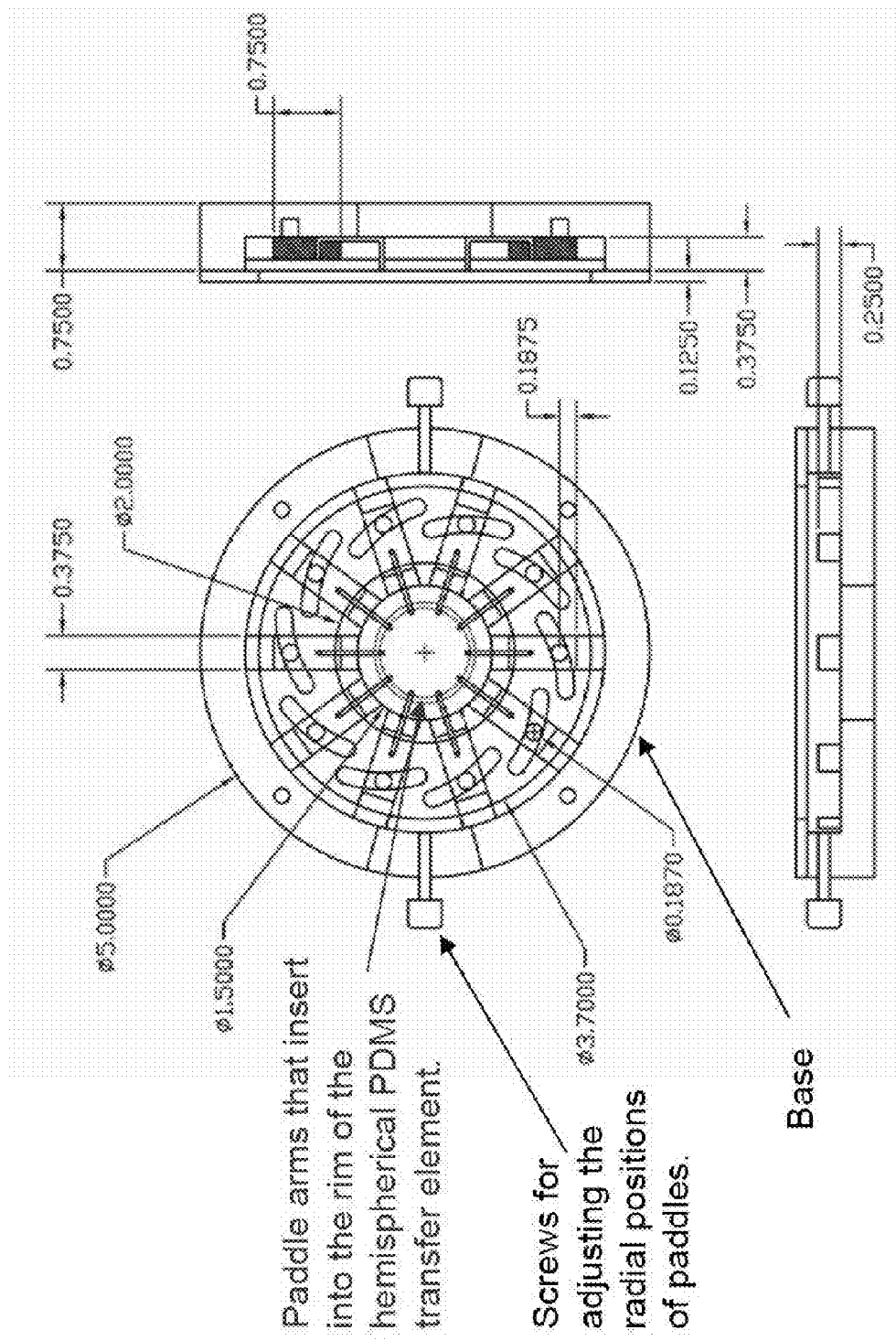
FIG. 24. Computer aided design drawing of the radial tensioning stage. The hemispherical PDMS element mounts in the center. The paddle arms move radially to expand the hemisphere into a planar drumhead shape.
Figure 25:
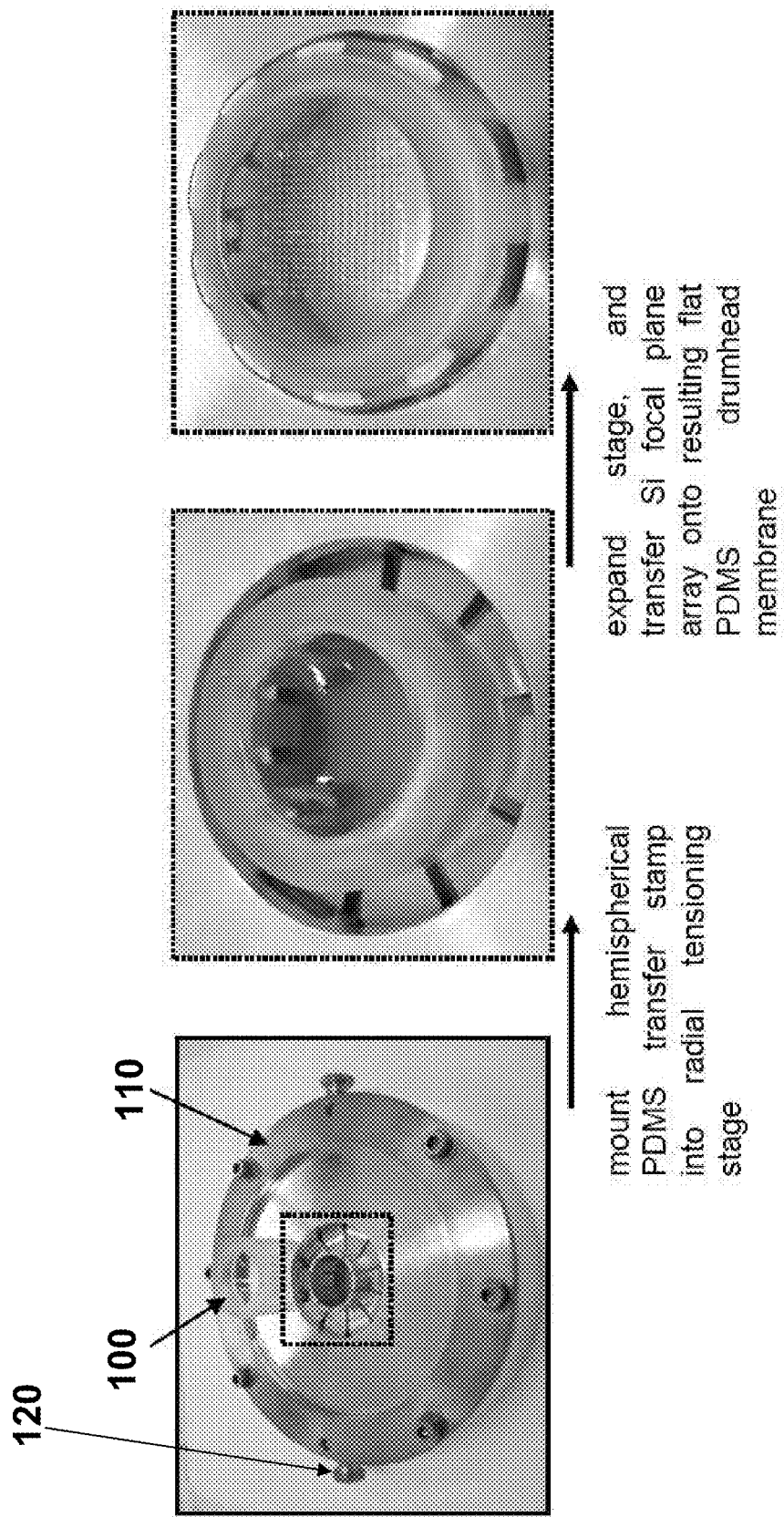
FIG. 25. Photograph of radial tensioning stage and PDMS transfer element (left frame). PDMS element mounted on the paddle arms of the stage (center frame), corresponding to the region of the image on the left indicated with a dashed line box. The right frame shows the PDMS element in its flat, drumhead configuration with a focal plane array on its surface.
Figure 26:
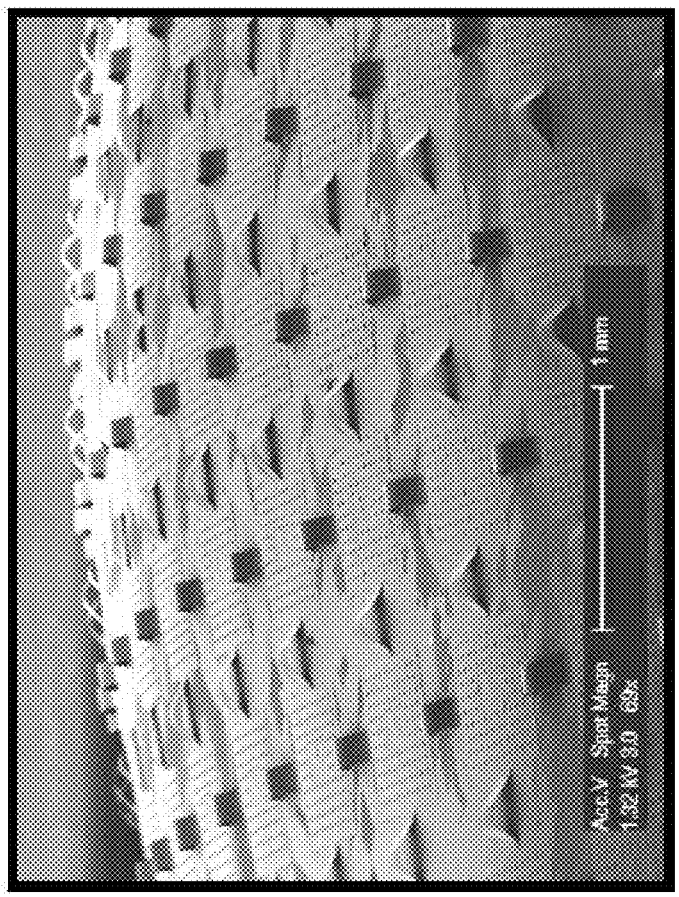
FIG. 26. Photograph of a hemispherical PDMS transfer element with a compressible focal plane array on its surface. The SEM shows of a portion of the array, illustrating the compressible interconnects.
Figure 26:
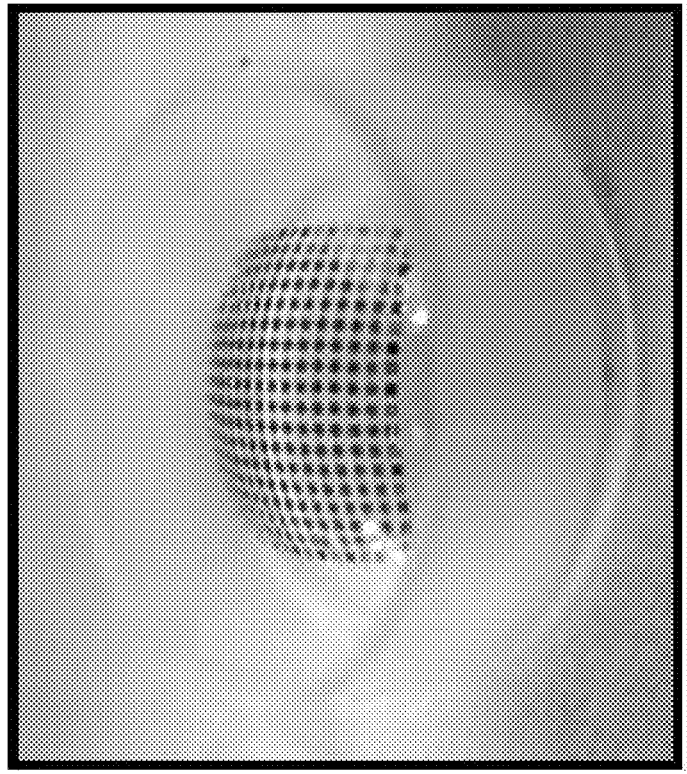

Stretching the PDMS Transfer Element and Transfer Printing: A specially designed radial tensioning stage provided a reproducible, controlled means to expand the hemispherical PDMS transfer element into a flat, drumhead state. FIG. 24 provides a computer aided design drawing of this system based on a scroll plate design. Ten separate paddle arms move in a coordinated fashion in the radial direction by an amount that can be controlled using a manual rotary stage. The raised rim of the PDMS element mounts onto the paddles. FIG. 25 shows images of the stage and an element in various stages of the stretching process. Referring to FIG. 25, holder 110 is capable of securably receiving a stamp 100. Force generator 120 is operably connected to the holder 110 for generating a force on a stamp mounted therein to substantially flatten the stamp (see right-most panel). FIG. 25 shows a stamp that is a hemispherically-shaped PDMS transfer element and a force generator 120 comprising a radial tensioning stage with ten paddle arms. FIG. 26 shows an image after liftoff of the array and removal from the tensioning stage, corresponding to the next to last frame in FIG. 14. Note that this array is a higher density array of passive silicon elements (20×20 µm, with 50 nm thickness) and nearest neighbor connections (20×4 µm, with 50 nm thickness).

Figure 27:
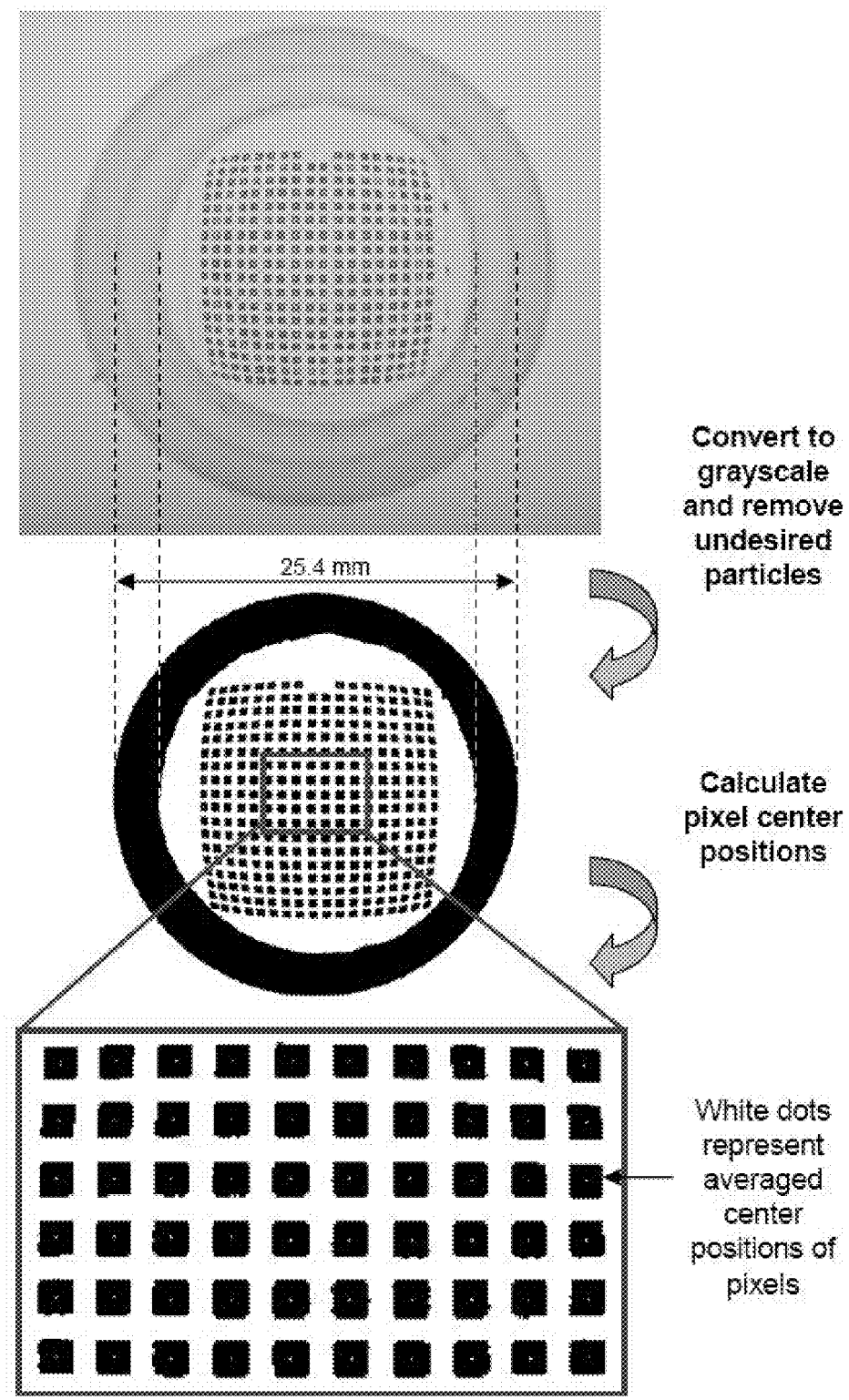
FIG. 27. Procedures for evaluating the spatial distributions of the pixel elements in a hemispherical focal plane array on a glass substrate. The process starts with a photograph of the system (top frame) that is then converted into a binary format (center frame) and then manipulated with imaging processing software to locate the spatial coordinates of the centers of the pixels.

The spatial distributions of the pixels in such an array are important to quantify and understand. FIG. 27 shows in a sequence of frames corresponding to the process that we used to evaluate these distributions. A top view optical image (top frame) is converted to binary format (middle frame), from which specially developed software locates the centers of the pixels and returns the coordinates (bottom frame).

Figure 28:
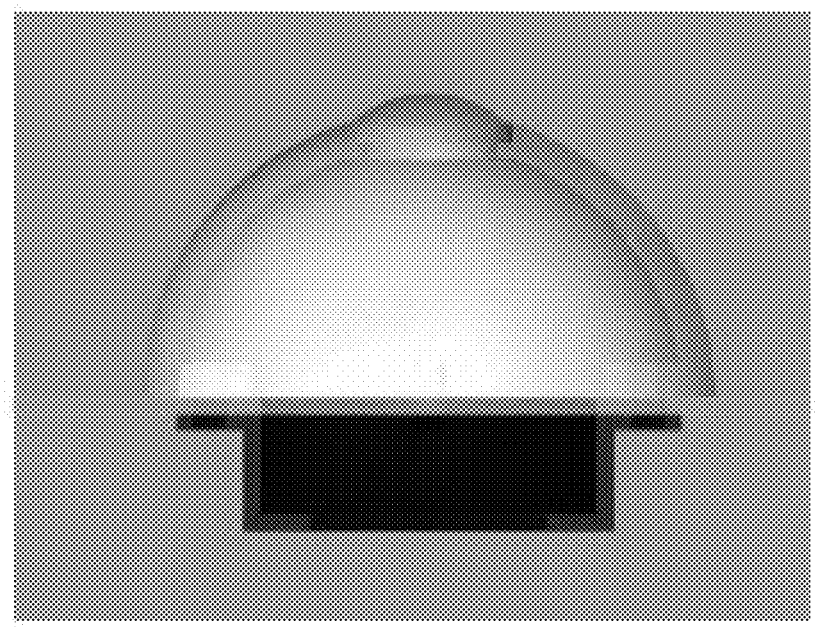
FIG. 28. Cross sectional schematic illustration and computer aided design drawing of the spherical cap and imaging lens, with key dimensions.
Figure 28:
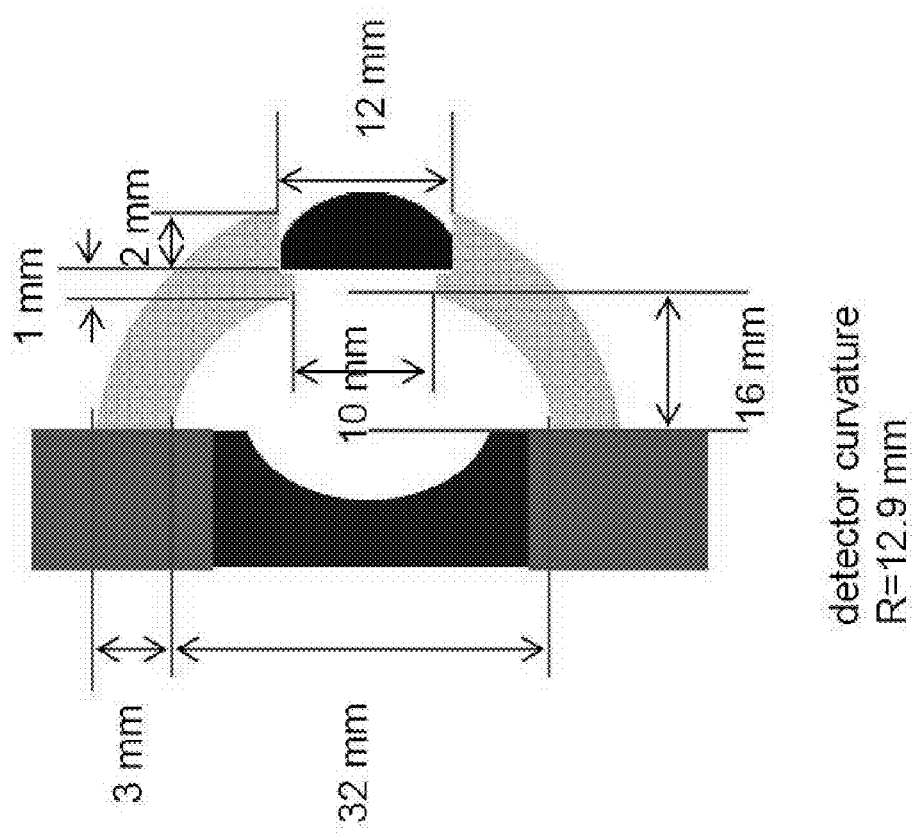

Integrating with Hemispherical Cap and Imaging Lens: FIG. 28 shows cross sectional schematic illustrations and computer aided design drawings of the hemispherical cap and integrated imaging lens, with key dimensions. These components complete the cameras, but they do not represent critical design components.

Figure 29:
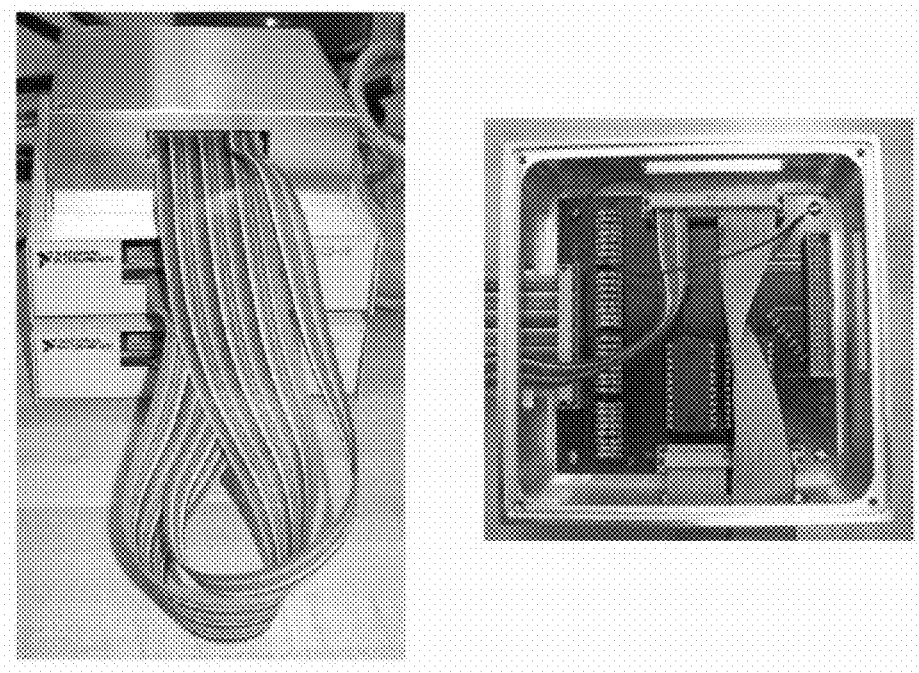
FIG. 29. Photograph of the mux/demux system for image acquisition.
Figure 30:
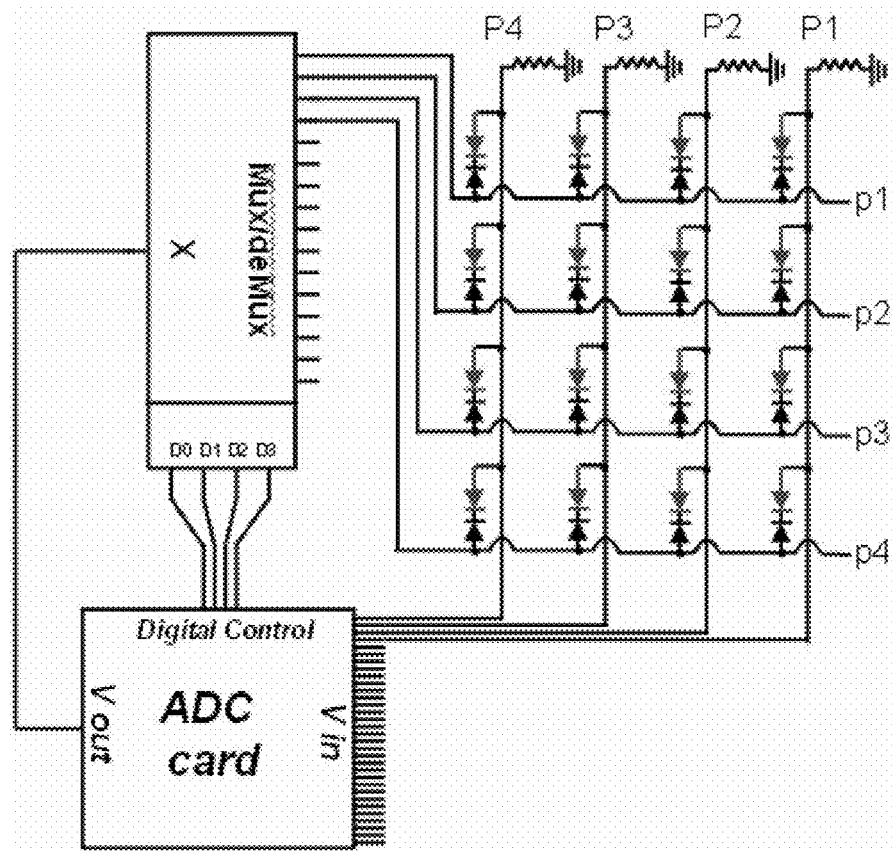
FIG. 30. Circuit diagram for the electronics for image acquisition.
Figure 57:
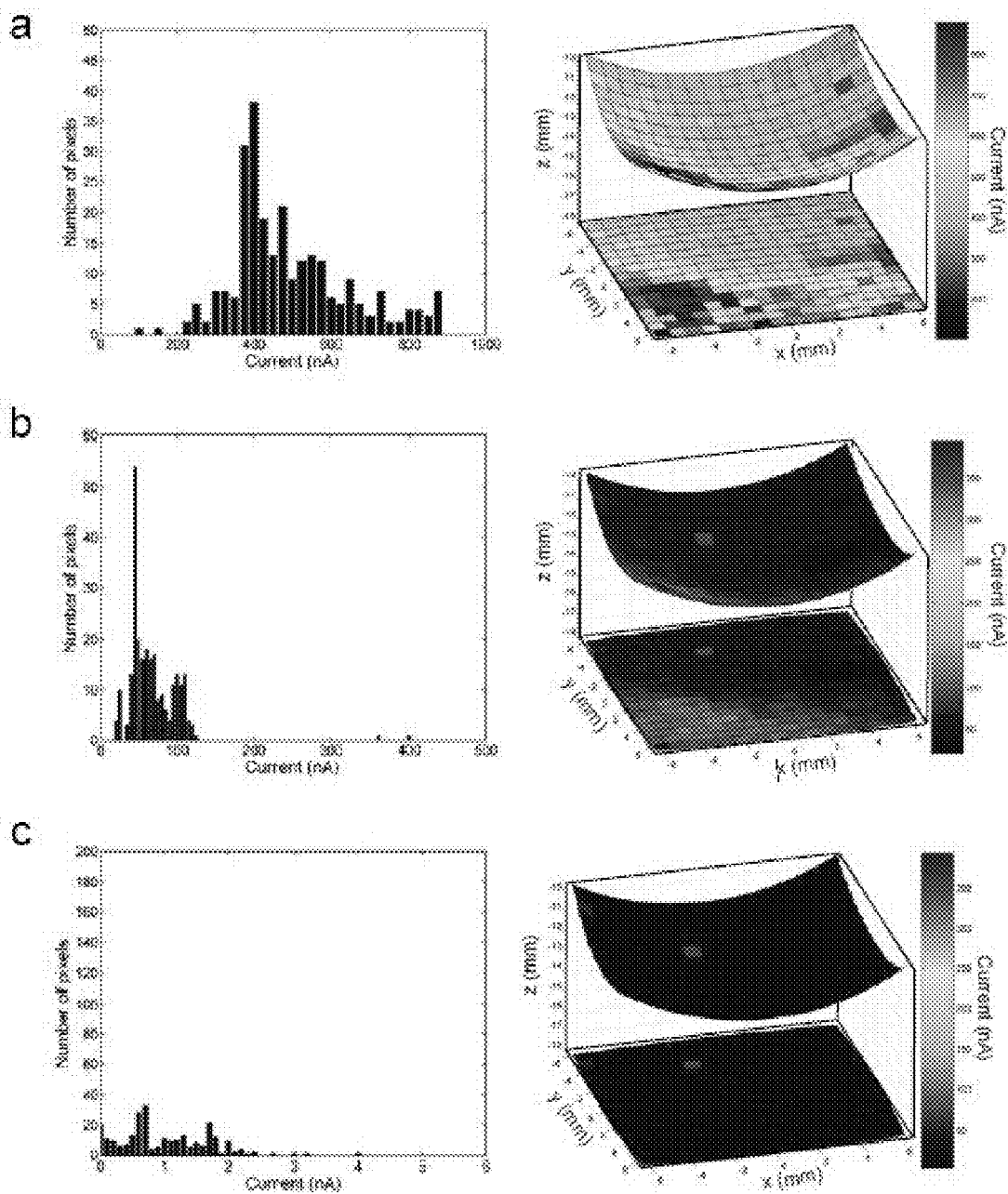
FIG. 57 Optoelectronic response of the 16 by 16 pixel photodetector array in a hemispherical camera. The current responses at an applied bias of 4 V have been measured for all the pixels at three different light intensities, including a, brightest laser light (514.5 nm), b, approximately one-tenth of the bright case, and c, complete darkness. The histograms on the left show the distribution of pixels with a given current response, while the color-maps on the right show the mapping of pixels with a given response in the hemispherical camera.
Figure 58:
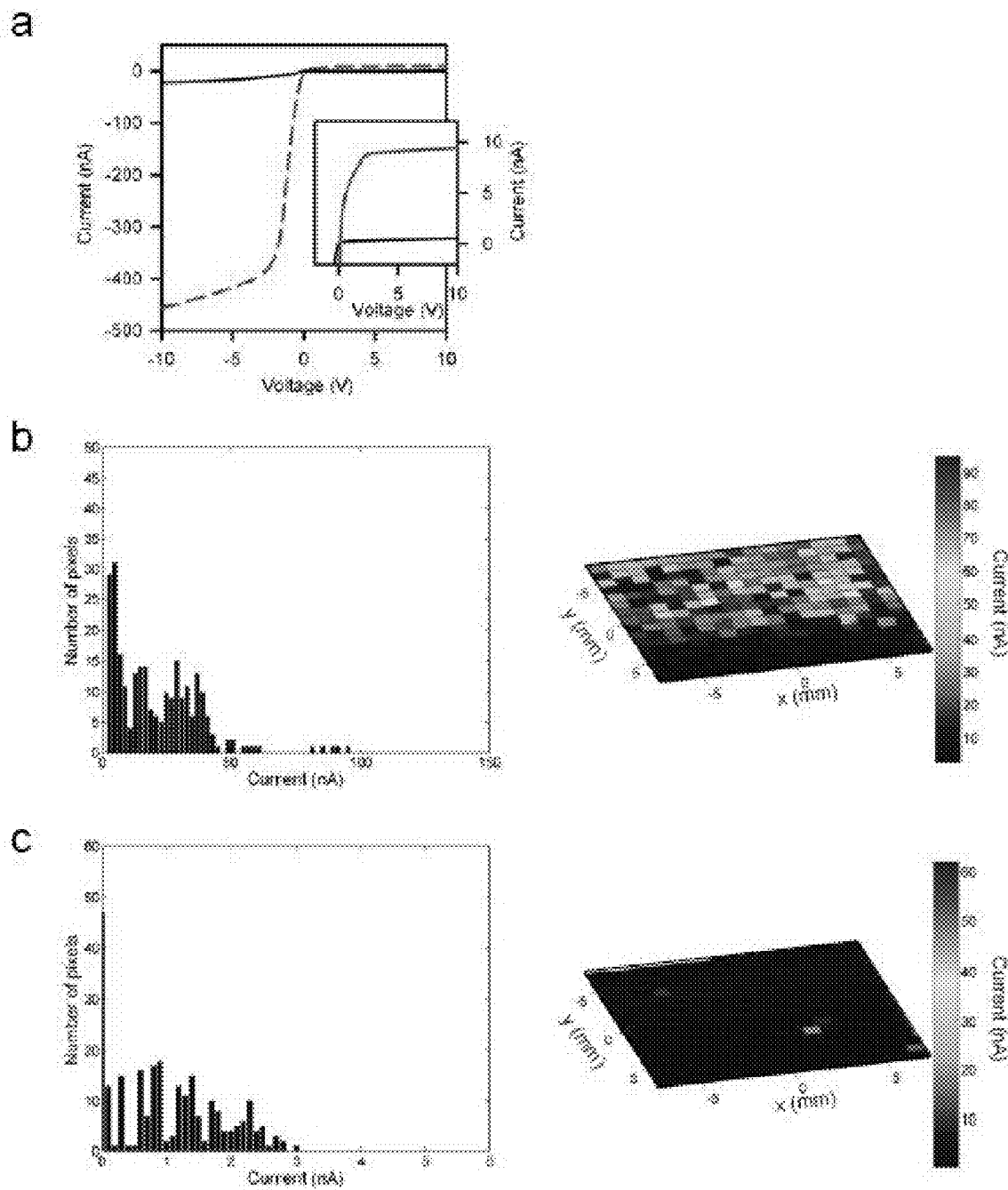
FIG. 58 Optoelectronic response of the 16 by 16 pixel photodetector array in a planar camera. a, Electrical properties of a unit cell. The data were measured by contacting the row and column electrodes that address this position in the hemispherical array, via pads at the perimeter of the system. The data (red: exposed to light; black: in the dark) show high contrast response to light exposure. The current responses at an applied bias of 4 V have been measured for all the pixels at two different light intensities, including b, bright case with a sheet of white paper backlit with halogen lamps and optically filtered to 620~700 nm wavelengths (identical setup used to generate FIG. 53*e-g*), and c, complete darkness. The histograms on the left show the distribution of pixels with a given current response, while the colourmaps on the right show the mapping of pixels with a given response in the hemispherical camera.

Imaging with the Camera: Mounting the focal plane arrays on specially design printed circuit boards, forming interconnections and integrating with mux/demux electronics and software control systems enables image acquisition. For electrical connections to the circuit board, we use electron beam evaporation of Cr/Au through flexible shadow masks draped over the edge of the hemispherical camera substrate. FIG. 29 shows the mux/demux electronics, and FIG. 30 provides a circuit diagram of these systems. The current responses at an applied bias of 4 V were measured for all the pixels in the 16 by 16 hemispherical camera used to generate the results of FIG. 17. See FIG. 57. Three different light intensities ranging from bright laser light (514.5 nm) to complete darkness have been used to test the detector arrays. A good range of sensitivity has been achieved for the photodetecting pixels, from current responses of 400~800 nA at the highest brightness to 0.5~2 nA in the dark state. The maps illustrate the distribution of measured responses throughout the hemispherical detector array and highlight the response uniformity (two pixels with the non-ideal response of large current in the dark are visible here). The grayscale images (e.g., FIG. 17F and FIG. 53a,b) represent the response signals for each pixel after normalization using the equation Signal=$(I_{signal}-I_{min})/(I_{max}-I_{min})$, where $I_{signal}$ is the measured current at the exposure condition, $I_{max}$ is the measured reference current at the brightest condition (maximum current), and $I_{min}$ is the measured reference current at the dark condition (minimum current). FIG. 58 contains an electrical response characterization of the pixels in the 16 by 16 planar camera; high pixel yields also were achieved in cameras with this geometry (3 out of 256 pixels have a less sensitive response).

Figure 31:
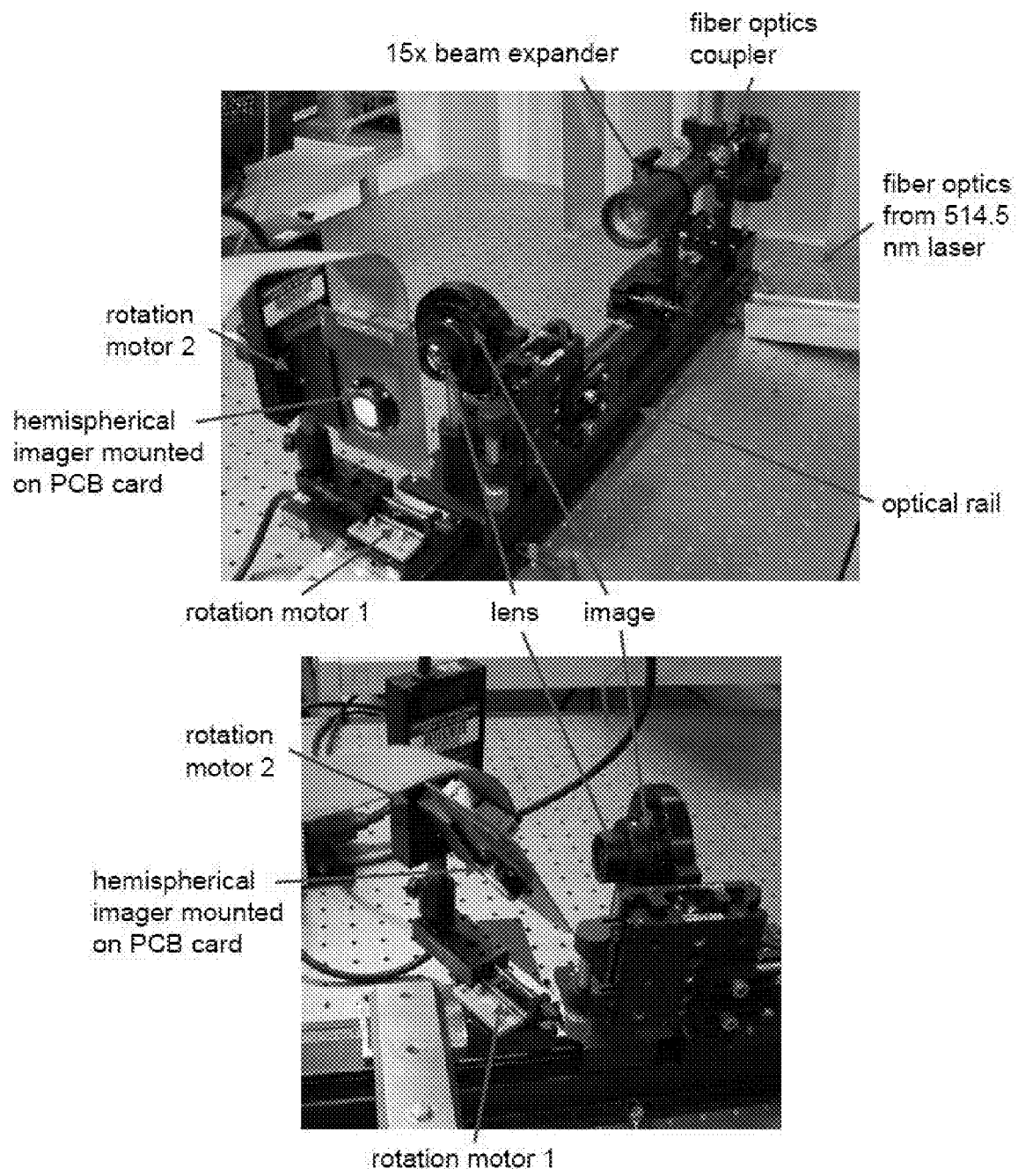
FIG. 31. Photographs of the optical setup used for image acquisition.
Figure 32:
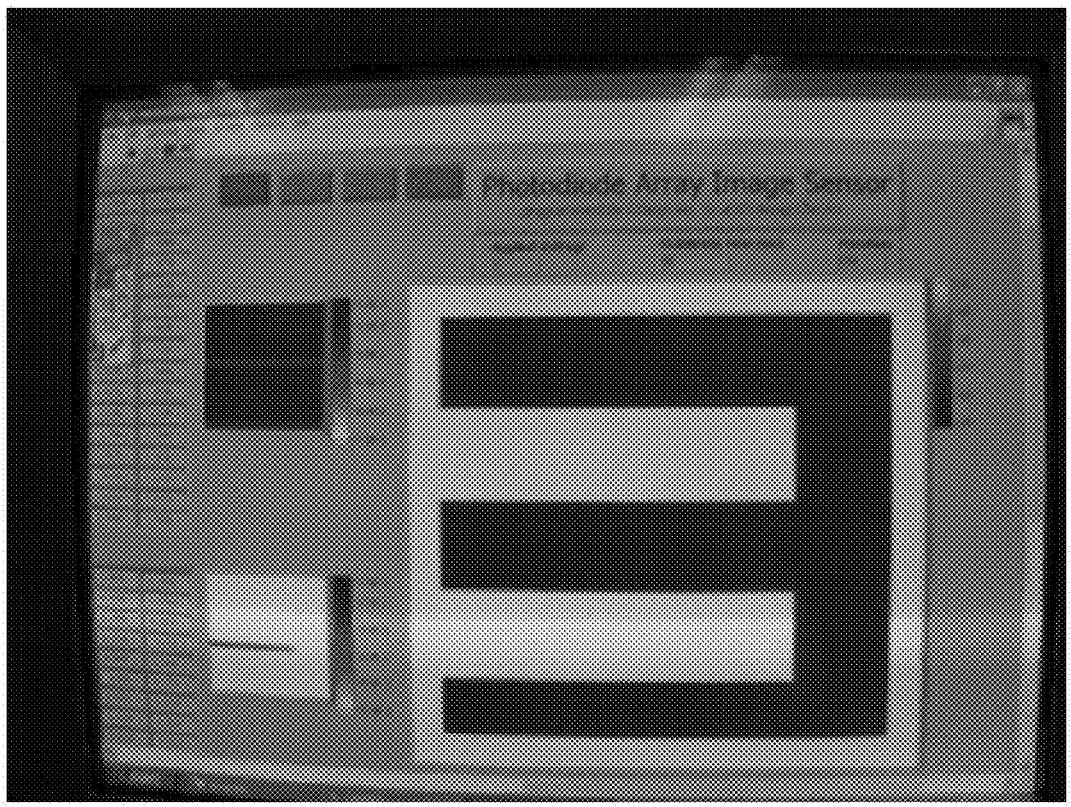
FIG. 32. Screen capture for the software interface used for imaging.
Figure 32:
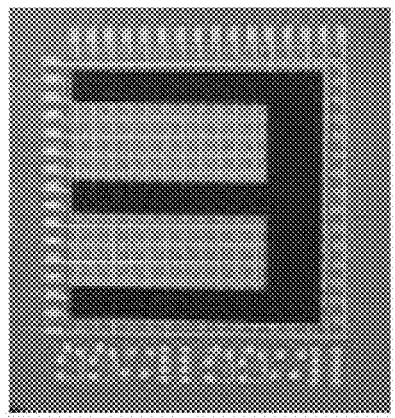

FIG. 31 demonstrates the optical setup used to image with the hemispherical detector. Green laser light (514.5 nm) is fed through an optical fiber to a fiber optics coupler and a beam expander (Thorlabs BE15M), and then onto a transparency film with an about 1 cm² area printed image generated using a commercial laser printer (1200 dpi). The projected image passed through a plano-convex lens (Thorlabs BPX055 and onto the hemispherical electronic eye camera. Two rotating motors are used to scan the image over nearly the entire surface of the detector and maintain an eccentric point at the optical axis. FIG. 32 shows the computer user interface. The computer user interface used to capture images with the cameras was written in National Instruments LabView and is shown in FIG. 32. The maximum acquisition rate of the cameras (~1 frame per second) was limited by the control system and could be improved by adding more sophisticated electronics. The minimum acquisition time for an individual pixel was determined to be 15 ms as limited by the control electronics. Videos demonstrate the data acquisition process using a hemispherical camera, as well as the detector rotations necessary to achieve higher resolution images.

Figure 54:
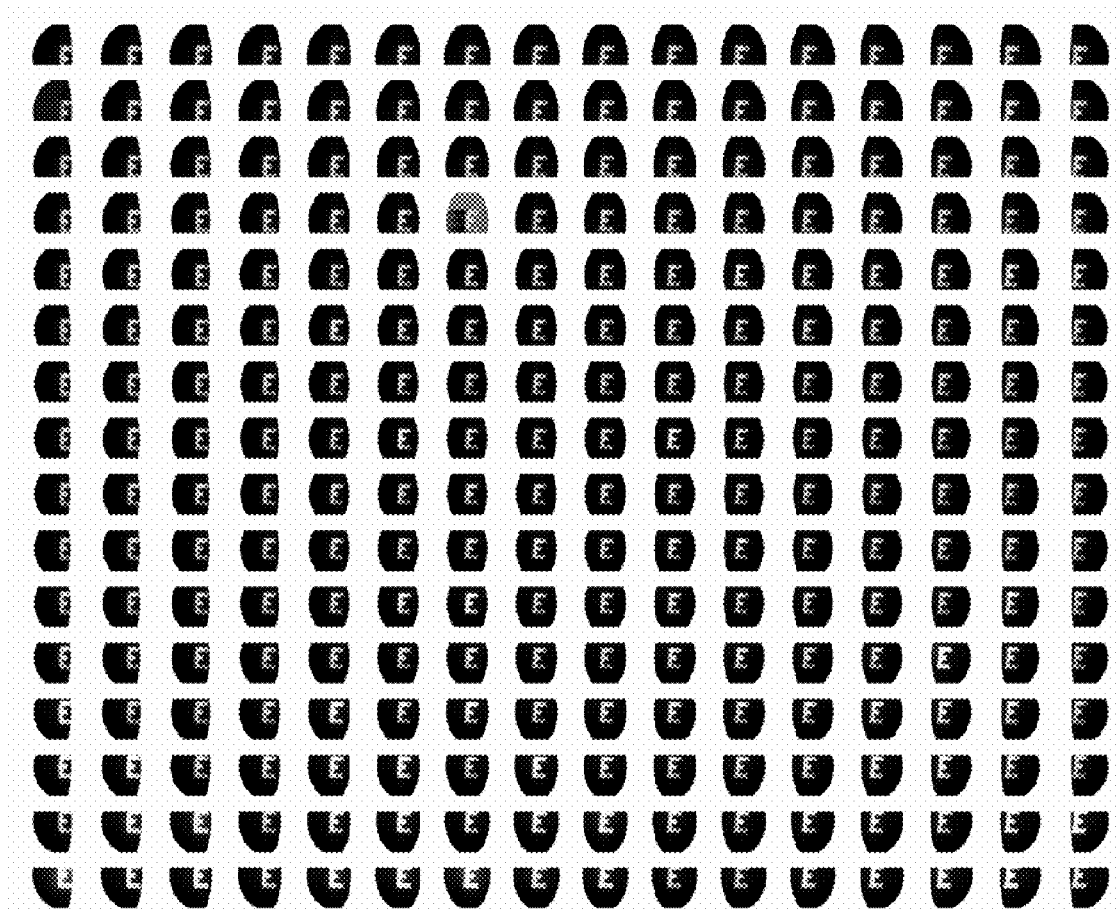
FIG. 54 The character "E" imaged by each pixel in the hemispherical camera when scanned over the entire projected image (scans from −40 to 40° in the θ and φ directions, 1.0° increments). The images cover varying portions of the hemispherical surface and are displayed as projected onto a planar surface.
Figure 55:
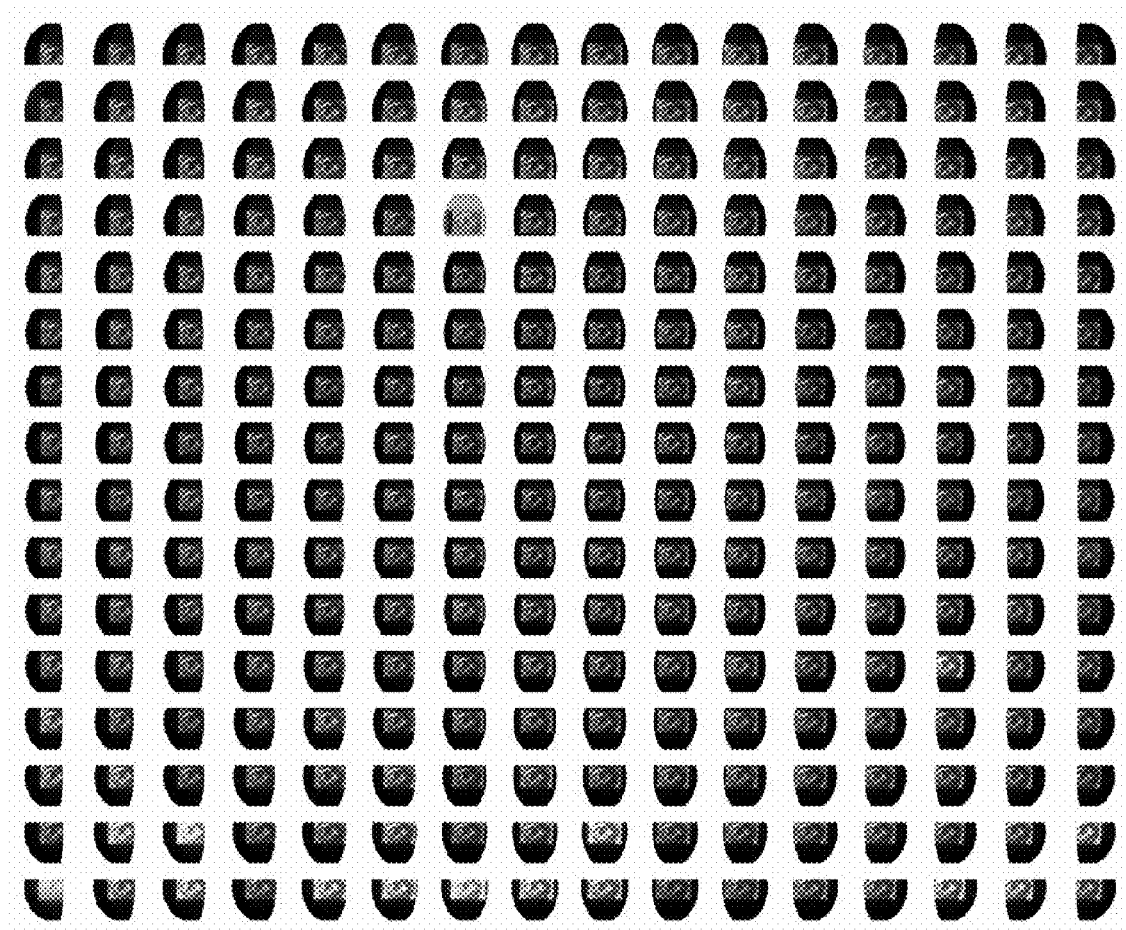
FIG. 55 A drawing of an eye imaged by each pixel in the hemispherical camera when scanned over the entire projected image (scans from −40 to 40° in the θ and φ directions, 0.5° increments). The images cover varying portions of the hemispherical surface and are displayed as projected onto a planar surface.

FIGS. 54 and 55 present the images acquired by each pixel in the hemispherical 16 by 16 detector array as they are scanned over the entire image. The camera scanned from −40 to 40° in both the θ and ϕ directions in 0.5° increments, with the center of the detector array positioned at θ=0° and ϕ=0°. This 0.5° scanning resolution corresponds to ~7-8 steps between pixels in the detector array. The yield of functioning pixels is high; only 2 out of 256 pixels, those at (row,column) positions (2,1) and (4,7), have a less sensitive response during imaging and should not be utilized.

Comparison of aberrations/distortions in hemispherical and planar detectors: Experiments A comparison of focusing abilities for hemispherical and planar detectors required non-collimated light sources and a wide aperture for a large field of view. These two conditions allow imaging with light that is non-paraxial and simulates the standard operation mode of photographic cameras. The optical test setup for making the focusing comparison in FIG. 53c-f used rear-illumination of a black and white pattern printed on paper with halogen lamps. A pair of optical filters limited the incident light wavelength to ~620-700 nm and minimized contributions from chromatic aberrations. The paper aided in diffusion of the light from the lamps. A high numerical aperture plano-convex lens (Edmund Optics PCX NT45-083; diameter=12 mm; focal length=12 mm) was used for the imaging optics with the convex side towards the light source. The lens to object distance was fixed at 62.85 mm.

Figure 56:
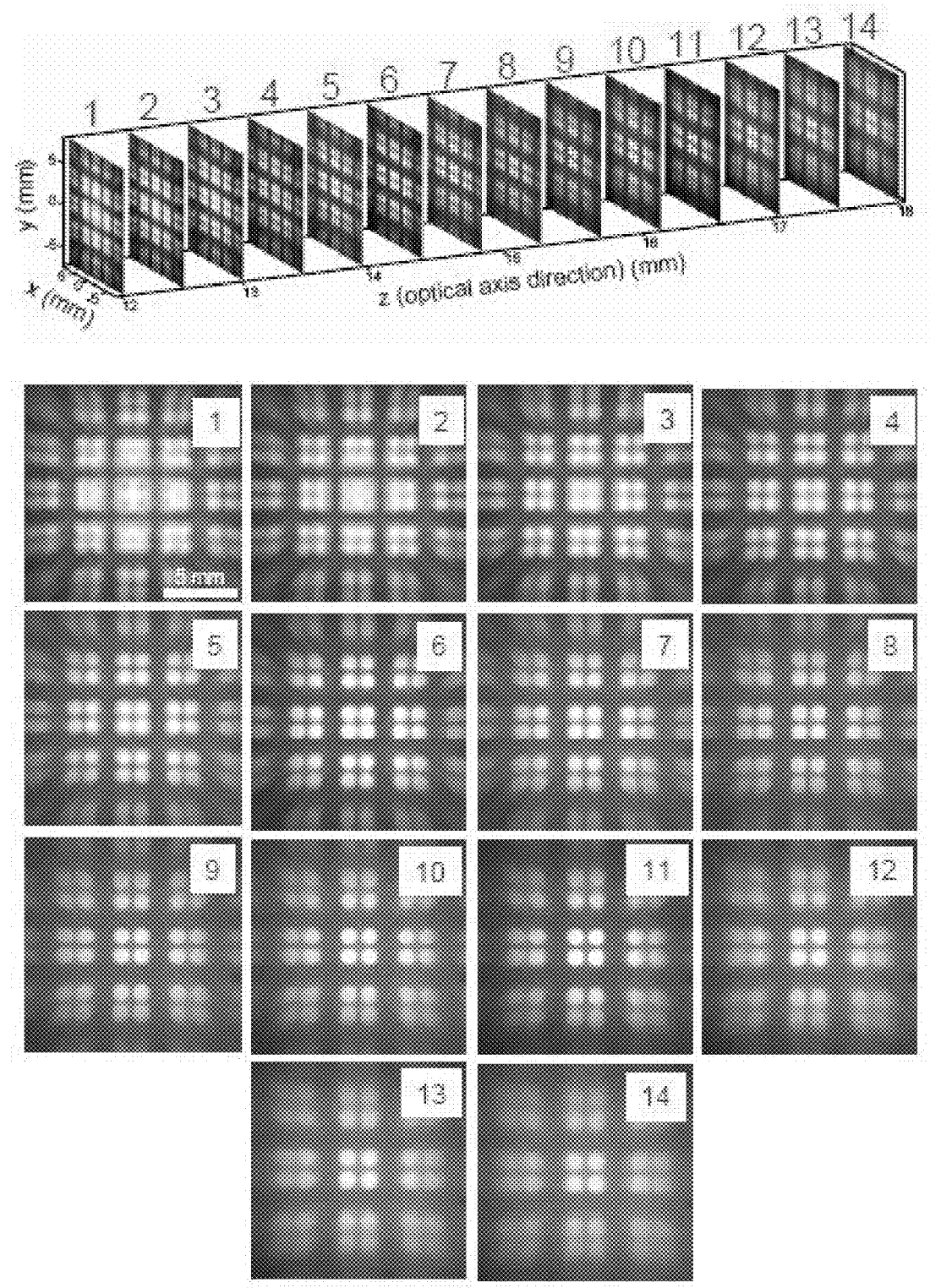
FIG. 56 High-resolution photographs on a planar screen positioned at varying distances from the lens. The images were acquired between 12.15 (image #1, left) and 18.00 mm (image #13, right) from the lens and demonstrate the curvilinear nature of the optimal focal surface.
Figure 59:
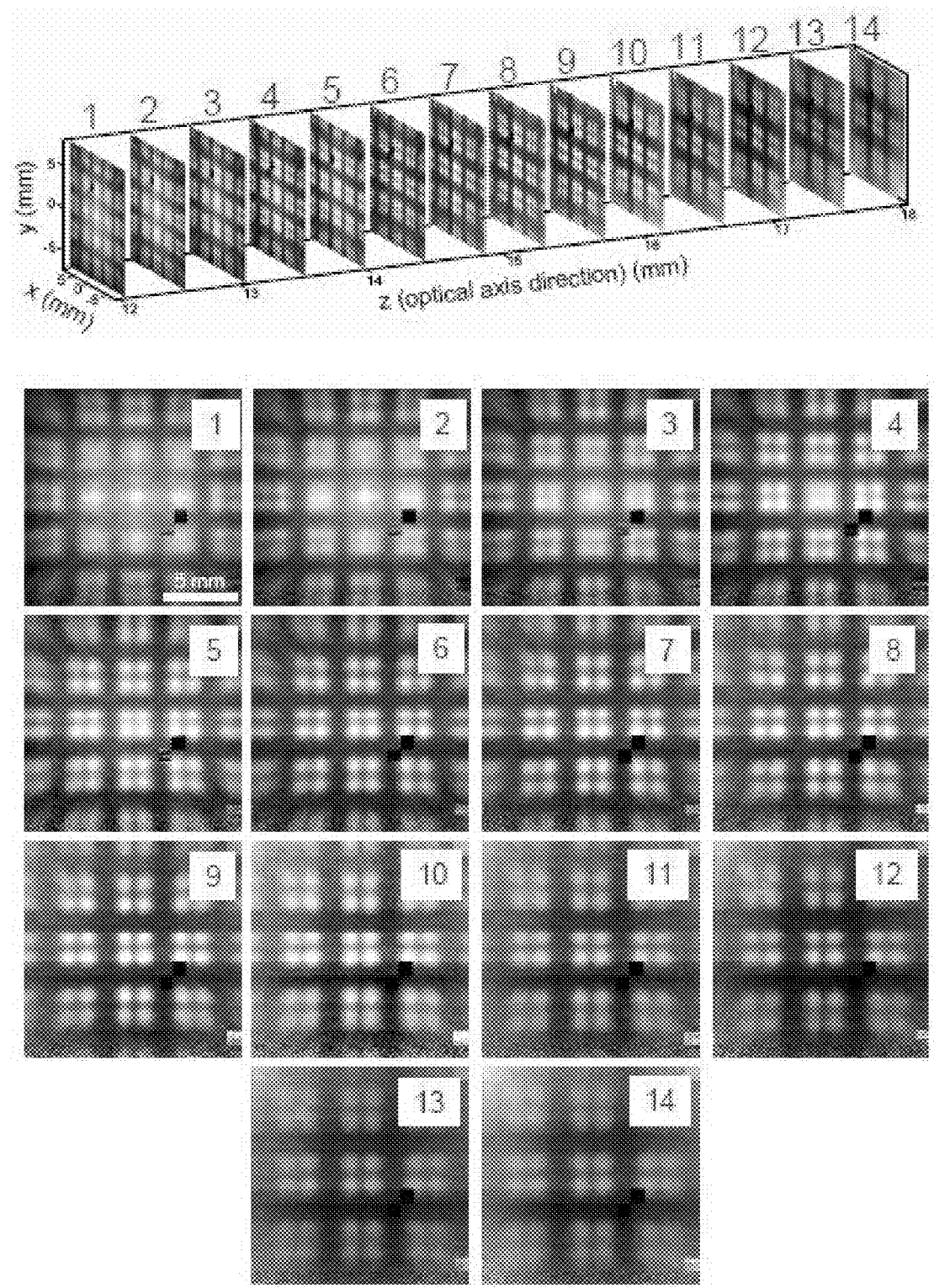
FIG. 59 Photographs of projected images acquired with the fabricated 16 by 16 planar camera at varying distances from the lens. The images were acquired between 12.15 (image #1, left) and 18.00 mm (image #14, right) from the lens and demonstrate the curvilinear nature of the optimal focal surface.

Two types of planar screens were used to demonstrate the curvilinear shape of the optimal focal surface. FIG. 56 shows high resolution photographs of the projected images on a planar screen (35 mm photographic plastic film) obtained using a commercial camera (Canon EOS30D with a Canon Macro Lens EF 100 mm f/1:2.8 USM). FIG. 59 contains images acquired using the fabricated planar cameras (16 by 16 pixels) when scanned in the x and y directions from −460 to 460 µm in 92 µm increments. A series of such images were collected for detector to lens (planar side) distances ranging from 5.85 to 22.05 mm. The position of best focus shifts from the center to the edge of the image with decreasing detector to lens distance, thereby indicating that the optimal focal surface is highly curved and non-planar.

Figure 60:
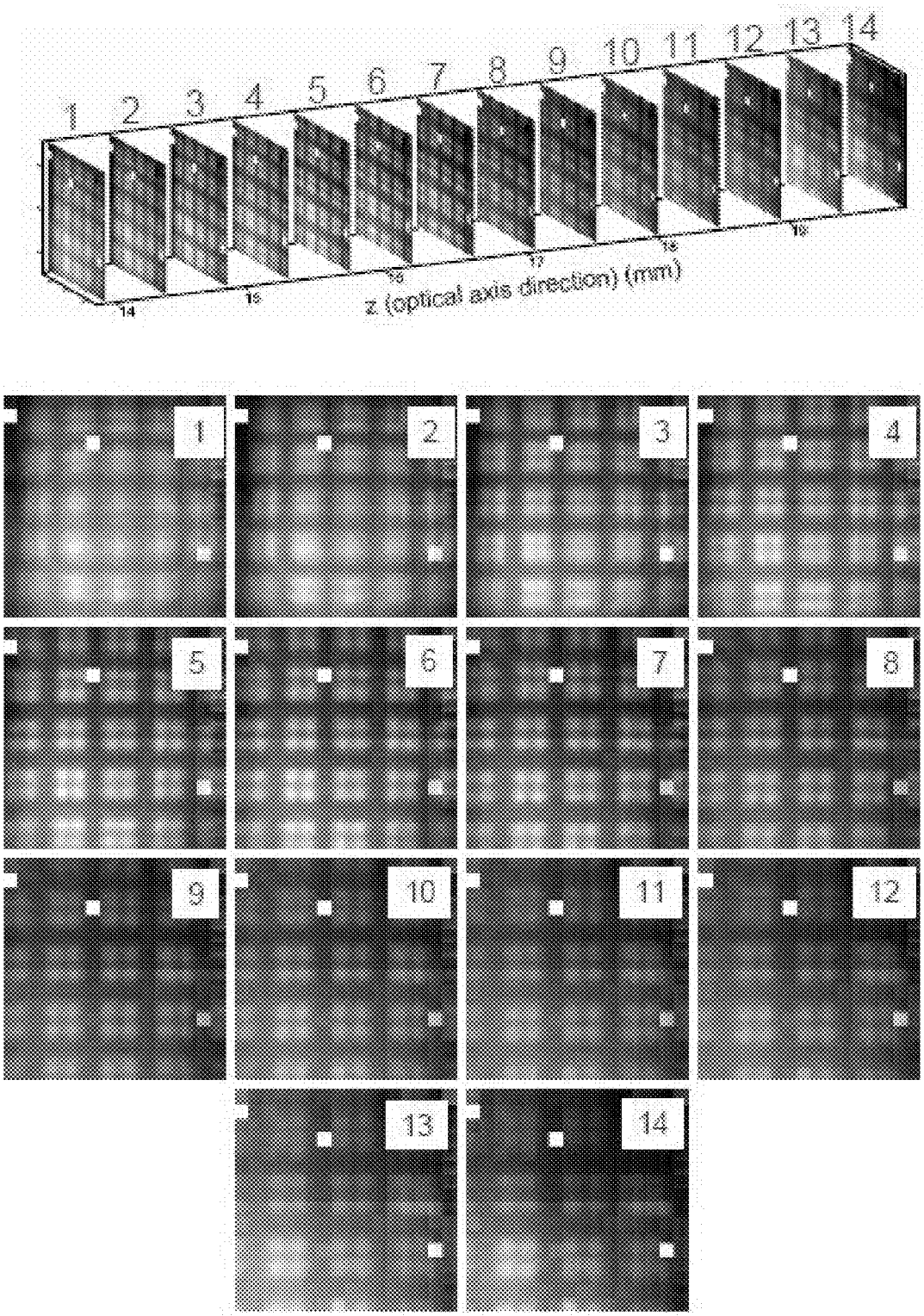
FIG. 60 Photographs of projected images acquired with the fabricated 16 by 16 hemispherical camera at varying distances from the lens. The images were acquired between 13.95 (image #1, left) and 19.80 mm (image #14, right) from the lens.

The fabricated hemispherical camera (16 by 16 pixels) was also used to image this same setup at varying positions along the optical axis (FIG. 60). Scanning of the detector from −2 to 2° in both the θ and ϕ directions in 0.4° increments followed by image reconstruction generated high resolution photographs. The quality of focus obtained is consistent throughout each image, with an optimal focus being achieved for the detector position z≈16.65 mm. The hemispherical detector surface provides improved imaging compared to planar detectors with better focusing, fewer distortions, and a wider field of view.

Comparison of aberrations/distortions in hemispherical and planar detectors: Theory: The laws of geometric optics allow for single planar or curved object surfaces to be imaged perfectly onto a curved image plane, though the image may be distorted. Distortion is a purely geometric effect that does not influence the sharpness of the images and can be removed. We performed ray tracing analysis with a commercial software program (Rayica) to compare distortions and defocusing on the fabricated hemispherical and planar detectors. The rays passed through a plano-convex lens (Edmund Optics PCX NT45-803) and onto the screens. An approximation to the optimal image surface was constructed by fitting a paraboloid of revolution, with a general form of $z=16.65-0.105r^2$, to the locations of the smallest focal spots (the root mean square of the intensity was minimized) formed by a set point objects arrayed on a line through the focal surface. Although the fabricated hemispherical detectors and the optics are not matched to achieve perfect imaging, significant reductions in both distortion and defocusing over planar detectors were observed.

The single lens system is perhaps the simplest example of how a curved detector could be used to improve camera performance. Since flat electronic detectors were introduced, there has been a trend to design both the optics and signal processing of cameras in an integrated manner, even to the extent that the signal recorded by the detector may not be recognizable as an image before processing. We expect our fabrication technique, which removes the design restriction that the detector arrays be planar, to allow further optimizations to be made.

Figure 33:
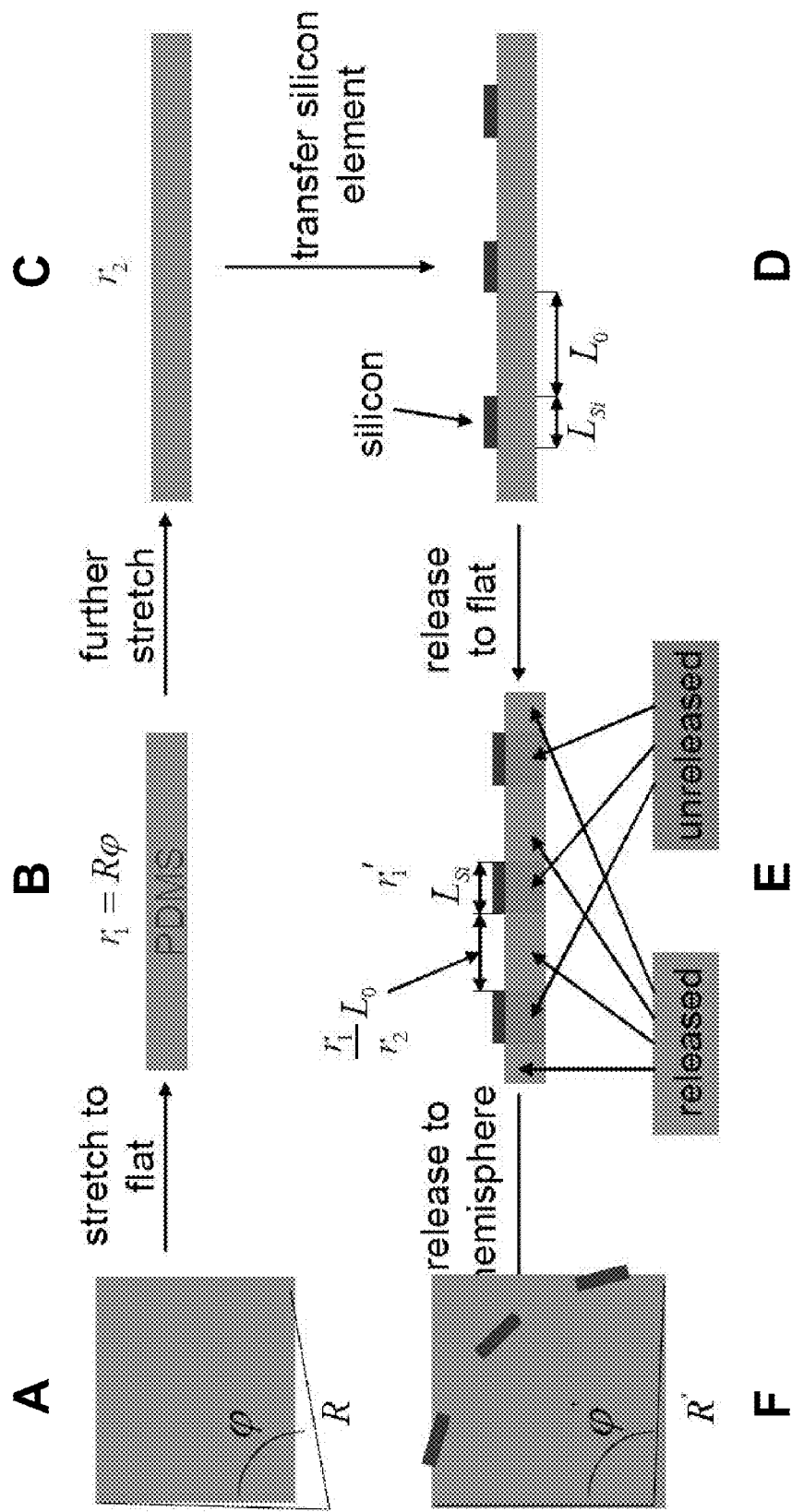
FIG. 33. Schematic illustration of the mapping of silicon elements onto a hemisphere. (A) a PDMS hemispherical cap of radius R; (B) the cap is first stretched to an approximately flat plate of radius $r_1$; (C) the flat plate is further stretched to a flat plate with radius $r_2$; (D) the silicon elements are transferred onto the plate; (E) the plate with Si elements is released to an approximately flat plate of radius $r_1'$; (F) further release leads to a new hemisphere of radius R'.

Mapping of Silicon Elements onto a Hemisphere: A simple mechanics model, based on plate theory, and confirmed using established finite element analysis techniques, shows how the silicon elements are mapped from the flat to hemisphere. FIG. 33 illustrates the mapping of silicon elements onto a hemisphere. A PDMS hemispherical cap of radius R (FIG. 33A) is first stretched to a flat plate of radius $r_1$ (FIG. 33B), which is further stretched to radius $r_2$ (FIG. 33C) to transfer the silicon elements of size $L_{Si}$ and spacing $L_0$ (FIG. 33D). The release of tension first leads to an approximately flat plate of radius $r_1'$ (FIG. 33E), and the further release leads to a new hemisphere of radius R' (FIG. 33F).

Figure 34A:
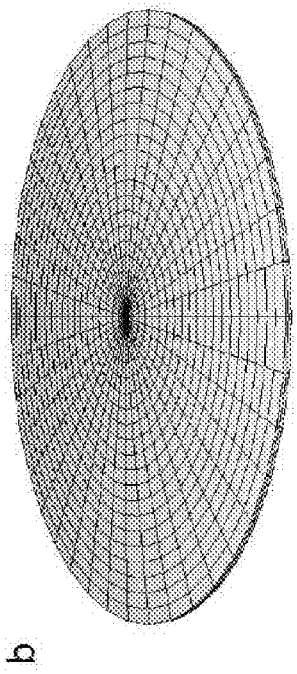
FIG. 34. Finite element analysis of the mapping from a hemisphere state to an approximately flat state. (A) the original mesh for the PDMS hemispherical cap; (B) the deformed mesh for the just flattened plate; (C) the strain distribution in the flattened plate; (D) comparison of the mapping between finite element results and analytical solution.
Figure 34B:
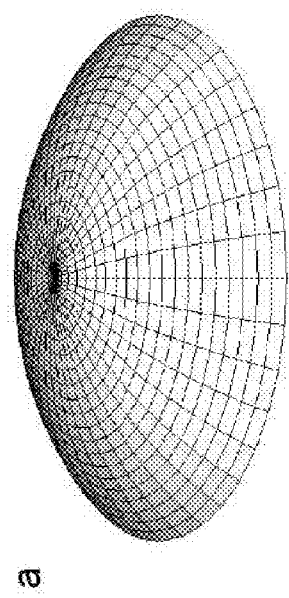

The above mapping process has been studied via the finite element method. Shell elements are used to model the PDMS hemispherical cap. FIG. 34A shows the original mesh for the PDMS hemispherical cap in FIG. 33A, while FIG. 34B shows the deformed mesh when the hemisphere is just flattened to a plate (when the edge of deformed hemisphere approximately reaches the same height as the plate center), corresponding to FIG. 33B. The (axisymmetric) strain distribution in the flattened plate shown in FIG. 34C clearly suggests that the meridional strain is negligible (<<circumferential strain), $\epsilon_{meridional} \approx 0$. This gives the arc length $R\phi$ of the hemisphere to be the same as the radius $r_1$ of the flattened plate, $$R\phi = r_1.$$

Figure 34C:
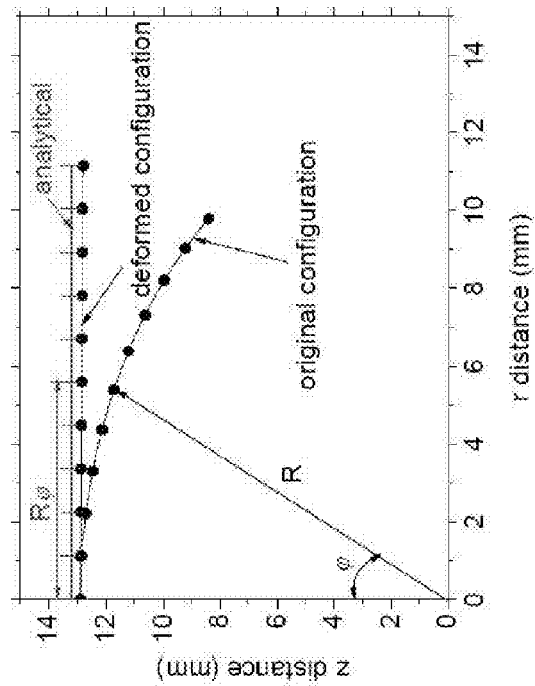
Figure 34D:
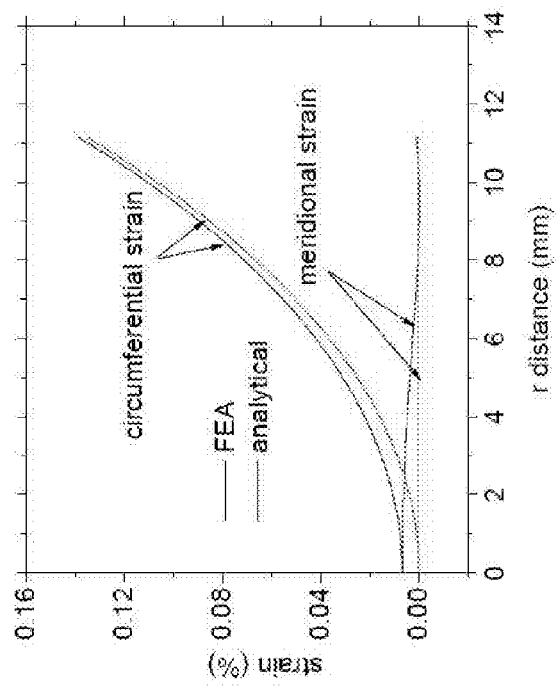

This is validated by the finite element analysis shown in FIG. 34D. The circumferential strain is then given by $$\epsilon_{circumferential} \approx \frac{\varphi - \sin\varphi}{\sin\varphi},$$

which agrees well with the finite element analysis, as shown in FIG. 34C.

The additional strains due to further stretching in FIG. 33C are uniform throughout the plate. The transfer of silicon elements in FIG. 33D do not introduce any strains.

Since the Young's modulus of silicon (130 GPa) is 5 orders of magnitude stiffer than the Young's modulus of PDMS (2 MPa), the strains in silicon elements are rather small, which prevents the PDMS underneath the silicon elements from being released during the relaxation to the flat stage shown in FIG. 33E. For PDMS not covered by the silicon elements, its length is reduced from $L_0$ to $$\frac{r_1}{r_2}L_0.$$

Thereof the radius of relaxed plate in FIG. 33E becomes $$r_1' = \frac{L_{Si}r_2 + L_0 r_1}{L_{Si} + L_0}.$$

For the hemispherical PDMS transfer element in FIG. 22 and $L_{Si}=500$ µm, $L_0=420$ µm, the above formula gives $r_1'=7.83$ mm, which agrees well with the radius $r_1'=7.71$ mm obtained by the finite element method to model the PDMS and silicon by the shell. FIG. 35A shows the deformed shape of the flat, relaxed PDMS and silicon.

Figure 35B:
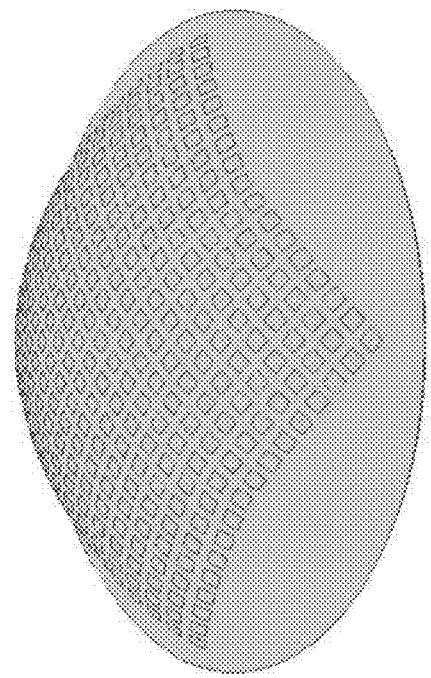
FIG. 35. The deformed shape of (A) the flat, relaxed PDMS and silicon and (B) the spherical, relaxed PDMS and silicon as calculated by finite element analysis.
Figure 35A:
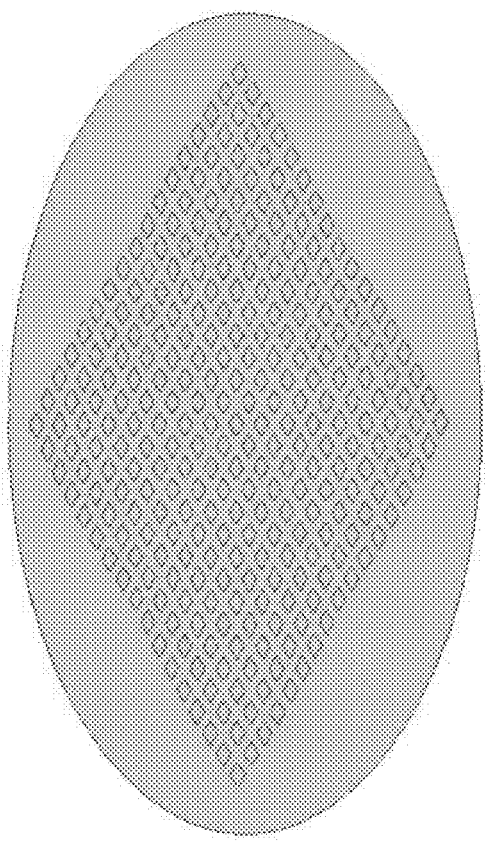

For the further release to the hemispherical cap (FIG. 33F), FIG. 35B gives the deformed shape of the spherical, relaxed PDMS and silicon. It is approximately a hemisphere with slightly larger radius R'=13.4 mm due to the stiffening effect of silicon elements. The mechanics analysis gives the new radius $$R' = R(1-f)\left(1 + \frac{f}{1-f}\frac{r_2}{r_1}\right)^{3/2},$$

which is R'=14.3 mm, and agrees reasonably well the finite element analysis, where $$f = \frac{NL_{Si}^2}{\pi r_2^2}$$

is the area fraction of the silicon elements on the PDMS surface, and N is the number of silicon elements.

Figure 36:
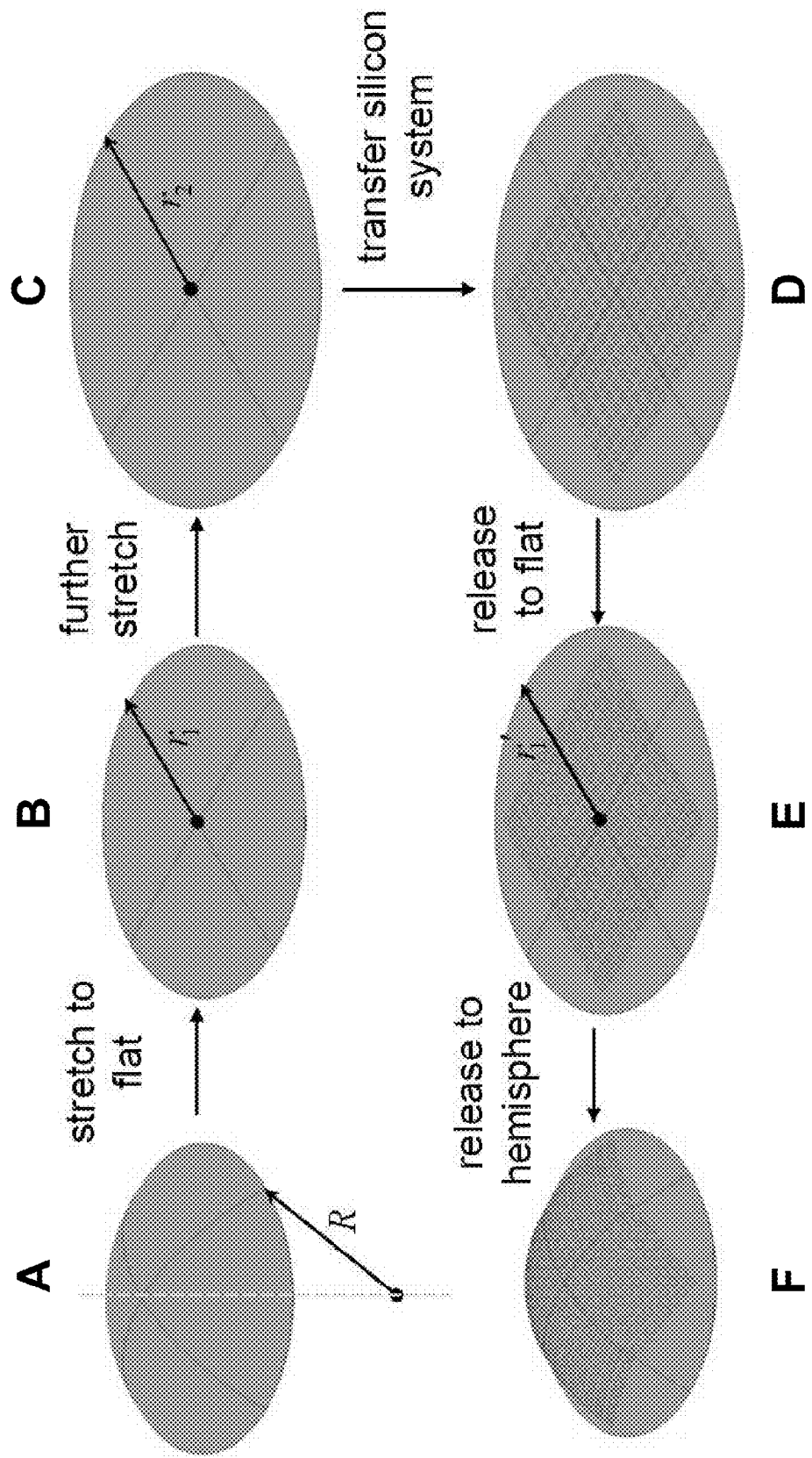
FIG. 36. The images obtained by the finite element method of the mapping process.
Figure 61:
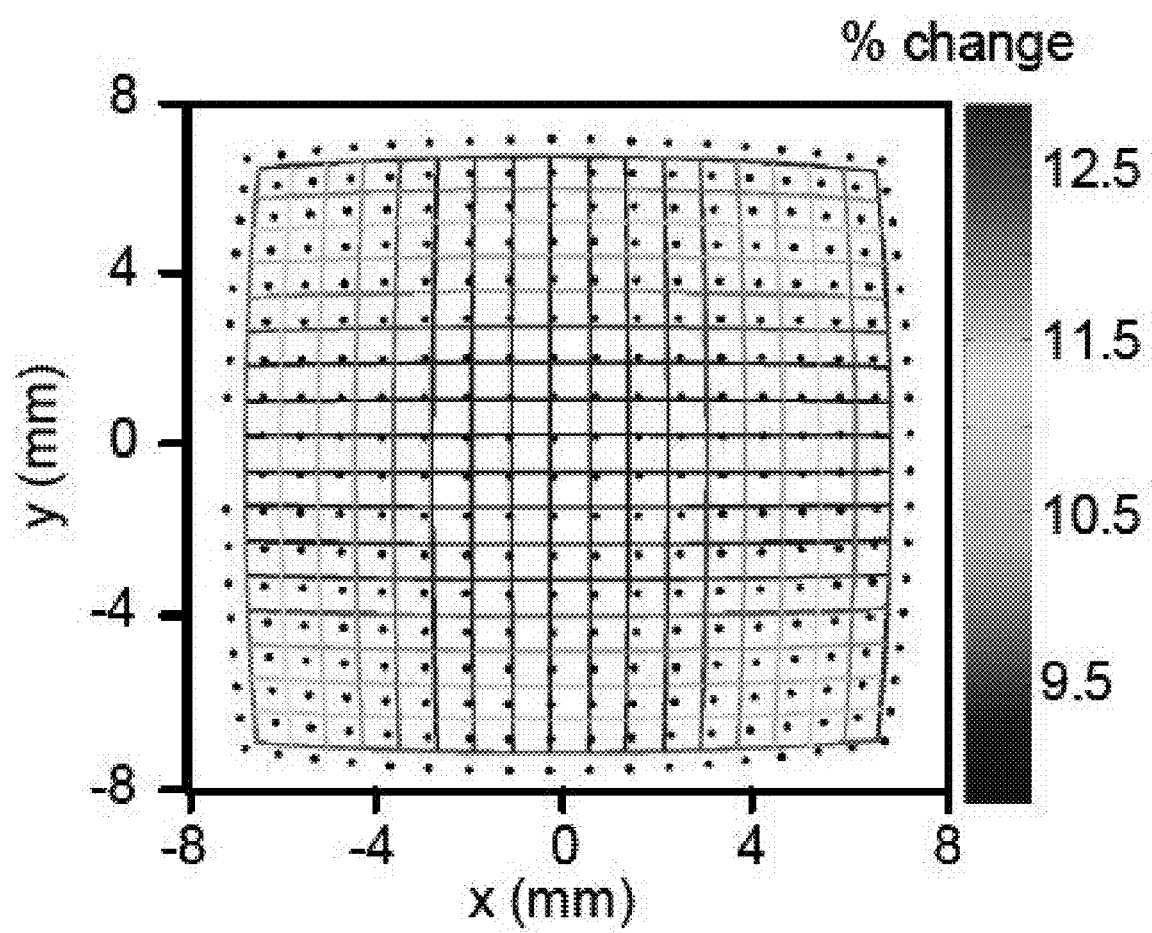
FIG. 61 Experimentally measured map (black dots) of spatial positions of silicon elements (500×500 μm; 1.2 μm thick) across a 16 by 16 array on a hemispherical transfer element. The overlaid coloured mesh represents predictions for the planar to hemispherical transformation from the analytical mechanics model; the mesh nodes are the predicted spatial positions of the array and the segment colours indicate the percentage change of the distance between neighbouring elements across the array, compared to those designed in the planar configuration. The results indicate less than a ~3% variation, from minimum to maximum.

FIG. 36 shows the images obtained by the finite element method of the mapping process schematically illustrated in FIG. 33. FIG. 61 shows the spatial distribution of elements in a 16 by 16 array transferred to a hemispherical PDMS element as predicted by the mechanics model and as measured during fabrication (see FIG. 27). The pixel positions given by the mechanical models agree well with the experiments without parameter fitting. These mechanics models indicate very small, ~3%, changes (maximum to minimum) in the local pitch across the entire area, with smooth, deterministic variations in this quantity. The relatively uniform pitch is ~10% smaller than the initial value before the PDMS is relaxed.

Figure 37:
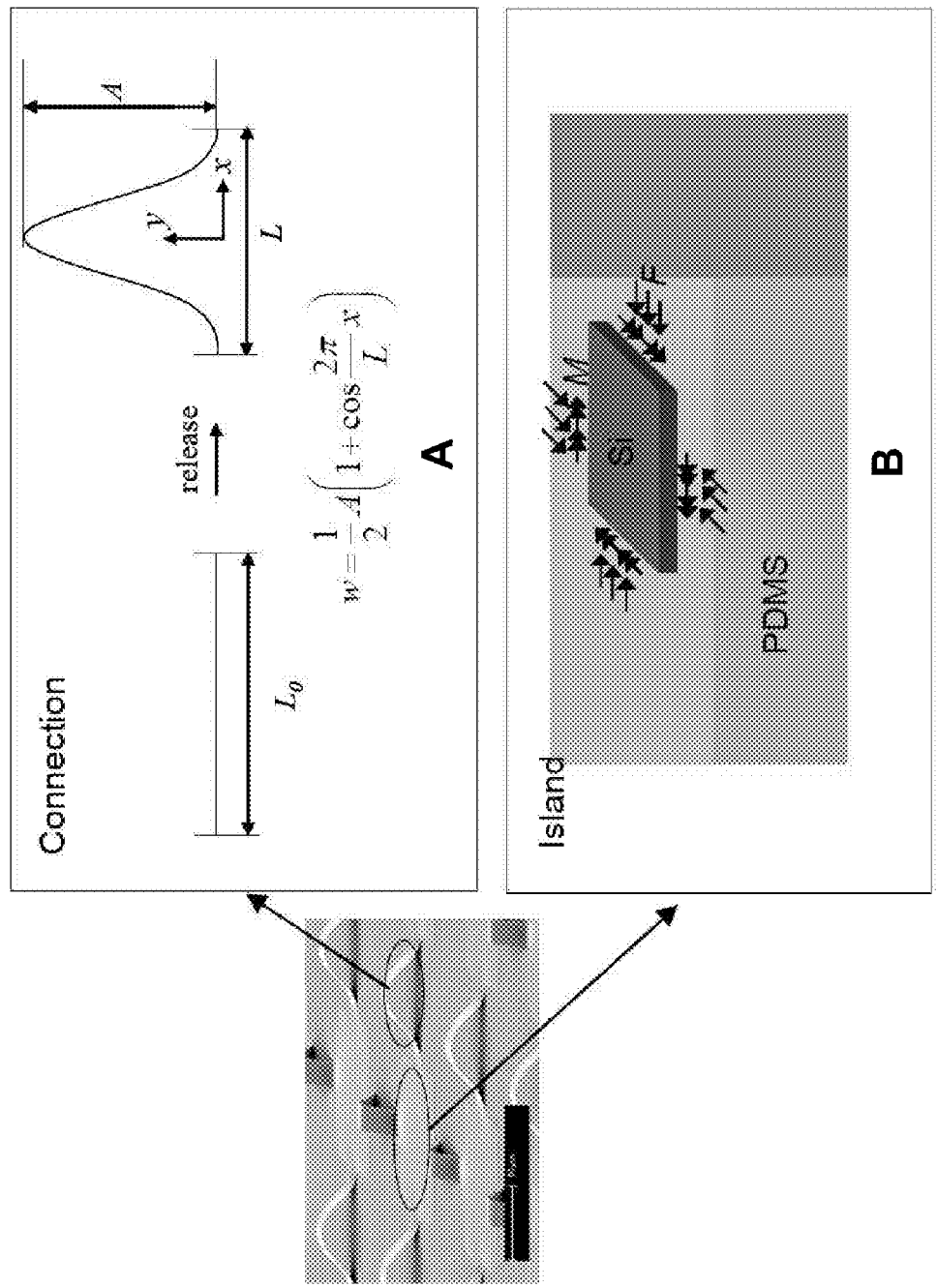
FIG. 37. Analytical model of (A) the shape of the compressed connections and (B) strain in the silicon elements.
Figure 38:
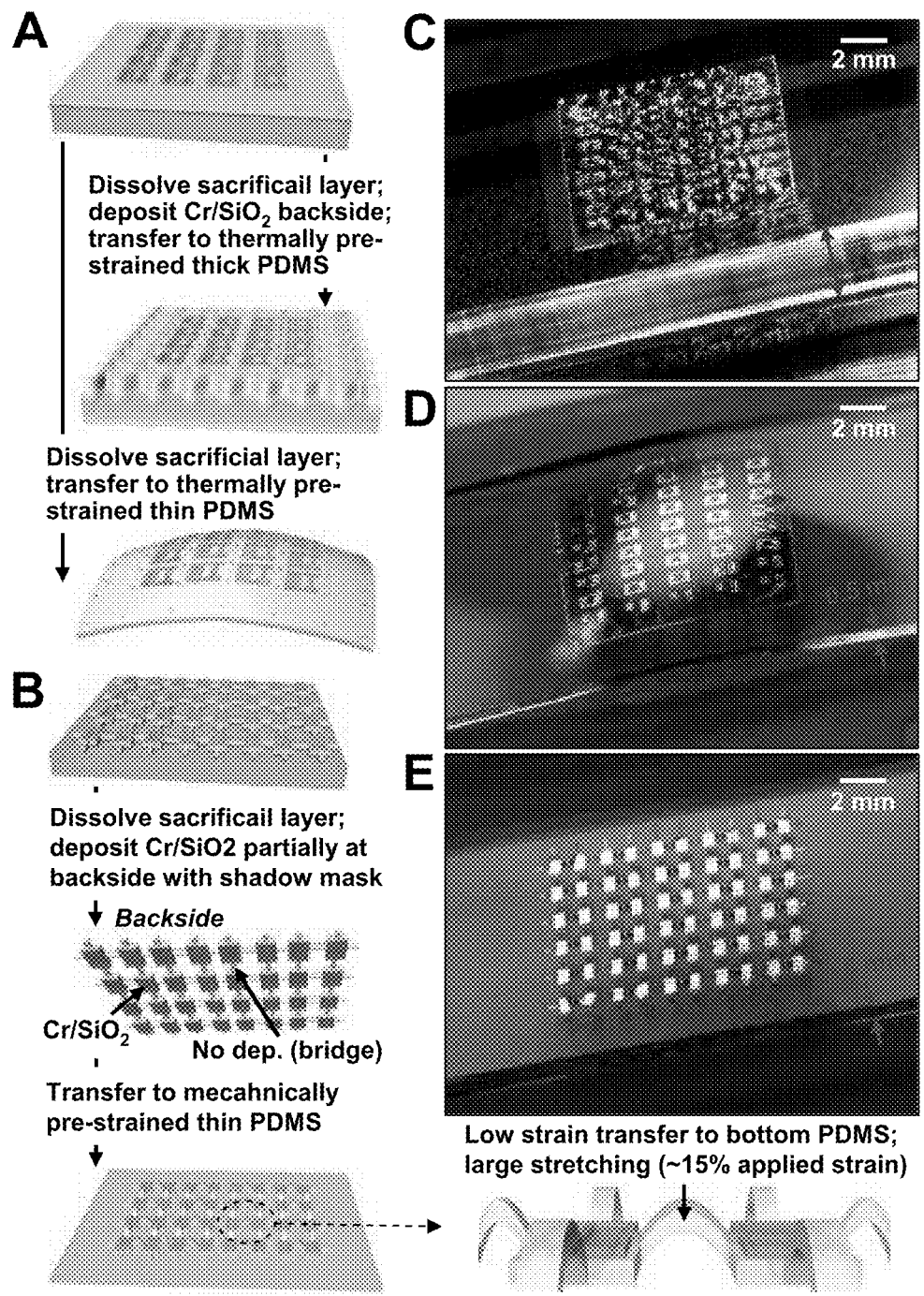
FIG. 38 illustrates a process for making a foldable and pop-up stretchable electronic device by (A) thermal transfer; and (B) mechanical deformation. Photographs of the devices are provided in C-E.
Figure 39:
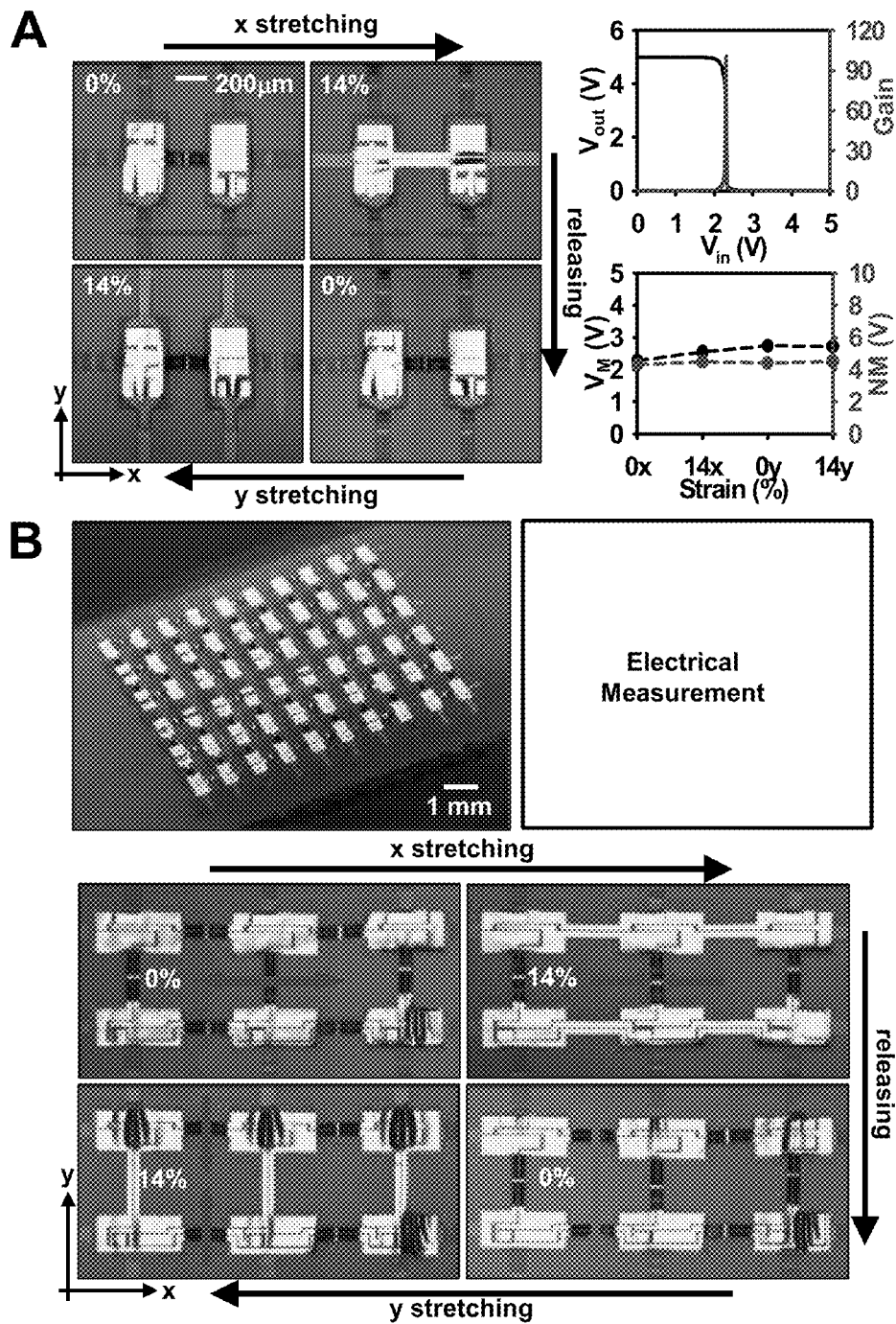
FIG. 39 summarizes functional characteristics of stretchable device arrays for various strains.
Figure 40:
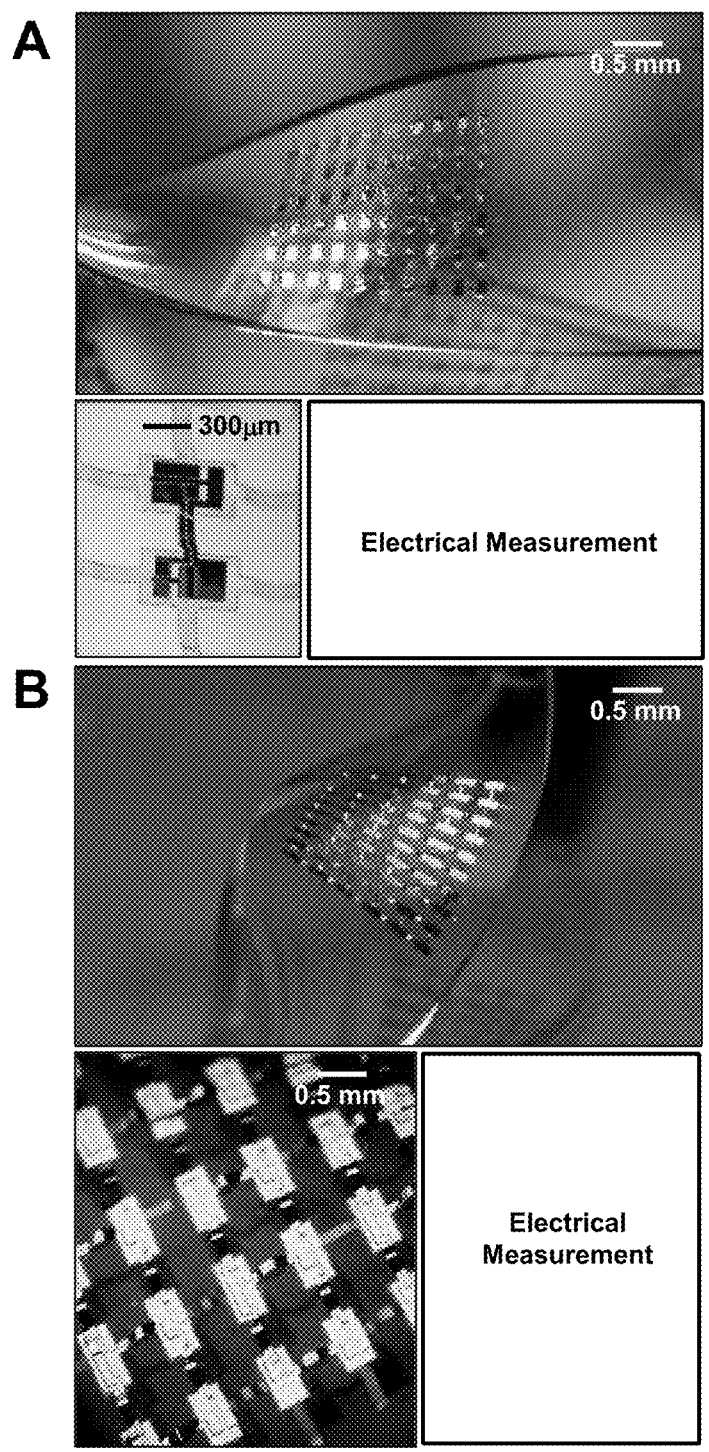
FIG. 40 are photographs of devices made by the processes disclosed herein undergoing twisting-type deformation.
Figure 41:
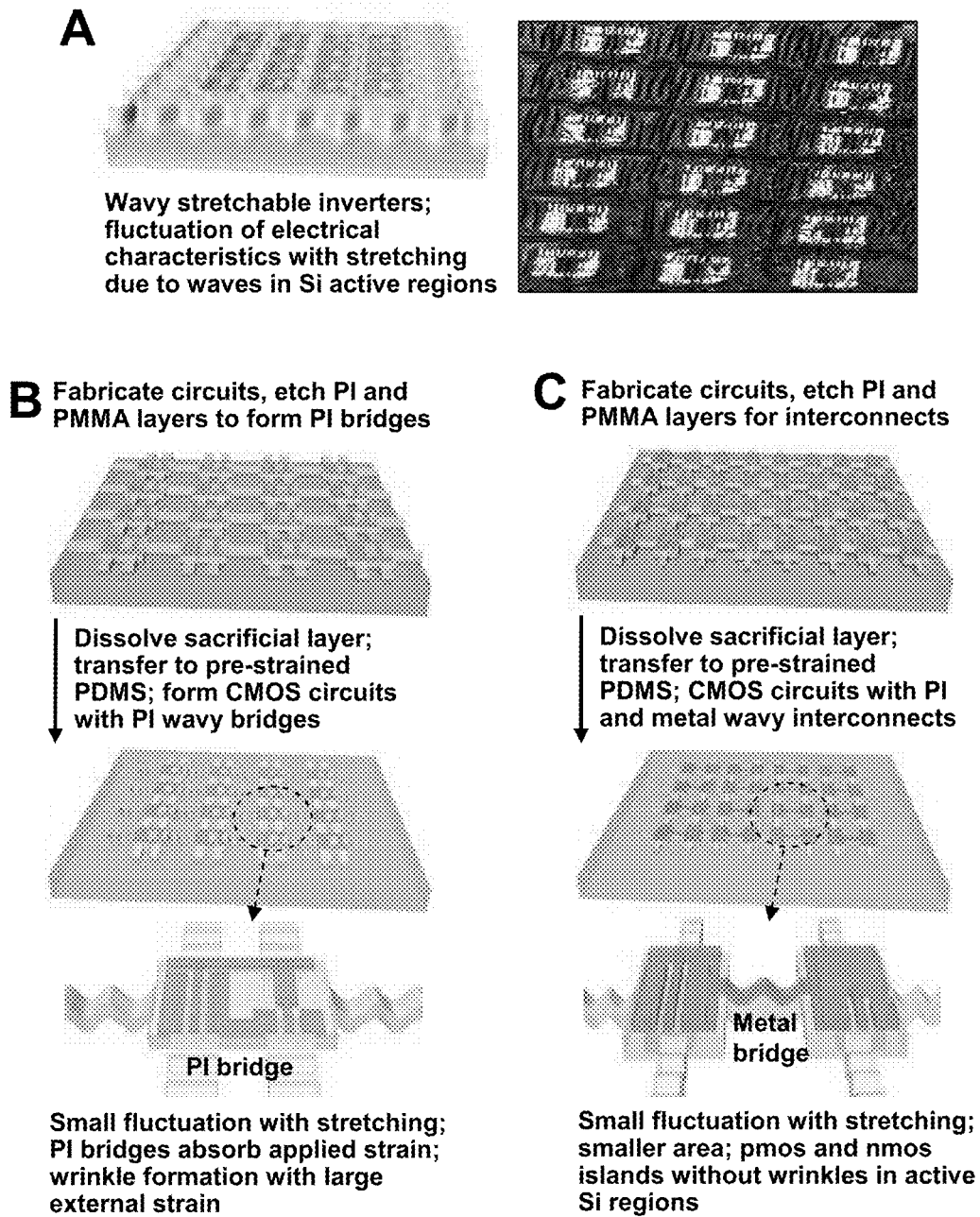
FIG. 41 Schematic comparison and overview of the fabrication process for wavy interconnected CMOS inverters using doped silicon nano-materials; (a) Sheet-type wavy inverters (b) Ultrathin CMOS islands connected with wavy PI bridges. (c) Ultrathin nMOS and pMOS devices connected with wavy PI and metal interconnects.
Figure 42:
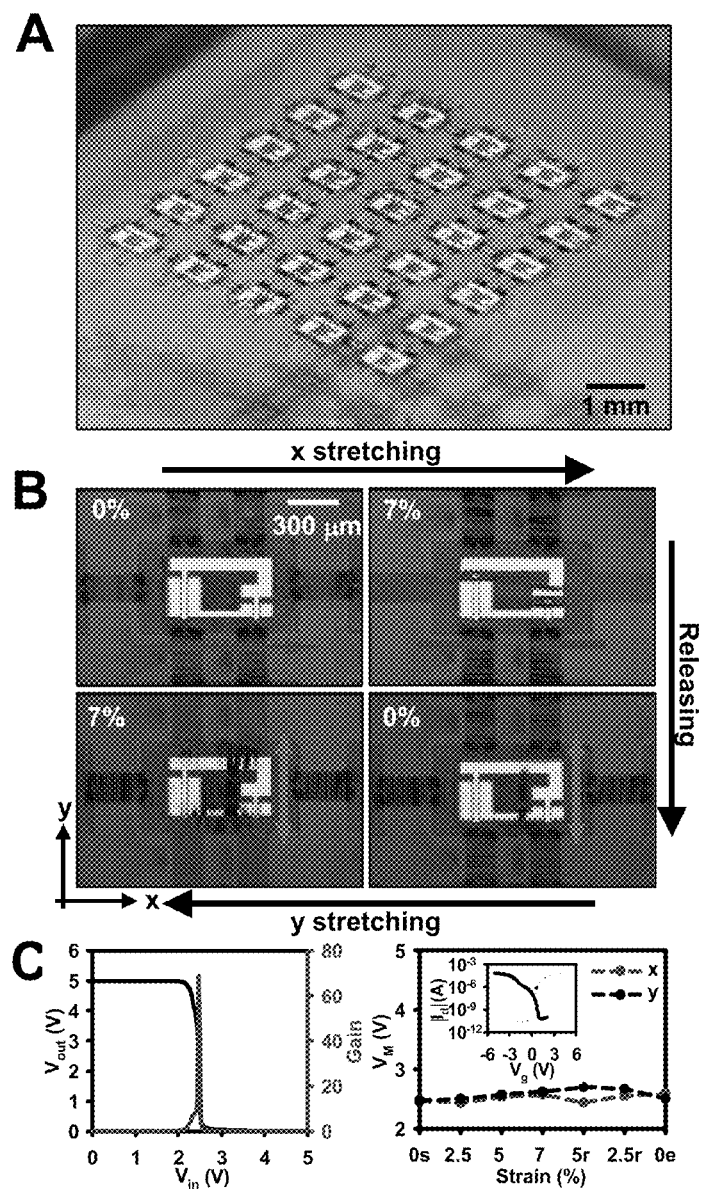
FIG. 42 (a) Image of CMOS inverters interconnected with wavy polyimide bridges. (b) Optical images of stretching tests. (c) Voltage transfer characteristics of wavy CMOS inverters (left) and variation of inverter threshold voltage for each applied strain (right); inset shows log scale transfer curve for individual devices.
Figure 43:
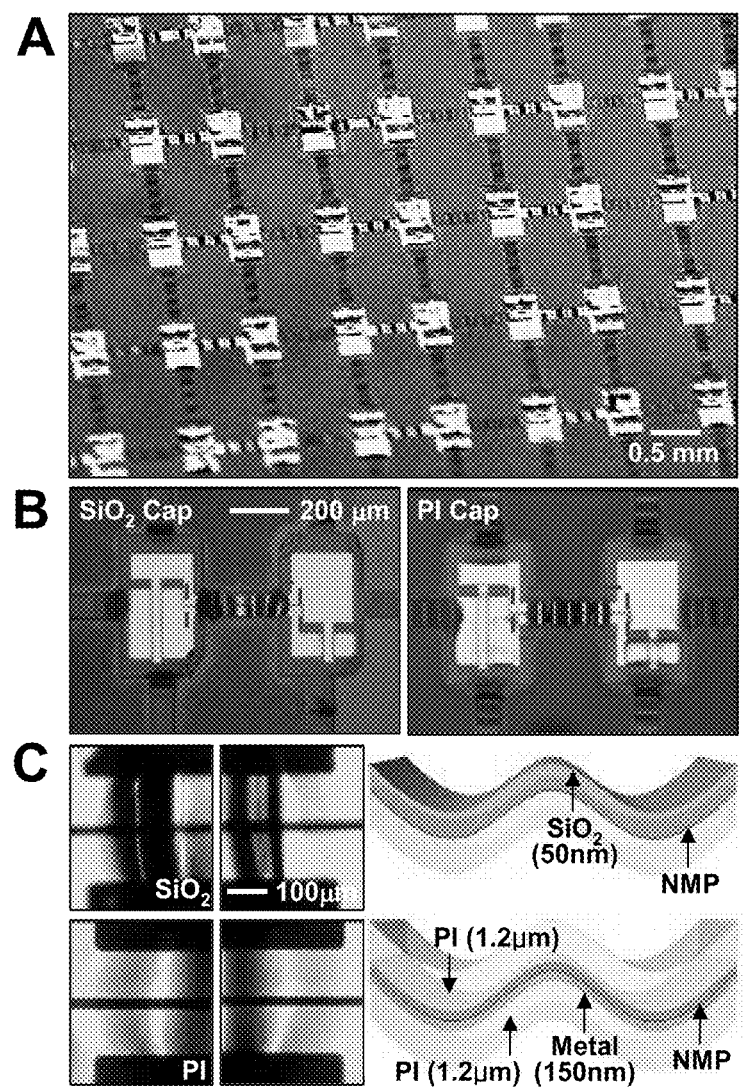
FIG. 43 (a) Image of CMOS inverters with metal and PI wavy bridges (b) Magnified view of wavy interconnected inverter with $SiO_2$ capping (top left) and with PI capping (top right) (c) Magnified view of electrode edge, which corresponds to white dotted box in FIG. 3(*b*), for $SiO_2$ capping (top) and PI capping (bottom); right cartoons are schematics for location of neutral mechanical plane for wavy interconnects FIG. 44 (a) Optical images of stretching test. (b) Profile changes due to Poisson effect on applying external strain in y (left) and x (right) direction. (c) Voltage transfer characteristics of wavy interconnected CMOS inverters (left) and variation of inverter threshold voltage for each applied strain. (right).

Arc-Shaped Connections between Silicon Elements: The nature of the compressibility provided by the narrow, thin interconnects between adjacent unit cells also can be understood through theoretical analysis (see FIG. 37). The SEM image in FIG. 37 provides a high magnification view of a unit cell in a high-density passive Si array transferred to a hemispherical surface (from FIG. 52); In silico analysis provides results in the form of color overlays of the arc shapes and the distributions of strain. The arc-shape of connections between silicon elements shown in FIG. 37A can be represented by an out-of-plane displacement, ω, of the arc-shaped connections that take the form:

$$w = \frac{A}{2}\left(1 + \cos\frac{2\pi x}{L}\right),$$

where A is the amplitude, x is the position along the connection and L is the lateral separation distance between adjacent pixel elements. The distance $L_0=20$ µm is measured in the as-fabricated planar configuration. This equation satisfies vanishing displacement and slope at the two ends ($x=\pm L/2$). The in-plane displacement can then be obtained from the force equilibrium. These give the bending energy $$U_b = \frac{\pi^4 E h^3 A^2}{12(1-v^2)L_0^3}$$

and membrane energy $$U_m = \frac{EhL_0}{2(1-v^2)}\left(\frac{\pi^2 A^2}{4L_0^2} - \frac{L_0 - L}{L_0}\right)^2.$$

The energy minimization $$\frac{\partial(U_b + U_m)}{\partial A} = 0$$

gives the
amplitude A yields an analytical expression for the amplitude $$A = \frac{2L_o}{\pi}\sqrt{\frac{L_o - L}{L_o} - \varepsilon_c},$$

where, $\epsilon_c$, the critical buckling strain, is given by $\epsilon_c=\pi^2 h^2/(3L_o^2)$, where h is the thickness; its value is 0.0021% for the system shown here. For L=17.5 µm, the amplitude A=4.50 µm agrees well with the experiments A=4.76 µm. The maximum strain in the connections is ~0.5%, substantially below the fracture strain for the silicon.

Strain Distributions in Silicon Elements: Mechanics models can also reveal the distribution of strains and displacements in the square silicon elements. As shown in FIG. 37B, the out-of-plane displacements in connections impose bending moments M (and axial force F) to the silicon elements, which are modeled as two-dimensional plates. The bending energy in the silicon elements is obtained in terms of its out-of-plane displacement w via the plate theory. The PDMS substrate is modeled as a semi-infinite solid subjected to the surface displacement w, and its strain energy is also obtained in terms of w. The displacement w can be expanded to the Fourier series, with the coefficients to be determined by minimizing the total energy. The bending strains in silicon elements can then be obtained from the curvatures, which are the second order derivatives of w. The strains due to the axial force are shown to be negligible as compared to the bending strains. The maximum out-of-plane displacements are very small (<0.1 µm), as are the strains $\epsilon_{xx}$ and $\epsilon^{yy}$ (<0.08%), as determined by in silico experiments described herein. The strain $\epsilon_{xx}$ in the Si element reaches the peak near the interconnections in the x-direction, while the peak of $\epsilon_{yy}$ occurs near those in the y-direction.

References: Walther, A. The Ray and Wave Theory of Lenses, Cambridge University Press, Cambridge, UK (1995). Rayica 3.0, Optica Software, Champaign, Ill., USA (2007). Mathematica 6.01, Wolfram Research, Champaign, Ill., USA (2007). Mait, J. N., Athale, R. & van der Gracht, J. Evolutionary paths in imaging and recent trends, Opt. Express 18, 2093-2101 (2003).

FIGS. 46-51 summarize a process for making a multilayer functional layer device by patterning and printing layer-by-layer.

EXAMPLE 3

CMOS Integrated Circuits with Monolithically Integrated Stretchable Wavy Interconnects Stretchable CMOS circuits comprising ultrathin active devices mechanically and electrically connected by narrow metal lines and polymer bridging structures are presented. This layout, together with designs that locate the neutral mechanical plane near the critical circuit layers yields strain independent electrical performance and realistic paths to circuit integration. Mechanical and electrical modeling and experimental characterization reveal the underlying physics of these systems.

Stretchable electronics is emerging as a technology that could be valuable for various applications, such as conformal personal or structural health monitors and hemispherical detector arrays. Such devices cannot be accomplished with conventional wafer based circuits or even with more recent systems that offer simple mechanical bendability. Presently, two approaches exist for achieving stretchability via the use of elastomeric substrates: one uses rigid device islands interconnected by separately fabricated stretchable interconnects; another exploits fully stretchable devices and integrated circuit systems. A disadvantage of the former is that large scale integration can be difficult, due to the nature of the fabrication procedures. The latter suffers from slight changes in device characteristics that can be induced by the strains associated with stretching. Here we present an approach that combines these two concepts, in a way that naturally incorporates the strengths of each. These systems comprise complete integrated circuits formed on ultrathin flexible plastic supports that are patterned in a manner that isolates the interconnects and mechanical bridging structures. Bonding to a prestrained rubber substrate followed by relaxing of this prestrain leads to systems with monolithically integrated, stretchable 'wavy' interconnects and bridges. Mechanical response to stretching involves, primarily, deformations only in these interconnects and bridges, thereby avoiding unwanted strains in the regions of the active devices. We demonstrate these concepts through comprehensive mechanical analysis and electrical characterization of stretchable complementary metal oxide semiconductor (CMOS) circuits based on single crystalline silicon.

FIG. 62A shows a schematic illustration of the fabrication of this type of system, for the case of CMOS inverter logic gates, using procedures derived from those provided herein. The semiconductor consisted of doped nanoribbons of single crystalline silicon, transfer printed onto a carrier wafer coated with a bilayer of poly(methyl methacrylate) (PMMA, MicroChem, USA) and polyimide (PI, Sigma Aldrich, USA) having thicknesses of 100 nm and 1.2 µm. Gate dielectrics, source, drain and gate electrodes and appropriate interconnects and vias were then fabricated with conventional semiconductor processes. Spin coating the resulting circuits with a layer of PI layer (~1.2 µm) positioned the circuit layers near the neutral mechanical plane of the composite structure. Next, a reactive ion etching process with photoresist and $SiO^2$ as masking layers removed regions of the PI encapsulant, substrate and underlying PMMA layer, to isolate the interconnect lines, to define structural bridges and to create a periodic array of circular openings. These openings facilitated the dissolution of the PMMA with acetone, to release 'segmented' ultrathin circuits. Depositing $Cr/SiO^2$ (3 nm/30 nm) onto the backside of lifted-off circuits enabled covalent bonding to a piece of prestrained Polydimethylsiloxane (PDMS, Dow Corning, USA) whose surface was chemically activated by exposure to ultraviolet induced ozone. Thermal expansion of the PDMS (to 160° C.) provided biaxial prestrains of ~3.9%. Releasing the prestrain induced the formation of 'wavy' structures in the narrow interconnects and structural bridges, as shown in second frame of FIG. 62A and FIG. 62B. The 'island' regions containing the active devices remained largely unperturbed. FIG. 62C provides a magnified view of this type of wavy CMOS inverter, which shows clearly the flat island region with wavy metal and PI interconnects. The top layer PI provides a neutral mechanical plane design to help avoid cracking of the metal associated with bending into the wavy shapes, as schematically shown in the bottom frame of FIG. 62A. Full three dimensional finite element modeling of this system exhibits good agreement with observations, as shown in FIG. 62D. The simulations were performed using the nonlinear finite element analysis package ABAQUS 3 to follow the same fabrication steps as in the experiments.

Figure 63:
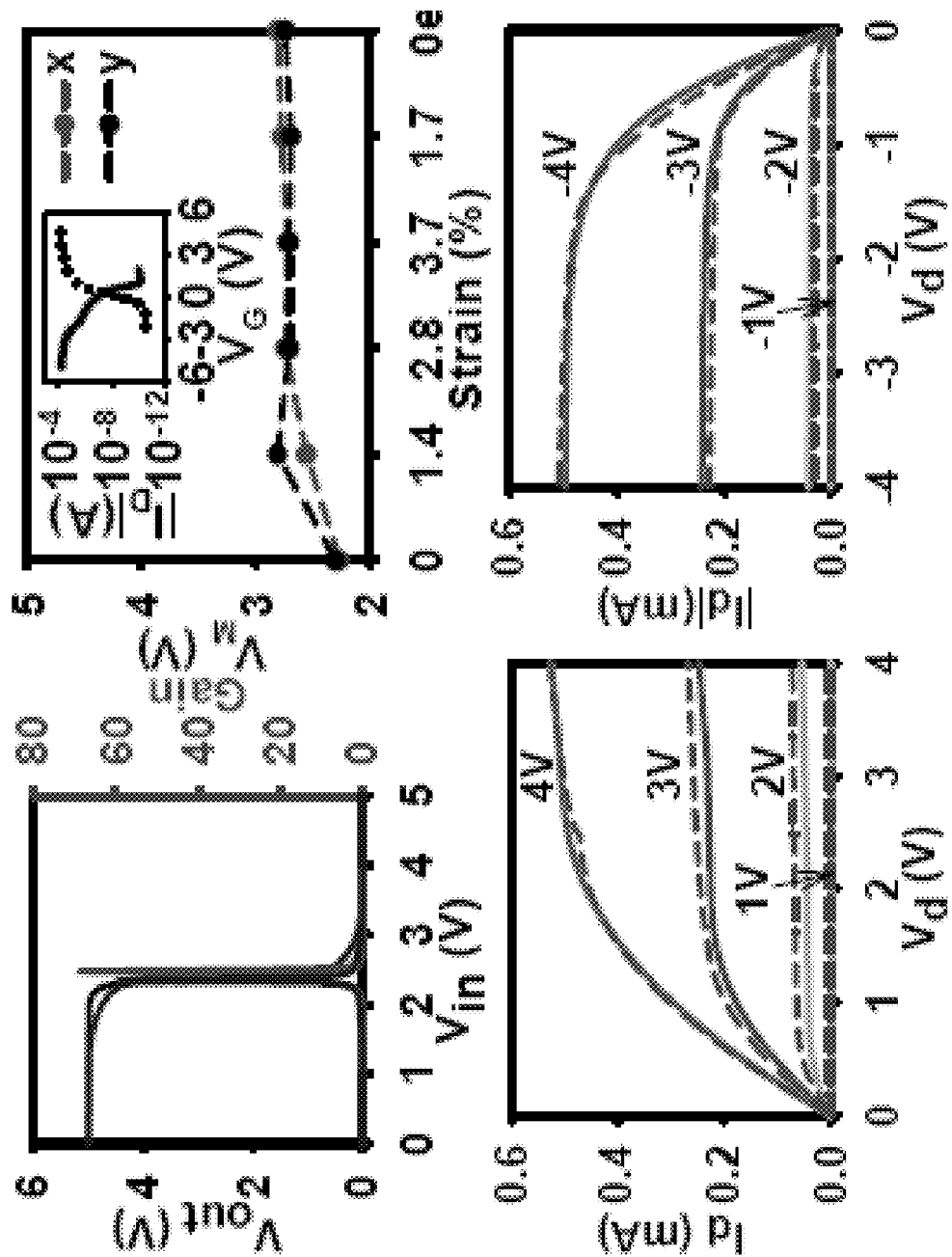
FIG. 63 Stretching tests. Transfer characteristics of stretchable CMOS inverters (red and black: experiment, blue: simulation, left) and variation of inverter threshold voltage for each applied strain (right); the inset shows log scale transfer curves for individual transistors. (d) Current-voltage curves of an nMOS (left) and PMOS (right) transistor; solid and dotted lines correspond to experiment and simulation, respectively.

We performed stretching tests on these inverters, in both the x and y directions (FIG. 44A). Due to the ability of the wavy interconnects and bridges to absorb applied strains, the islands do not show significant deformations even for local strains of 3.7%. Behaviors consistent with the Poisson effect can also be observed in profiles of FIG. 44B. In particular, when we stretch the PI bridge in y direction, the metal bridge experiences compression (and vice versa), such that the wavelength decreased from 120 µm to 116 µm, while the amplitude increased from 17 µm to 26 µm, as shown in top two frames of FIG. 44B. Also when the metal bridge is stretched in x direction, the PI bridge is compressed, thereby the wavelength of PI bridge changes from 122 µm to 103 µm and amplitude from 18 µm to 24 µm, as in bottom frames of FIG. 44B. The electrical properties are consistent with this mechanics of deformation. In the as-fabricated state, without applied strain, the inverters showed expected transfer characteristics with gains as high as ~70, consistent with PSPICE simulation based on separate measurements of individual transistors (FIG. 63, top left). The mobilities were ~310 $cm^2$/Vs and ~150 $cm^2$/Vs for nMOS and PMOS devices, with on/off ratios >105 for both types of devices (FIG. 63, top right inset). For the CMOS inverters, the channel lengths and widths were 13 µm and 100 µm for nMOS and 13 µm and 300 µm for PMOS, respectively. Under various applied strains, the electrical properties showed little variation. For example, the inverter threshold voltage changed by less than ~0.5V for strains between ~3.7% in x direction and ~3.7% in y direction, as shown in the top-right frame of FIG. 63. Also FIG. 63 (bottom frames) shows IV curves, in which solid lines are experimental results and dotted lines are estimated simulation results by PSPICE. These strain independent behaviors represent significant improvements over similar circuits that do not use isolated interconnect and bridge structures, thereby validating the designs introduced here. Mechanics analysis is consistent with these observations. For the prestrain 3.9% in experiments, mechanics analysis based on energy minimization gives the wavelength 127 µm and amplitude 18.6 µm for the metal bridge, which agree well with experimental values 120 µm and 17 µm, respectively. The maximum strain in the Si layer is only 0.04%. Even for a much larger prestrain 10%, the maximum strains in the Si, metal and $SiO_2$ layers are 0.07%, 0.50% and 0.73%, respectively, which are one third to one half of their counterparts without isolated interconnect and bridge structures. This result occurs because the bridge structures buckle to accommodate the large prestrain, which protects the device islands from buckling and therefore reduces the strain. Also, the top PI layer shifts the neutral mechanical plane in a way that further reduces the strain.

Figure 44:
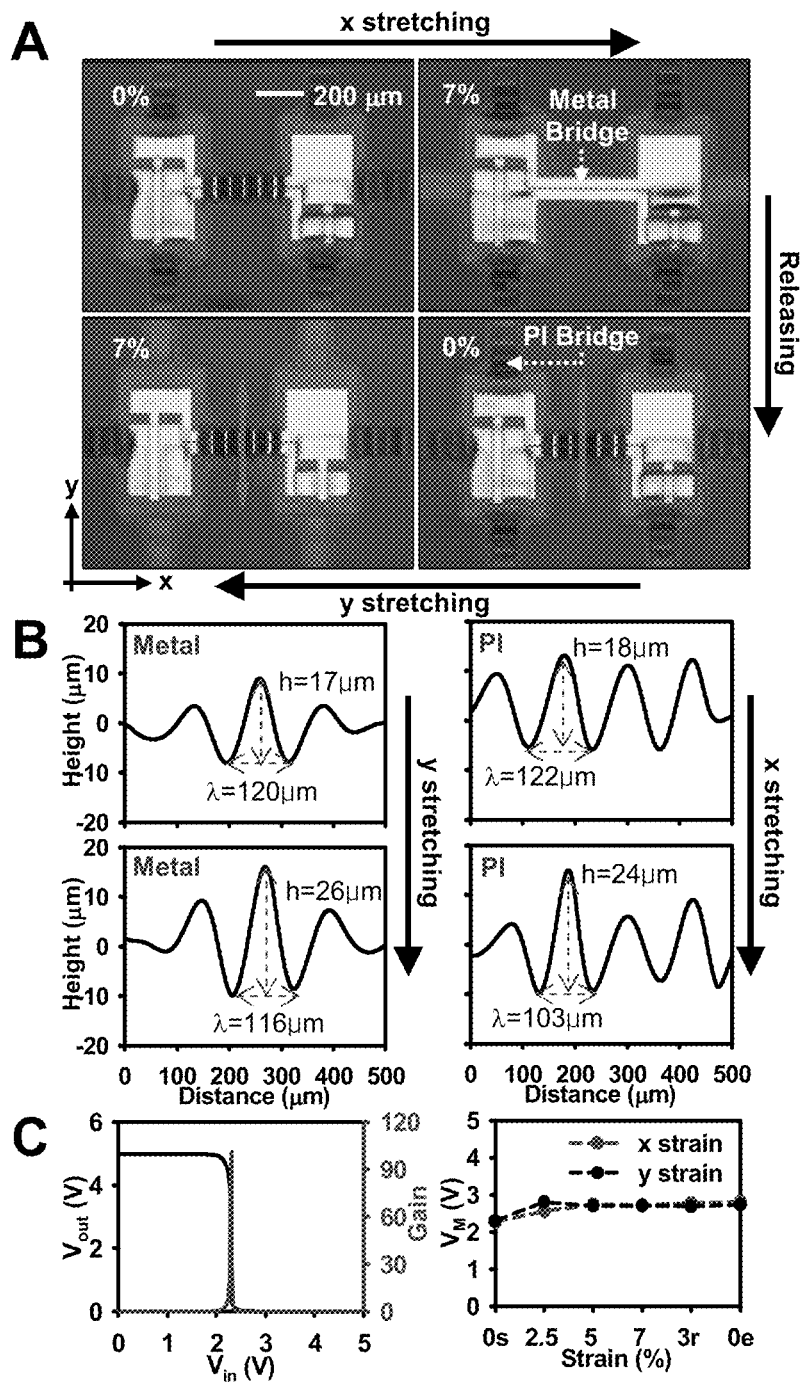
Figure 62:
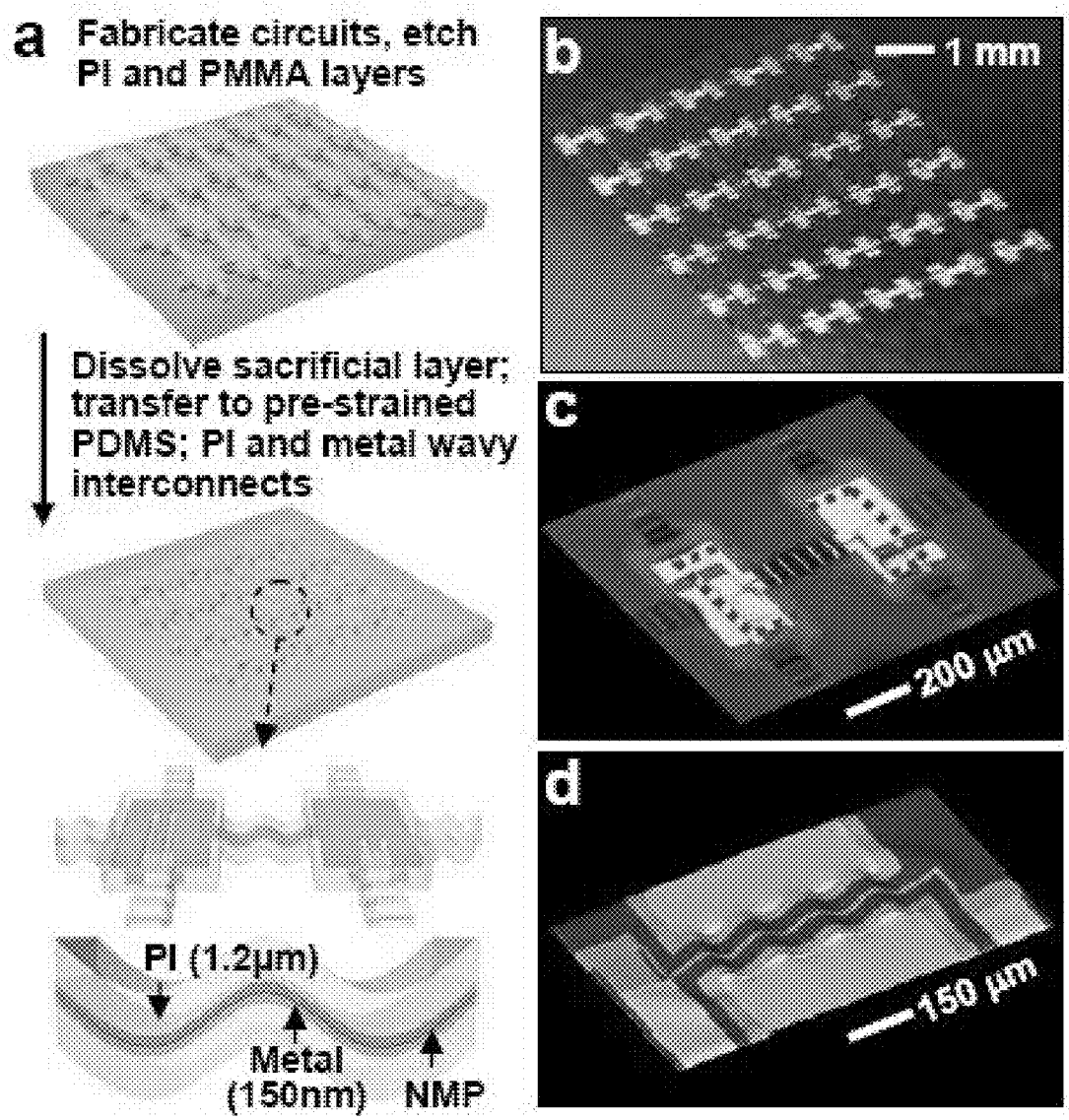
FIG. 62 (a) Schematic illustration of the fabrication process, including cartoons of CMOS inverter logic gates with stretchable, 'wavy' interconnects. Also shown is the strategy of top layer encapsulation to locate the critical circuit elements near the neutral mechanical plane to avoid cracking. (b) Image of CMOS inverters with wavy interconnects and bridge structures. (c) Magnified view of a CMOS inverter with wavy interconnects. (d) Three dimensional finite element simulation of the mechanics of this system, showing good agreement with experimental observation.

The inverters in FIGS. 44, 62 and 63 can also be stretched in any angle. The angled stretching is equivalent to stretching along the bridge directions x and y plus an in-plane shear. Since the thickness (~2.5 µm) is much less than the width (~100 µm), the large inplane shear leads to "lateral buckling" out of the plane such that the strains remain small. This mechanics is related to that of a mesh based approach described by Someya et al. In those systems, rotation and bending of struts in the mesh provide large degrees of stretchability in certain, but not all, directions. This type of approach, which is interesting and useful for many applications, is fully compatible with the layouts and fabrication approaches presented here.

Figure 45:
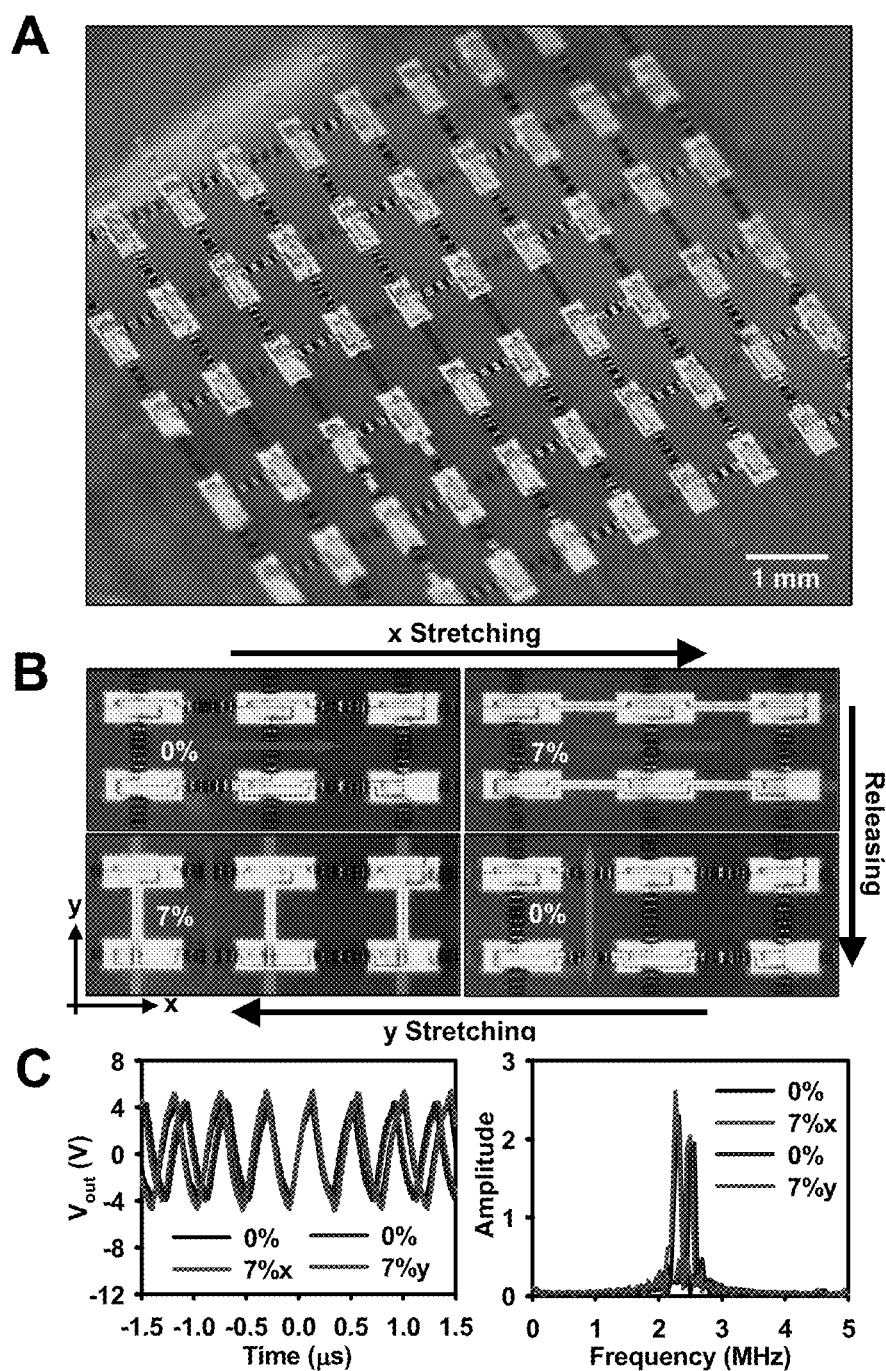
FIG. 45 (a) Image of wavy interconnected three stage ring oscillators. (b) Images of stretching test. (c) Oscillation characteristics (left: ring oscillation at different strain values, right: Fourier transform of oscillation from time domain to frequency domain).
Figure 46:
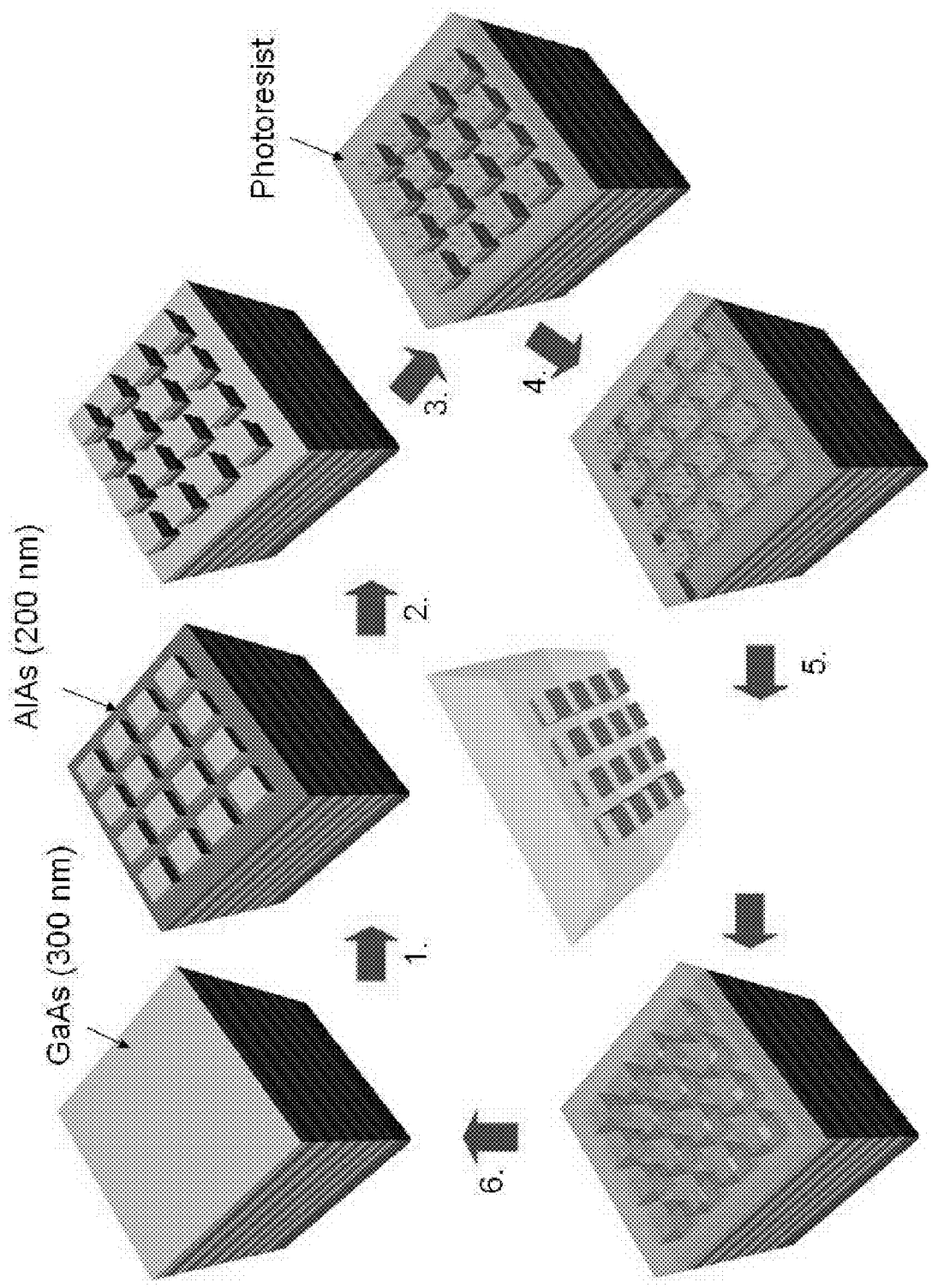
FIG. 46 Schematic illustration of GaAs MESFET processing flow.
Figure 47:
FIG. 47 Flow chart summary of GaAs MESFET processing.
Figure 48:
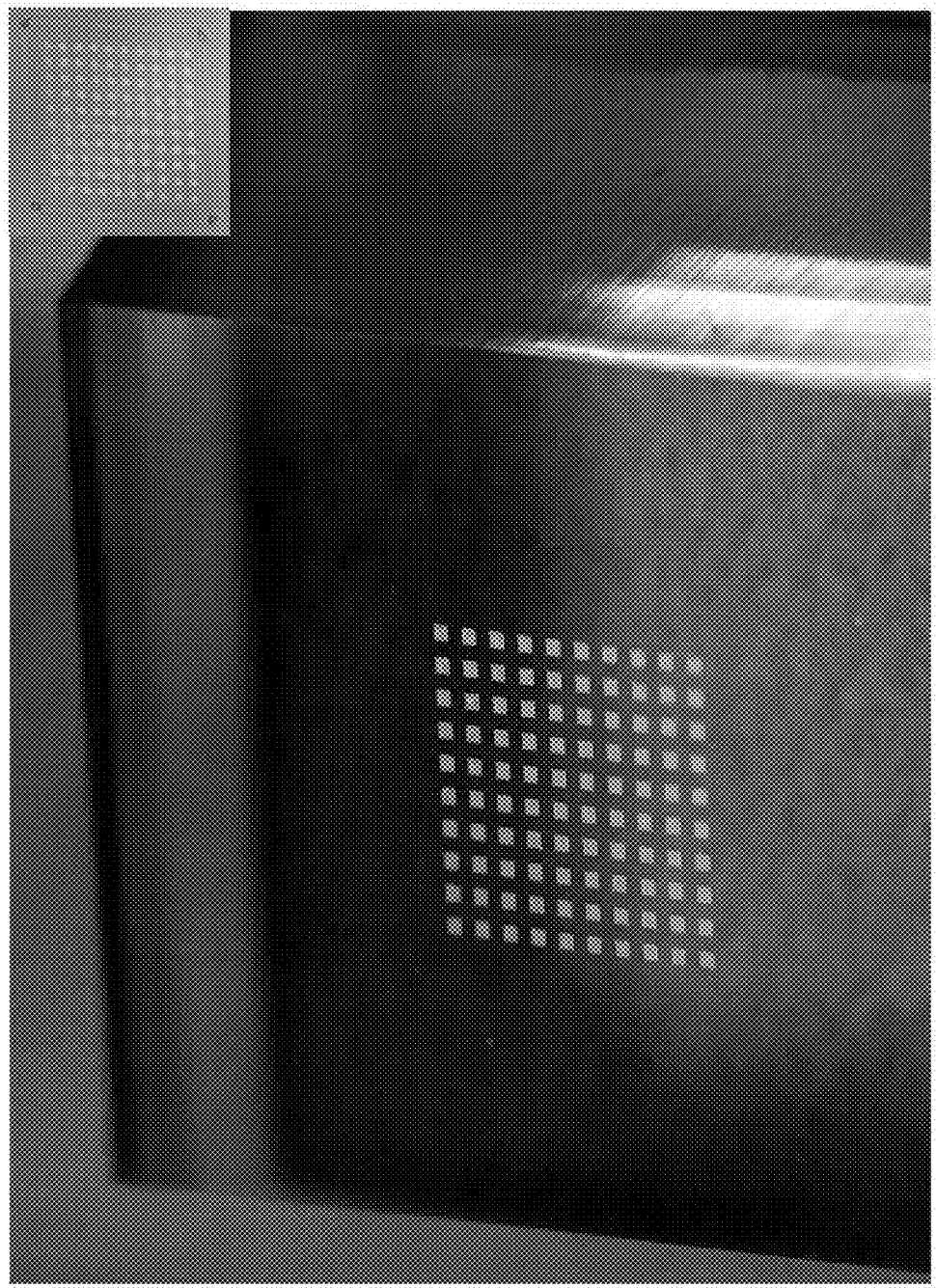
FIG. 48 Pick-up of GaAs elements by PDMS (inset is the donor source substrate after pick-up).
Figure 49:
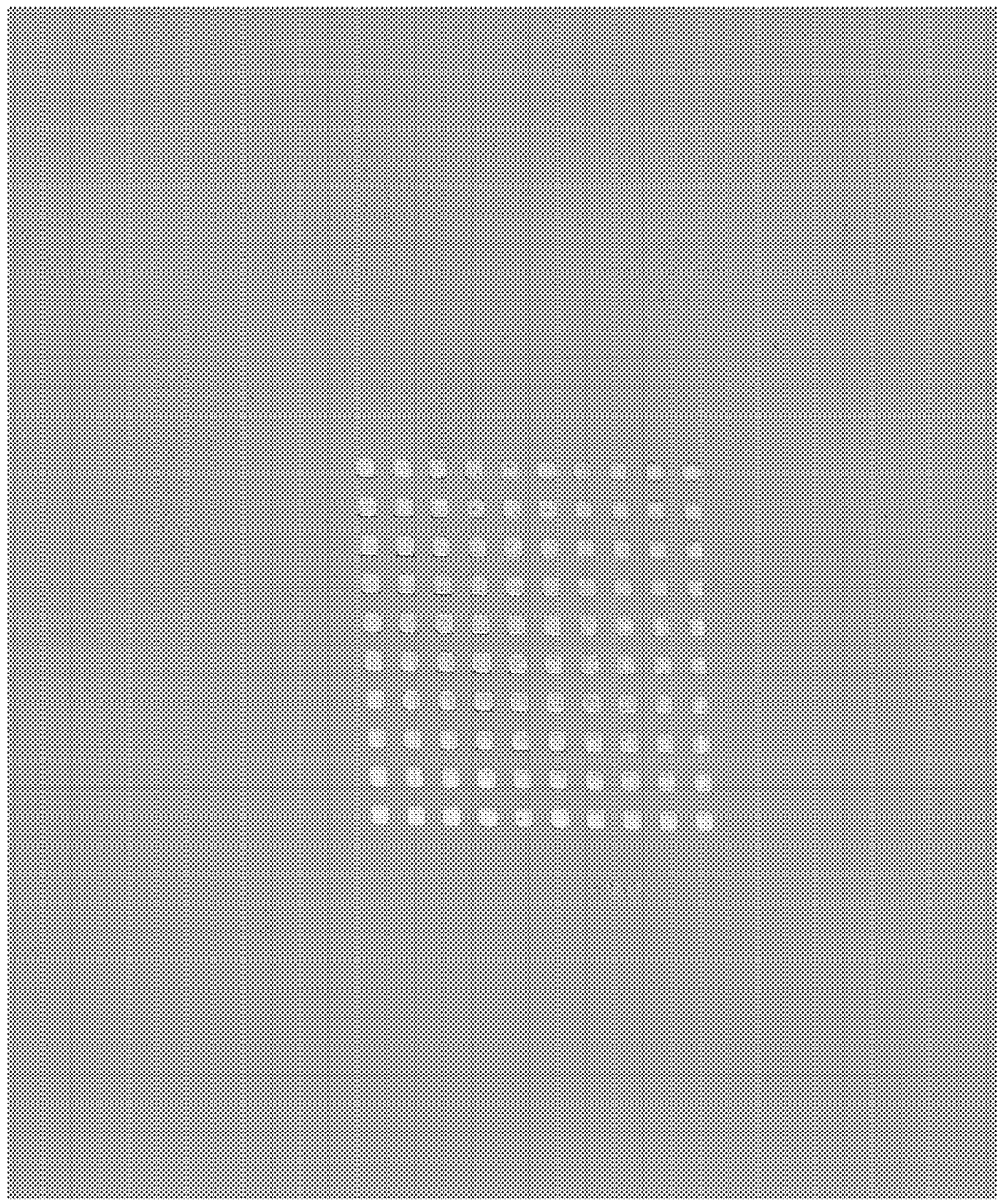
FIG. 49 Transfer of GaAs from stamp of FIG. 48 to PI coated glass substrate.
Figure 50:
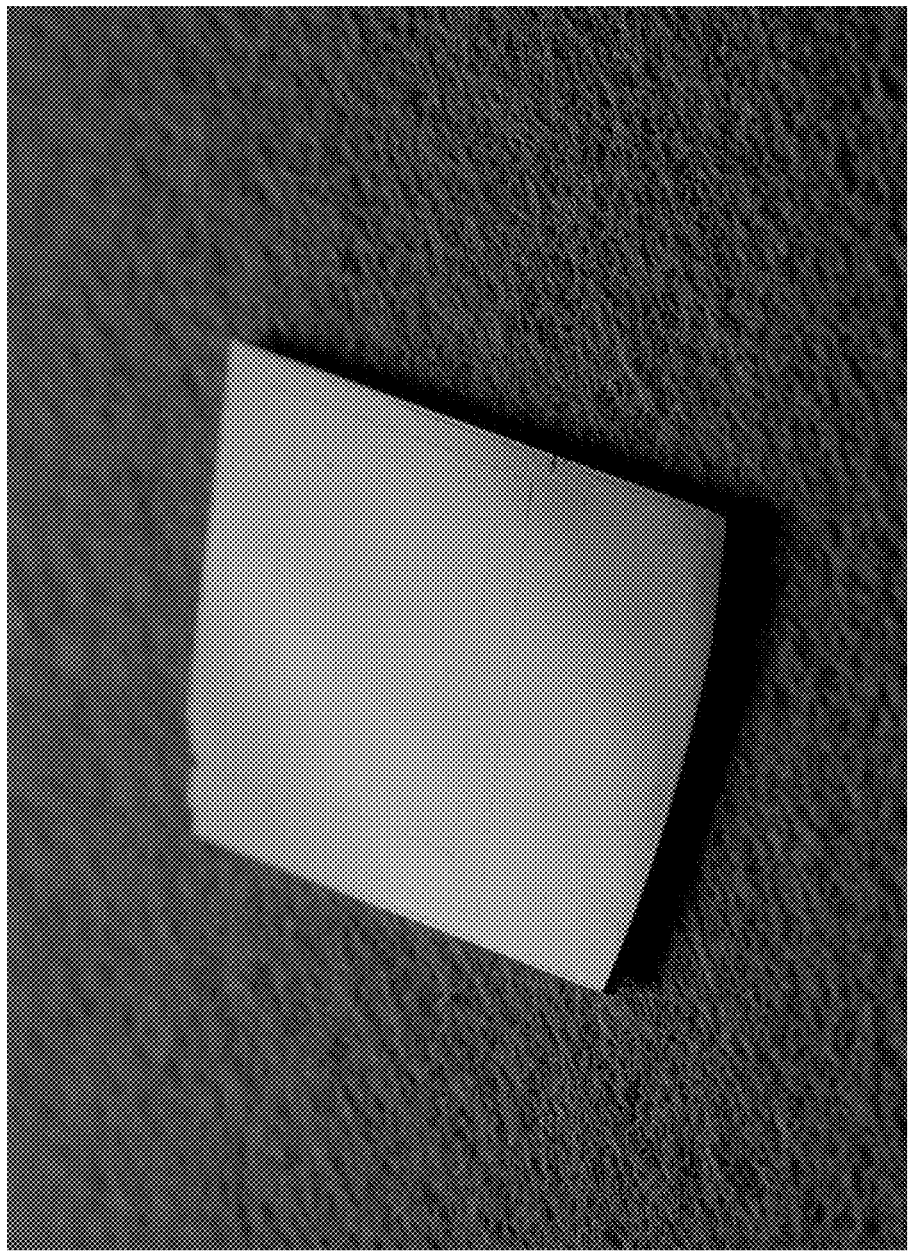
FIG. 50 Photograph of donor after cleaning up remaining photoresist, and ready for process repetition for the second functional GaAs layer.
Figure 51:
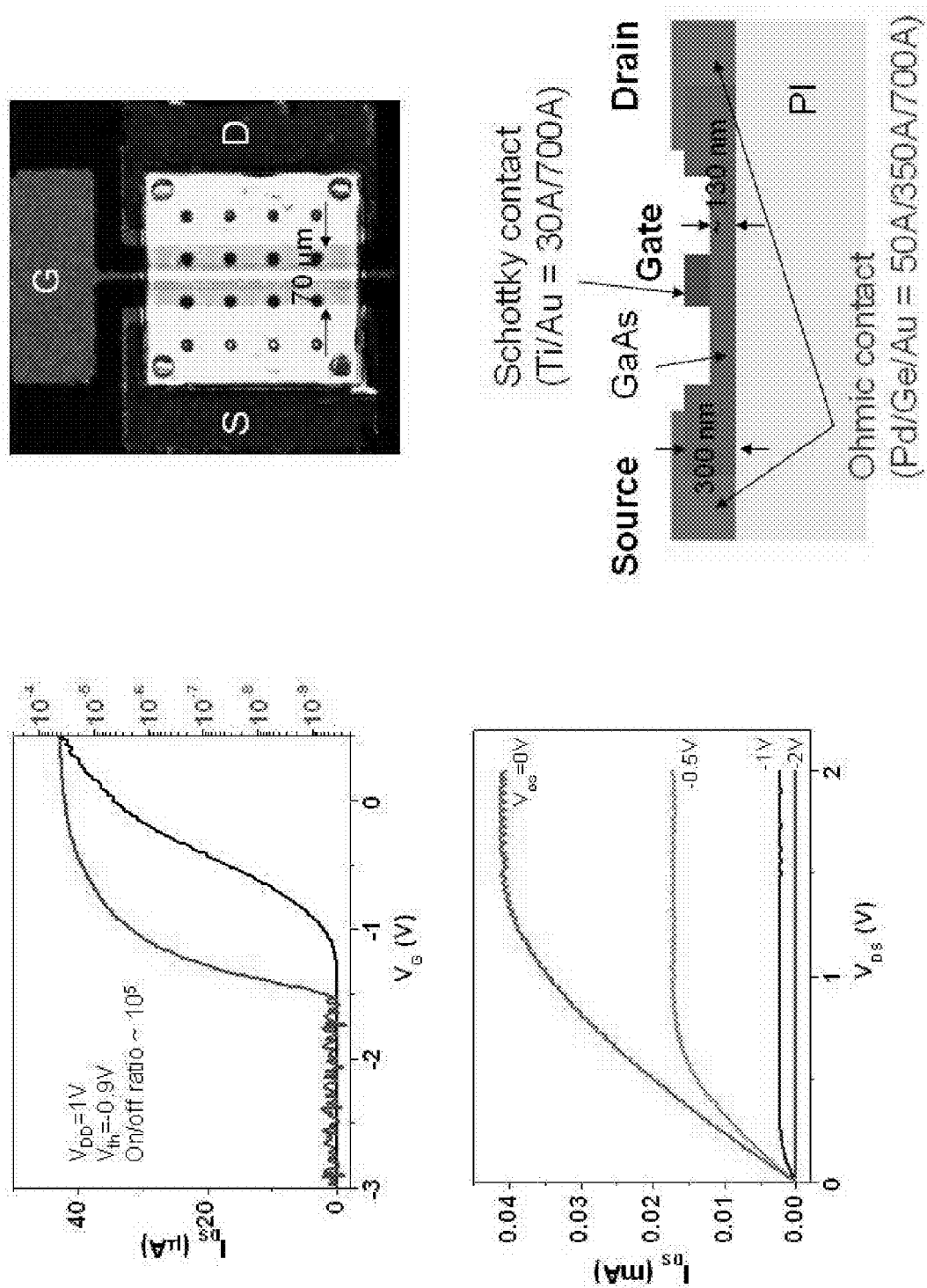
FIG. 51 Metallization and device characterization (for the first layer of the multilayer).

This strategy can be applied not only to inverters, but also to more complex circuits. FIG. 45 shows, as an example, three stage CMOS ring oscillators and stretching tests in the x and y directions. The geometries of the transistors and the PDMS prestrain were the same as those for the inverters discussed previously. In this circuit, all nMOS and pMOS islands were interconnected with 4 horizontal and 3 vertical interconnects, and each ring oscillator was connected with structural bridges, as illustrated in FIG. 45. The oscillation frequency is ~2.3 MHz at a supply voltage of 10 V. The change in frequency with stretching is less than 0.3 MHz, up to strains of nearly 4% (FIG. 45C). As with the individual inverters, this level of strain independent performance represents an important improvement over previous results.

In conclusion, by structuring the types of ultrathin substrates implemented in separately reported stretchable circuit designs, it is possible to localize mechanical deformations in noncritical regions to remove any measurable dependence of the electrical performance on applied strain. This simple design concept is validated by mechanics analysis and electrical measurements on representative circuits.

D.-H. Kim, J.-H. Ahn, W. M. Choi, H.-S. Kim, T.-H. Kim, J. Song, Y. Y. Huang, Z. Liu, C. Lu and J. A. Rogers, Science 25, 507 (2008).

D.-H. Kim, J.-H, Ahn, H.-S. Kim, K. J. Lee, T.-H. Kim, C.-J. Yu, R. G. Nuzzo and J. A. Rogers. IEEE Electron Device Lett 20, 73 (2008).

S. Timoshenko and J. Gere. Theory of Elastic Stability. McGraw-Hill, New York (1961).

T. Someya, Y. Kato, T. Sekitani, S. Lba, Y. Noguchi, Y. Murase, H. kawaguchi, and T. Sakurai. Proceedings of the National Academy of Sciences 102, 12321 (2005).

EXAMPLE 4

Materials and Non-Coplanar Mesh Designs for Integrated Circuits with Linear Elastic Responses to Extreme Mechanical Deformations Electronic systems that offer elastic mechanical responses to high strain deformations are of growing interest, due to their ability to enable new biomedical devices and other applications whose requirements are impossible to satisfy with conventional wafer-based technologies or even with those that offer simple bendability. This example introduces materials and mechanical design strategies for classes of electronic circuits that offer extremely high stretchability, enabling them to accommodate even demanding configurations such as corkscrew twists with tight pitch (e.g. 90 degrees in ~1 cm) and linear stretching to 'rubber-band' levels of strain (e.g. up to ~140%). The use of single crystalline silicon nanomaterials for the semiconductor provides performance in stretchable complementary metal-oxide-semiconductor (CMOS) integrated circuits approaching that of conventional devices with comparable feature sizes formed on silicon wafers. Comprehensive theoretical studies of the mechanics reveal the way in which the structural designs enable these extreme mechanical properties without fracturing the intrinsically brittle active materials or even inducing significant changes in their electrical properties. The results, as demonstrated through electrical measurements of arrays of transistors, CMOS inverters, ring oscillators and differential amplifiers, suggest a valuable route to high performance stretchable electronics.

Increasingly important classes of application exist for electronic systems that cannot be formed in the usual way, on semiconductor wafers. The most prominent example is in large area electronics (e.g. backplanes for liquid crystal displays), where overall system size, rather than operating speed or integration density, is the most important metric. Similar systems that use flexible substrates are presently the subject of widespread research and commercialization efforts, due to advantages that they offer in durability, weight and ease of transport/use.[1,2] Stretchable electronics represents a fundamentally different and even more challenging technology, of interest for its unique ability to flex and conform to complex curvilinear surfaces such as those of the human body. Several promising approaches exist, ranging from the use of stretchable interconnects between rigid amorphous silicon devices[3] to 'wavy' layouts in single crystalline silicon CMOS circuits[4], both on elastomeric substrates, to net shaped structures in organic electronics on plastic sheets[5]. None offers, however, the combination of electrical performance, scalability and mechanical properties required of some of the most demanding, and most interesting, systems. Here, we introduce new design concepts for stretchable electronics that exploit semiconductor nanomaterials (i.e. silicon nanoribbons) in ultrathin, mechanically neutral circuit layouts integrated on elastomeric substrates in non-coplanar mesh designs, with certain features inspired by methods recently reported for transforming planar optoelectronics into hemispherical shapes for electronic eye cameras[6]. As demonstrated in diverse circuit examples, these ideas accomplish a form of stretchable electronics that uniquely offers both high performance and an ability to accommodate nearly any type of mechanical deformation to high levels of strain. Experimental and theoretical studies of the electrical and mechanical responses illuminate the key materials and physics aspects associated with this new type of technology.

FIG. 64(*a*) schematically illustrates steps for fabricating a representative system that consists of a square array of CMOS inverters. The overall process can be divided into two parts. The first defines CMOS circuits on ultrathin plastic substrates using printing methods and single crystalline silicon nanoribbons, according to procedures described previously[7]. For all of the results reported here, the ribbons had thicknesses of 260 nm and 290 nm for p-channel and n-channel metal oxide semiconductor field effect transistors (MOSFETs), respectively. The gate dielectric consisted of a 50 nm thick layer of $SiO_2$ deposited by plasma enhanced chemical vapor deposition. The same type of film formed an interlayer dielectric for metal (Ti:5 nm/Au:150 nm) interconnect lines and electrodes. The plastic substrate consisted of a thin layer (1.2 µm) of polyimide (PI) supported by a carrier wafer (test grade silicon) coated with a film (100 nm) of poly(methylmethacrylate) (PMMA)[8]. A thin top coating of PI (1.2 µm), with etched (reactive ion etching; RIE) holes for electrical access, protected the circuits and placed the most fragile components near the neutral mechanical plane[4]. Individual devices fabricated in this manner exhibited device mobilities of ~130 and ~370 $cm^2$/Vs for p channel and n channel MOSFETs, respectively, with on/off ratios $>10^6$ and operating voltages in the range of <5V. The second part of the fabrication process involves structuring the circuits into non-coplanar layouts intimately integrated with elastomeric substrates to yield systems with reversible, elastic responses to extreme mechanical deformations. In the first step toward achieving this outcome, certain regions of the PI/PMMA between the electronic components of the system, were removed by RIE through a patterned layer of photoresist. The result was a segmented mesh with active device islands connected electrically and/or mechanically by thin polymer bridges with or without metal interconnect lines, respectively. Immersion in acetone washed away the PMMA layer to release the system from the carrier. Lifting off the patterned circuit sheet onto a slab of poly(dimethylsiloxane) (PDMS) exposed its underside for deposition of a thin layer of $Cr/SiO_2$ (3 nm/30 nm) at the locations of the islands by electron beam evaporation through an aligned shadow mask. Delivering the circuit to a biaxially pre-strained substrate of PDMS with its surface activated by exposure to ozone led to the formation of strong mechanical bonds at the positions of the islands. The interface chemistry responsible for this bonding involves condensation reactions between hydroxyl groups on the $SiO_2$ and PDMS[4] to form —O—Si—O— linkages, similar to that described recently for controlled buckling in collections of semiconductor nanoribbons[8]. Releasing the pre-strain resulted in compressive forces that caused the connecting bridges to lift vertically off the PDMS, thereby forming arc-shaped structures. We refer to this layout as a non-coplanar mesh design. The localization of this out-of-plane mechanical response to the bridges results partly from their poor adhesion to the PDMS and partly from their narrow geometries and low bending stiffnesses compared to the device islands. (This latter aspect allows similar structures to be formed even without the patterned $SiO_2$ adhesion layer.) The bottom frames of FIG. 64(*a*) and FIG. 64(*b*) show schematic illustrations and scanning electron microscope (SEM) images. In this format, the system can be stretched or compressed to high levels of strain (up to 100%, and in some cases higher, as described subsequently), in any direction or combination of directions both in and out of the plane of the circuit, as might be required to allow complex twisting, shearing and other classes of deformation. The top frames of FIG. 64(*b*) and FIG. 64(*c*) show images that illustrate some of these capabilities, in circuits that use a PDMS substrate with thickness ~1 mm and a prestrain of ~17%, as defined by the change in separation between inner edges of adjacent device islands. For practical applications, such systems are coated with a protective layer of PDMS in a way that does not alter significantly the mechanical properties, as argued subsequently. For ease of imaging and electrical probing, the circuits described in the following are all unencapsulated.

The physics of deformation associated with applying tensile or compressive forces oriented along the directions of the bridges is similar to that involved in relaxing the prestrain in the circuit fabrication process of FIG. 64. The bridges move up or down (corresponding to decreases or increases in end-to-end lengths, respectively) as the system is compressed or stretched, respectively. Another, less obvious, feature is that the thin, narrow construction of these bridges also enables them to twist and shear in ways that can accommodate more complex distributions of strain. FIG. 64(*c*) shows some representative cases, described in more detail subsequently, for different regions of a system under a complex, twisting deformation. The basic mechanics is similar to that of systems that are encapsulated by PDMS. For example, calculation indicates that the maximum strain that can be applied to the system, as shown in the bottom frame of FIG. 64(*b*), reduces by only ~2.5% due to the addition of a ~1 mm thick overcoat of PDMS.

Figure 65:
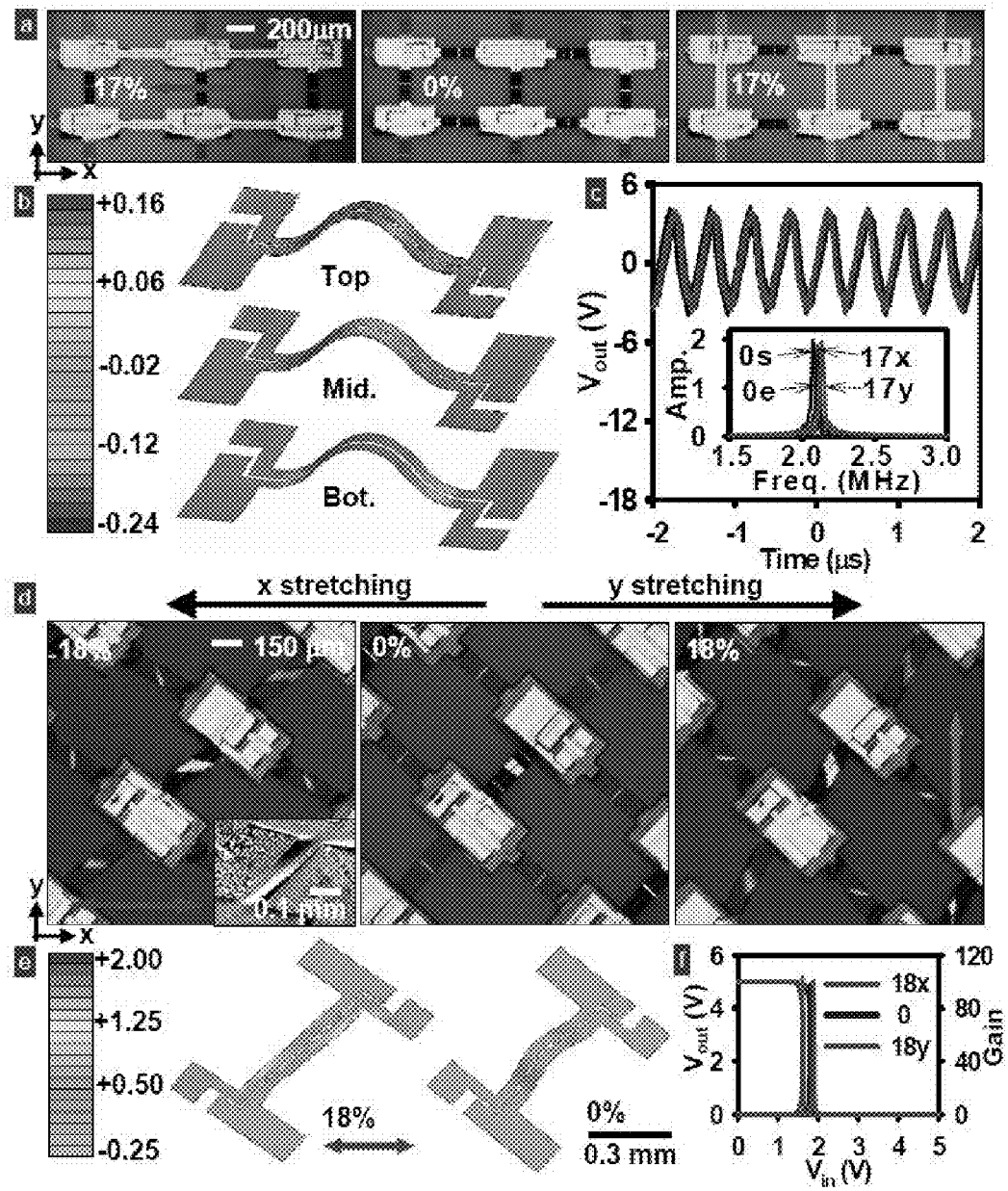
FIG. 65. (a) Optical images of stretchable, three stage CMOS ring oscillators with noncoplanar mesh designs, for stretching along the bridges (x and y). (b) FEM modeling of the strain distributions at the top surface of the circuit (Top) and at the mid-point of the metal layer (Mid) and bottom surface (Bot). (c) Electrical characteristics of the oscillators as represented in the time and frequency (inset) domains in the different strain configurations illustrated in (a). Here 0s and 0e refer to 0% strains at the start and end of the testing, respectively. 17x and 17y refer to 17% tensile strains along the x and y directions indicated in (a). (d) Optical images of stretchable CMOS inverters with non-coplanar mesh designs, for stretching at 45 degrees to the directions of the bridges (x and y). (e) FEM simulations of these motions. (f) Transfer characteristics of the inverters (output voltage, $V_{out}$, and gain as a function of input voltage, $V_{in}$). 18x and 18y refer to 18% tensile strains along the x and y directions indicated in (d).

These designs lead to electronic properties that are largely independent of strain, even in extreme configurations such as those illustrated in FIGS. 64(*b*) and 64(*c*). This feature can be demonstrated explicitly through device and circuit measurements on systems for various, well-defined mechanical deformations induced with custom assemblies of mechanical stages. The simplest case corresponds to in-plane stretching in directions parallel to the bridges. Testing of this deformation mode was performed using three stage ring oscillators, in which each island supports an n channel and a p channel MOSFET (channel widths of 100 µm and 300 µm, respectively; channel lengths of 13 µm). Metal electrodes on the bridges form the required interconnects. FIG. 65(*a*) shows optical micrographs of a typical response, for a system fabricated with a prestrain of ~17%. With stretching in the x direction, the bridges oriented along x progressively flatten, while those along y rise up slightly, due to the Poisson effect, and vice versa. A critical aspect of the strategy outlined in FIG. 64 is the ability of the non-coplanar structures to accommodate nearly all of the strains associated with the fabrication process and with deformations that can occur during use.

This mechanical isolation can be seen clearly through finite element modeling (FEM) analysis of the tensile strain distribution at the top and bottom surface and midpoint through the thickness of the metal layer in the circuit (FIG. 65(*b*)). For the middle layer, all areas experience almost zero strain due to the neutral mechanical plane design. Negligible strains throughout the thickness and in all regions of the islands derive from strain relaxation provided by the bridges/interconnects in the non-coplanar mesh layout. For this example, the change in separation of islands (i.e., prestrain) is ~17%, which corresponds to the system-level strain of ~11% as defined by the change of the distances from the outer edges of adjacent device islands. Mechanics analysis based on energy minimization (Supplementary Information) gives an amplitude of 116.3 µm for the 445 µm-long bridge, which agrees well with experimental value ~115 µm. The maximum tensile strains calculated for the metal layer in the bridges and islands are ~0.11% and ~0.01%, respectively, while that in the Si layer of the islands is ~0.01%. These values are all much smaller than the fracture strains (~1%) in these materials. The finite element analysis results of FIG. 65(*b*) are consistent with this analysis. For applied strains between −40% (i.e. compressive) and 17% (tensile), which corresponds to a strain range of 57%, the mechanical advantage provided by the non-coplanar mesh layout, as defined by the ratio of the system level strain to the peak material strain, is ~180. Measurements on these oscillators show well behaved responses at these strain conditions, and others in between. The observed frequencies (~2 MHz, FIG. 65(*c*)) and other properties of the circuits and individual devices reported here and elsewhere in this example, are comparable to those measured in the initial, planar configurations prior to removal from the carrier substrate (FIG. 64(*a*)).

Figure 73:
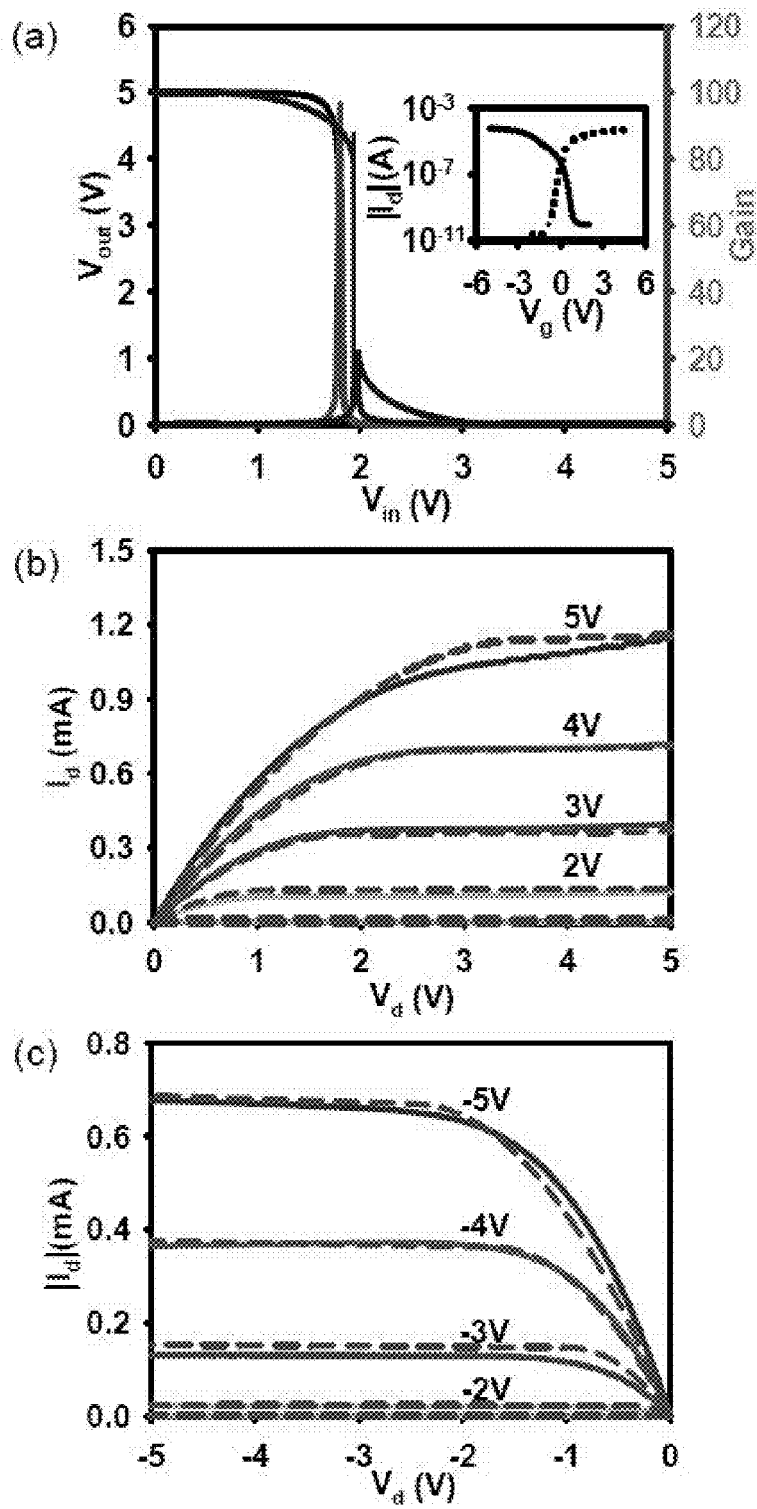
FIG. 73. Voltage transfer curve of CMOS inverter (a) and IV curves for individual devices, for nMOS (b) and for pMOS (c).

A somewhat more complex deformation mode that involves in-plane stretching along an axis not aligned to the bridges illustrates additional capabilities of the non-coplanar design. Such applied strains cause the bridges not only to flatten, as for the case of FIG. 65(*a-c*), but also to rotate and twist out of the plane (FIG. 65(*d*)). This deformation is referred to as lateral buckling[11], and can be characterized by a Bessel function (for tilting) and a sinusoidal function (for flattening) to accommodate off-axis stretching (Supplementary Information). Since this type of stretching involves significant shear, the principal strain, which combines the tensile and shear strains (See Supplementary Information), replaces the tensile strain to describe the extent of deformation. For off-axis stretching that results in 14% stretching in the bridge and 7.5% shear, minimization of energy (including the twisting energy) gives a maximum principal strain 2% and 0.8% in the metal layer of the bridges and islands, respectively, and 0.6% in the Si layer of islands. FEM simulation of these systems, as illustrated in FIG. 65(*e*), further quantifies the underlying mechanics. The ability of the bridges to absorb nearly all of these off-axis strains enables excellent device and circuit performance, with little dependence on strain. FIG. 65(*f*) shows, as an example, transfer characteristics and gains (up to ~100) measured on CMOS inverters formed by electrical interconnects on bridges between adjacent islands that each support one p channel and one n channel MOSFET. Also electrical simulation of the inverters, using individual transistor data, agrees with the measurement results (see FIG. 73). These transistors have layouts identical to those in the ring oscillators of FIG. 65(*a*). Although the deformation modes of FIG. 65 are also possible with recently reported 'wavy' designs[4], the non-coplanar mesh layouts increase the levels of strain that can be accommodated by more than five times and they substantially reduce the sensitivity of electrical response to strain (i.e. to values close to measurement repeatability limits for the cases of FIG. 65). In all cases, the deterministic, linear elastic nature of the underlying mechanics, which arises from the small strains in the electronic materials and the linear response of the PDMS (up to strains of 110%)[9], leads to little change in properties even on extensive mechanical cycling, as demonstrated subsequently (FIG. 68(*e*)).

An extreme type of deformation, which is partly involved in the configuration shown in FIG. 64, involves twisting into corkscrew shapes with tight pitch. Under such applied strain, the bridges deform due mainly to in-plane shear with a magnitude on the order of the ratio of (bridge or island) thickness to length times the rotation angle. Such twisting deformation is different from off-axis stretching because it does not involve buckling and is therefore amenable to linear analysis. For a 90 degree rotation over a distance corresponding to a pair of bridges and an island, the maximum shear strains in the metal and Si layers are 0.08% and 0.02%, respectively, for the 445 µm-long bridge and 260 µm-long island. The left frame of FIG. 66(*a*) shows an image of a circuit on thin PDMS, in a twisted geometry; the right frame shows a magnified view of a CMOS inverter in this system. As for the previously described cases, FEM simulation (FIG. 66(*b*)) supports the experimental observations and reveals the level of principal strain to be 0.3% in the metal layer of the bridge and the island. An SEM image of an interconnected array of inverters for a ring oscillator (FIG. 66(*c*)) shows the shape of the twisted bridges. Electrical measurements indicate stable electrical performance before and after twisting, both for inverters (top frame of FIG. 66(*d*)) and ring oscillators (bottom frame of FIG. 66(*d*)). The electrical properties, in all cases, are comparable to those described previously. In other words, the systems are, to within experimental uncertainty, agnostic to deformation mode for all configurations studied here.

Figure 66:
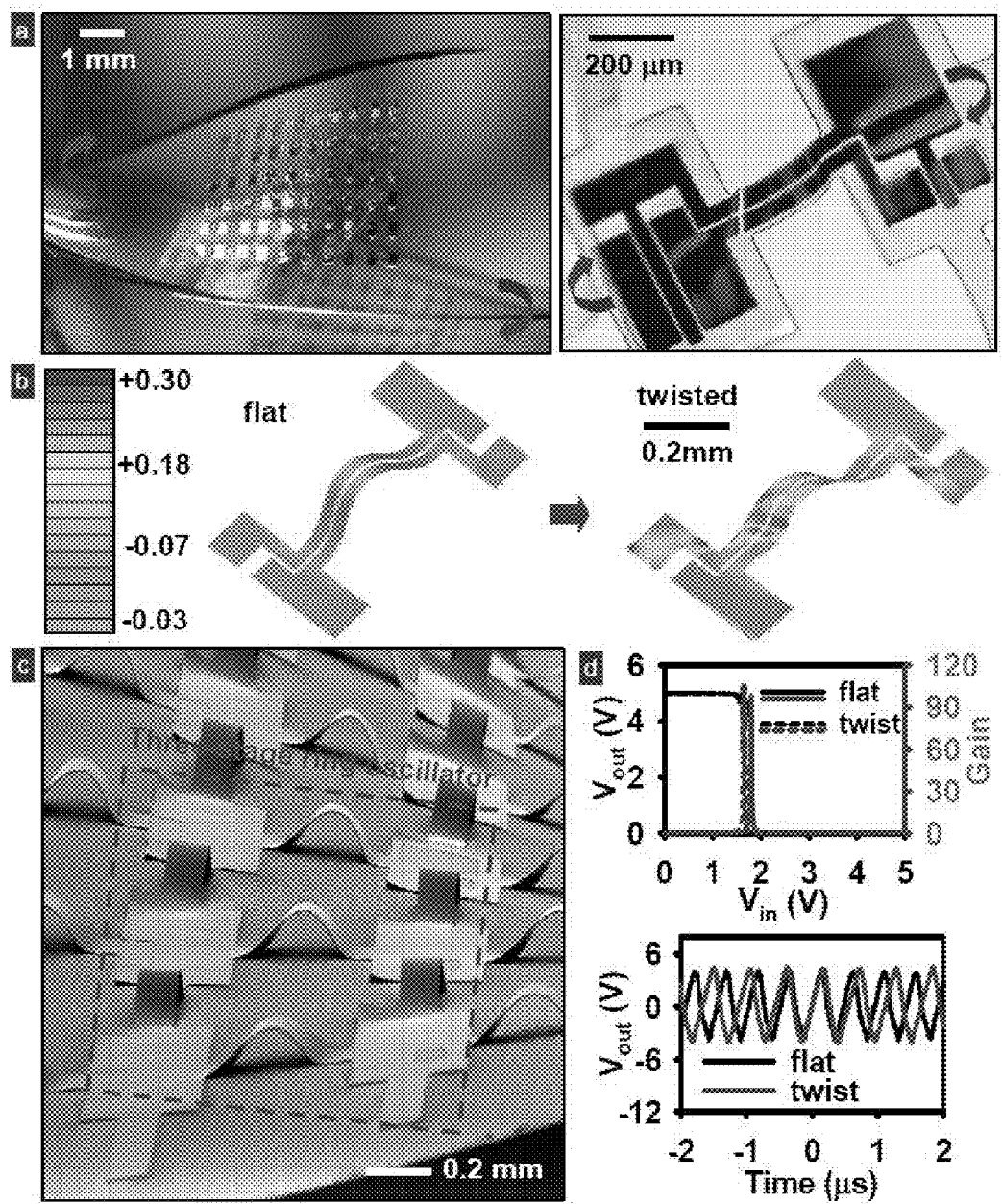
FIG. 66. (a) Optical images of an array of stretchable CMOS inverters in a twisted configuration (left) and magnified view of a single inverter, illustrating the nature of the deformation (right). (b) FEM simulation of the mechanics of twisting on the bridge structures (c) SEM image of an array of stretchable, three stage CMOS ring oscillators in a twisted configuration. (d) Electrical characteristics of the inverters (top; gain and output voltage, $V_{out}$, as a function of input voltage, $V_{in}$) and oscillators (bottom; output voltage, $V_{out}$, as a function of time) in planar and twisted states.
Figure 67:
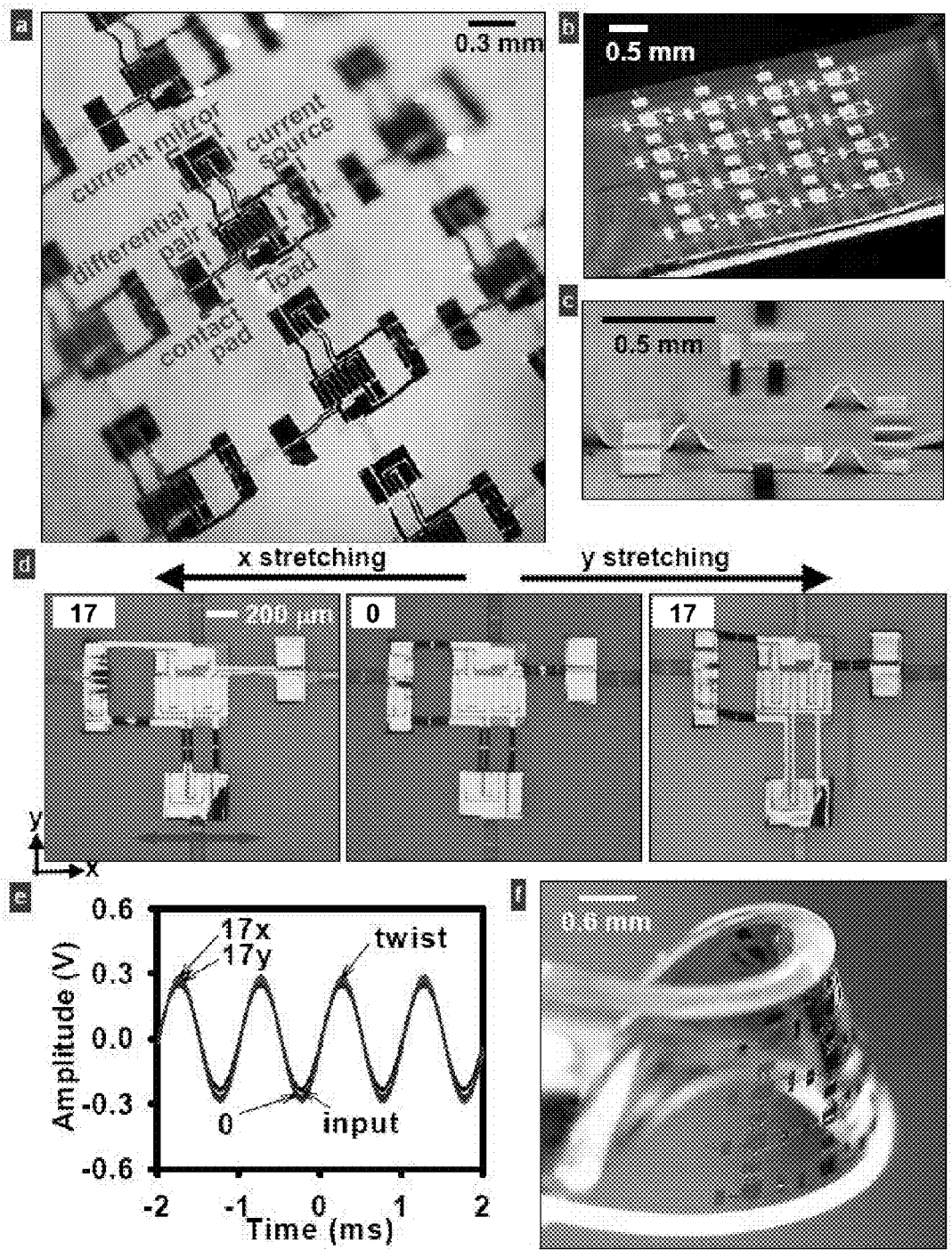
FIG. 67. Optical images of an array of stretchable differential amplifiers in twisted (a) and planar stretched (b) layouts. (c) Tilted view SEM of a representative amplifier, showing the non-coplanar layout. Optical images under stretching along the x and y directions (d), and corresponding electrical output as a function of time for a sinusoidal input (e). (f) Optical image of a device in a complex deformation mode. Here, 17x and 17y refer to 17% tensile strains along the x and y directions indicated in (d).

FIGS. 64-66 illustrate examples for circuits, such as inverters and ring oscillators, which are straightforward to implement in repetitive, arrayed layouts. More complex, irregular designs might be required in many cases of practical importance; these can also be implemented in non-coplanar mesh designs. We demonstrate this concept for a differential amplifier[10], in which we divide the circuit into four sections each of which forms an island connected by metal lines on pop-up bridges. The dotted boxes in the left frame of FIG. 67(*a*) highlight these four regions; an angled view SEM image in the inset shows the structure. The bridges provide a mechanics that is conceptually similar to those in the regular array layouts, even though the details are somewhat different. As a result, this irregular circuit can be stretched or twisted reversibly, as shown in FIGS. 67(*b*) and (*c*), respectively. FIG. 67(*d*) shows magnified images of stretching in the x and y direction. Electrical measurements verify that the amplifiers work well under these deformations. The gains for 0%, 17% x stretching, 17% y stretching and twisting to a full 180 degree rotation of a PDMS substrate with a length of ~2 cm were 1.15, 1.12, 1.15 and 1.09 (design value ~1.2), respectively. Such systems can also be freely deformed, as shown in FIG. 67(*f*).

Figure 68:
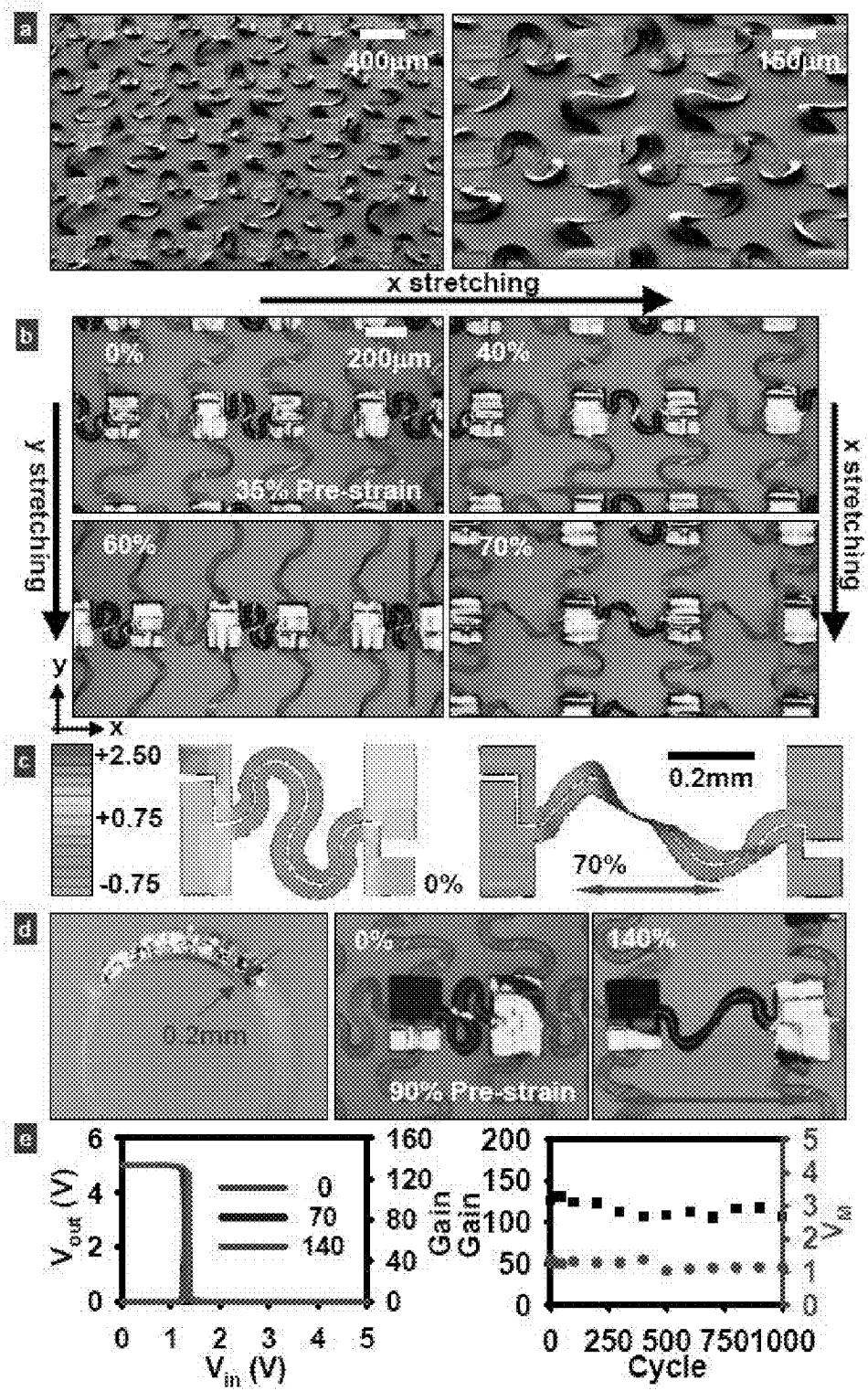
FIG. 68. (a) SEM image of an array of stretchable CMOS inverters with non-coplanar bridges that have serpentine layouts (left) and magnified view (right). (b) Optical images of stretching test in the x and y directions. (c) FEM simulation before (35% pre-strain) and after stretching (70% applied strain). (d) Arrays of inverters on a thin PDMS substrate (0.2 mm) (left) and images in unstretched (middle; 90% prestrain) and stretched (right; 140% tensile strain). (e) Transfer characteristics and gain for a representative inverter under stretching (left) and plot of gain and voltage at maximum gain (VM) for a similar device as a function of stretching cycles (right).

Although the materials and mechanical designs described previously can accommodate larger strains and in more diverse configurations compared to previous demonstrations, they might not satisfy requirements for certain advanced device concepts, such as electronics for 'smart' surgical gloves, where truly 'rubberband-like' stretchability (e.g. to >50% strain) is needed. A simple method to increase the stretchability, without changing the materials or layouts in the stacks that make up the circuits, involves increasing the separations between the device islands and decreasing the thicknesses of the bridges. The quantitative effects of these parameters on the peak material strain can be represented by a simple analytical relation, presented in the Supplementary Information, for the approximate case that the islands are strictly rigid and remain planar. As an example, for square islands with widths/lengths of 260 µm and spaced by 445 µm, the peak strains in the materials at the surfaces of bridges with thicknesses of 0.8 µm are 1% for 50% compressive strains applied to the system starting from a flat, planar state. If the materials in the bridges fail at ~1% strain (i.e. a worst case scenario, in which neutral mechanical designs are not used), then the maximum system strain is 50%. Increasing the spacing to ~604 µm or decreasing the bridge thicknesses to ~0.56 µm, improves the maximum system strain to ~100%. To expand the deformability even further, without increasing the sparseness of the distribution of islands, serpentine bridges can be used. FIG. 68(*a*) shows SEM images of such a design after executing the fabrication procedures of FIG. 64. When external strain is applied along the x or y directions, these non-coplanar serpentine bridges effectively compensate the applied strain non only through changes in height but also by changes in geometry of the serpentine shape. FIG. 68(*b*) shows images of the response of a representative device to on-axis stretching strains up to 70%, for a system built with 35% prestrain, in which deformations of the serpentine bridges exhibit changes in configurations that might be expected intuitively. Remarkably, finite element modeling reveals that even to stretching strains of 70%, the peak strains in the metal layer in the bridges and islands are 0.2% and 0.5%, respectively and the strain in silicon is 0.15% as indicated in FIG. 68(*c*). (The strains reach ~3% in certain locations of the PI.) To explore the limits, we used thin PDMS substrates (0.2 mm) to facilitate stretching to even larger strains. FIG. 68(*d*) shows a case corresponding to ~90% pre-strain which allows stretching to ~140% strain and corresponds to ~100% system strain. Consistent with the small strains in the active materials revealed by FEM, the electrical properties approach those of the corresponding unstrained, planar systems; the operation is also stable over many cycles (up to 1000, evaluated here) of stretching, as indicated in FIG. 68(*e*).

Finally, a practical application of popup circuits incorporates an additional passivation layer (e.g., "encapsulation layer") on top of devices for the protection of active regions from unwanted damages. Therefore, we coated popup circuits with PDMS and cured it after all bridges and islands were embedded by flowing PDMS. This additional encapsulation approach prevents damages on the device surface. In addition, the double neutral mechanical plane can be formed by controlling the top and bottom PDMS thickness, which provides additional mechanical strength for flexing[4]. Even after this encapsulation, the stretchability is not so much changed except for slightly larger strain on bridges due to restricted deformation inside cured PDMS. However, low modulus PDMS with extremely low content of curing agent or without curing agent this difference from encapsulation can be minimized.

Collectively, the results presented here provide design rules for circuits that provide both excellent electrical performance and capacities to be elastically deformed in diverse configurations to high levels of strain. The same ideas can, in many cases, be used to advantage in other conventionally rigid, planar technologies such as photovoltaics, microfluidics, sensor networks, photonics and others. These and related types of systems access many important new applications that cannot be addressed with other approaches.

METHODS

Preparation of Doped Silicon Nanoribbons

Preparation of Doped Silicon Nanoribbons Starts with the Doping of the Top silicon on silicon-on-insulator (SOI) wafers: nMOS source/drain doping with p-type SOI wafers (SOITEC, France) and PMOS source/drain doping with n-type SOI wafers (SOITEC, France). This process uses plasma enhanced chemical vapor deposition (PECVD) of silicon dioxide ($SiO_2$) for a diffusion mask, photolithography and RIE with $CF_4/O_2$ gas for patterning, spin coating and high temperature diffusion of Boron spin-on-dopant (B153, Filmtronics, USA) at 1000~1050° C. for p-type and Phosphorous spin-on-dopant (P509, Filmtronics, USA) at 950° C. for p-type. After doping, ribbons are defined by photolithography and RIE; they are released from the mother wafer by removing the buried oxide layer of the SOI wafers. These doped nanoribbons are picked up by PDMS and transfer printed to a carrier wafer for circuit integration.

Fabrication of Stretchable Circuits

Doped n-type and p-type nano-ribbons are sequentially transfer printed to a carrier wafer coated with thin layers of PMMA (~100 nm) as a sacrificial layer and PI (~1.2 µm) as an ultrathin substrate. After transfer printing, 50 nm PECVD $SiO_2$ is deposited for the gate dielectric, contact windows for source and drain are etched with buffered oxide etchant, 150 nm metal electrodes are evaporated and patterned and another PI layer is spin cast for passivation and control of neutral mechanical plane location. After circuit fabrication, oxygen RIE defines the mesh format. Dissolution of the PMMA layer with acetone releases the circuits from the carrier wafer. Such circuits are transferred to mechanically pre-strained PDMS for the formation of non-coplanar, 'pop-up' layouts. To help define the locations of the pop-up regions, thin layers of Cr and SiO$_2$ are selectively deposited on the bottoms of active islands by evaporation through a shadow mask, to enhance the adhesion between these regions of the circuit and PDMS.

Stretching Tests and Electrical Measurements

Stretching tests are performed with automated assemblies of translations stages, capable of applying tensile or compressive strains in x, y or diagonal directions. For twisting, edges of the PDMS are mechanically clamped with a twist angle of 180°. Electrical measurement are performed with a probe station (Agilent, 5155C), directly while under stretching or twisting deformations.

Analytical Calculations of the Non-Coplanar Bridge Structures

The bridge is modeled as a composite beam. Its out-of-plane displacement has a sinusoidal form with the amplitude determined by energy minimization. The island is modeled as a composite plate. Its out-of-plane displacement is expanded to as a Fourier series, with the coefficients determined by energy minimization. The PDMS substrate is modeled as a semi-infinite solid subjected to a surface displacement, which is same as the out-of-pane displacement of islands. The total energy of the system consists of the membrane and bending energy in the bridges, membrane and bending energy in the islands and strain energy in the substrate. Minimizing the total energy gives the displacements and strain distributions in bridges and islands.

Finite Element Modeling

Three dimensional finite element models of the systems have been developed using the commercial ABAQUS package. Eight-node, hexahedral brick elements with four-node multi-layer shell elements are used for the substrate and the thin film, respectively. The multi-layer shell is bonded to the substrate by sharing the nodes. Each layer of thin film is modeled as a linear elastic material; the soft, elastomeric substrate is modeled as an incompressible hyperelastic material. We first determine the eigenvalues and eigenmodes of the system. The eigenmodes are then used as initial small geometrical imperfections to trigger the buckling of the system. The imperfections are always small enough to ensure that the solution is accurate. The simulations are performed in the same procedure as the key fabrication steps of integrated circuits system. These simulations give an insight to the formation of buckling patterns, the mechanics behavior of the thin film and the nested hierarchy of the structure.

References

1. Reuss R. H. et al. (2005) Macroelectronics: Perspectives on technology and applications. *Proc. IEEE.* 93:1239-1256.
2. Reuss R. H. et al. (2006) Macroelectronics. *MRS Bull.* 31:447-454.
3. Lacour S. P., Jones J., Wagner S., Li T. & Suo Z. (2005) Stretchable interconnects for elastic electronic surfaces. *Proc. IEEE.* 93:1459-1467.
4. Kim D.-H. et al. (2008) Stretchable and foldable silicon integrated circuits. *Science* 320:507-511.
5. Someya T. et al. Conformable, flexible, large-area networks of pressure and thermal sensors with organic transistor active matrixes. *Proc. Nat. Acad. Sci. USA.* (2005) 102:12321-12325.
6. Ko H. C. et al. (2008) A hemispherical electronic eye camera based on compressible silicon optoelectronics. *Nature*, In press.
7. Kim D.-H. et al. (2008) Complementary logic gates and ring oscillators plastic substrates by use of printed ribbons single-crystalline silicon. *IEEE Electron Device Lett.* 20:73-76.
8. Sun Y., Choi W. M., Jiang H., Huang Y. Y., Rogers J. A. (2006) Controlled buckling of semiconductor nanoribbons for stretchable electronics. *Nat. Nanotechnol.* 1:201-207.
9. Schneider F., Fellner T., Wilde J., Wallrabe U., Mechanical properties of silicones for MEMS. (2008) *J. Micromech. Microeng.* 18:065008.
10. Ahn J.-H. et al. (2007) Bendable integrated circuits on plastic substrates by use of printed ribbons of single-crystalline silicon. *Appl. Phys. Lett.* 90:213501.
11. Bazant Z. P. and Cedolin L. (2003) Stability of Structures, Dover Publications, New York.

Figure 69:
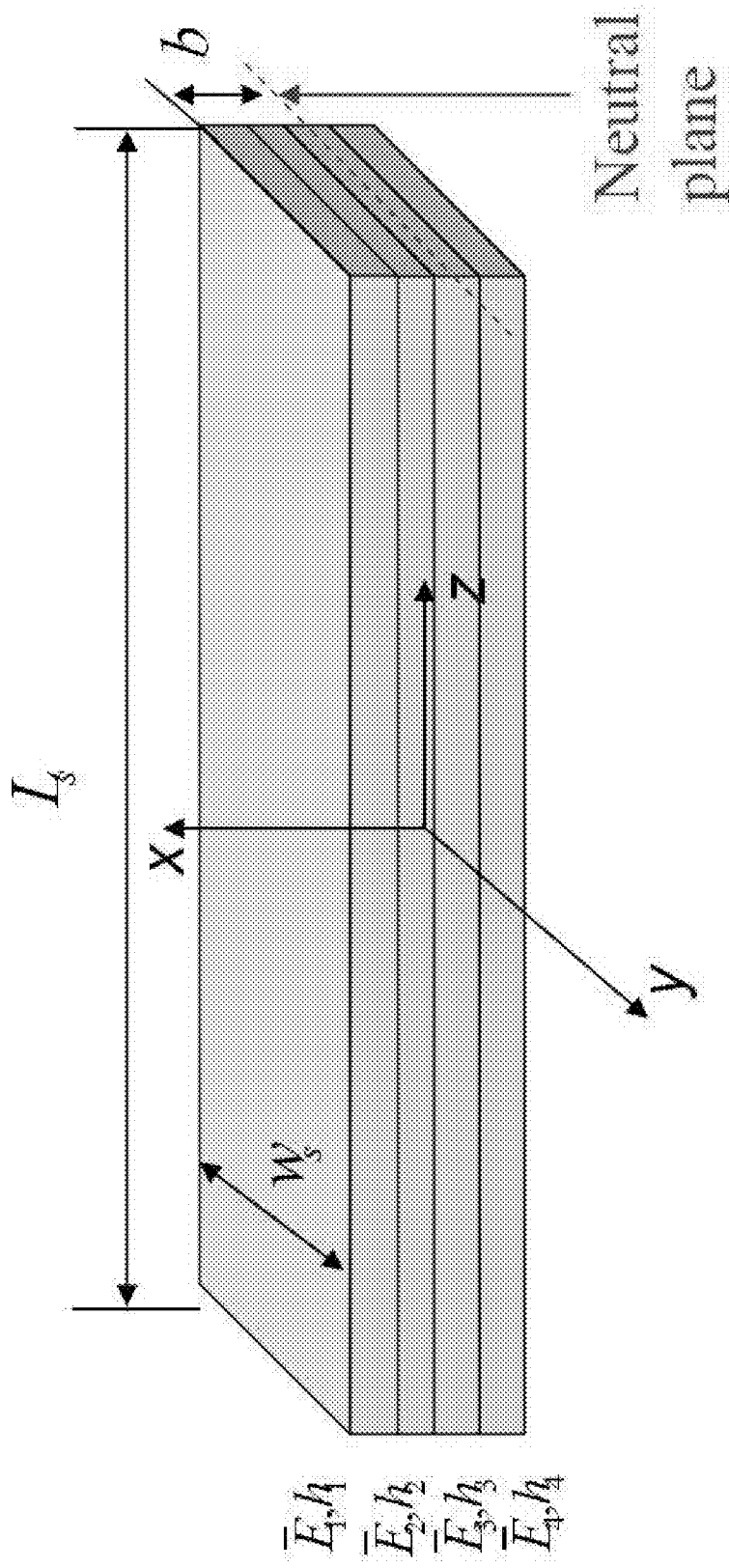
FIG. 69. Schematic diagram of multilayer stacks.

Effective Tensile and Bending Stiffness of Multilayer Stacks:

FIG. 69 shows multilayer stacks with the 1$^{st}$ layer on top and n$^{th}$ layer at the bottom. Their (plane-strain) moduli and thicknesses are denoted by $\overline{E}_1, \ldots \overline{E}_n$ and $h_1, \ldots h_n$, respectively. The length and width are denoted by $L_s$ and $w_s$. The multilayer stacks are modeled as a composite beam with the effective tensile stiffness[1]

$$\overline{EA} = w_s \sum_{i=1}^{n} \overline{E}_i h_i, \quad (S.1)$$

and effective bending stiffness[1]

$$\overline{EI} = w_s \left[ \sum_{i=1}^{n} \overline{E}_i h_i \left( b - \sum_{j=1}^{i} h_j \right)^2 + \sum_{i=1}^{n} \overline{E}_i h_i^2 \left( b - \sum_{j=1}^{i} h_j \right) + \frac{1}{3} \sum_{i=1}^{n} \overline{E}_i h_i^3 \right], \quad (S.2)$$

where b is the distance between the neutral mechanical plane to the top surface, and is given by[1]

$$b = \frac{\sum_{i=1}^{n} \overline{E}_i h_i \left[ \left( \sum_{j=1}^{i} h_j \right) - \frac{h_i}{2} \right]}{\sum_{i=1}^{n} \overline{E}_i h_i} \quad (S.3)$$

Non-Coplanar Bridges Between Islands:

The nature of compressibility obtained from the non-coplanar bridges connecting the adjacent islands, shown by the SEM image in FIG. 64(b), can be understood through theoretical analysis (see FIG. 69). The bridges (n=4, PI/metal/SiO$_2$/PI: ~1.2 μm/0.15 μm/0.05 μm/1.2 μm) are modeled as a composite beam with the effective tensile $\overline{EA}_{bridge}$ and bending stiffness $\overline{EI}_{bridge}$ obtained from Eqs. (S.1) and (S.2) for n=4. The elastic moduli and Poisson's ratios are $E_{SiO_2}$=70 GPa, $v_{SiO_2}$=0.17, $E_{metal}$=78 GPa, $v_{metal}$=0.44, $E_{PI}$=2.5 GPa and $v_{PI}$=0.34.

The out-of-plane displacement, u, of the non-coplanar bridges takes the form $$u = \frac{A}{2}\left(1 + \cos\frac{2\pi}{L_{bridge}}z\right),$$

which satisfies vanishing displacement and slope at the two ends ($x=\pm L_{bridge}/2$), where A is the amplitude, x is the position along the bridge and $L_{bridge}$ is the lateral separation distance between adjacent islands. The initial distance $L_{bridge}^0 = 445$ µm is measured in the as-fabricated configuration. The in-plane displacement can then be obtained from the force equilibrium. These give the bending energy $$U_b = \overline{EI}_{brdige}\frac{\pi^4 A^2}{(L_{brdige}^0)^3}$$

and membrane energy $$U_m = \frac{1}{2}\overline{EA}_{bridge}\left[\frac{\pi^2 A^2}{4(L_{bridge}^0)^2} - \frac{L_{bridge}^0 - L_{bridge}}{L_{bridge}^0}\right]^2 L_{bridge}^0.$$

Energy minimization $$\frac{\partial(U_b + U_m)}{\partial A} = 0$$

yields an analytical expression for the amplitude $$A = \frac{2L_{bridge}^0}{\pi}\sqrt{\frac{L_{bridge}^0 - L_{bridge}}{L_{bridge}^0} - \varepsilon_c},$$

where $$\varepsilon_c = \frac{\overline{EI}_{bridge}}{\overline{EI}_{bridge}}\frac{4\pi^2}{L_0^2}$$

is the critical buckling strain, and is 0.0034% for the system shown above. For $L_{bridge}=370$ µm, the analytical expression above give the amplitude A=116.3 µm, which agrees well with the experiments A=115 µm. The corresponding maximum strain in the metal layer of the bridge is ~0.11%, substantially below the fracture strain for the metal.

Strain Distributions in Islands:

The islands (n=5, PI/metal/SiO$_2$/Si/PI: ~1.2 µm/0.15 µm/0.05 µm/0.25 µm/1.2 µm) are modeled as a composite plate with the effective tensile stiffness $\overline{EA}_{islands}$ and effective bending stiffness $\overline{EI}_{islands}$ obtained from Eqs. (S.1) and (S.2) for n=5. The additional elastic properties beyond those given above are $E_{Si}=130$ GPa and $v_{Si}=0.27$.

Figure 70:
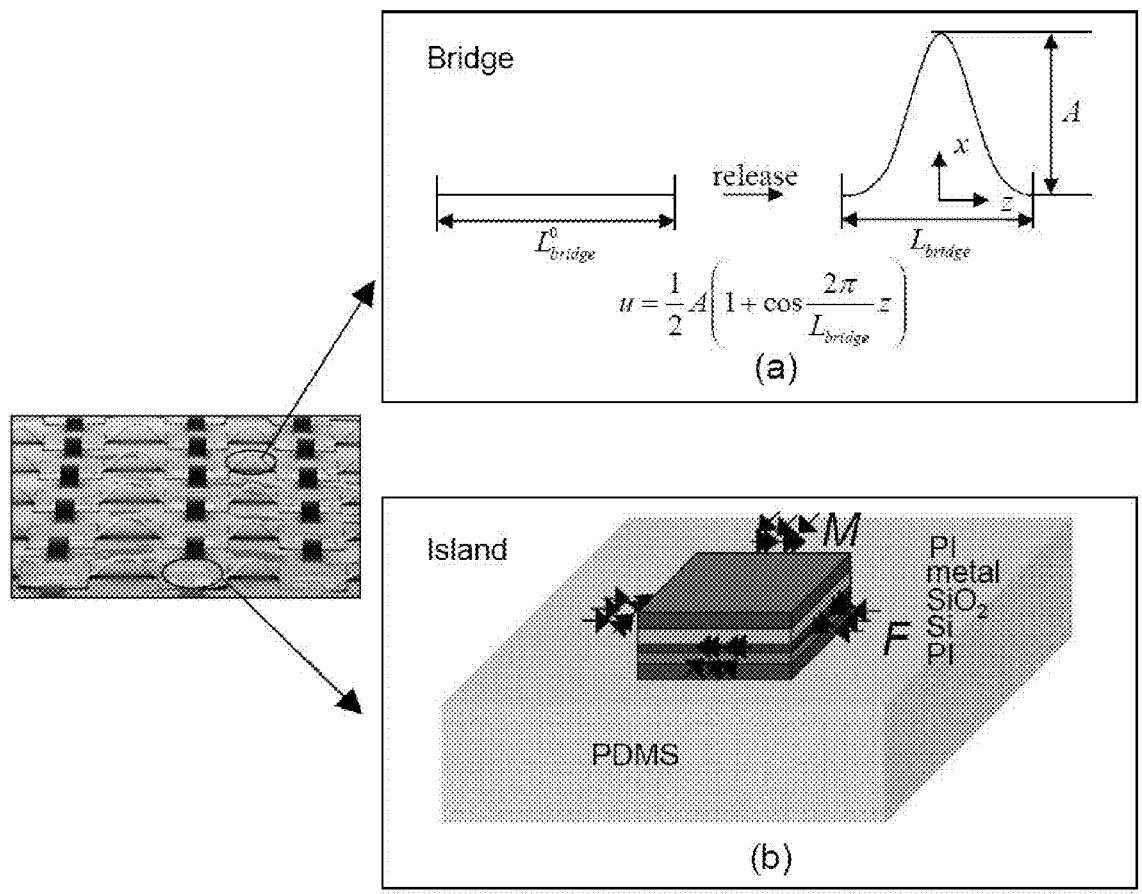
FIG. 70. Analytical model of (a) pop up bridges and (b) islands.

Mechanics models give the distribution of strains and displacements in the islands. As shown in FIG. 70(b), the out-of-plane displacements in bridges impose bending moments M (and axial force F) to the island. The bending energy in the island is obtained in terms of its out-of-plane displacement u via the plate theory. The PDMS substrate is modeled as a semi-infinite solid subjected to the surface displacement u, and its strain energy is also obtained in terms of u. The displacement u is expanded to the Fourier series, with the coefficients to be determined by minimizing the total energy. The bending strains in each layer of the islands are obtained from the curvatures, which are the second order derivatives of u. The maximum out-of-plane displacements are very small (<0.4 µm), as are the strains $\varepsilon_{yy}$ and $\varepsilon_{zz}$ (~0.01%) in the Si layer. The strain $\varepsilon_{yy}$ in the Si element reaches the peak near the interconnections in the y-direction, while the peak of $\varepsilon_{zz}$ occurs near those in the z-direction.

Off-Axis Stretching

Off-axis stretching has two effects, namely the axis stretch along the bridge direction and the shear normal to the bridge direction. Such deformation is accommodated by lateral buckling, which is characterized by the sinusoidal function (for axial stretch) shown in FIG. S2b, and Bessel function (for shear). The out-of-plane rotation φ due to lateral buckling takes the form $$\phi = B\left[\sqrt{\frac{2}{L_{bridge}}}z\, J_{-1/4}\left(\frac{13.96403}{L_{bridge}^2}z^2\right) - J_{-1/4}(3.49101)\right] \quad (S.4)$$

for the symmetric buckling mode, and $$\phi = B\left[\sqrt{\frac{2}{L_{bridge}}}z\, J_{1/4}\left(\frac{18.45820}{L_{bridge}^2}z^2\right) + \frac{424.956}{L_{bridge}^3}z^3\phi_p\left(\frac{18.45820}{L_{bridge}^2}z^2\right)\right] \quad (S.5)$$

for the asymmetric mode, where $J_\alpha(x)$ is the Bessel function of order α, B is the amplitude to be determined by energy minimization, and $\phi_p(x)$ takes the form $$\phi_p(x) = -\frac{1}{48x^2}\begin{bmatrix} 8\sqrt[4]{2^3}\, x^{9/4} Hypergeom\left(\frac{3}{4}, \frac{5}{4}, \frac{7}{4}; -\frac{1}{4}x^2\right)J_{-1/4}(x) \\ \Gamma\left(\frac{3}{4}\right) - 6\sqrt{2}\,\pi x^2 J_{1/4}(x)J_{-1/4}(x) + \\ 6\sqrt{2}\,\pi x^{7/4} J_{1/4}(x)J_{3/4}(x)LommelS1\left(\frac{1}{4}, \frac{7}{4}, x\right) - \\ 9\sqrt{2}\,\pi x^{3/4} J_{1/4}(x)J_{3/4}(x)LommelS1\left(\frac{5}{4}, \frac{3}{4}, x\right) + \\ 6\sqrt{2}\,\pi x^{7/4} J_{1/4}(x)J_{-1/4}(x)LommelS1\left(\frac{5}{4}, \frac{3}{4}, x\right) \end{bmatrix} \quad (S.6)$$

where Hypergeom($a_1, a_2, \ldots; b_1, b_2, \ldots; x$) is the generalized Hypergeometric function, $\Gamma(x)$ is the Gamma function, and Lommel S1($\mu, v, x$) is the Lommel function. Here $a_1, a_2, \ldots, b_1, b_2, \ldots, \mu, v$ are the parameters for the special functions.

We first obtain the solution for the bridges subjected to the off-axis stretching by energy minimization (including twisting energy) with respect to two amplitudes A and B. The reaction forces, bending moment and torques at the bridge/island interconnections are then applied to the islands to determine the distributions of strains and displacements in islands.

Principal Strains:

For the structure subjected to $\varepsilon_{yy}$, $\varepsilon_{zz}$, and $\varepsilon_{yz}$, the principal strains are $$\varepsilon_{1,2} = \frac{\varepsilon_{yy} + \varepsilon_{zz}}{2} \pm \sqrt{\left(\frac{\varepsilon_{yy} + \varepsilon_{zz}}{2}\right)^2 + 4\varepsilon_{yz}^2}. \quad (S.7)$$

The principal strain presented in the paper is $\epsilon_1$.

Twisting

Twisting shown in FIG. 66 is different from the off-axis stretching because it doesn't involve lateral buckling. For the multilayer stacks shown in FIG. 69 (stack width>>stack thickness) subjected to a torque $M_x$, only the shear strain $\epsilon_{yz}$ exists and is given by[2]

$$\varepsilon_{yz} = \frac{M_x}{\overline{GJ}} x \qquad (S.8)$$

where $\overline{GJ}$ is the equivalent torsional stiffness and given by $$\overline{GJ} = 4w_s \left[ \sum_{i=1}^{n} G_i h_i \left( b - \sum_{j=1}^{i} h_j \right)^2 + \sum_{i=1}^{n} G_i h_i^2 \left( b - \sum_{j=1}^{i} h_j \right) + \frac{1}{3} \sum_{i=1}^{n} G_i h_i^2 \right], \qquad (S.9)$$

where $G_i$ is the shear modulus for each layer.

Figure 71:
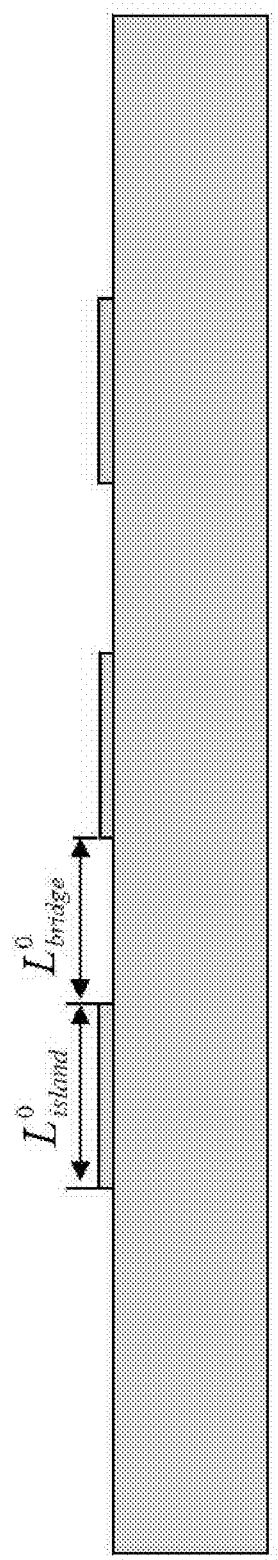
FIG. 71. Schematic diagram of island-bridge structure

Spacing Effect on Stretchability of Pop-Up Interconnect Structure:

FIG. 71 shows the interconnect structure with the bridge of length $L_{bridge}^0$ and island of length $L_{island}^0$. The bridges pop up after the prestrain releases and the bridge length $L_{bridge}^0$ changes to $L_{bridge}$ but the island length remains essentially unchanged because the elastic rigidity of island is many times larger than that of bridges. The prestrain at the system level of the pop up structure is then given by $$\varepsilon_{pre} = \frac{L_{bridge}^0 - L_{bridge}}{L_{island}^0 + L_{bridge}^0}.$$

Let $\epsilon_{fracture}$ (~1%) denotes the critical strain of fracture of bridge material, the maximum prestrain that can be applied in the system is given by $$(\varepsilon_{pre})_{max} = \frac{L_{bridge}^0}{L_{island}^0 + L_{bridge}^0} \left( \frac{L_{bridge}^0 \varepsilon_{fracture}}{2\pi h_{bridge}} \right)^2, \qquad (S.10)$$

where $h_{bridge}$ is the bridge thickness and it clearly shows that large spacing (i.e., $L_{bridge}^0$) and small bridge thickness increases the maximum prestrain at the system level. The stretchability of system is simply $(\epsilon_{pre})_{max} + \epsilon_{fracture}$.

Encapsulation Case:

The non-coplanar bridges can be protected by encapsulation with a top, spin cast layer of PDMS. The postbuckling analysis of bridges and islands is coupled. The out-of-displacement in each region has its own wavelength and amplitude, and across the regions the displacement, rotation, moment and shear force are continuous. The minimization of total energy, which consists of the bending and membrane energy of the bridges and the islands, and the strain energy in the substrate, gives the wavelength and amplitudes in all regions. For example, for a system level applied strain –20% when the prestrain 10.7%, the amplitude of bridges is 196 μm while that of islands is only 1 μm.

Figure 72:
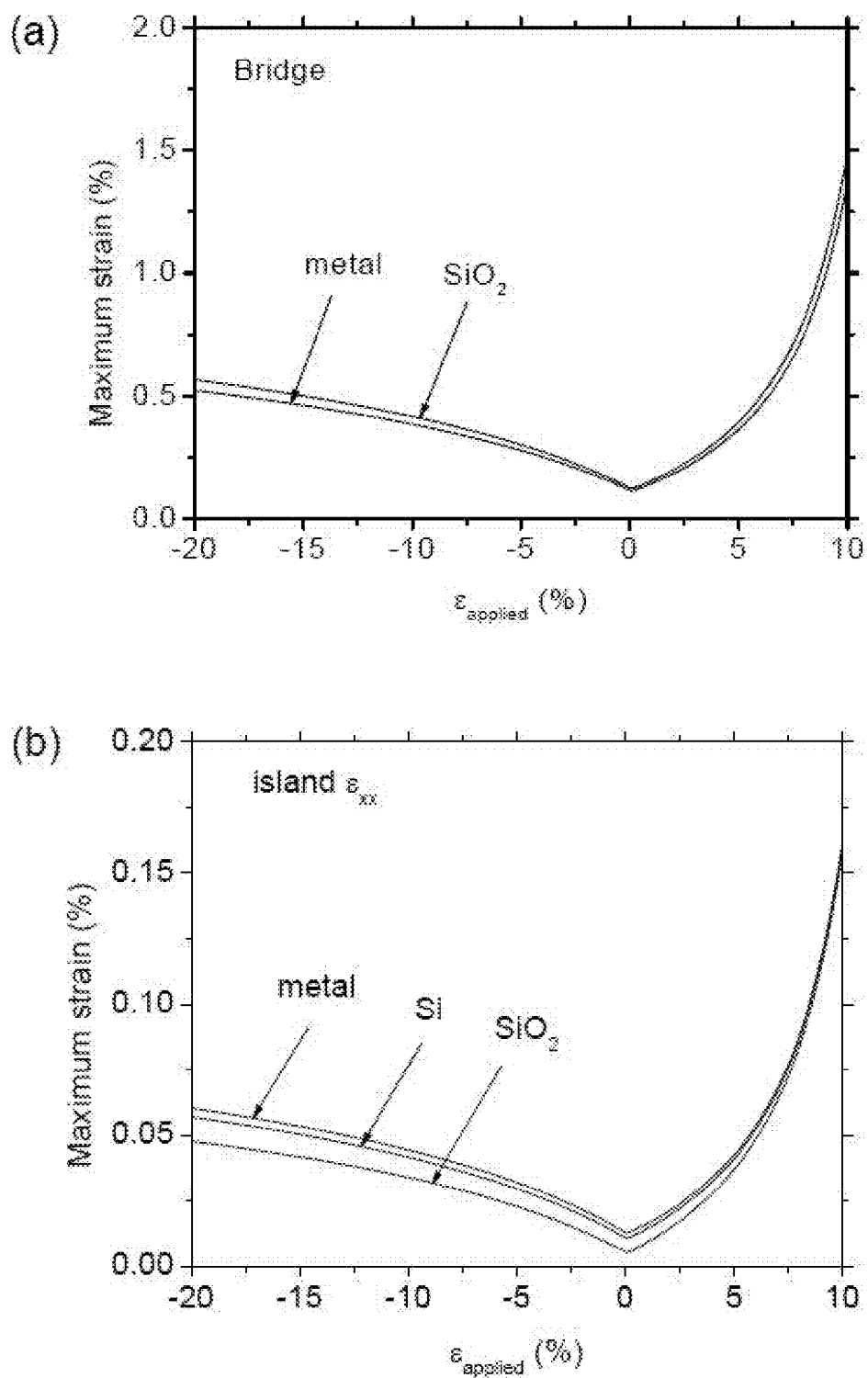
FIG. 72. Maximum strains of (a) bridges and (b) islands versus the system level applied strain for the prestrain of 10.7%.

FIG. 72 shows the maximum strains in different device layers versus the system level applied strain. The encapsulated system fails before the applied strain reaches the prestrain, which is different from that without capsulation (i.e., the prestrain plus 1% or 2% of fracture strain of materials).

References

[1] D. Gray, S. V. Hoa, and S. W. Tsai, Composite Materials: Design and Applications, CRC Press, Boca Raton, Fla. (2003).

[2] S. P. Timoshenko and J. N. Goodier, Theory of Elasticity (3$^{rd}$ edition), McGraw-Hill, New York, 1987.

Example 5

Ultrathin Silicon Circuits with Strain Isolation Layers and Mesh Layouts for High Performance Electronics on Fabric, Vinyl, Leather and Paper Electronic systems built on plastic sheets, metal foils, rubber slabs and other unusual substrates have great potential for use in conformal image sensors, flexible displays, biomedical devices and other emerging applications. Research in this area includes the development of organic conductors and semiconductors materials whose excellent mechanical flexibility and low temperature processability are attractive for these systems. The characteristics of devices that can be achieved with such materials enable electronic paper displays and other important products, but not readily those that require, for example, radio frequency operation. Newer research aims to avoid this limitation by exploiting thin films of inorganic materials or assemblies of carbon nanotubes, graphene platelets, nanoparticles, nanowires, nanoribbons or nanomembranes for the semiconductor[. With certain of these materials, it is possible to build high performance circuits that are not only bendable but are also, in some cases, reversibly stretchable, with elastic responses to compressive and tensile strains of 100% or more. One approach to stretchability relies on semiconductor membranes or ribbons in buckled or wavy shapes that accommodate applied strains with a physics similar to an accordion bellows. High performance transistors and their use in logic gates, ring oscillators and differential amplifiers suggest the possibility for realistic applications; hemispherical arrays of photodiodes for electronic eye cameras provide an example of a system level demonstration. Here, we extend these concepts and implement them with a new technique that involves thin, low modulus elastomers to isolate the active circuit materials from applied strains. The result is a path to high performance silicon complementary metal oxide semiconductor (CMOS) circuits (or other device technologies) capable of integration on diverse classes of substrates. Examples of substrate of interest for electronics include, but are not limited to, paper, fabric, leather and vinyl, as presented herein. Data indicate that the electrical performance of representative CMOS components and logic gates on these substrates can approach those of similar devices on silicon wafers, without degradation upon bending, folding, draping and other modes of deformation[. Experimental and theoretical studies described herein support these outcomes and reveal important features of the materials and mechanics.

In this example, fabrication begins with the formation of ultrathin CMOS circuits in planar, serpentine mesh geometries using procedures related to those reported recently (Kim et al. PNAS USA 2008, 55, 2859). Releasing the circuits from the carrier wafer on which they are formed (FIG. 74A) by dissolving an underlying layer of poly(methylmethacrylate) (PMMA, MicroChem, USA), lifting them onto the surface of a polydimethylsiloxane (PDMS, Dow Corning, USA) stamp, depositing a bilayer of Cr/SiO2 (3 nm/30 nm) selectively onto the backsides of regions of the circuit that correspond to the active device islands by evaporation through an aligned shadow mask and, finally, transfer printing onto a substrate coated with a thin layer of cured PDMS completes the process (FIG. 74B). Measurements of individual transistors formed in this manner (FIG. 74D) indicate electron and hole mobilities of ~530 and ~150 $cm^2/Vs$ for n-type MOS (nMOS) and p-type MOS (pMOS) transistors, respectively, and on/off ratios $>10^5$ in both cases. The channel lengths and widths for devices reported here are 13 μm and 100 μm for nMOS and 13 μm and 300 μm for pMOS. Connecting nMOS and pMOS devices via serpentine interconnects yields inverters with gains as high as 150, consistent with PSPICE simulations (FIG. 74D). Full integrated circuits can be achieved with similar layouts.

Figure 74:
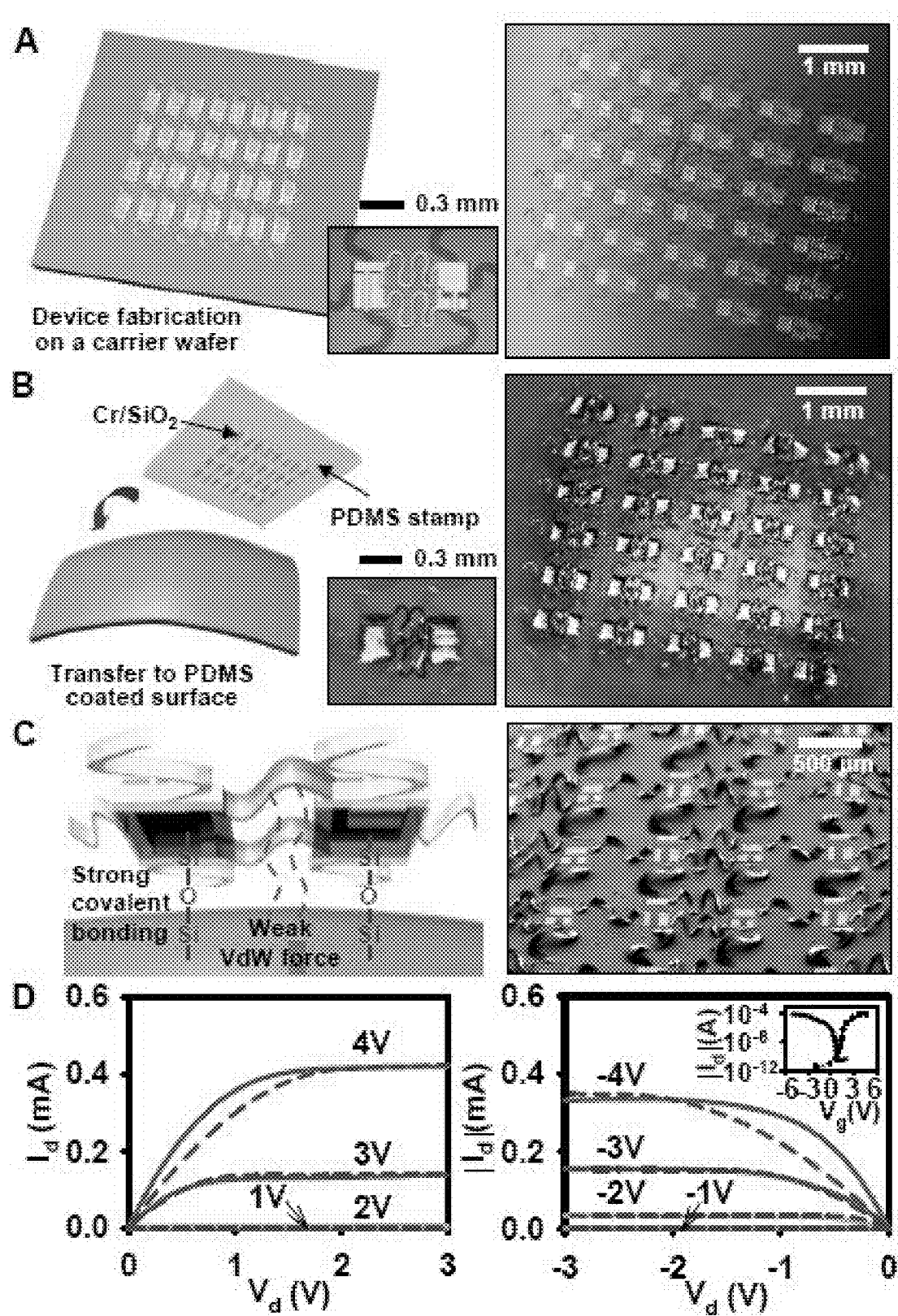
FIG. 74. (A) Schematic illustration of an ultrathin silicon circuit fabricated in a serpentine mesh geometry on a handle wafer (left) and an optical image (right). The inset at the center shows an optical micrograph of a CMOS inverter, corresponding to the dotted box in the right frame. (B) Schematic illustration of the process for transfer printing the circuit after patterned deposition of Cr/SiO2 (left) and an optical image after transfer (right). The inset at the center shows an optical micrograph of a transferred CMOS inverter, corresponding to the dotted box on right frame. (C) Schematic illustration of the bonding between the serpentine circuits and PDMS (left). Scanning electron micrograph of the system in a bent configuration (right). (D) Current (Id; drain current), voltage (Vd; drain voltage) measurements on representative nMOS (left) and pMOS (right) transistors collected from a circuit similar to those shown in the other frames. The solid and dashed lines correspond to measurement and PSPICE simulation. The labels on the curves correspond to gate voltages (Vg). The inset in the right frame shows transfer curves plotted on a semi log scale for nMOS (dotted) and pMOS (solid) devices.

The thin layer of PDMS described above serves two important roles. First, and most simply, it provides an adhesive that bonds certain strategic regions of the circuits to a wide range of surfaces including fabric, vinyl, leather and paper, as reported here, in either flat or curved, balloon-like shapes. In particular, —OH groups associated with the SiO2 on the backsides of the islands covalently react with the PDMS to form Si—O—Si linkages. Such —OH groups exist naturally on the SiO2 and PDMS. Their density can be increased by exposure to ozone, oxygen plasma or other related procedures. The absence of SiO2 on the serpentine interconnects leads to only weak Van der Waals (VdW) interactions in these regions (left frame of FIG. 1(C)). As a result, upon stretching, compressing or extreme bending, the interconnects lift out of contact with the PDMS to adopt non-coplanar geometries, as shown in the right scanning electron microscope (SEM) image of FIG. 74(C). This motion accommodates large tensile or compressive strains in a manner that avoids fracture of the interconnects or significant strains in the islands. Similar circuit layouts bonded to the PDMS in all regions show much reduced (2-3 times lower) ability to withstand applied strain. The approach of FIG. 74 provides large stretchability while avoiding steps that use prestrain to create the non-coplanar layouts.

Figure 75:
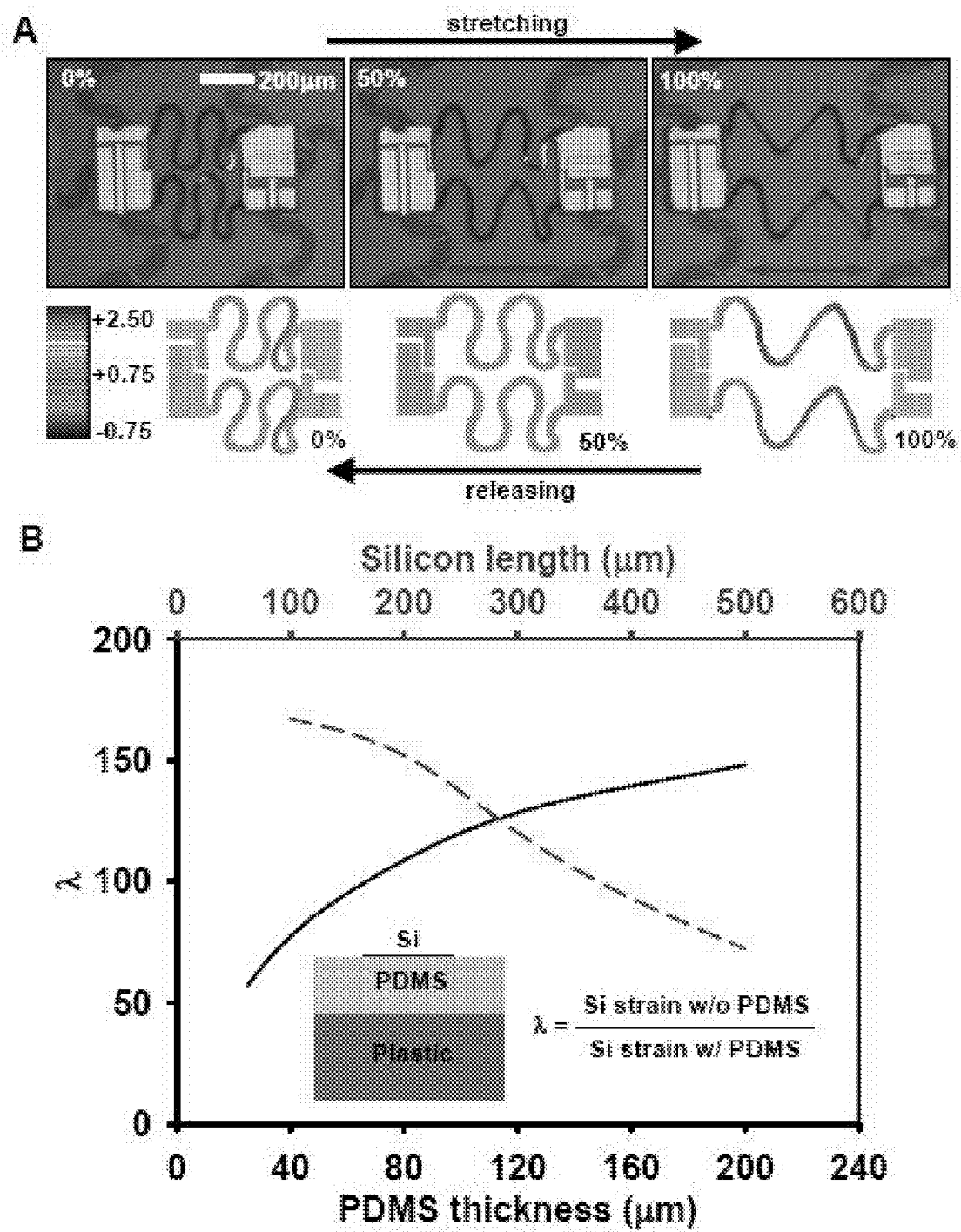
FIG. 75. (A) Optical micrographs (upper frames) of a CMOS inverter circuit under various levels of tensile strain (upper left) and finite element modeling of the corresponding mechanics (lower frames). The colors indicate peak strains (in percent) in the metal interconnect level of the circuit. (B) Computed ratio of the surface strain in the silicon of the system schematically illustrated in the inset as a function of thickness of this layer (black solid line) and length of the silicon (red dotted line; PDMS thickness is 100 μm for this case). The PDMS provides strain isolation for the silicon, with increasing effectiveness as the silicon length decreases and the PDMS thickness increases. (C) Top view of a stretchable and foldable electronic device. (D) and (E) are side views that illustrate partial and complete encapsulation of a foldable and stretchable device with an encapsulation layer, respectively.

The second important role of the PDMS layer is illuminated by examining the mechanics. FIG. 75A shows optical micrographs and finite element modeling for the response of a system similar to the one shown in FIG. 74 to uniaxial tensile strain. At maximum extension explored here, the modeling indicates peak strains in the metal layer of the interconnects and in the silicon of the active islands are 0.20% and 0.46%, respectively, i.e., >200 times smaller than the applied strain. This behavior provides utility for stretching/compressing on length scales larger than a pair of islands; it cannot accommodate strain localized on individual islands generated, for example, by a sharp folding deformation with a paper substrate. The low modulus PDMS adhesive layer solves this problem, by providing strain isolation. To gain a qualitative understanding, consider limiting cases where the modulus of this layer is equal to the underlying substrate and when it is arbitrarily small. In the first situation, bend induced strains in surface mounted circuits depend, approximately, on the ratio of the total thickness of the system divided by the radius of curvature of the bend. For a sharp folding deformation, this radius can be very small. As a result, the strain in an island located at the position of such a fold can exceed the fracture point of the electronic materials for all but the thinnest systems (or those with sandwich type neutral mechanical plane layouts). In the second case, the substrate is weakly mechanically coupled to the circuit components, such that bending the substrate leads to only relatively small bending of the islands. As a result of this mechanics, bend induced strains in the electronic materials are much lower than would otherwise be expected. It is in this sense, the low modulus layer provides strain isolation. Similar arguments can be used to understand the dependence of the strain on the thickness of this layer. In an actual system, the moduli and thicknesses of all layers are important variables. The key dependencies can be illustrated in a simplified system that consists of a plastic substrate, a PDMS adhesive layer and a thin silicon layer. The elastic modulus of PDMS is several orders of magnitude smaller than those of plastics and silicon. Salient findings of analytical calculations that include all of the mechanics in a rigorous way appear in FIG. 75B. This plot shows the ratio of the surface strain for a two dimensional system composed of an island of silicon (300 nm thick) on a layer of PDMS on a sheet of plastic (100 μm thick), as a function of the width of the silicon and the thickness of the PDMS. The results indicate that the isolation efficiency increases with increasing PDMS thickness and decreasing silicon width. For parameters comparable to those of the circuits studied here, the isolation provides ~100× reduction in strain, thereby enabling extreme degrees of bending even without ultrathin layouts or neutral mechanical plane designs. The use of this strategy with serpentine meshes simultaneously achieves high bendability and stretchability.

Figure 75C:
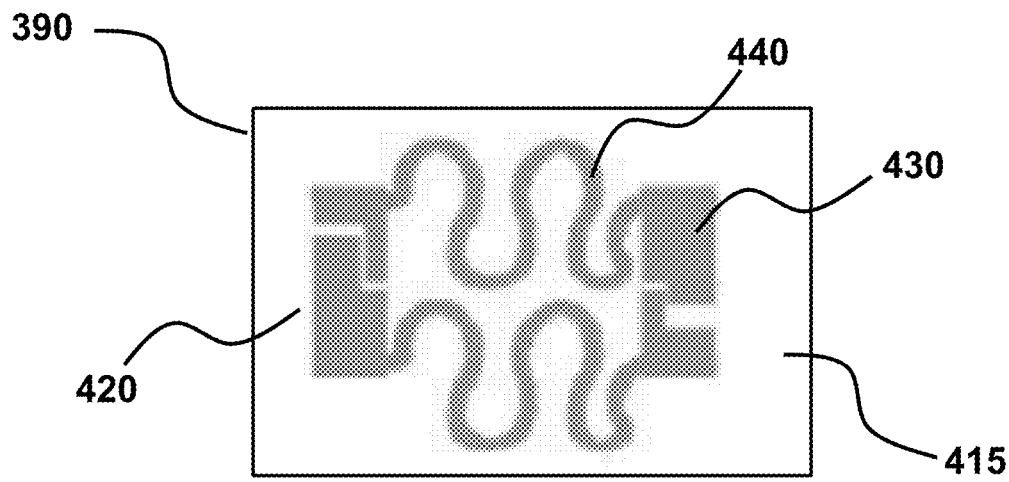
Figure 75D:
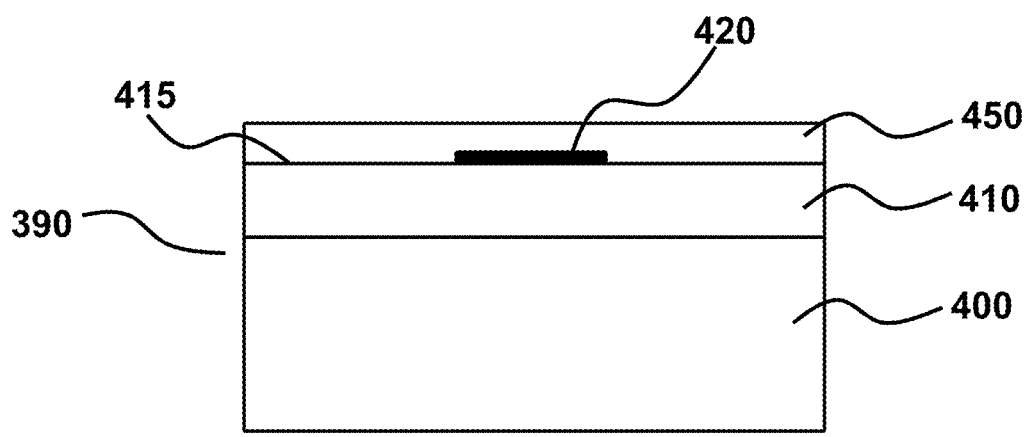
Figure 75E:
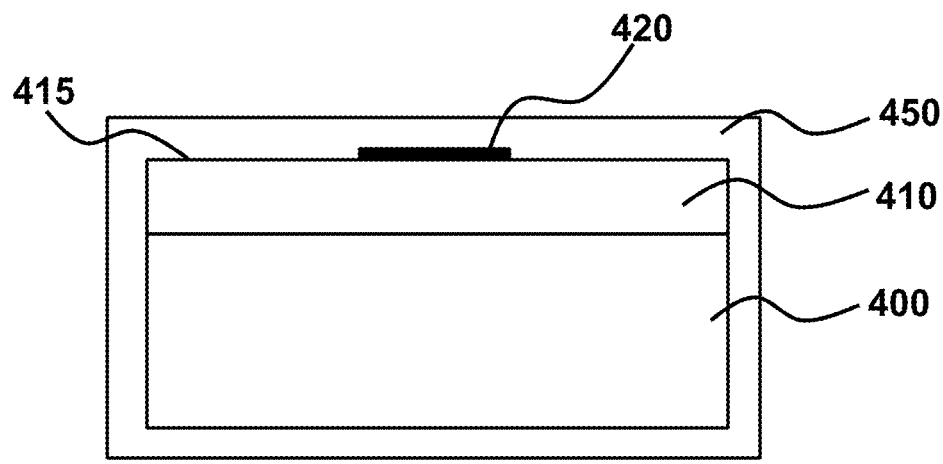

A schematic overview of a stretchable and foldable device 390 is provided in FIG. 75C-E. FIG. 75C is a top-view showing an electronic device 420 on a receiving surface 415 of an isolation layer 410. The electronic device 420 has bond regions 430 (corresponding to relatively rigid device islands) and non-bond regions 440 (corresponding to curved interconnects) to the isolation layer 410. The isolation layer 410 is supported by receiving substrate 400. FIG. 75D illustrates an encapsulation layer 450 on the top surface of the device 390 and FIG. 75E illustrates an encapsulation layer 450 that encapsulates the entire device.

Figure 76:
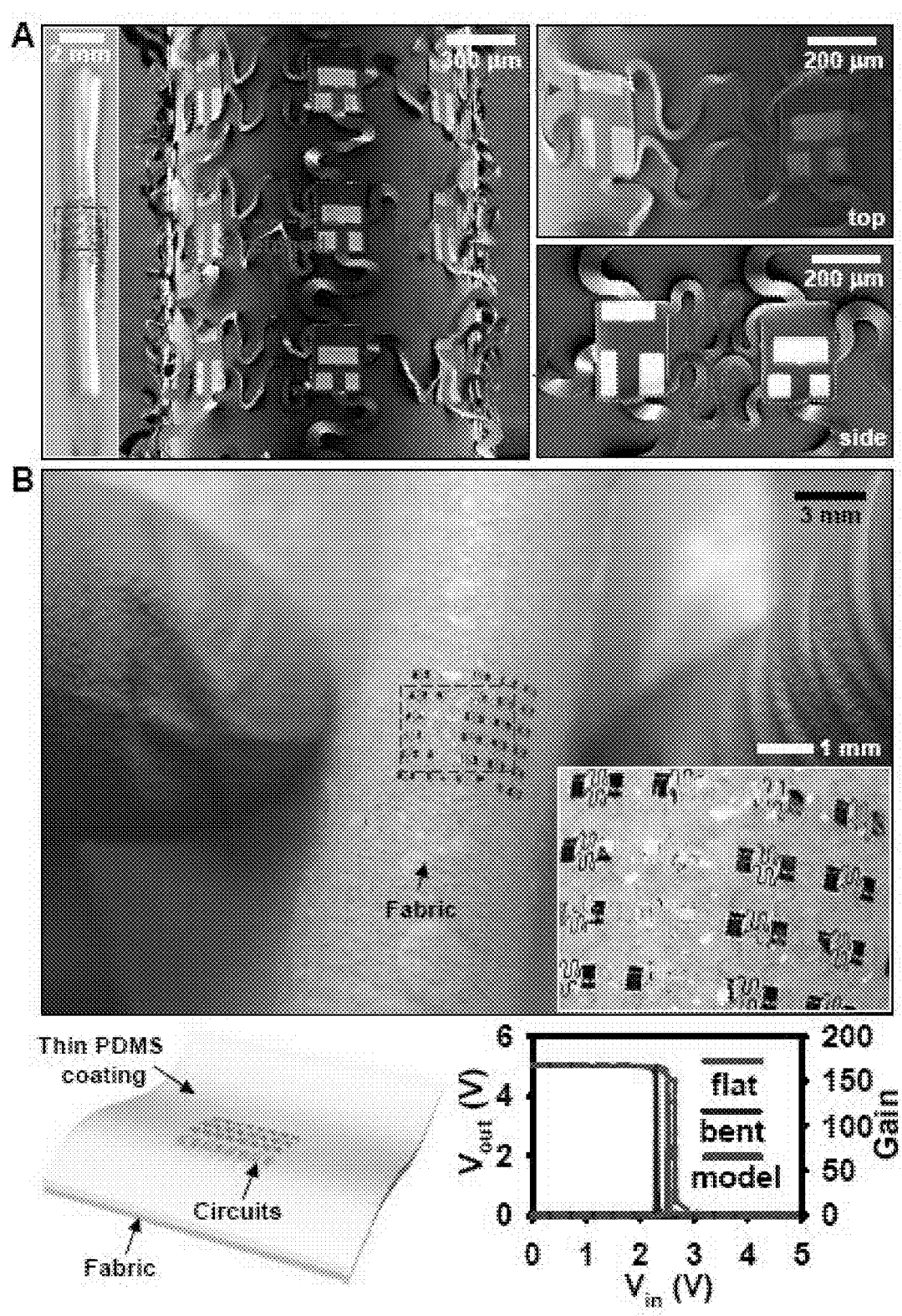
FIG. 76. (A) Optical image of a folded circuit (left) consisting of an array of CMOS inverters and scanning electron micrograph (center). The images on the right provide views at the folded edge (right top) and side (right bottom). (B) Optical image of a similar circuit integrated on a fabric substrate coated with a thin layer of PDMS (top) and magnified view (top right). The bottom left frame provides a schematic illustration. The bottom right shows transfer curves of a representative inverter in flat and bent states, and PSPICE simulation (model).

FIG. 76A shows the response of the serpentines to spatially non-uniform strains generated by bending a circuit on a thin sheet of PDMS. Variable levels of deformation can be seen at the folded corner (right top SEM image) and at the sides (right bottom SEM image). Bonding the circuit to a thin, low modulus strain isolation and adhesion layer as described above provides a strategy for integration with various other kinds of substrates. The top and left bottom frame of FIG. 76(B) show images and schematic diagrams of CMOS inverters on fabric. "Fabric" refers to a material made from a textile, such as a woven textile or cloth and generally comprises individual fibers. The inset shows a magnified view. Even after bending to radii of ~5 mm, the inverter functions well, as shown in the right bottom frame of FIG. 76(B). Although this kind electronic textile offers much better performance than alternatives based on active threads or fibers it does not offer the potentially attractive weaving mode of manufacturing. In this sense, the systems presented here may complement such fiber based approaches.

Figure 77:
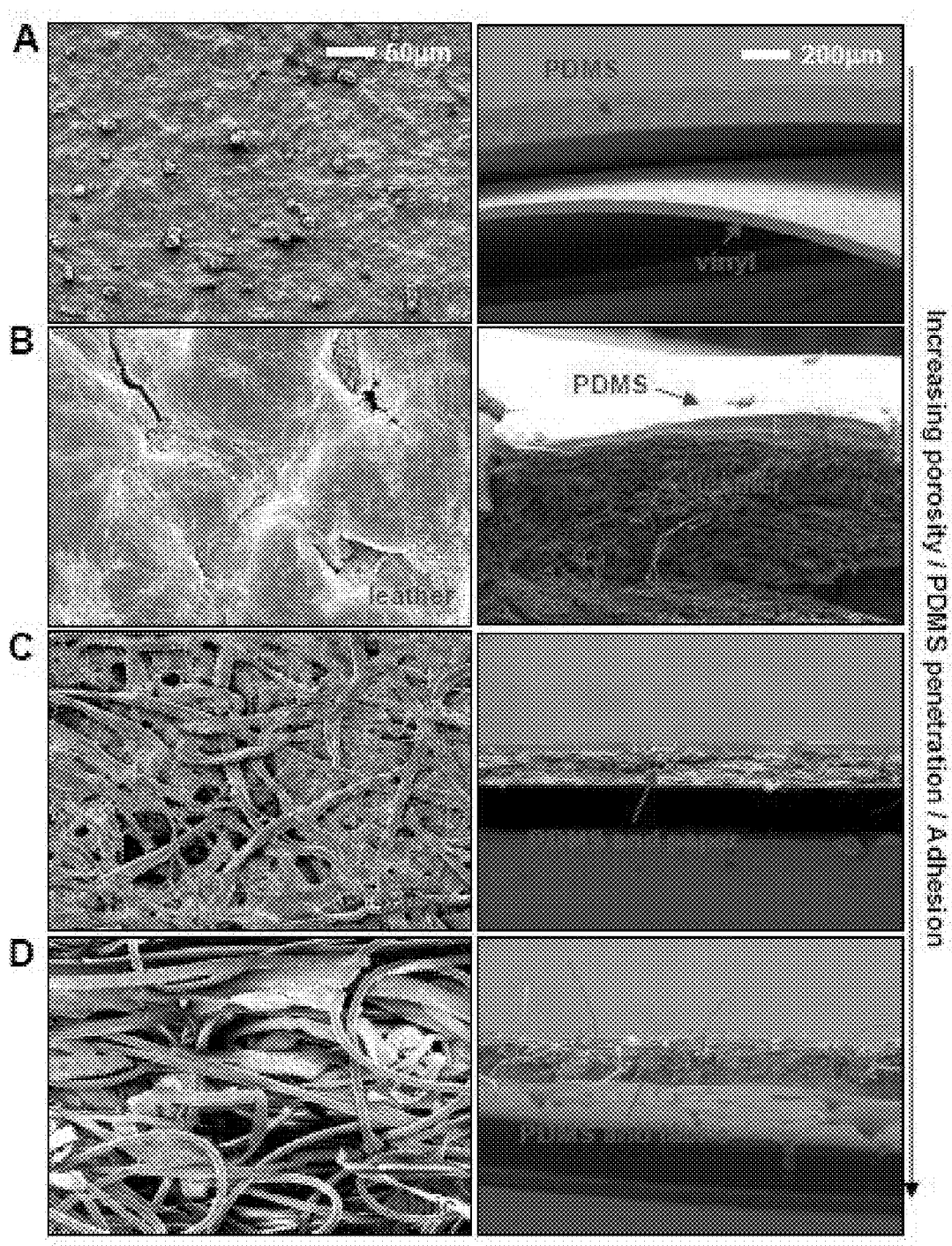
FIG. 77. Scanning electron micrographs of the surfaces of various substrates before coating with PDMS (left) and corresponding tilted views of freeze fractured edges after PDMS coating (right) for (A) vinyl, (B) leather, (C) paper and (D) fabric substrates.

A key feature of the example of FIG. 76B is that the PDMS adhesion layer penetrates into the fibers of the fabric to yield strong adhesion without chemical bonding, thereby providing a route to integration that does not depend critically on chemistry. The left frames of FIG. 77 show SEM images of surfaces of vinyl (FIG. 77(A)), leather (FIG. 77(B)), paper (FIG. 77(C)) and fabric (FIG. 77(D)). The porosity and roughness increase from FIG. 77(A) to 77(D).

The right frames of FIG. 77 show fracture cross-sections of each surface after coating with PDMS (The approximate thickness of PDMS is ~200 μm, ~100 μm, ~80 μm and ~50 μm for vinyl, leather, paper and fabric, respectively.), in a dip casting and thermal curing process. As the surface porosity increases, the degree of penetration of PDMS into the substrate increases, thereby improving the strength of adhesion. In the case of vinyl, the PDMS coating delaminates upon freeze fracture (FIG. 77(A)). In the case of fabric, the constituent fibers are completely embedded by the PDMS, leading to strong bonding as indicated by the fracture surface in FIG. 77(D). The intermediate cases of leather and paper exhibit strong adhesion.

Figure 78:
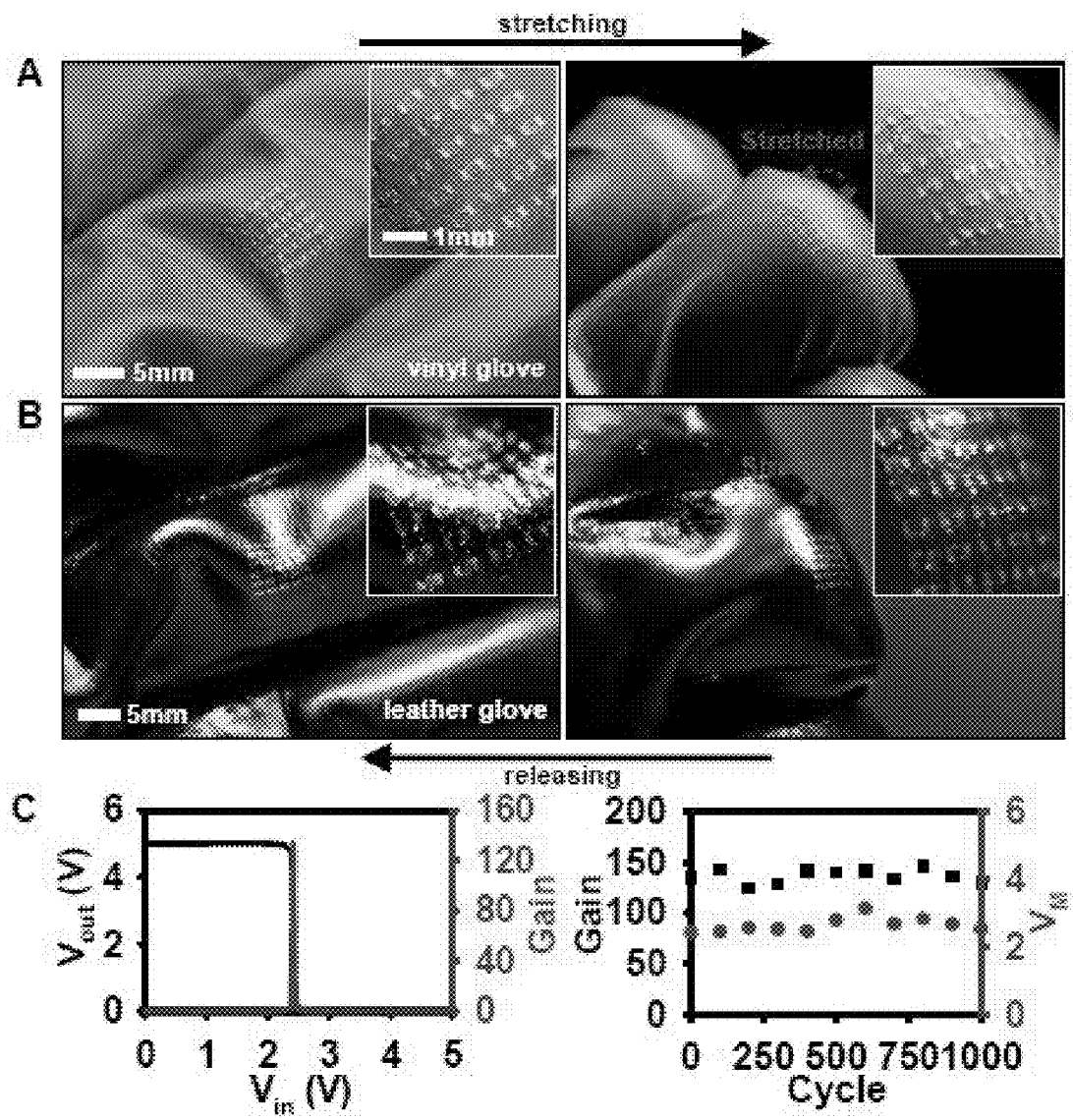
FIG. 78. Optical images of CMOS circuits on finger joints of vinyl (A) and leather (B) gloves in released (left) and stretched (right) states. The insets provide magnified views. (C) Voltage transfer curve (left) and cycling test results that show the gain and threshold voltage of the inverter (VM) measured in the flat states after various numbers of bending cycles (right).
Figure 79:
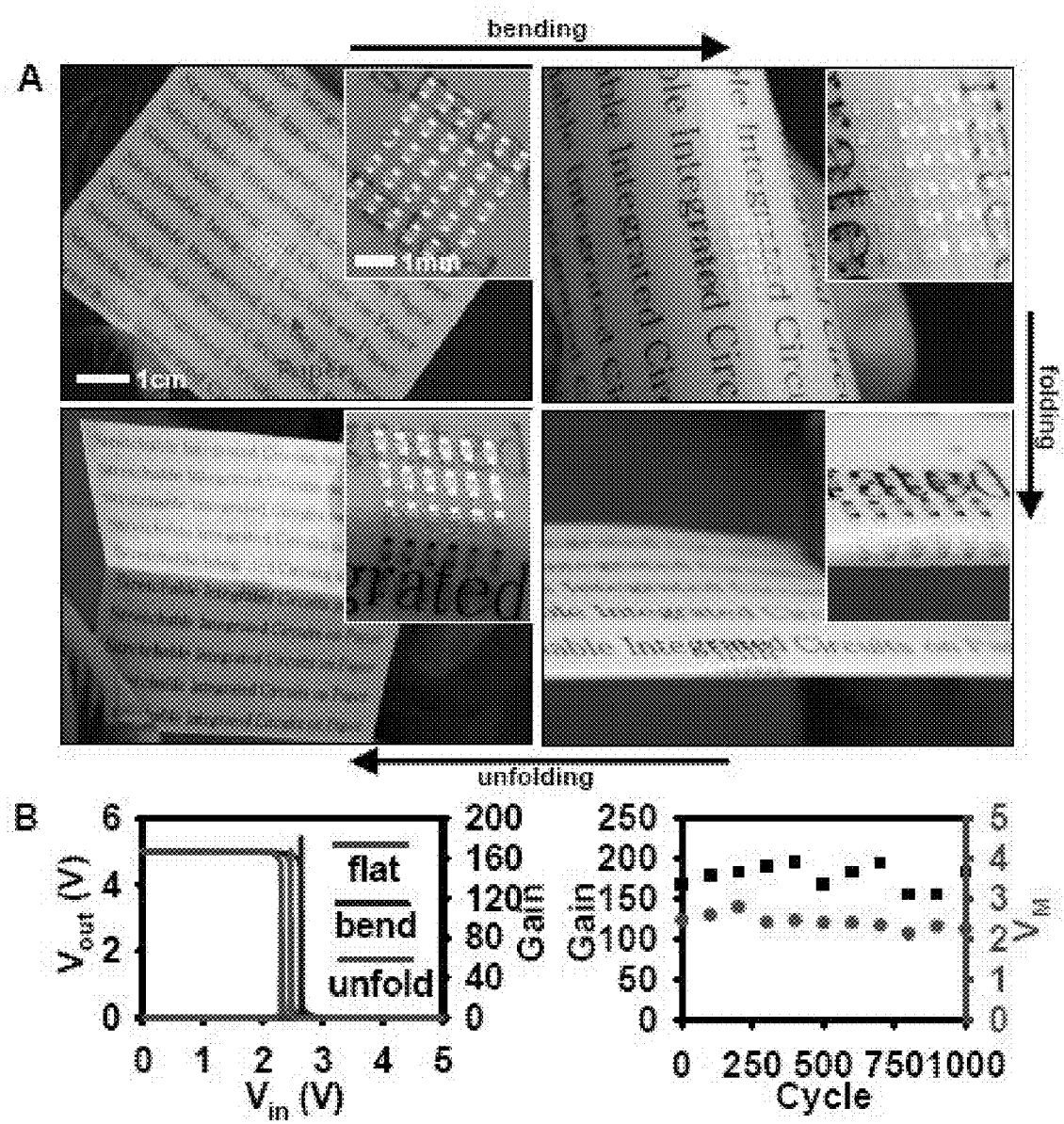
FIG. 79. (A) Optical images of CMOS inverters on paper, in flat (left top), bent (right top), folded (right bottom) and unfolded (left bottom) states. The insets provide magnified views. (B) Voltage transfer curve (left) and cycling test results that show the gain and threshold voltage of the inverter (VM) measured in the flat states after various numbers of bending cycles (right).

As a demonstration of CMOS circuits on leather and vinyl, we integrated arrays of inverters at finger joints in gloves made of these materials, as shown in the FIGS. 78(A) and (B). Moving the fingers causes the circuits to stretch and release, with no noticeable change in the electronic properties. To examine fatigue, we cycle through such motion 1000 times, and measure the electrical properties at various stages of the test, as shown in FIG. 78(C). For this example, the inverter threshold voltage and gain change by less than ±0.4V and ±5%, respectively. Similar circuits on paper are particularly interesting, not only for applications in smart cards and related technology, but also for their capacity to add functionality to paper-based microfluidic diagnostic devices. FIG. 79(A) and the left frame of FIG. 79(B) show CMOS inverters on paper and their properties, in a series of bending, folding and unfolding tests. Electrical measurements associated with 1000 cycles of these deformations indicate stable, high performance operation (inverter threshold voltage change <±0.4V, gain change <±~10%.) and even good characteristics upon folding and extreme bending (bottom, right frame of FIG. 79(A)). This approach to electronics on paper provides an alternative to those that rely on direct thin film deposition of organic or inorganic electronic materials.

In summary, the combined use of circuits with non-coplanar serpentine mesh designs and thin, low modulus strain isolation layers allows integration of high performance electronic devices and components, such as silicon CMOS integrated circuits, on diverse substrates. The devices optionally have a top encapsulation layer to provide mechanical protection and an environmental barrier. Although these layers do not affect significantly the mechanics of non-coplanar interconnects at modest strains (<50%), they can have a significant influence at high strain (>50%). Encapsulants with low moduli provide the most freedom of motion and, therefore, the highest levels of stretchability. Low modulus (~0.5 MPa) formulations of PDMS, for example, increase the range of stretchability from 60%, corresponding to the case of PDMS like that used for the adhesive/isolation layer (1~2 MPa), to 120%. Further optimization of the encapsulant materials and serpentine geometries may yield further improvement.

Experimental: Fabrication of ultrathin, stretchable CMOS circuits. In this example, fabrication of CMOS circuits starts with the doping of single crystalline silicon nanoribbons (260 nm) derived from n-type SOI wafers (SOITEC, France). P-well, PMOS and nMOS source/drain doping is accomplished by using a 300 nm layer of silicon dioxide (SiO2) formed by plasma enhanced chemical vapor deposition (PECVD) as a diffusion mask and Boron (B153, Filmtronics, USA) and Phosphorous (P509, Filmtronics, USA) spin-on-dopants. Diffusion was carried out at 550~600° C., 1000~1050° C. and 950~1000° C. for pwell, p-type source/drain and n-type source/drain doping. The doped ribbons were released from the SOI wafer by etching the buried oxide, and then sequentially transfer printing onto a carrier wafer coated with thin layers of PMMA (~100 nm) as a sacrificial layer and PI (~1.2 μm) as an ultrathin substrate. Isolated nMOS and PMOS source/drain patterns were defined with photolithography and reactive ion etching (RIE). Patterned etching of PECVD SiO2 (~40 nm) provided the gate dielectric; metal electrodes (Cr/Au, ~5 nm/~1500 nm) deposited by electron beam evaporation and patterned by wet etching defined source, drain, gate and interconnects for the circuits. Spin coating PI (1.2 μm) on top of the resulting circuits formed a passivation layer and also located the neutral mechanical plane near the brittle electronic materials. Finally, oxygen RIE through a patterned mask defined the serpentine bridges.

Transfer printing: Dissolving the PMMA layer with acetone releases the circuits from the carrier wafer. Lifting the circuits onto a PDMS stamp exposes their backsides for deposition of a thin layer of Cr/SiO2 (3 nm/30 nm) at the islands by electron beam evaporation through an aligned shadow mask. Transfer printing the circuit to a PDMS coated surface (paper, vinyl, leather or fabric) activated by exposure to UV/ozone led to —O—Si—O— bonding at the positions of the islands.

Cycling test and measurement: Cycling tests for gloves are performed through repetitive bending of joints after wearing gloves on which CMOS circuits were transferred. The electrical measurement is carried out using a probe station (Agilent, 4155C) after a series of cycling tests. The cycling for paper was similar. The paper was folded and unfolded repetitively and measured with the probe station.

References for Example 5
[1] R. H. Reuss, et al. *Proc. IEEE.* 2005, 93, 1239.
[2] S. P. Lacour, J. Jones, S. Wagner, T. Li, Z. Suo, *Proc. IEEE.* 2005, 93, 1459.
[3] A. C. Siegel, et al., *Adv. Mater.* 2007, 19, 727.
[4] T. Someya, et al. *IEEE Trans. Electron Devices,* 2005, 52, 2502.
[5] T. Someya, et al., *Proc. Nat. Acad. Sci. USA* 2005, 102, 12321.
[6] J. A. Rogers, et al., *Proc. Nat. Acad. Sci. USA* 2001, 9, 4835.
[7] S. R. Forrest, *Nature* 2004, 428, 911.
[8] T.-W. Lee et al., *Proc. Nat. Acad. Sci. USA* 2004, 101, 429.
[9] C. Kocabas, et al., *Proc. Nat. Acad. Sci. U.S.A.* 2008, 105, 1405.
[10] A. J. Baca, et al., *Angew. Chem. Int. Ed.* 2008, 47, 2.
[11] Q. Cao, et al., *Nature* 2008, 454, 495.
[12] A. K. Geim, K. S, Novoselov, *Nature Mater.* 2007, 6, 183.
[13] D. V. Talapin, C. B. Murray, *Science* 2005, 310, 86.
[14] W. Lu, P. Xie, C. M. Lieber, *IEEE Trans. Electron Devices* 2008, 55, 2859.
[15] D.-H. Kim, et al., *Proc. Nat. Acad. Sci. USA* 2008, 105, 18675.
[16] T. Sekitani, et al., *Science* 2008, 321, 1468.
[17] N. Bowden, et al., *Nature* 1998, 393, 146.
[18] D. Y. Khang, H. Jiang, Y. Huang, J. A. Rogers, *Science* 2006, 311, 208.
[19] D.-H. Kim, et al., *Science* 2008, 320, 507.
[20] H. C. Ko, et al., *Nature* 2008, 454, 748.
[21] D.-H. Kim, et al., *IEEE Electron Device Lett.* 2008, 20, 73.
[22] K. Teshimaa, et al., *Surf. Coat. Technol.* 2001, 146-147, 451.

[23] R. Morent, et al., *J. Phys. D: Appl. Phys.* 2007, 40, 7392.
[24] R. F. Service, *Science* 2003, 301, 909.
[25] Y. Ouyang, W. J. Chappell, *IEEE Trans. Antennas Propag.* 2008, 56, 381.
[26] J. B. Lee, V. Subramanian, *IEEE Trans. Electron Devices* 2005, 52, 269.
[27] M. Hamedi, R. Forchheimer, O. Inganas, *Nat. Mater.* 2007, 6, 357.
[28] P. J. Bracher, M. Gupta, G. M. Whitesides, *Adv. Mater.* 2009, 21, 445.
[29] P. Andersson, et al., *Adv. Mater.* 2002, 14, 1460.
[30] F. Eder, et al., *Appl. Phys. Lett.* 2004, 84, 2673.
[31] Y.-H. Kim, D.-G. Moon, J.-I. Han, *IEEE Electron Device Lett.*, 2004, 25, 702.
[32] L. Yang, et al., *IEEE Trans. Microw. Theory Tech.* 2007, 55, 2894.
[33] D. T. Britton, et al., *Thin Solid Films* 2006, 501, 79.
[34] Y. M. Chung, et al., *Surf. Coat. Technol.* 2003, 171, 65.
[35] E. Fortunato, et al., *IEEE Electron Device Lett.* 2008, 29, 988.

Example 6

Curvilinear Silicon Electronics by Use of Non-Coplanar Mesh Designs and Elastomeric Transfer Elements All dominant forms of electronics and optoelectronics exist exclusively in planar layouts on the flat surfaces of rigid, brittle semiconductor wafers or glass plates. Although these largely two dimensional (2D) configurations are well suited for many existing applications, they are intrinsically incompatible with many envisioned systems of the future. For example, they do not enable natural integration with the soft, curvilinear surfaces of biological systems (e.g. body parts), for the purposes of health monitoring or therapeutics. They also preclude the use of many interesting, often biologically inspired, non-planar device designs such as those proposed and recently demonstrated in fully functional hemispherical electronic eye cameras (see, e.g., Example 2 presented herein). Such curvilinear systems cannot be achieved easily using established technologies due to the inherently 2D nature of established device processing procedures, ranging from photolithographic patterning to deposition, etching and doping. This example provides advanced concepts for conformally wrapping silicon based circuits, initially fabricated in 2D layouts with conventional or moderately adapted forms of existing techniques, onto surfaces with a wide range of curvilinear shapes. Quantitative comparison of theoretical mechanics models to wrapped systems on diverse classes of substrates demonstrates the underlying science and provides engineering design rules for future work.

Figure 80:
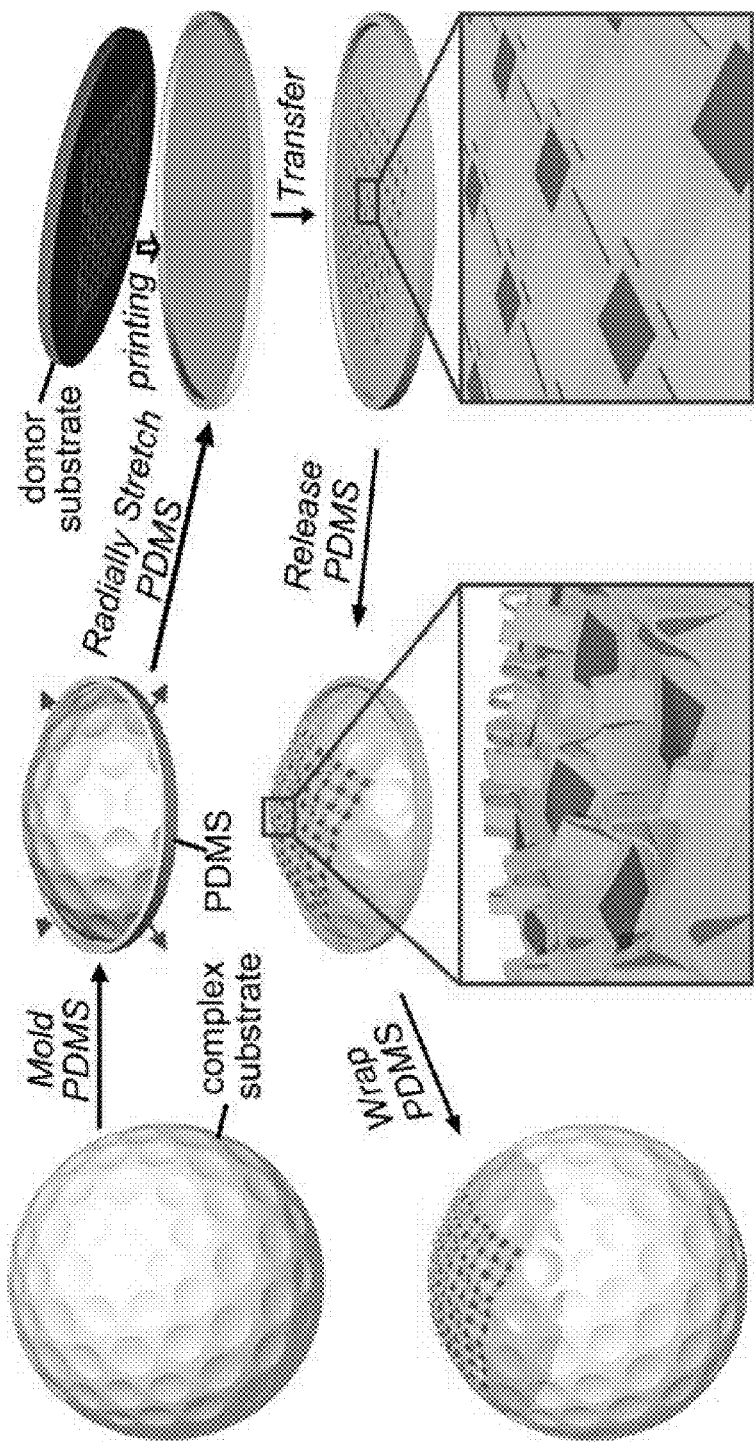
FIG. 80. Schematic illustration of steps for using compressible circuit mesh structures (i.e. arrays of islands interconnected by narrow strips) and elastomeric transfer elements to wrap conformally curvilinear substrates with complex shapes, such as the dimpled surface of the golf ball. The process begins with fabrication of a transfer element in an elastomer such as poly(dimethylsiloxane) (PDMS) by double casting and thermal curing against the object to be wrapped (i.e. the master). See top middle frame. Radially stretching the resulting element forms a flat drumhead membrane in which all points in the PDMS are in tension, with levels of strain that vary with position. Contacting this stretched membrane against a prefabricated circuit in an ultrathin mesh geometry in a planar configuration on a silicon wafer and then peeling it back lifts the circuit onto the membrane. See right frames. Relaxing the tension geometrically transforms the membrane and the circuit on its surface into the shape of the master. See bottom middle frame. During this process, the interconnection bridges of the mesh adopt non-coplanar arc shapes (bottom middle inset), thereby accommodating the compressive forces in a way that avoids significant strains in the island regions. Coating the target substrate with a thin layer of an adhesive, and then transferring the non-coplanar circuit mesh onto its surface completes the process (bottom left).

FIG. 80 provides a schematic illustration of the strategy, for the case of conformal integration of circuits on the surface of a golf ball, which we will generically refer to as the target substrate. The approach, which represents a generalization of procedures reported herein, begins with the formation of a thin, elastomeric membrane that has the surface geometry of the target substrate. This process involves first casting and thermally curing a bulk quantity of liquid prepolymer to an elastomer (poly(dimethylsiloxane; PDMS, Dow Corning) against the target substrate to form a solid, elastomeric replica. Casting and curing a thin layer of PDMS in the narrow gap between the target substrate (or a derivative surface formed from this substrate) and the replica, while held in an aligned configuration by a specialized mechanical jig, forms a thin (down to ~100 µm, for the experiments described in this example) membrane with an comparatively thick (~5 mm) integrated rim around the perimeter, as shown in FIG. 80. We refer to this structure as an elastomeric transfer element or a stamp. Mounting in a tensioning stage that applies radially directed force at the rim through the action of ten coordinated paddle arms pulls the thin, structured membrane of PDMS into the flat shape of a drumhead, in a manner that places all points under net tensile strain. In the next step, this tensioned transfer element contacts a separately fabricated silicon circuit mesh supported by, but not strongly adhered to, the surface of a silicon wafer (i.e. handle wafer of the SOI substrate). For the experiments described here, the circuit was formed with conventional planar processing methods using a silicon-on-insulator wafer (SOI; Soitec) to form an array of silicon islands interconnected by narrow strips of polyimide. Removing the buried oxide (thickness 400 nm) of the SOI wafer with HF leaves the top circuit layer raised slightly (~400 nm) above the underlying silicon wafer, supported by polyimide post structures that exist between the silicon islands. Peeling the transfer element back from the wafer lifts the circuit onto the flat, soft surface of the PDMS membrane, in a nondestructive manner via the action of van der Waals forces. Releasing the tensioning stage causes the PDMS to relax elastically back to its original shape, carrying the circuit mesh along with it. During this process, the silicon islands move closer together, with magnitudes corresponding to significant compressive strain (depending on the radial pre-extension strain) The thin polyimide interconnect lines accommodate this motion by delaminating from the PDMS to adopt non-coplanar arc shapes. This process accomplishes the geometrical transformation from flat to curvilinear layouts, without inducing significant strains in the silicon regions of the circuit mesh. In the final step, this structure is aligned and transferred to the target substrate and the rim structure is cut away. Experimental demonstrations and theoretical analyses described herein reveal essential details of this strategy.

Figure 81:
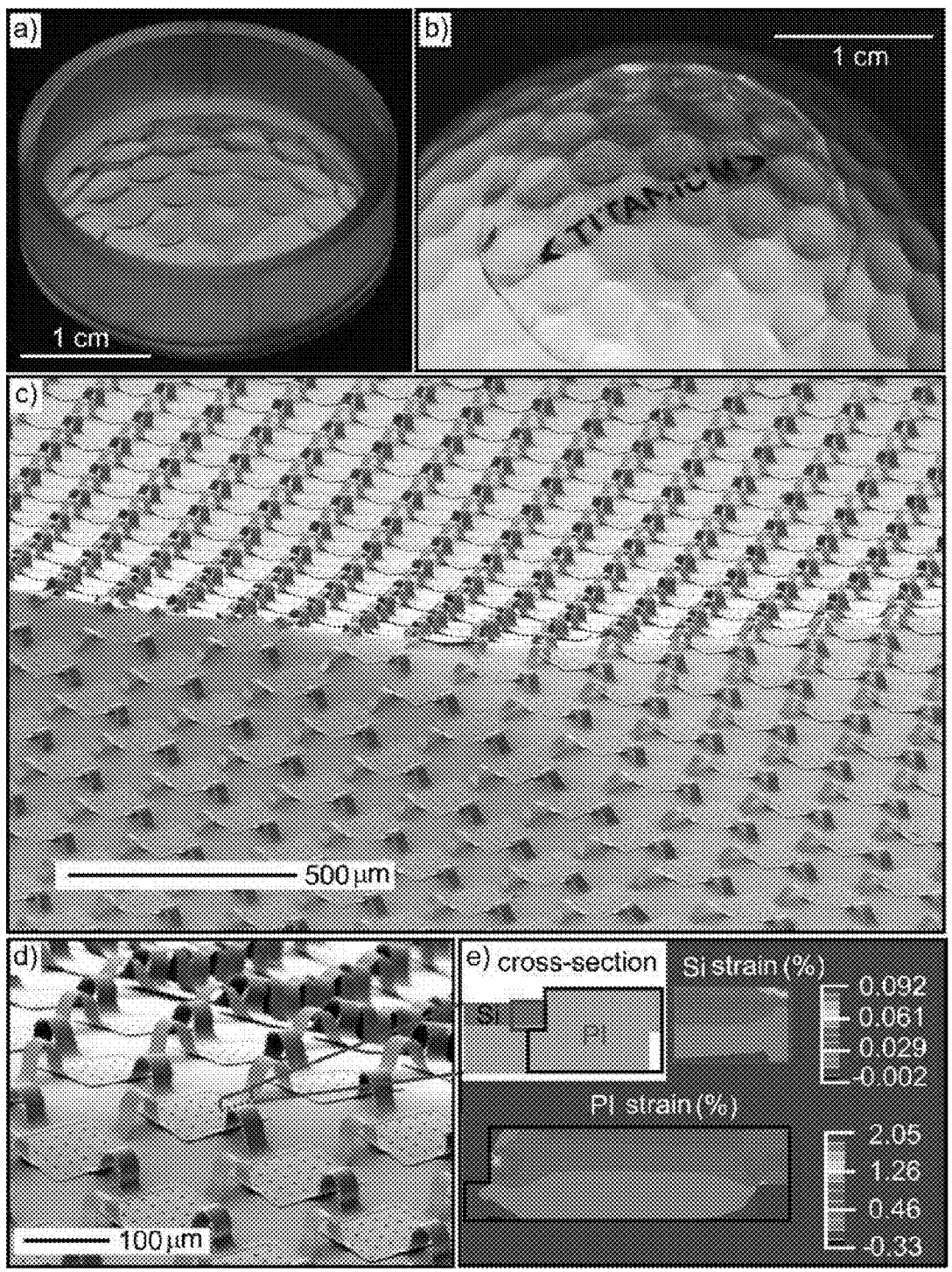
FIG. 81. Photographs of a silicon circuit mesh wrapped on the surface of a PDMS transfer element with the surface shape of a golf ball (a) and after contacting this element to the corresponding region of a golf ball (after cutting away the PDMS rim) (b). (c and d) Angled-view scanning electron micrographs of the sample shown in (a). The images were colorized to enhance the contrast between the various regions. The gray, yellow, and blue colors correspond to silicon, polyimide, and PDMS, respectively. (e) Simulated strain distribution in the silicon and polyimide regions at the cross-sectional area highlighted in (d).

FIG. 81 summarizes results in an experimental example corresponding to the system of FIG. 80, with a mesh that consists of a square array of square islands of silicon (100 µm by 100 µm; pitch 250 µm; thickness 700 nm) and polyimide interconnects (width: 30 µm, length: 150 µm; thickness 1.4 µm). FIGS. 81a and 81b show optical images of the mesh on a transfer element in the geometry of a golf ball and after integration with the ball. The dimples in this particular type of golf ball (diameter~cm) have diameters and depths of ~3.6 mm and ~0.26 mm, respectively. The thickness of the silicon islands and the polyimide interconnects are ~700 nm and ~1.4 um, respectively. Scanning electron microscope (SEM) images reveal that compression of the mesh associated with the geometry transformation, in the range of about ~20% or greater, depending on position across the structure. The images indicate remarkably high levels of uniformity in the wrapped circuit. In certain relatively infrequent cases, we observe partial detachment of some fraction of the silicon islands located on the most highly curved areas (i.e. rim edges of the dimples). We do not observe cracking or any other related mechanical failures in the silicon or the polyimide anywhere in the system. Full mechanics analysis provides additional insights. FIG. 81e shows that the maximum strain of the silicon islands is ~0.09% which is significantly below the fracture strain (1%). The maximum strain in the polyimide occurs near the edges of the silicon islands in the most compressed regions of the mesh, and is ~2%, considerably below the fracture strain for this material.

Figure 82:
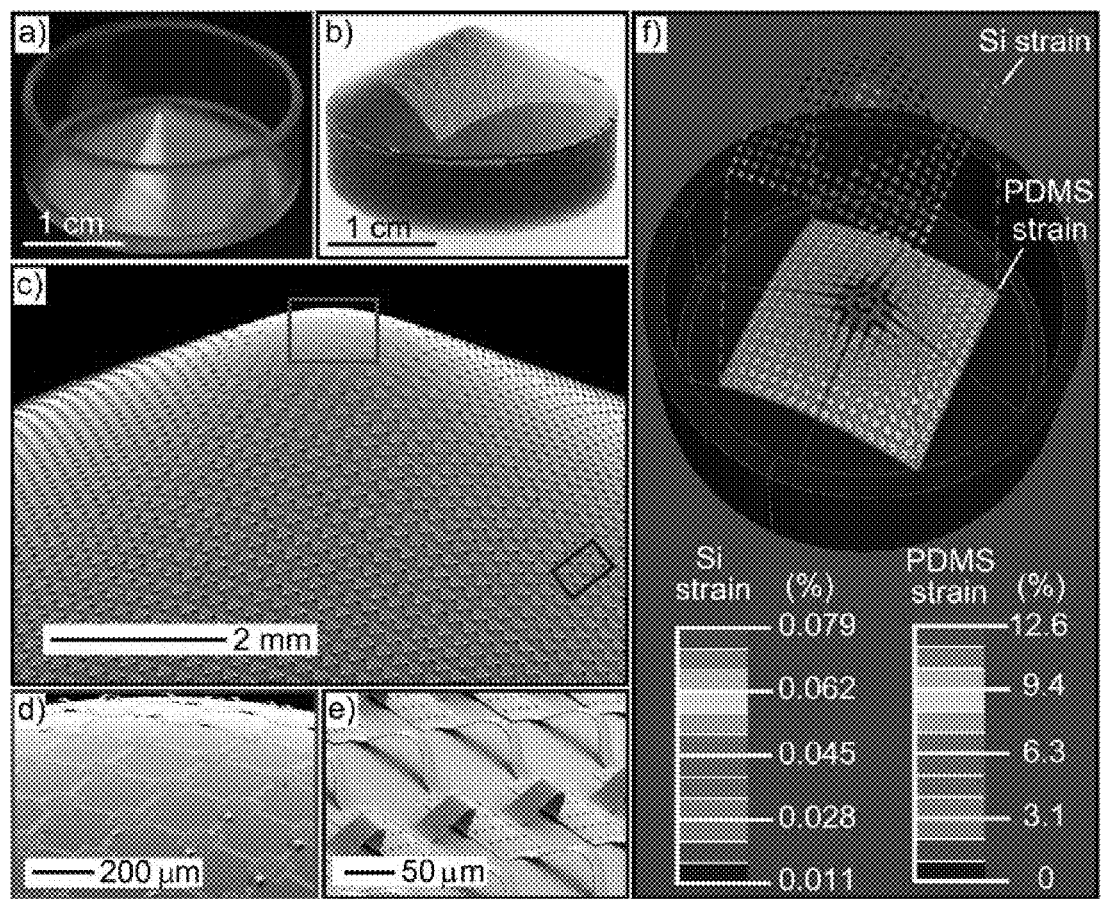
FIG. 82. Photographs of a silicon circuit mesh on the surface of a PDMS transfer element with a conical shape before (a) and after transfer printing to a conical surface (b). (c) Angled-view scanning electron micrographs of the sample shown in (a and b). (d and e) Magnified angled-view scanning electron micrographs of highlighted area of image (c). The images were colorized to enhance the contrast of the various regions. The gray, yellow, and blue colors correspond to silicon, polyimide, and PDMS, respectively. (e) Simulated distribution of strain in the silicon regions of the circuit and in the underlying PDMS transfer element, corresponding to the system shown in (a).

FIG. 82 shows an example of wrapping the same type of circuit mesh onto a conical substrate. FIGS. 82a and 82b show the structure on the transfer element and the target substrate, respectively, A notable feature of this system, illustrated in the SEM images of FIG. 82c-e, is that the polyimide interconnects remain flat on the surface of the PDMS near the peak of the cone (FIG. 82d). The arc shapes increase in curvature from center to edge (FIG. 82e). Accordingly, provided herein are methods and devices having spatially varying or inhomogeneous interconnect geometry, such as interconnect amplitude, periodicity, or curvature shape that selectively vary with position of the underlying stamp or transfer element surface. This behavior can be quantitatively related to the local levels of tensile strains in the transfer element in its tensioned, flat membrane geometry. Full finite element modeling of the circuit system (without the polyimide interconnects) as integrated with the PDMS transfer element appears in FIG. 82f. The results show that the maximum strain in the silicon is ~0.08%, decreasing with distance toward the center. This behavior indicates that the tensile pre-strain in the periphery of the extended flat PDMS is much larger than that in the central region. The higher strain in the silicon islands at the center is due primarily to bending deformations associated with the small radius of curvature (~2 mm) in this region. By contrast, the maximum strain in the PDMS is 12.6%, much higher than in the silicon but still far below the fracture strain of PMDS (>150%).

Figure 83:
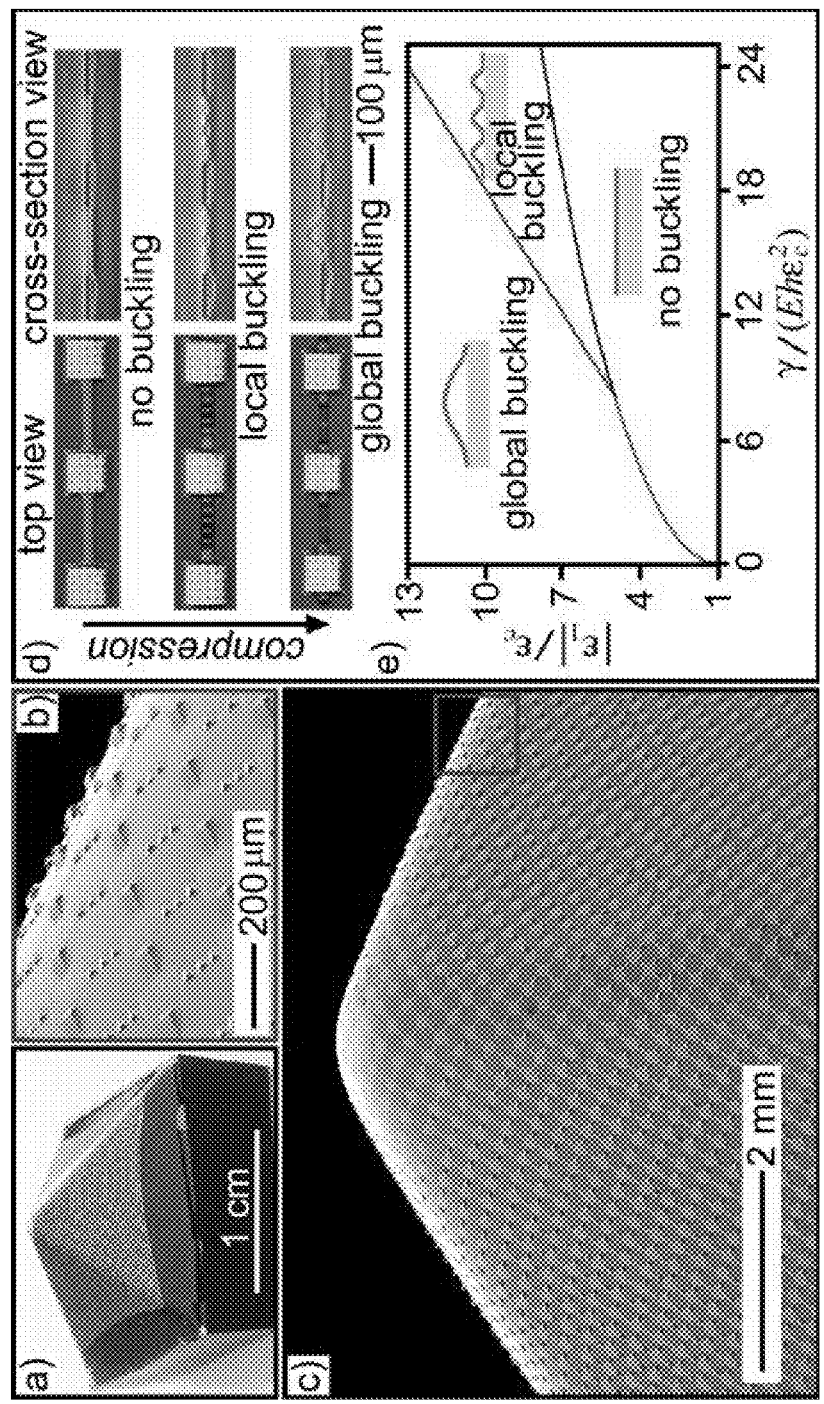
FIG. 83. (a) Photograph of a silicon circuit mesh wrapped onto a pyramidal substrate. (b and c) Angled-view scanning electron micrographs of the sample shown in (a). (b) Magnified view of the area indicated by the box in the left middle region of the image in (c). The gray, yellow, and blue colors correspond to silicon, polyimide, and PDMS, respectively. (d) Top and cross-sectional views of a linear array of interconnected silicon islands on a PDMS substrate subjected, from top to bottom, to low, medium and high levels of compressive strains. (e) Plot summarizing mechanical modeling results.

FIG. 83a shows the case of a pyramidal substrate, to illustrate additional features of the underlying mechanics. As with the conical surface, the polyimide interconnects show little or no buckling at the center due to negligible tensile prestrains in this region. Around the edges of the pyramid, however, different configurations of the non-coplanar interconnects are observed. In particular, the contour shapes include not only single (i.e. global) but multiple (i.e. local) buckling, as highlighted in the SEM images of FIGS. 83b and 83c. To gain insights into this behavior, we prepare a one dimensional array of silicon islands and polyimide interconnects, transfer them to a thin piece of PDMS under uniaxial tension and then monitor the configurations during release of the tension. For relatively low strains, the interconnects show no significant buckling. Multiple buckling occurs over an intermediate strain range. Global buckling occurs as the small multiple waves merge together. Mechanical modeling shows that these different buckling behaviors relate to the degree of compressive stress and the adhesion energy between the polyimide and the PDMS. In the case of the pyramid, radial tensioning of the transfer element by extending the rim from an unstressed diameter to a stressed diameter that flattens the transfer element and creates meridional strains that are much less than the circumferential strains. This effect, combined with the underlying buckling mechanics described above, accounts for the observed behavior.

Figure 84:
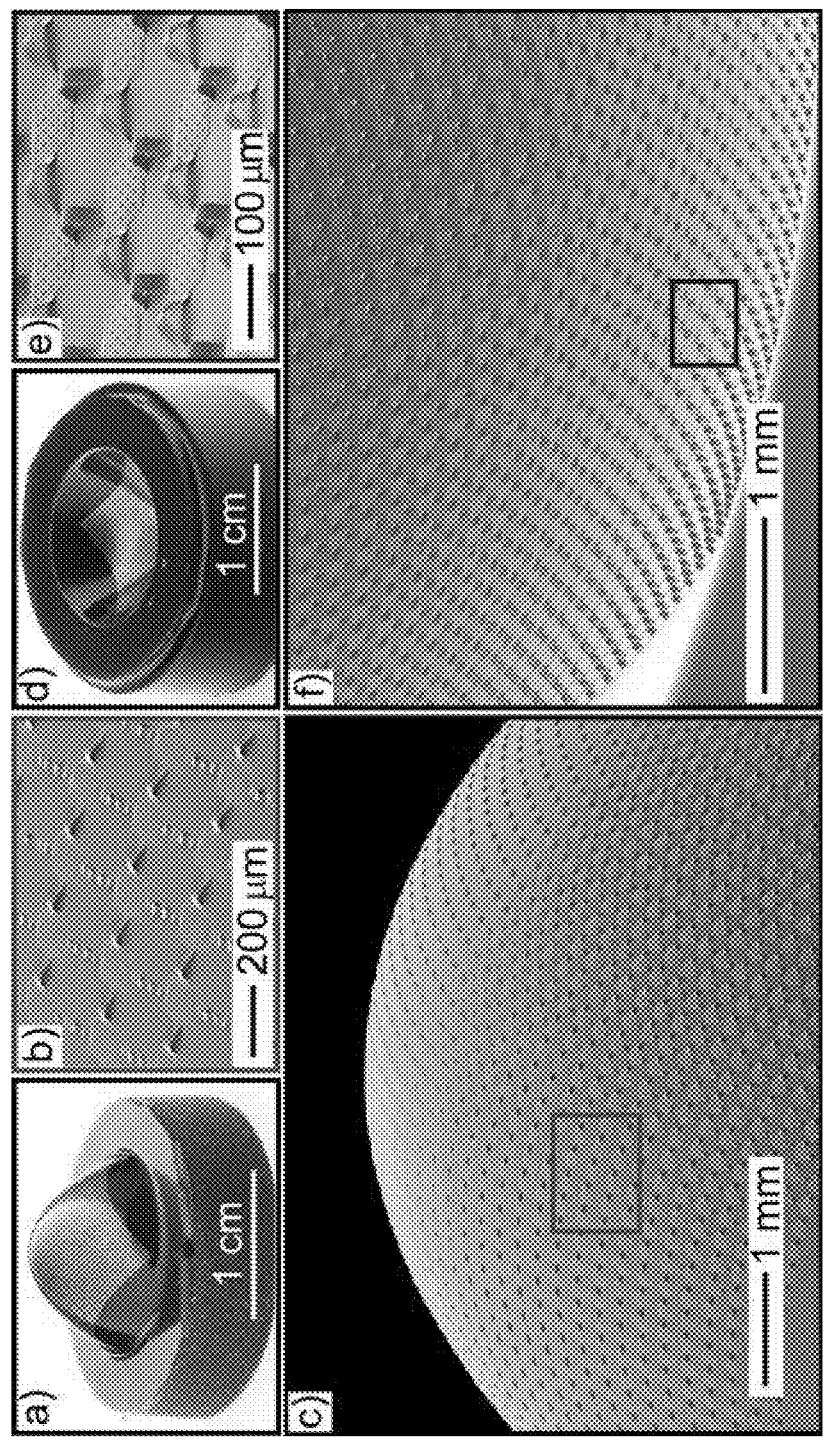
FIG. 84. (a) Photograph of a silicon circuit mesh on a convex paraboloid substrate. (b and c) Angled-view scanning electron micrographs of the sample shown in (a). (b) Magnified view of the area indicated by the box in the center region of (c). (d) Photograph of a silicon circuit mesh on a concave paraboloid substrate. (e and f) Angled-view scanning electron micrographs of the sample shown in (d). (e) Magnified view of the area indicated by the box in the lower center region of (f). The gray, yellow, and blue colors in the images b, c, e, and f correspond to silicon, polyimide, and PDMS, respectively.
Figure 85:
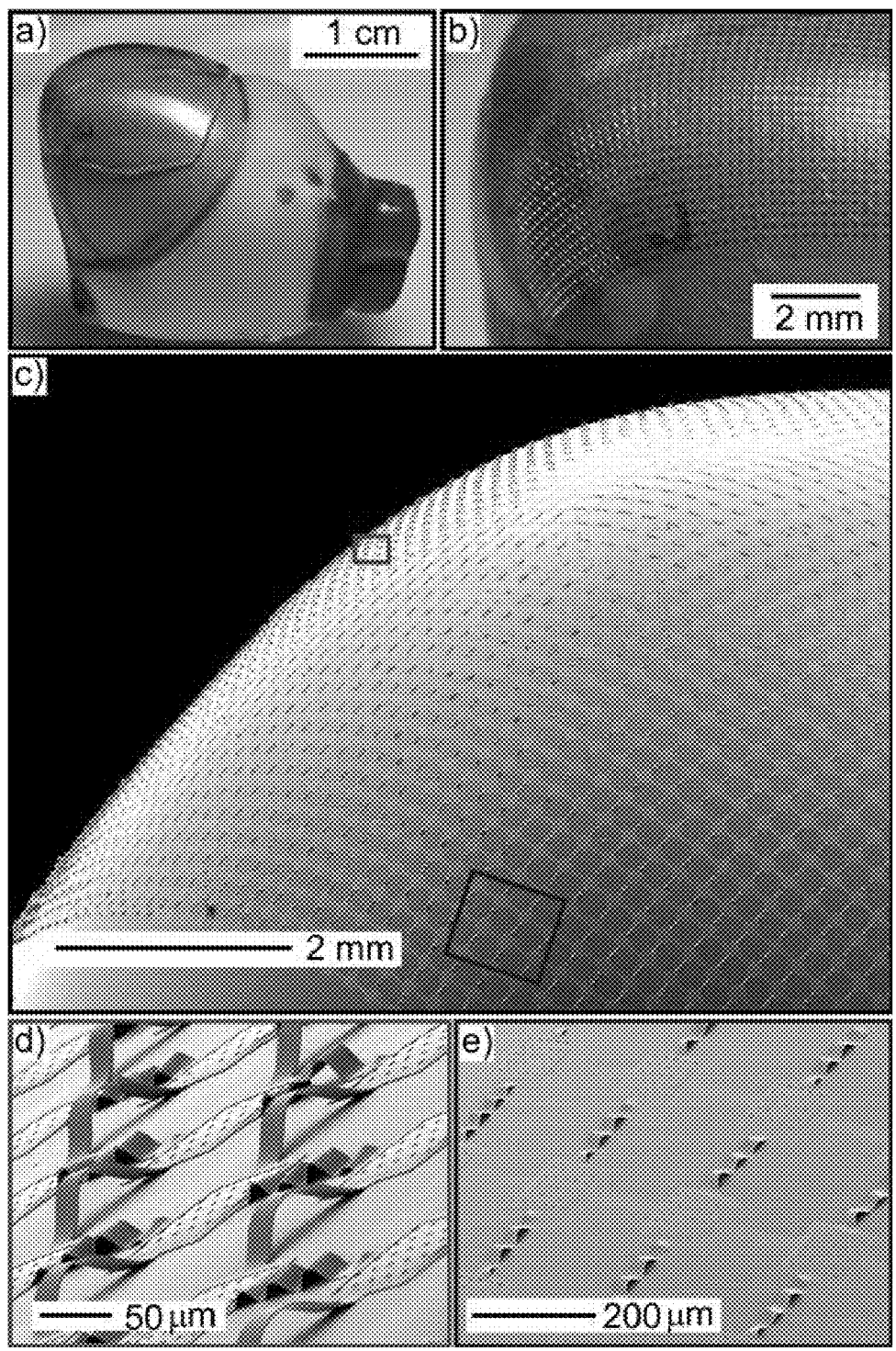
FIG. 85. (a and b) Photographs of a silicon circuit mesh on a PDMS transfer element with having a complex curved geometry obtained from a model of a heart. (b) Magnified image of (a). (c and e) Colorized angled-view scanning electron micrographs of the sample shown in (a). (d and e) provide magnified views of the areas indicated by the corresponding boxes in (c). The gray, yellow, and blue colors correspond to silicon, polyimide, and PDMS, respectively.

Although the examples described previously involve surfaces with positive curvature, those with negative curvature are also possible. As an example, we created transfer elements in the geometry of parabaloids and transferred silicon circuit mesh structures onto both the convex (FIG. 84a-84c) and concave (FIG. 84d-84f) surfaces. More complex, irregular shapes are also possible. FIGS. 85a and 85b demonstrate an example of a target substrate that consists of an anatomically correct, plastic model of a heart. As in previous examples, here the interconnects adopt a variety of configurations in different areas, i.e. no buckling and multiple waves in the slightly strained area (a red rectangular region of FIGS. 85c and 85d) and multiple waves and one pop-up structure in the comparably highly strained area (a blue rectangular region of FIGS. 85c and 85e). The underlying mechanics naturally determines the spatial distributions of these various buckled configurations.

Figure 86:
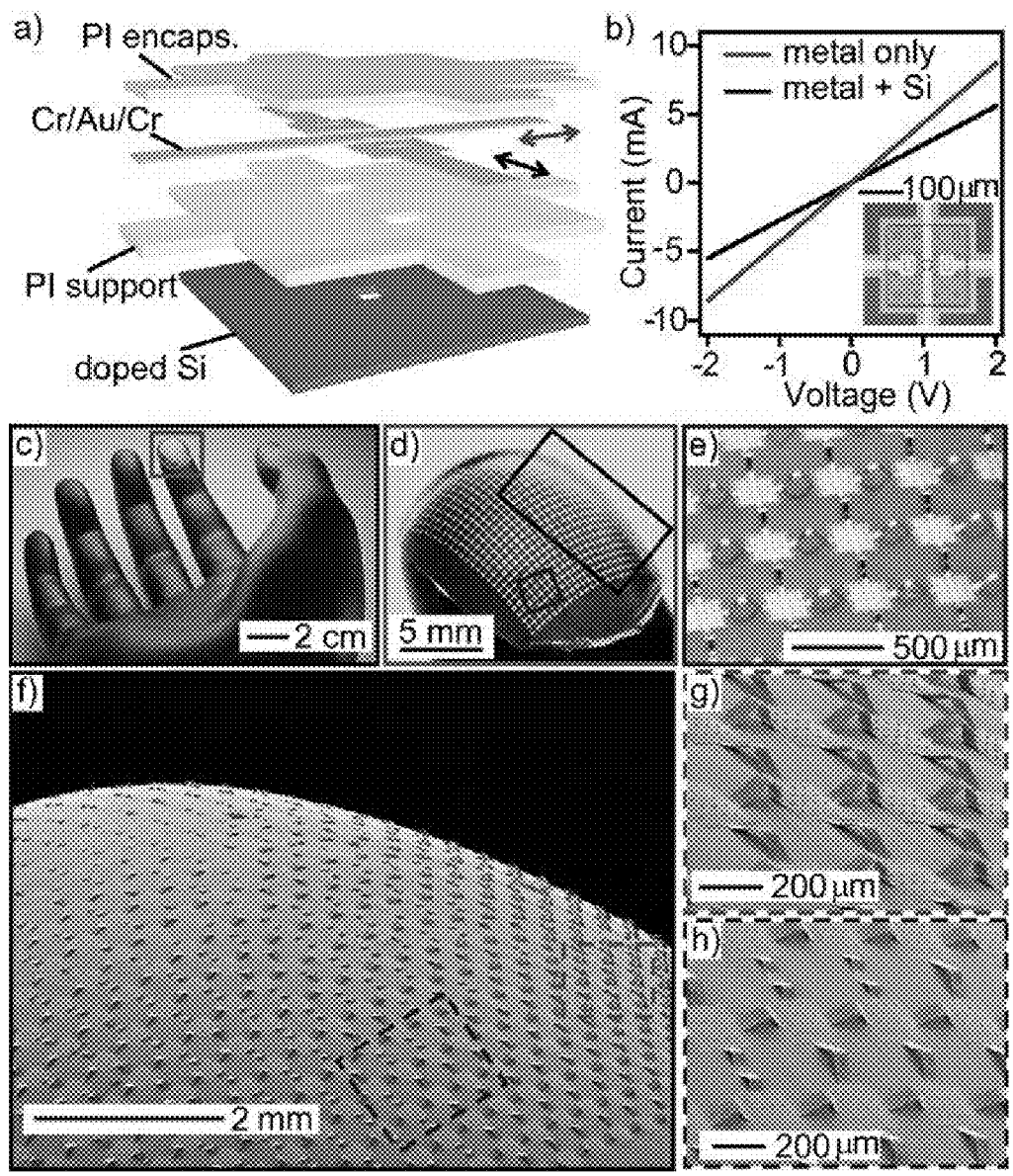
FIG. 86. (a) Exploded view schematic illustration of the layout of the silicon, metal, and polymer layers in a unit cell of a silicon circuit mesh test structure. (b) Current-voltage characteristics measured by contacting the continuous metal line (red arrow in a) and the discontinuous metal line (black arrow in a) at the periphery of the array. The inset shows a top view optical microscope image of a representative individual pixel. (c and d) Photographs of the circuit mesh transferred onto the tip of a finger on a plastic substrate with the shape of a human hand. (d) Magnified view of the region indicated by the box in (c). (e) Magnified image of the region indicated by the box in (d), collected using a scanning focal technique. (f and h) Colorized angled-view scanning electron micrographs of the sample shown in (c). (g and h) Magnified views of areas indicated by the dashed boxes in (f). The gray, yellow, and blue colors correspond to silicon, polyimide, and PDMS, respectively.

An important aspect of these results is that the mechanics depends only weakly on the presence or absence of active devices, metal electrodes and other related structures on the islands and interconnecting bridges. To show explicitly the possibility of achieving electrically functional systems, we constructed test structures consisting of circuit meshes with two metal lines encapsulated in polyimide and contacted to doped silicon islands through vias. The sandwich polyimide layout places the metal layer near the geometric center of the structure, near the neutral mechanical plane, thereby preventing significant strains in the metals due to buckling deformations. Silicon heavily n-doped with phosphorous (P509, Filmtronics) allows ohmic contact between the metal and the silicon, to facilitate electric test. The mesh in this case consists of a 28×28 array of silicon islands with ends configured for probing. The total number of vias is 1404 (each pixel has two vias) and total number of metal lines is 702. The lines are continuous in one direction along the array and discontinuous in the other. FIG. 86b shows representative current-voltage curves of associated with probing these two directions at the ends of a mesh wrapped onto a plastic model of a fingertip (FIG. 86c-h). The overall yield of electrical connections along the continuous metal lines (the red arrow in FIG. 86a) was 99.9% (701 out of 702) and that along the discontinuous (the black arrow in FIG. 86a) metal lines and vias was 100% (1404 out of 1404). These results provide clear evidence of the scalability of these approaches to active electronics that could be designed for various applications (e.g. electrotactile stimulation for the case of FIG. 86).

An exemplary scheme for conformal wrapping to various complex substrates is summarized below:
Preparing Wafers
1. Clean a SOI wafer chip (Soitec, thickness of top silicon: 700 nm, thickness of SiO2: 400 nm) with acetone, IPA, and water, followed by drying 5 min at 110° C.
Si Isolation
2. HMDS pretreatment for 1.5 min.
3. Pattern photoresist (PR; Clariant AZ5214, 3000 rpm, 30 s) with 365 nm optical lithography through chrome mask (Karl Suss MJB3) and develop in aqueous base developer (MIF 327).
4. Reactive ion etching (RIE; PlasmaTherm 790 Series, 50 mTorr, 40 sccm SF6,100 W, 3 min).
5. After removing PR, clean the chip with the acetone and piranha treatment (~3:1 $H_2SO_4$:$H_2O_2$ for 3 min).
6. HF treatment (Fisher, concentrated 49%, 2 sec).
Pre-Treatment with Sacrificial Oxide Layer
7. Plasma enhanced chemical vapor deposition (PECVD; PlasmaTherm SLR) of 100 nm $SiO_2$.
8. Pattern PR & post-baking at 110° C. for 5 min.
9. BOE 30 s=>Acetone, Piranha cleaning 3 min=>BOE 1 s.
Deposit PI and Pattern Holes for Oxide Box Layer Etch
10. Spin coat with polyimide (PI, poly(pyromellitic dianhydride-co-4,4'-oxydianiline) amic acid solution, Sigma-Aldrich, 4000 rpm for 60 s).
11. Anneal at 110° C. for 3 min and 150° C. for 10 min.
12. Anneal at 250° C. for 2 h in $N_2$ atmosphere.
13. Ultraviolet ozone (UVO) treatment for 5 min.
14. PECVD $SiO_2$ (150 nm).
15. HMDS 1.5 min.
16. Pattern PR.
17. RIE (50 mTorr, 40/1.2 sccm $CF_4/O_2$, 150 W, 8 min).
18. After removing PR, clean the chip with the acetone.
19. RIE (50 mTorr, 20 sccm O2, 150 W, 13 min) to remove PI.
20. RIE (50 mTorr, 40 sccm $SF_6$, 100 W, 3 min).
21. BOE35s.

PI Isolation
22. UVO treatment, 5 min.
23. PECVD SiO2 (150 nm).
24. HMDS 1.5 min
25. Pattern PR
26. RIE (50 mTorr, 40/1.2 sccm $CF_4/O_2$, 150 W, 8 min).
27. Acetone washing.
28. RIE (50 mTorr, 20 sccm $O_2$, 150 W, 16 min).
Box Etching and Transfer
29. PR coating.
30. Grinding the corners of the chip=>Acetone washing.
31. HF etching (20 min).
32. UVO 5 min for the chip and PDMS mold.
33. Transfer=>wrapping on a substrate.

In particular, a process for transfer of silicon-polyimide interconnection arrays from a donor SOI wafer to a PDMS film relates to the following. a) Wet etch an insulator layer to slightly undercut SiO2 layer. b) Spin cast a polyimide layer to fill the undercut and the rest area to post the Si and prevent sagging down in the coming wet etching step-d. c) Pattern holes to allow HF etching through them to etch the SiO2 box-layer. d) Etch the SiO2 layer by dipping the chip in HF solution. e) Pattern the polyimide layer to have narrow compressible interconnects. f) Expose UV to both surfaces of PI and PDMS to enhance the adhesion between the both surfaces.

A molding process for use with electronic devices on complex-shaped surfaces, such as a golf ball, for example, involves: a) Cast and cure a liquid pre-PDMS solution against the original golf ball at room temperature for 1 day. b) Expose the surface of the replica to oxygen plasma (O2 30 mtorr, 20 SCCM, 30 W, 15 s) in a reactive ion etching system and dip it in water for easy detachment of PDMS in further molding process. Next, mold PDMS in a gap between the original target surface (or a PDMS replica) and opposing PDMS replica.

A molding stage can readily control thickness of PDMS over any desired range, such as, for example, a thickness from between about 100 μm and 1.5 mm. The molding may occur by any means known in the art, such as by: mount the replicas with a steel molding stage; Fill and cure the PDMS prepolymer liquid between the gap between the replicas at room temperature for 1 day; Separate the base and side wall from the resulting PDMS molds; Remove the both replicas from thin golf ball shaped PDMS film with a rim.

A radial tensioning stage, such as a stage provided herein, provides two-dimensional radial extension of the PDMS rim, thereby deforming the transfer element to a geometry having a contact surface with substantially flat geometry. The transfer element can then be brought into conformal contact with a planar donor substrate. The donor substrate may support any desired electronic device, such as silicon island arrays and polyimide interconnects, for example.

Arbitrary transfer element shaped surfaces may be used. For example, a pyramid or a thin cone with a rim, such as having a thickness inside the rim varying from 200 μm to 500 μm. Exemplary transfer elements may also include inner diameters in an unstressed state of about 20 mm to extended states of about 30 mm, for example, or any other dimensions to obtain a desired buckling geometry and buckling geometry spatial distribution.

Example 7

Optimized Materials and Structural Designs for Stretchable Silicon Integrated Circuits This example explores materials and design strategies in stretchable silicon integrated circuits that use non-coplanar mesh layouts and elastomeric substrates. Detailed experimental and theoretical studies reveal many of the key underlying aspects of these systems. The results indicate, as an example, optimized mechanics and materials for circuits that exhibit maximum principal strains less than 0.2% even for applied strains of ~90% (e.g., strain isolation better than 99%). Simple circuits, including CMOS inverters and NMOS differential amplifiers, provide examples that validate these designs. The results suggest practical routes to high performance electronics with linear elastic responses to large strain deformations, suitable for diverse applications that are not readily addressed with conventional wafer-based technologies.

Electronic circuits that offer the performance of conventional wafer-based devices but with the mechanical properties of a rubber band have the potential to open up many new application possibilities, most prominently those that involve intimate integration of electronics with the human body [1] for health monitoring or therapeutic purposes. Several interesting schemes have been demonstrated to achieve stretchable circuits, as defined by reversible, elastic mechanical responses to large (>>1%) compressive or tensile strains. Those that exploit single crystalline semiconductor nanomaterials, in the form of nanoribbons or nanomembranes, are attractive due to the excellent electrical properties that can be achieved. The most advanced strategies use single crystal silicon for the active materials of ultrathin devices (e.g. transistors) that are interconnected (mechanically and/or electrically) with non-coplanar bridges, to provide stretchability up to ~100%, in a manner that maintains small material strains for linear, reversible response and good fatigue properties [7,8]. In this example, we theoretically and experimentally study many of the key design variables, including aspects of bridge design and encapsulation. The results reveal important features of the underlying materials and micro/nanomechanics and provide design strategies for this class of stretchable electronics technology.

Figure 87:
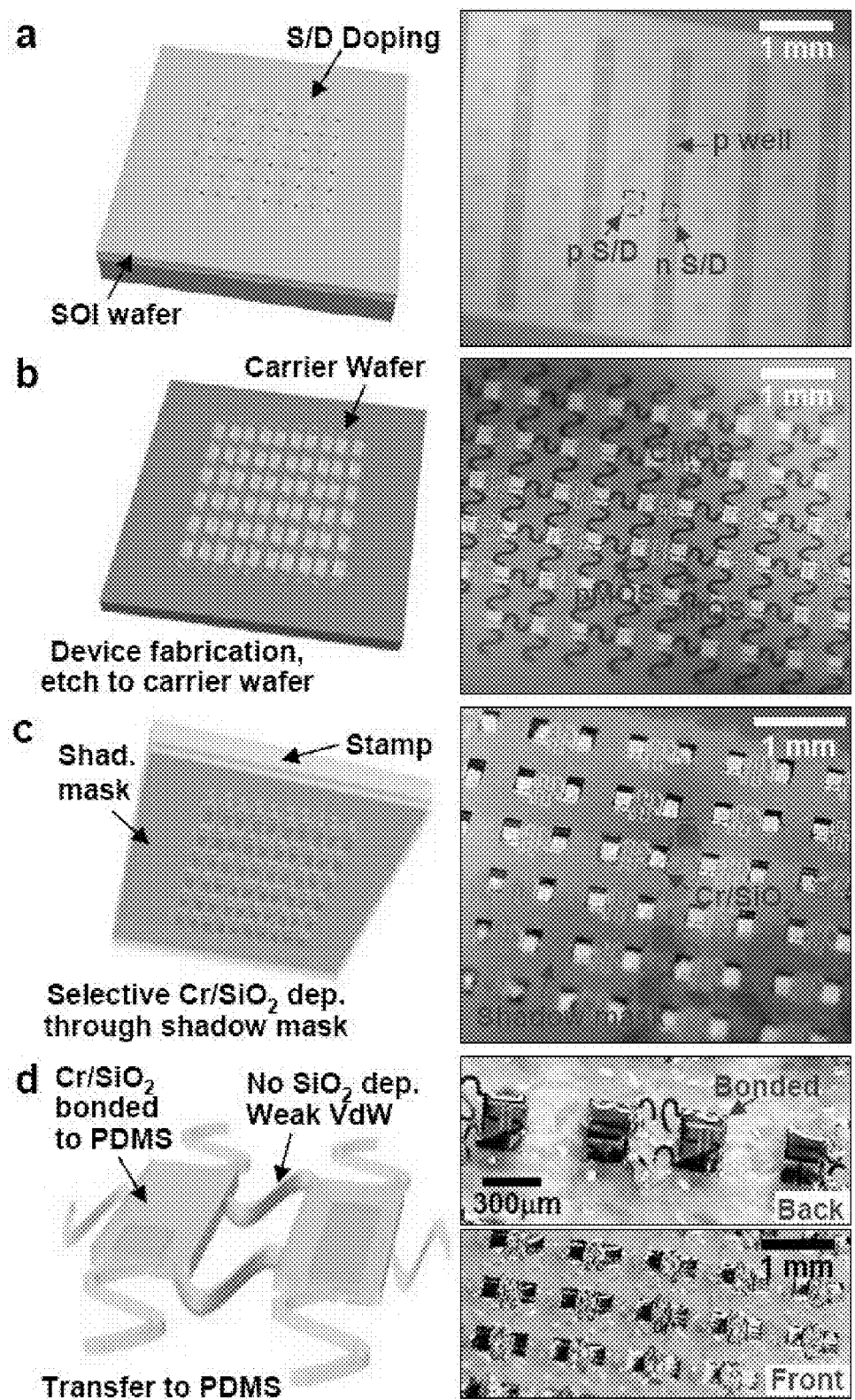
FIG. 87. (a) Schematic illustrations (left) and corresponding optical images (right) of (a) doped silicon, (b) interconnected arrays of CMOS inverters, (c) lifted inverters covered with a shadow mask for selective deposition of $Cr/SiO_2$ and (d) magnified views of an inverter.

The process for fabricating stretchable silicon circuits is similar to that of recent reports [2,8]. FIG. 87 provides an overview for systems that use non-coplanar serpentine bridge structures. The sequence begins with high temperature doping processes, starting with an n-type silicon on insulator wafer (260 nm top silicon, 1 μm buried oxide; SOITEC, France), as shown in FIG. 87(a). Doped silicon nanomembranes prepared in this manner are transfer printed onto a carrier wafer coated with poly(methylmethacrylate)/polyimide (PMMA/PI, 100 nm/1.2 μm, MicroChem/Sigma Aldrich, USA) and then processed to yield ultrathin circuits (FIG. 87(b)). Another transfer printing step lifts the ultrathin circuits from the carrier wafer to expose their back surfaces for selective area deposition of Cr/SiO$_2$ (3 nm/30 nm) through an aligned shadow mask (FIG. 87(c)), and then delivers them to a biaxially pre-strained piece of polydimethylsiloxane (PDMS, Dow Corning, USA) bearing —OH groups on its surface. Strong covalent bonding forms between the PDMS and the SiO$_2$ on the circuits upon contact and mild heating (FIG. 87(d)). This bonding, together with the comparatively weak Van der Waals adhesion between the PDMS and other regions of the circuits, lead to a controlled non-coplanar layout in the bridge structures upon release of the pre-strain (FIG. 87(d)).

Figure 88:
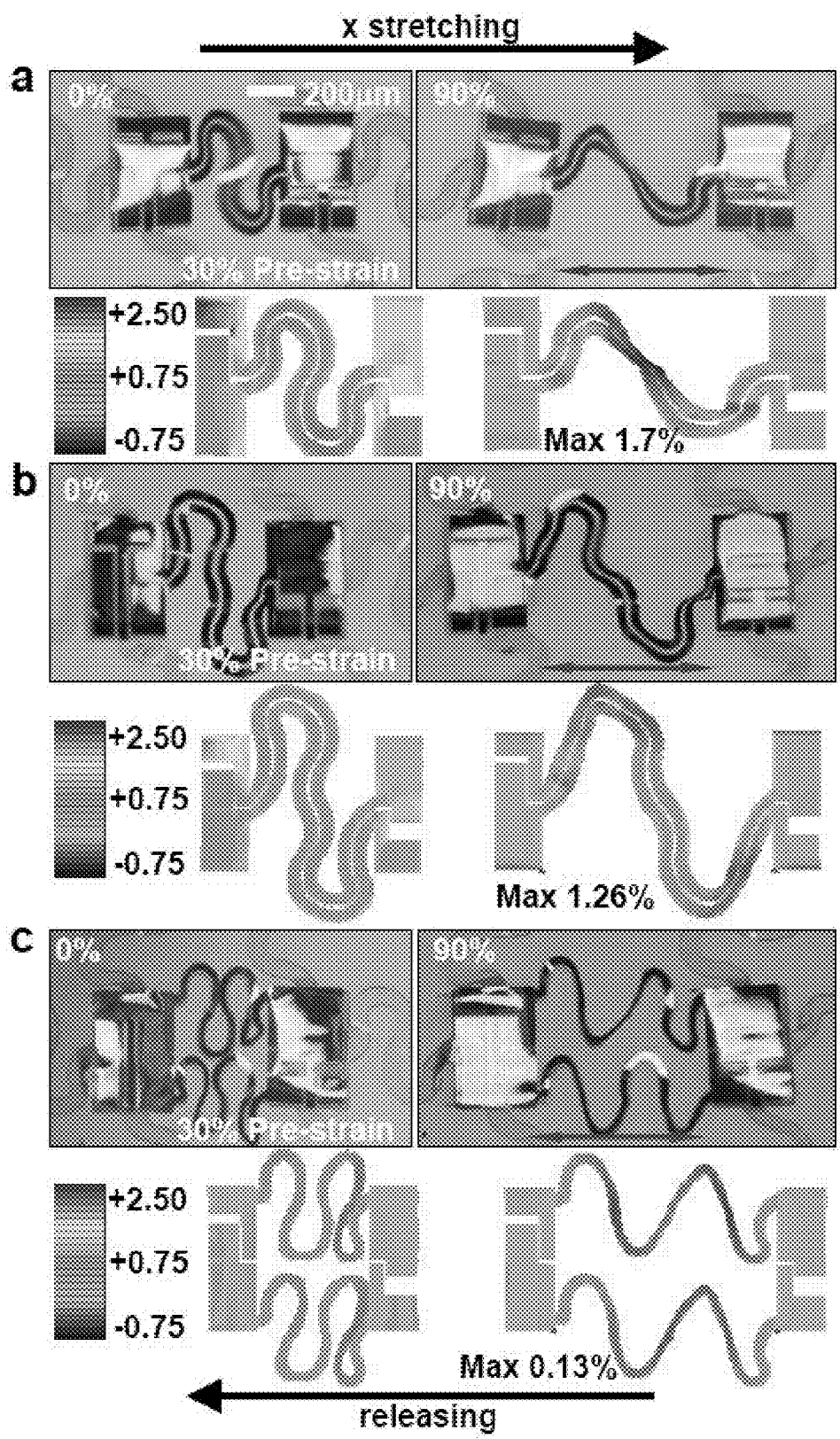
FIG. 88. Optical microscope images and maximum principal strain distribution evaluated by FEM simulation for a CMOS inverter with (a) a standard serpentine interconnect, (b) an interconnect with large amplitude and (c) an interconnect with large amplitude to wavelength ratio, narrow width and large number of curves.

Systematic study of this system began with investigations of the dependence of the mechanics on the bridge design, such as shown in FIG. 88. FIG. 88(a) shows a standard serpentine structure of low amplitude and wide width, formed with a pre-strain value of ~30%. For an applied strain of ~90%, the bridge changes shape, to first reach its original layout when the applied strain equals the pre-strain, followed by further deformation at higher strains, without fractures. This ability to accommodate strains larger than the pre-strain is absent from straight bridge designs explored previously. Nevertheless, the serpentine layout of FIG. 88*a* exhibits stress concentrations near the corners of the points of highest curvature, suggesting the possibility for mechanical failure in these regions. Full three dimensional finite element modeling (FEM) analysis (bottom frames in FIG. 88(*a*)), indicates maximum principal strain of ~1.7% for applied strain of ~90%. A different design, shown in FIG. 88(*b*), that increases the ratio of the amplitude to wavelength of the serpentine structure reduces the maximum principal strain to 1.26% under the same applied strain. Extending this strategy by decreasing the width of the lines and increasing the number of 'coils' in the serpentines while maintaining the ratio of the amplitude to wavelength (FIG. 88(*c*)) dramatically reduces the maximum principal strain to 0.13% for the same conditions. This sequence of designs illustrate the extent to which bridge or interconnect design (e.g., amplitude, frequency, coiling, thickness, width) can influence the micromechanics of these systems.

Figure 89:
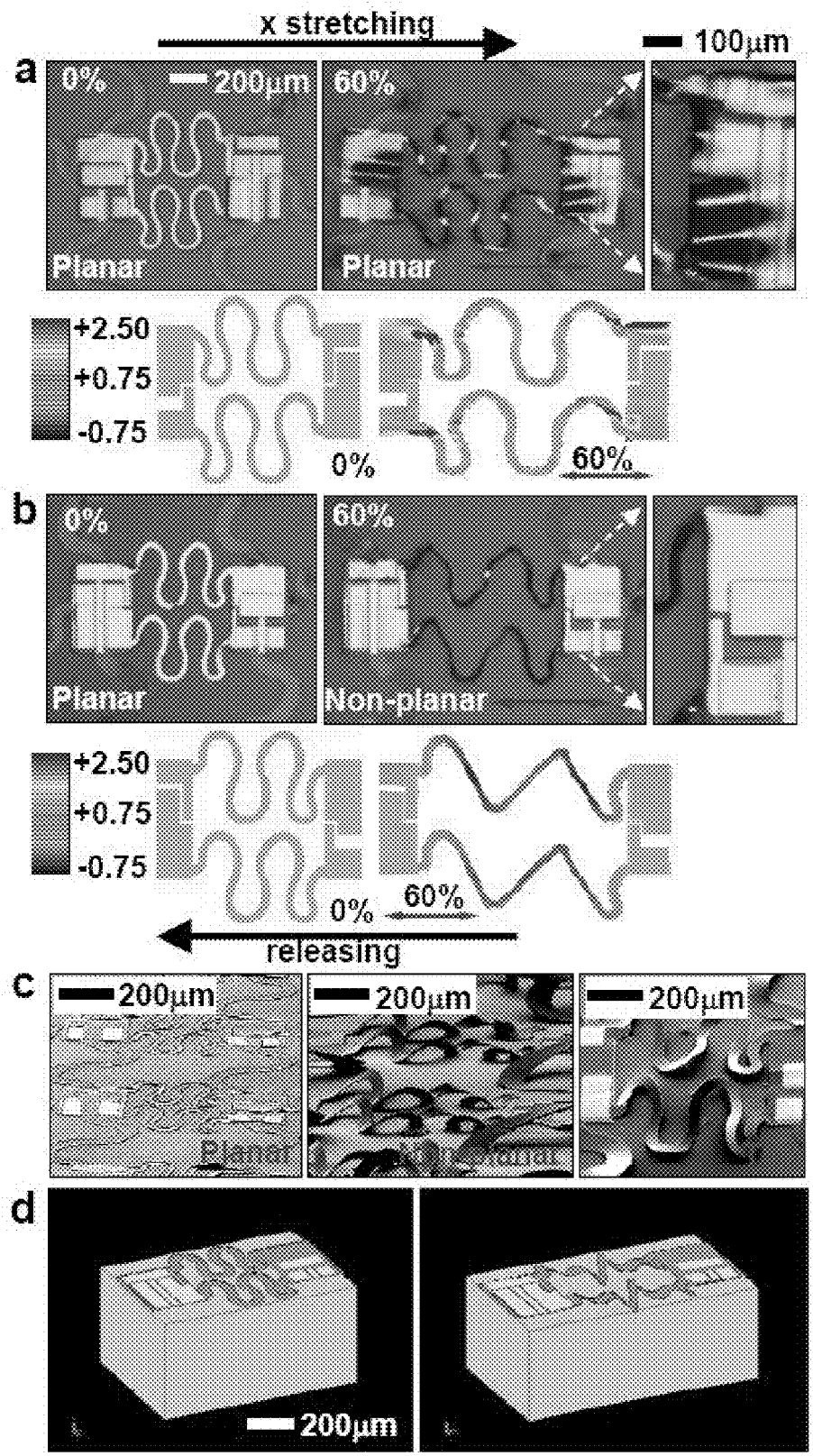
FIG. 89. Optical microscope images and maximum principal strain distributions computed by FEM simulation for a CMOS inverter with (a) coplanar and (b) non-coplanar structure, (c) Scanning electron microscopy (SEM) images for FIG. 3(b) before (left) and after (center and right) applying external strain, (d) FEM simulation for FIG. 3(b) before (left) and after (right) applying external strain.

Another important design feature is the non-coplanar layout of serpentines such as these. To reveal the effects, FIG. 89 compares coplanar (formed with the $Cr/SiO_2$ adhesion layer deposited uniformly on the backsides of the circuits) and non-coplanar systems with the bridge design of FIG. 88(*c*). For simplicity of comparison, the pre-strain was zero for both cases, leading to identical strain distributions for the unstrained cases shown in the left frames of FIGS. 89(*a*) and (*b*). With an applied tensile strain of ~60%, the bridges in the coplanar remain largely flat due to their adhesion to the PDMS substrate. By contrast, the bridges of the non-coplanar case delaminate from the PDMS and move out of the plane to accommodate more effectively the applied strain. FIG. 89(*c*) shows this behavior in scanning electron microscope (SEM) images. The left frame (60° tilted) corresponds to the system without applied strain; the center (60° tilted) and right (top view) frames are for strains of 60%. In the case of coplanar bridges, the constrained motion leads to much higher peak strains in the circuits compared to the non-coplanar design. As a result, cracks and wrinkles appear inside the active device regions contrary to the coplanar system, as shown in the center and right images of FIGS. 89(*a*) and (*b*). The strain distributions and maximum principal strains calculated by FEM analysis confirm these experimental observations (bottom frames of FIGS. 89(*a*) and (*b*)). The maximum principal strains under applied strains of ~60% for coplanar and non-coplanar structures are 6.8% and 0.177%, respectively. FIG. 89(*d*) shows tilted views of the FEM simulation results for the non-coplanar structure before and after applying strain.

Figure 90:
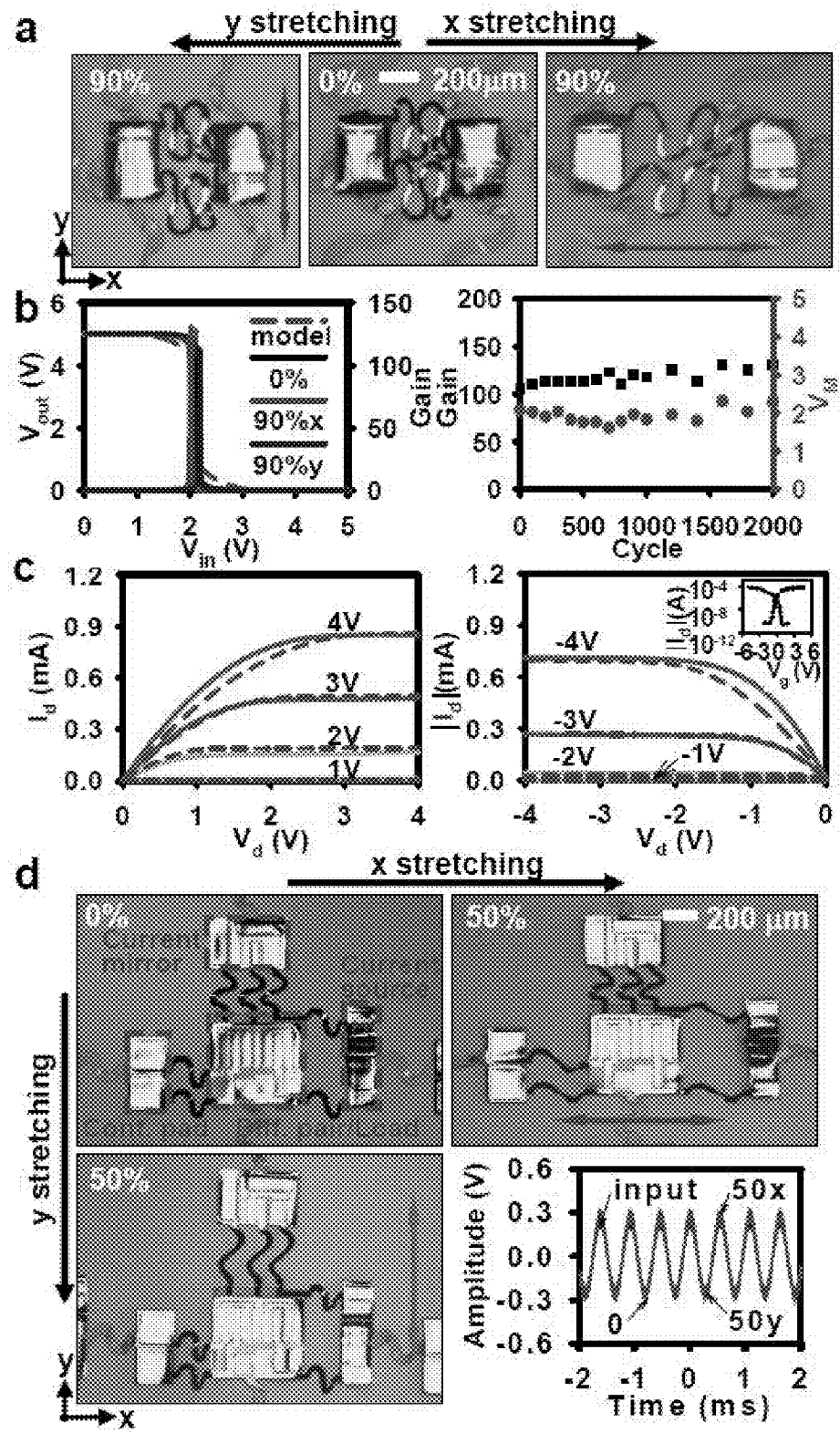
FIG. 90. (a) Optical images of a CMOS inverter with non-coplanar serpentine interconnects before and after applying 90% external strain in the x (right) and y (left) direction and (b) corresponding voltage transfer curves (left) and cycling test results (right). (c) Current-voltage response and PSPICE simulation result for nMOS (left) and pMOS (right) transistors; the inset shows the transfer curve on a semilog scale. (d) Optical images and electrical characteristics of a differential amplifier with non-coplanar serpentine interconnects.

To illustrate the value of these simple, optimized designs, we built CMOS inverters and NMOS differential amplifiers. The inverters exhibited gains as high as ~130, consistent with PSPICE simulation based on separate measurements of individual transistors (FIG. 90(*b*), left) that showed mobilities of ~400 $cm^2/Vs$ and ~160 $cm^2/Vs$ for nMOS and PMOS devices respectively, and on/off ratios >$10^5$ for both types of devices (FIG. 90(*c*), inset). The inverters incorporated devices with channel lengths and widths of 13 μm and 100 μm for nMOS and 13 μm and 300 μm for PMOS, respectively. Under large applied strains, the electrical properties showed little variation, due to the strain isolation effects of the bridges. For example, the inverter threshold voltage changed by less than ~0.5V for strains of ~90% in x and y direction, as shown in the right frame of FIG. 90(*b*). To explore fatigue, we cycled the strain from 0% to ~90% in the x direction 2000 times (FIG. 90(*b*)). The inverters showed little change in properties (gain and threshold voltage, VM) throughout these tests. This non-coplanar serpentine bridge strategy can be applied not only to inverters, but also to more complex circuits. FIG. 90(*d*) shows, as an example, a differential amplifier with designs and properties reported elsewhere. We divided the circuit into 4 sections, each of which forms an island connected by non-coplanar serpentine bridges. FIG. 90*d* shows magnified images of stretching in the x and y directions. Electrical measurements verify that the amplifiers work well under these deformations. The gains for 0%, 50% x stretching and 50% y stretching were 1.19, 1.17 and 1.16 (design value 1.2), respectively. Similar strategies are applicable to more complex systems.

Figure 91:
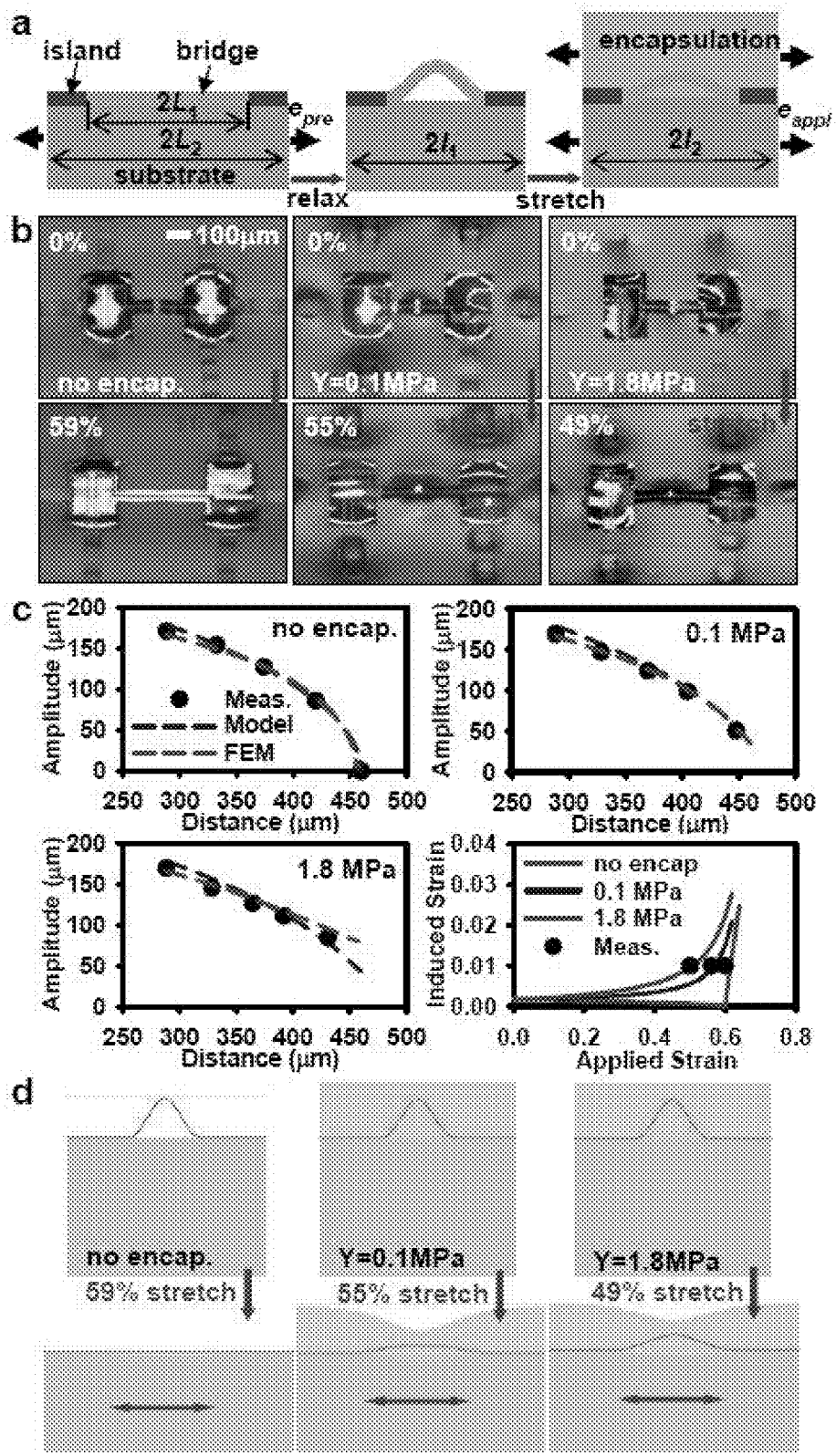
FIG. 91. (a) Schematic illustration of stretching test procedures for an encapsulated, straight bridge non-coplanar interconnect, (b) optical microscope images of the structure for the cases of zero strain (top) and maximum stretching before visible cracking (bottom) for no encapsulation (left), soft encapsulation (0.1 MPa, center) and hard encapsulation (1.8 MPa, right), (c) height of the bridge as a function of distance between the two islands determined by experiment, analytical modeling and FEM simulation; right bottom graph shows maximum strain before cracking estimated by theoretical modeling, (d) deformation geometries at maximum stretching before cracking, simulated by FEM.

In practice, and especially for non-coplanar device designs, electronic circuits preferably have top surface encapsulation layers to provide mechanical and environmental isolation. An ideal material for this purpose is an elastomer, with properties not too dissimilar from the substrate. For optimized mechanical response, this layer should provide minimal restriction of the free deformation of the interconnects, such as the non-coplanar serpentine bridges. This extent of restriction is controlled, in large part, by the modulus of the encapsulating layer. To provide insights into the materials and mechanics aspects, and to allow analytical calculation, we studied the behavior of straight bridge structures. After fabricating corresponding non-coplanar circuits, we encapsulated the system by casting and curing PDMS with different moduli (1.8 MPa and 0.1 MPa) on top (FIG. 91(*a*)). To prepare PDMS with these moduli, we mixed the prepolymer and curing agent (catalyst) at ratios of 10:1 and 45:1, respectively [10]. To examine the stretchability, we applied tensile strains up to the fracture point observable by optical microscope (FIG. 91(*a*)). With pre-strain of ~60%, the inverter with no encapsulation can be stretched up to ~59% without fracture. By contrast, similar inverters encapsulated using PDMS with modulus of 0.1 MPa and 1.8 MPa modulus, the maximum stretchability decreased to 55% and 49%, respectively, as shown in FIG. 91(*b*). To confirm these changes, we develop an analytical model and perform numerical FEM simulation.

The models are further validated by measuring non-coplanar bridge amplitudes during stretching of each system and comparing the measured value to those obtained by FEM. The results show good agreement, as shown in the top frames and bottom left frame of FIG. 91(*c*)); based on these theoretical modeling, we estimate the maximum stretchability. The stretchability decreases as we use the high modulus encapsulation, consistent with experiments (right bottom frame of FIG. 91(*c*)) and FEM simulation. FIG. 91(*d*) shows FEM simulation images for no stretching and maximum stretching of each encapsulation case.

Figure 92:
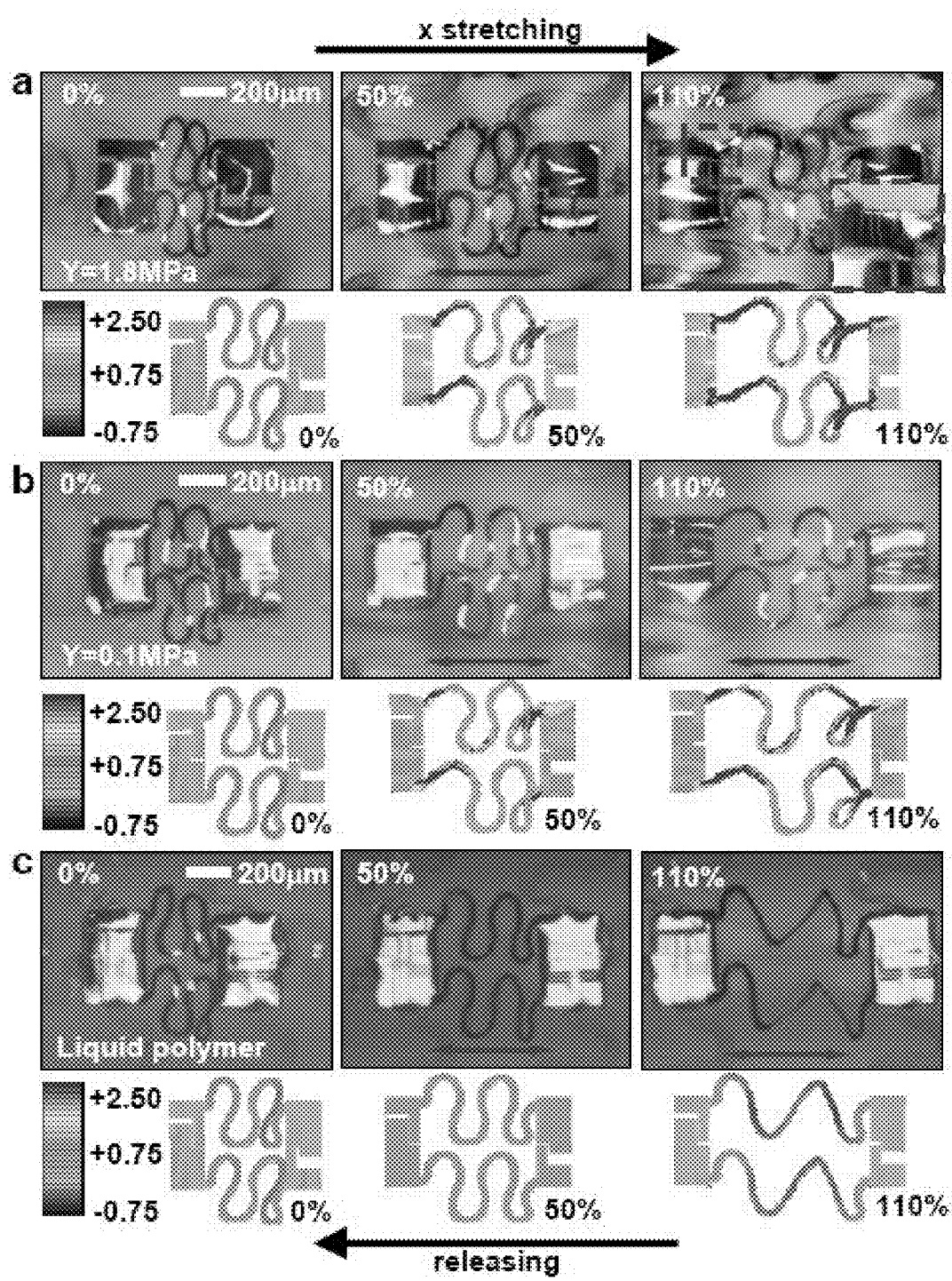
FIG. 92. Optical microscope images and strain distributions determined by FEM simulation for zero strain (left), ~50% strain (center) and ~110% strain (right), (a) hard PDMS (modulus ~1.8 MPa) encapsulation, (b) soft PDMS (modulus ~0.1 MPa) encapsulation and (c) uncured PDMS prepolymer (viscous liquid) encapsulation covered by a thin, solid layer of PDMS.

On the basis of insight from the simple cases of FIG. 91, we apply PDMS encapsulation to non-coplanar serpentine bridges to examine responses for PDMS with moduli of 1.8 MPa and 0.1 MPa, and also for the case of uncured, liquid PDMS. For the 1.8 MPa case, large applied strains (~110%, right frame of FIG. 92(*a*)) cause cracks, while small strains (~50%, center frame of FIG. 92(*a*)) does not. Although 0.1 MPa PDMS avoids visible cracks at ~110% strain, the images suggest significant strains, as also indicated by FEM simulation (bottom frames of FIG. 92(*b*)), with significant wrinkling in the device islands. For further improvement, an uncured liquid prepolymer to PDMS, without curing agent, can be injected between the circuit level and additional thin, top solid encapsulation layer of PDMS. As might be expected, the liquid PDMS has negligible effects on the essential mechanics, even after ~120% external strain, as shown in FIG. 92(*c*).

These three cases are supported by the theoretical analysis through finite element modeling (FEM) simulation.

Systematic studies of key effects of materials and design layouts on the mechanical properties of stretchable silicon integrated circuits reveal basic strategies for engineering these systems. Using relatively simple strategies, circuits with excellent electrical performance and reversible, elastic mechanical responses to applied strains in the range of 100% are possible. More sophisticated approaches, including use of automated design tools conceptually similar to those in current use for design of electrical properties in circuits, may further optimize mechanical properties and materials choices for desired applications.

The first step in fabricating stretchable silicon CMOS circuits is high temperature diffusion for source, drain and well doping. In this example, n-type SOI wafer (SOITEC, France) with 260 nm top silicon and 1 μm buried oxide provided the source of silicon nanoribbons/membranes. Since the mother wafer is n-type, the p-type well is formed first. For p-well, 550~600° C. diffusion of Boron from a spin on dopant (B153, Filmtronics, USA) was performed. Next, successive high temperature source and drain doping for PMOS (1000~1050° C.) and nMOS (950~1000° C.) was accomplished with Boron (B153, Filmtronics, USA) and Phosphorous (P509, Filmtronics, USA) spin-on-dopants, respectively. After high temperature doping, doped nanoribbons/membranes were transfer printed onto a carrier wafer coated with layers of PMMA (~100 nm) and PI (~1.2 μm). Electrical isolation of each transistor by reactive ion etching (RIE), followed by deposition of gate dielectrics using PECVD SiO2 (~40 nm) and metal electrodes (Cr/Au, ~5 nm/~1500 nm) using electron beam evaporation formed the CMOS circuits. Coating a thin layer of PI (1.2 μm) as a passivation layer and forming the segmented, mesh structure by RIE completed the device fabrication. Dissolving the underlying PMMA layer released the ultrathin circuits. Lifting them to a prestrained PDMS exposed their back surfaces for selective deposition of $SiO_2$ onto the active device regions. Transferring to a pre-strained substrate of PDMS completed the process. Electrical measurements were carried out using a probe station (Agilent, 4155C). Mechanical tests, including fatigue cycling, were performed with custom made bending and stretching stages. For the substrates, the stamps and the encapsulation layers, commercial PDMS kits (Sylgard 184, Dow Corning, USA) was used. After mixing the PDMS prepolymer and curing agent(catalyst) with an appropriate ratio, the samples were degassed for 1 hour to remove bubbles generated during mixing. Curing was performed in an oven at 70° C. for 2 hours.

References for Example 6

[1] R. H. Reuss, et al., Proc. IEEE. 2005, 93, 1239.
[2] D.-H. Kim et al., Science 2008, 320, 507.
[3] T. Someya et al., Proc. Natl. Acad. Sci. USA 2005, 102, 12321.
[4] T. Sekitani, et al., Science 2008, 321, 1468.
[5] S. P. Lacour, et al., Proc. IEEE. 2005, 93, 1459.
[6] D.-H. Kim, et al. Adv. Mater. 2008, 20, 1.
[7] H. C. Ko, et al., Nature 2008, 454, 748.
[8] D.-H. Kim, et al., Proc. Natl. Acad. Sci. USA 2008, 105, 18675.
[9] X. Lu, Y. Xia, Nature Nanotechnology 2006, 1, 161.
[10] Xin Q. et al., Biomaterials 2005, 26, 3123.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

U.S. patent application Ser. Nos. 11/981,380, 11/851,182 (Pub. No. 2008/0157235), 11/115,954 (Pub. No. 2005/0238967), 11/145,574, 11/145,542 (Pub. No. 2006/0038182), 11/675,659 (Pub. No. 2008/0055581), 11/465,317, 11/423,287 (Pub. No. 2006/0286785), 11/423,192, 11/001,689 (Pub. No. 2006/0286488) and 11/421,654 (Pub. No. 2007/0032089) are hereby incorporated by reference to the extent not inconsistent with the present description.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of making a stretchable and foldable electronic device, said method comprising:
providing a multilayer device comprising a substrate layer, a functional layer and one or more neutral mechanical surface adjusting layers,
wherein said functional layer is supported by said substrate layer,
wherein at least one of said one or more neutral mechanical surface adjusting layers is disposed above said functional layer,
wherein at least one of said one or more neutral mechanical surface adjusting layers of said multilayer device has a property that is spatially inhomogeneous relative to a location in said multilayer device,
wherein said spatially inhomogeneous property positions a spatially varying neutral mechanical surface coincident with or proximate to said functional layer, and
wherein spatial variations in said spatially inhomogeneous property causes said spatially varying neutral mechanical surface to be positioned at different distances from a to surface of the multilayer device in different spatial regions of the multilayer device, relative to said functional layer.

2. The method of claim 1, further comprising:
generating a pattern of said spatially inhomogeneous property in said one or more neutral mechanical surface adjusting layers having said spatially inhomogeneous property to provide one or more flexible and foldable regions in said multilayer device and one or more rigid regions in said multilayer device.

3. The method of claim 1, wherein the spatially inhomogeneous property is one or more of:
a spatially varying porosity of a layer;
a spatially varying extent of crosslinking of a layer;
a spatially varying Young's modulus of a layer;
a spatially varying deposition of an add layer; or
a spatially varying placement of recess features.

4. The method of claim 1, further comprising laterally patterning any layer of said multilayer device.

5. The method of claim 4, wherein said laterally patterning comprises patterning said substrate layer with one or more neutral mechanical surface adjusting layers comprising thin films or add layers.

6. The method of claim 4, wherein said laterally patterning comprises patterning said substrate layer with one or more neutral mechanical surface adjusting layers comprising one or more encapsulating layers.

7. The method of claim 4, wherein said laterally patterning comprises patterning said substrate layer with one or more recess features.

8. The method of claim 7, wherein said one or more recess features are etch holes.

9. The method of claim 4, wherein each layer of said multilayer device has a thickness, and wherein said laterally patterning comprises selectively varying the thickness of said substrate layer or the thickness of said one or more neutral mechanical surface adjusting layers.

10. The method of claim 4, wherein said laterally patterning comprises modulating a mechanical property of said substrate layer or said one or more neutral mechanical surface adjusting layers; and wherein said mechanical property is selected from the group consisting of porosity, extent of cross linking and Young's modulus.

11. The method of claim 1, wherein said one or more neutral mechanical surface adjusting layers comprises one or more encapsulating layer.

12. The method of claim 11, wherein said one or more encapsulating layer has a thickness that varies selectively in a lateral direction.

13. The method of claim 1, wherein said functional layer comprises a pop-up interconnect.

14. The method of claim 1, further comprising positioning the neutral mechanical plane to be coincident with or proximate to the functional layer that is most sensitive to strain-induced failure.

15. A method of making an electronic device having a curved surface, said method comprising:
- providing a multilayer device comprising a substrate layer, a functional layer and one or more neutral mechanical surface adjusting layers,
- wherein said functional layer is supported by a substrate layer,
- wherein at least one of said one or more neutral mechanical surface adjusting layers is disposed above said functional layer,
- wherein at least one of said one or more neutral mechanical surface adjusting layers of said multilayer device has a property that is spatially inhomogeneous relative to a location in said multilayer device,
- wherein said spatially inhomogeneous property positions a spatially varying neutral mechanical surface coincident with or proximate to said functional layer;
- wherein spatial variations in said spatially inhomogeneous property causes said spatially varying neutral mechanical surface to be positioned at different distances from a top surface of the multilayer device in different spatial regions of the multilayer device, relative to said functional layer
- providing a curvilinear surface; and
- conformally wrapping said curvilinear surface with said multilayer device, thereby making an electronic device with a curved surface.

16. The method of claim 15, wherein said functional layer comprises a component of an electronic device, wherein said component comprises a plurality of serpentine interconnects.

17. The method of claim 15, wherein said one or more neutral mechanical surface adjusting layers comprises one or more encapsulating layer.

18. The method of claim 15, wherein said functional layer comprises a semiconductor thin film layer, multiple semiconductor layers separated by support layers, or a plurality of patterned elements.

19. The method of claim 18, wherein said wherein said functional layer comprises a plurality of patterned elements, and wherein said patterned elements comprise interconnects.

20. The method of claim 1, wherein said functional layer comprises a component of an electronic device, wherein said component comprises a plurality of serpentine interconnects.

21. The method of claim 1, wherein said substrate layer comprises a polymer, an elastomer, a semiconductor, an inorganic polymer, an organic polymer, fabric, vinyl, latex, spandex, leather or paper.

22. The method of claim 1, wherein said multilayer device further comprises an isolation layer interspersed between a portion of said substrate layer and a portion of said functional layer, and wherein said isolation layer isolates at least a portion of said functional layer from an applied strain.

23. The method of claim 1, wherein said functional layer comprises a semiconductor thin film layer, multiple semiconductor layers separated by support layers, or a plurality of patterned elements.

24. The method of claim 23, wherein said functional layer comprises a plurality of patterned elements, and wherein said patterned elements comprise interconnects.

25. The method of claim 1, wherein said functional layer comprises curved interconnects that connect rigid device islands.

26. The method of claim 25, wherein the curved interconnects are in plane, out of plane, or a combination thereof.

27. The method of claim 25, wherein the curved interconnects are encapsulated with uncured, liquid prepolymer.

28. The method of claim 1, wherein the neutral mechanical surface is positioned proximate to a strain-sensitive material of said functional layer to provide an at least 50% reduction in strain in the strain sensitive material for a given folded configuration.

29. The method of claim 1, wherein the neutral mechanical surface is positioned less than 2 mm from a strain sensitive material of said functional layer.

30. The method of claim 1, wherein the neutral mechanical surface is positioned less than 10 µm from a strain sensitive material of said functional layer.

31. The method of claim 1, wherein the neutral mechanical surface is positioned within a layer that is adjacent to the functional layer.

32. The method of claim 1, further comprising:
- providing a carrier layer surface and coating at least a portion of said carrier surface with a sacrificial layer;
- attaching said substrate layer to said sacrificial layer, wherein said substrate layer supports at least a component of said electronic device;
- patterning a plurality of sacrificial layer access openings through said substrate layer; and
- releasing said substrate layer from said carrier layer surface by introducing a sacrificial-removing material to said sacrificial layer via said access openings, thereby obtaining a stretchable and foldable electronic device.

* * * * *

UNITED STATES PATENT AND TRADEMARK OFFICE
CERTIFICATE OF CORRECTION

PATENT NO. : 8,552,299 B2  Page 1 of 1
APPLICATION NO. : 12/398811
DATED : October 8, 2013
INVENTOR(S) : Rogers et al.

It is certified that error appears in the above-identified patent and that said Letters Patent is hereby corrected as shown below:

In the Claims:

In Claim 1, column 84, line 9, please replace "to surface" with -- top surface --.

In Claim 19, column 85, line 38, please replace "wherein said wherein said" with -- wherein said --.

Signed and Sealed this
Seventh Day of January, 2014

Margaret A. Focarino
*Commissioner for Patents of the United States Patent and Trademark Office*